(12) United States Patent
Rogers et al.

(10) Patent No.: US 10,497,633 B2
(45) Date of Patent: Dec. 3, 2019

(54) STRETCHABLE ELECTRONIC SYSTEMS WITH FLUID CONTAINMENT

(71) Applicant: The Board of Trustees of the University of Illinois, Urbana, IL (US)

(72) Inventors: John A. Rogers, Champaign, IL (US); Sheng Xu, Urbana, IL (US); Jonathan A. Fan, Columbus, OH (US); Lin Jia, Boston, MA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 219 days.

(21) Appl. No.: 13/835,284

(22) Filed: Mar. 15, 2013

(65) Prior Publication Data

US 2014/0220422 A1    Aug. 7, 2014

Related U.S. Application Data

(60) Provisional application No. 61/761,412, filed on Feb. 6, 2013.

(51) Int. Cl.
*H01L 23/18* (2006.01)
*H01L 23/08* (2006.01)
(Continued)

(52) U.S. Cl.
CPC .............. *H01L 23/18* (2013.01); *H01L 23/08* (2013.01); *H01L 23/22* (2013.01); *H05K 1/0283* (2013.01);
(Continued)

(58) Field of Classification Search
CPC ........... H01L 24/97; H01L 23/18; H01M 6/40
(Continued)

(56) References Cited

U.S. PATENT DOCUMENTS

| | | | |
|---|---|---|---|
| 5,171,482 A | | 12/1992 | Asai |
| 5,477,067 A | * | 12/1995 | Isomura ................ H01L 23/057 257/208 |

(Continued)

FOREIGN PATENT DOCUMENTS

| | | |
|---|---|---|
| CN | 102311092 | 1/2012 |
| DE | 102010030960 | 1/2012 |

(Continued)

OTHER PUBLICATIONS

Takahashi, K., Machine translation of JP 10-125825 A, May 1988.*

(Continued)

*Primary Examiner* — Sean P Cullen
(74) *Attorney, Agent, or Firm* — Leydig, Voit & Mayer, Ltd.

(57) ABSTRACT

The present invention provides electronic systems, including device arrays, comprising functional device(s) and/or device component(s) at least partially enclosed via one or more fluid containment chambers, such that the device(s) and/or device component(s) are at least partially, and optionally entirely, immersed in a containment fluid. Useful containment fluids for use in fluid containment chambers of electronic devices of the invention include lubricants, electrolytes and/or electronically resistive fluids. In some embodiments, for example, electronic systems of the invention comprise one or more electronic devices and/or device components provided in free-standing and/or tethered configurations that decouple forces originating upon deformation, stretching or compression of a supporting substrate from the free standing or tethered device or device component.

63 Claims, 80 Drawing Sheets

(51) Int. Cl.
*H01L 23/22* (2006.01)
*H05K 1/02* (2006.01)
*H01M 6/40* (2006.01)

(52) U.S. Cl.
CPC ............ *H01L 2224/16225* (2013.01); *H01L 2924/12032* (2013.01); *H01L 2924/12041* (2013.01); *H01L 2924/12042* (2013.01); *H01L 2924/12043* (2013.01); *H01M 6/40* (2013.01)

(58) Field of Classification Search
USPC ................. 429/124, 163; 438/117; 257/687
See application file for complete search history.

(56) References Cited

U.S. PATENT DOCUMENTS

| | | | |
|---|---|---|---|
| 5,663,106 A * | 9/1997 | Karavakis | H01L 21/56 257/791 |
| 5,686,162 A | 11/1997 | Polak et al. | |
| 5,739,463 A | 4/1998 | Diaz et al. | |
| 5,967,986 A | 10/1999 | Cimochowski et al. | |
| 6,020,219 A | 2/2000 | Dudderar et al. | |
| 6,489,669 B2 | 12/2002 | Shimada et al. | |
| 6,614,108 B1 | 9/2003 | Sanftleben et al. | |
| 6,617,683 B2 | 9/2003 | Lebonheur et al. | |
| 6,993,392 B2 | 1/2006 | Nicolelis et al. | |
| 7,195,733 B2 | 3/2007 | Rogers et al. | |
| 7,491,892 B2 | 2/2009 | Wagner et al. | |
| 7,521,292 B2 | 4/2009 | Rogers et al. | |
| 7,557,367 B2 | 7/2009 | Rogers et al. | |
| 7,622,367 B1 | 11/2009 | Nuzzo et al. | |
| 7,704,684 B2 | 4/2010 | Rogers et al. | |
| 7,705,280 B2 | 4/2010 | Nuzzo et al. | |
| 7,799,699 B2 | 9/2010 | Nuzzo et al. | |
| 7,932,123 B2 | 4/2011 | Rogers et al. | |
| 7,943,491 B2 | 5/2011 | Nuzzo et al. | |
| 7,972,875 B2 | 7/2011 | Rogers et al. | |
| 7,982,296 B2 | 7/2011 | Nuzzo et al. | |
| 8,039,847 B2 | 10/2011 | Nuzzo et al. | |
| 8,198,621 B2 | 6/2012 | Rogers et al. | |
| 8,217,381 B2 | 7/2012 | Rogers et al. | |
| 8,367,035 B2 | 2/2013 | Rogers et al. | |
| 8,394,706 B2 | 3/2013 | Nuzzo et al. | |
| 8,440,546 B2 | 5/2013 | Rogers et al. | |
| 8,470,701 B2 | 6/2013 | Rogers et al. | |
| 8,552,299 B2 | 10/2013 | Rogers et al. | |
| 8,562,095 B2 | 10/2013 | Alleyne et al. | |
| 8,664,699 B2 | 3/2014 | Nuzzo et al. | |
| 8,666,471 B2 | 3/2014 | Rogers et al. | |
| 8,679,888 B2 | 3/2014 | Rogers et al. | |
| 8,722,458 B2 | 5/2014 | Rogers et al. | |
| 8,729,524 B2 | 5/2014 | Rogers et al. | |
| 8,754,396 B2 | 6/2014 | Rogers et al. | |
| 8,865,489 B2 | 10/2014 | Rogers et al. | |
| 8,895,406 B2 | 11/2014 | Rogers et al. | |
| 8,905,772 B2 | 12/2014 | Rogers et al. | |
| 8,934,965 B2 | 1/2015 | Rogers et al. | |
| 8,946,683 B2 | 2/2015 | Rogers et al. | |
| 9,057,994 B2 | 6/2015 | Rogers et al. | |
| 9,061,494 B2 | 6/2015 | Rogers et al. | |
| 9,105,555 B2 | 8/2015 | Rogers et al. | |
| 9,105,782 B2 | 8/2015 | Rogers et al. | |
| 9,117,940 B2 | 8/2015 | Rogers et al. | |
| 9,278,522 B2 | 3/2016 | Rogers et al. | |
| 9,324,733 B2 | 4/2016 | Rogers et al. | |
| 9,349,900 B2 | 5/2016 | Rogers et al. | |
| 9,378,864 B1 | 6/2016 | Liu et al. | |
| 9,442,285 B2 | 9/2016 | Rogers | |
| 9,450,043 B2 | 9/2016 | Nuzzo et al. | |
| 9,487,002 B2 | 11/2016 | Rogers et al. | |
| 9,496,229 B2 | 11/2016 | Rogers et al. | |
| 9,515,025 B2 | 12/2016 | Rogers et al. | |
| 9,554,465 B1 | 1/2017 | Liu et al. | |
| 9,554,484 B2 | 1/2017 | Rogers et al. | |
| 9,555,644 B2 | 1/2017 | Rogers et al. | |
| 9,601,671 B2 | 3/2017 | Rogers et al. | |
| 9,613,911 B2 | 4/2017 | Rogers et al. | |
| 9,647,171 B2 | 5/2017 | Rogers et al. | |
| 9,691,873 B2 | 6/2017 | Rogers et al. | |
| 9,761,444 B2 | 9/2017 | Nuzzo et al. | |
| 9,765,934 B2 | 9/2017 | Rogers et al. | |
| 9,768,086 B2 | 9/2017 | Nuzzo et al. | |
| 2002/0094701 A1 | 7/2002 | Biegelsen et al. | |
| 2002/0109219 A1 * | 8/2002 | Yang | H01L 21/565 257/712 |
| 2004/0188136 A1 | 9/2004 | Sunohara et al. | |
| 2005/0238967 A1 | 10/2005 | Rogers et al. | |
| 2005/0253273 A1 | 11/2005 | Tai et al. | |
| 2006/0038182 A1 | 2/2006 | Rogers et al. | |
| 2006/0071349 A1 | 4/2006 | Tokushige et al. | |
| 2006/0286488 A1 | 12/2006 | Rogers et al. | |
| 2006/0286785 A1 | 12/2006 | Rogers et al. | |
| 2007/0032089 A1 | 2/2007 | Nuzzo et al. | |
| 2008/0055581 A1 | 3/2008 | Rogers et al. | |
| 2008/0108171 A1 | 5/2008 | Rogers et al. | |
| 2008/0157095 A1 | 7/2008 | Son et al. | |
| 2008/0157235 A1 | 7/2008 | Rogers et al. | |
| 2008/0193855 A1 | 8/2008 | McDonald | |
| 2008/0212102 A1 | 9/2008 | Nuzzo et al. | |
| 2009/0199960 A1 | 8/2009 | Nuzzo et al. | |
| 2009/0294803 A1 | 12/2009 | Nuzzo et al. | |
| 2009/0309116 A1 * | 12/2009 | Kato | C09K 11/7721 257/98 |
| 2010/0002402 A1 * | 1/2010 | Rogers | H01L 21/4867 361/749 |
| 2010/0052112 A1 | 3/2010 | Rogers et al. | |
| 2010/0059863 A1 | 3/2010 | Rogers et al. | |
| 2010/0072577 A1 | 3/2010 | Nuzzo et al. | |
| 2010/0116526 A1 | 5/2010 | Arora et al. | |
| 2010/0143848 A1 | 6/2010 | Jain et al. | |
| 2010/0157804 A1 | 6/2010 | Bugenhagen | |
| 2010/0178722 A1 | 7/2010 | De Graff et al. | |
| 2010/0283069 A1 | 11/2010 | Rogers et al. | |
| 2010/0289124 A1 | 11/2010 | Nuzzo et al. | |
| 2010/0298895 A1 * | 11/2010 | Ghaffari | A61B 1/00082 607/3 |
| 2010/0317132 A1 | 12/2010 | Rogers et al. | |
| 2011/0147715 A1 | 6/2011 | Rogers et al. | |
| 2011/0170225 A1 | 7/2011 | Rogers et al. | |
| 2011/0171813 A1 | 7/2011 | Rogers et al. | |
| 2011/0187798 A1 | 8/2011 | Rogers et al. | |
| 2011/0220890 A1 | 9/2011 | Nuzzo et al. | |
| 2011/0230747 A1 | 9/2011 | Rogers et al. | |
| 2011/0266561 A1 | 11/2011 | Rogers et al. | |
| 2011/0277813 A1 | 11/2011 | Rogers et al. | |
| 2011/0316120 A1 | 12/2011 | Rogers et al. | |
| 2012/0038027 A1 | 2/2012 | Broekaart | |
| 2012/0051005 A1 | 3/2012 | Vanfleteren et al. | |
| 2012/0052268 A1 | 3/2012 | Axisa et al. | |
| 2012/0083099 A1 | 4/2012 | Nuzzo et al. | |
| 2012/0105528 A1 | 5/2012 | Alleyne et al. | |
| 2012/0121963 A1 | 5/2012 | Kwon et al. | |
| 2012/0157804 A1 | 6/2012 | Rogers et al. | |
| 2012/0165759 A1 | 6/2012 | Rogers et al. | |
| 2012/0176764 A1 * | 7/2012 | Löher | H05K 1/0283 361/820 |
| 2012/0261551 A1 | 10/2012 | Rogers et al. | |
| 2012/0320581 A1 | 12/2012 | Rogers et al. | |
| 2012/0321785 A1 | 12/2012 | Rogers et al. | |
| 2012/0327608 A1 | 12/2012 | Rogers et al. | |
| 2013/0036928 A1 | 2/2013 | Rogers et al. | |
| 2013/0041235 A1 | 2/2013 | Rogers et al. | |
| 2013/0072775 A1 | 3/2013 | Rogers et al. | |
| 2013/0100618 A1 | 4/2013 | Rogers et al. | |
| 2013/0140649 A1 | 6/2013 | Rogers et al. | |
| 2013/0313713 A1 | 11/2013 | Arora et al. | |
| 2013/0320503 A1 | 12/2013 | Nuzzo et al. | |
| 2013/0333094 A1 | 12/2013 | Rogers et al. | |
| 2014/0022745 A1 * | 1/2014 | Ehrenpfordt | B81B 7/0058 361/749 |
| 2014/0092158 A1 | 4/2014 | Alleyne et al. | |
| 2014/0097010 A1 | 4/2014 | Plant | |
| 2014/0124257 A1 | 5/2014 | Yoshihara et al. | |
| 2014/0140020 A1 | 5/2014 | Rogers et al. | |

(56) References Cited

U.S. PATENT DOCUMENTS

| | | |
|---|---|---|
| 2014/0163390 A1 | 6/2014 | Rogers et al. |
| 2014/0191236 A1 | 7/2014 | Nuzzo et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |
| 2014/0340857 A1 | 11/2014 | Hsu et al. |
| 2014/0361409 A1 | 12/2014 | Rogers et al. |
| 2014/0373898 A1 | 12/2014 | Rogers et al. |
| 2014/0374872 A1 | 12/2014 | Rogers et al. |
| 2015/0001462 A1 | 1/2015 | Rogers et al. |
| 2015/0080695 A1 | 3/2015 | Rogers et al. |
| 2015/0132873 A1 | 5/2015 | Rogers et al. |
| 2015/0141767 A1 | 5/2015 | Rogers et al. |
| 2015/0181700 A1 | 6/2015 | Rogers et al. |
| 2015/0207012 A1 | 7/2015 | Rogers et al. |
| 2015/0237711 A1 | 8/2015 | Rogers et al. |
| 2015/0290938 A1 | 10/2015 | Rogers et al. |
| 2015/0373831 A1 | 12/2015 | Rogers et al. |
| 2015/0380355 A1 | 12/2015 | Rogers et al. |
| 2016/0005700 A1 | 1/2016 | Rogers et al. |
| 2016/0027737 A1 | 1/2016 | Rogers et al. |
| 2016/0050750 A1 | 2/2016 | Rogers et al. |
| 2016/0066411 A1 | 3/2016 | Hong et al. |
| 2016/0066789 A1 | 3/2016 | Rogers et al. |
| 2016/0072027 A1 | 3/2016 | Rogers et al. |
| 2016/0133843 A1 | 5/2016 | Rogers et al. |
| 2016/0136877 A1 | 5/2016 | Rogers et al. |
| 2016/0284544 A1 | 9/2016 | Nuzzo et al. |
| 2016/0293794 A1 | 10/2016 | Nuzzo et al. |
| 2016/0381789 A1 | 12/2016 | Rogers et al. |
| 2017/0020402 A1 | 1/2017 | Rogers et al. |
| 2017/0128015 A1 | 5/2017 | Rogers et al. |
| 2017/0164482 A1 | 6/2017 | Rogers et al. |
| 2017/0179085 A1 | 6/2017 | Rogers et al. |
| 2017/0179100 A1 | 6/2017 | Rogers et al. |
| 2017/0179356 A1 | 6/2017 | Rogers et al. |
| 2017/0181704 A1 | 6/2017 | Rogers et al. |
| 2017/0200679 A1 | 7/2017 | Rogers et al. |
| 2017/0200707 A1 | 7/2017 | Rogers et al. |
| 2017/0210117 A1 | 7/2017 | Rogers et al. |
| 2017/0224257 A1 | 8/2017 | Rogers et al. |
| 2017/0231571 A1 | 8/2017 | Rogers et al. |
| 2017/0291817 A1 | 10/2017 | Rogers et al. |

FOREIGN PATENT DOCUMENTS

| | | | |
|---|---|---|---|
| DE | 102011003195 A1 * | 7/2012 | ........... B81B 7/0058 |
| GB | 2489508 | 10/2012 | |
| JP | S60-007056 A | 1/1985 | |
| JP | 10125825 A * | 5/1998 | |
| JP | 2001-237351 A | 8/2001 | |
| JP | 2003-521146 A | 7/2003 | |
| JP | 2005-518074 A | 6/2005 | |
| JP | 2012-508083 A | 4/2012 | |
| JP | 2012-222826 A | 11/2012 | |
| JP | 2012-231018 A | 11/2012 | |
| TW | 201247050 | 11/2012 | |
| WO | WO 1992/020096 | 11/1992 | |
| WO | WO 2003/069700 A2 | 8/2003 | |
| WO | WO 2010/086034 | 8/2010 | |
| WO | WO 2011/008459 | 1/2011 | |
| WO | WO 2012/131352 | 10/2012 | |
| WO | WO 2013/144738 | 10/2013 | |
| WO | WO 2016/196673 | 12/2016 | |
| WO | WO 2016/196675 | 12/2016 | |
| WO | WO 2017/004531 | 1/2017 | |
| WO | WO 2017/004576 | 1/2017 | |

OTHER PUBLICATIONS

International Search Report and Written Opinion dated Dec. 18, 2014, for International Application No. PCT/US14/14944.

Hu et al. (2011) "Stretchable Inorganic-Semiconductor Electronic Systems," Adv. Mater., pp. 2933-2936.

U.S. Appl. No. 11/001,689, filed Dec. 1, 2004, 2006/0286488, Dec. 21, 2006, U.S. Pat. No. 7,704,684, Apr. 27, 2010.

U.S. Appl. No. 11/115,954, filed Apr. 27, 2005, 2005/0238967, Oct. 27, 2005, U.S. Pat. No. 7,195,733, Mar. 27, 2007.

U.S. Appl. No. 11/145,574, filed Jun. 2, 2005, 2009/0294803, Dec. 3, 2009, U.S. Pat. No. 7,622,367, Nov. 24, 2009.

U.S. Appl. No. 11/145,542, filed Jun. 2, 2005, 2006/0038182, Feb. 23, 2006, U.S. Pat. No. 7,557,367, Jul. 7, 2009.

U.S. Appl. No. 11/421,654, filed Jun. 1, 2006, 2007/0032089, Feb. 8, 2007, U.S. Pat. No. 7,799,699, Sep. 21, 2010.

U.S. Appl. No. 11/423,287, filed Jun. 9, 2006, 2006/0286785, Dec. 21, 2006, U.S. Pat. No. 7,521,292, Apr. 21, 2009.

U.S. Appl. No. 11/423,192, filed Jun. 9, 2006, 2009/0199960, Aug. 13, 2009, U.S. Pat. No. 7,943,491, May 17, 2011.

U.S. Appl. No. 11/465,317, filed Aug. 17, 2006.

U.S. Appl. No. 11/675,659, filed Feb. 16, 2007, 2008/0055581, Mar. 6, 2008.

U.S. Appl. No. 11/782,799, filed Jul. 25, 2007, 2008/0212102, Sep. 4, 2008, U.S. Pat. No. 7,705,280, Apr. 27, 2010.

U.S. Appl. No. 11/851,182, filed Sep. 6, 2007, 2008/0157235, Jul. 3, 2008, U.S. Pat. No. 8,217,381, Jul. 10, 2012.

U.S. Appl. No. 11/585,788, filed Sep. 20, 2007, 2008/0108171, May 8, 2008, U.S. Pat. No. 7,932,123, Apr. 26, 2011.

U.S. Appl. No. 11/981,380, filed Oct. 31, 2007, 2010/0283069, Nov. 11, 2010, U.S. Pat. No. 7,972,875, Jul. 5, 2011.

U.S. Appl. No. 12/372,605, filed Feb. 17, 2009.

U.S. Appl. No. 12/398,811, filed Mar. 5, 2009, 2010/0002402, Jan. 7, 2010, U.S. Pat. No. 8,552,299, Oct. 8, 2013.

U.S. Appl. No. 12/405,475, filed Mar. 17, 2009, 2010/0059863, Mar. 11, 2010, U.S. Pat. No. 8,198,621, Jun. 12, 2012.

U.S. Appl. No. 12/418,071, filed Apr. 3, 2009, 2010/0052112, Mar. 4, 2010, U.S. Pat. No. 8,470,701, Jun. 25, 2013.

U.S. Appl. No. 12/564,566, filed Sep. 22, 2009, 2010/0072577, Mar. 25, 2010, U.S. Pat. No. 7,982,296, Jul. 19, 2011.

U.S. Appl. No. 12/669,287, filed Jan. 15, 2010, 2011/0187798, Aug. 4, 2011.

U.S. Appl. No. 12/778,588, filed May 12, 2010, 2010/0317132, Dec. 16, 2010.

U.S. Appl. No. 12/844,492, filed Jul. 27, 2010, 2010/0289124, Nov. 18, 2010, U.S. Pat. No. 8,039,847, Oct. 18, 2011.

U.S. Appl. No. 12/892,001, filed Sep. 28, 2010, 2011/0230747, Sep. 22, 2011.

U.S. Appl. No. 12/916,934, filed Nov. 1, 2010, 2012/0105528, May 3, 2012, U.S. Pat. No. 8,562,095, Oct. 22, 2013.

U.S. Appl. No. 12/947,120, filed Nov. 16, 2010, 2011/0170225, Jul. 14, 2011.

U.S. Appl. No. 12/996,924, filed Dec. 8, 2010, 2011/0147715, Jun. 23, 2011.

U.S. Appl. No. 12/968,637, filed Dec. 15, 2010, 2012/0157804, Jun. 21, 2012.

U.S. Appl. No. 13/046,191, filed Mar. 11, 2011, 2012/0165759, Jun. 28, 2012.

U.S. Appl. No. 13/071,027, filed Mar. 24, 2011, 2011/0171813, Jul. 14, 2011.

U.S. Appl. No. 13/095,502, filed Apr. 27, 2011.

U.S. Appl. No. 13/100,774, filed May 4, 2011, 2011/0266561, Nov. 3, 2011.

U.S. Appl. No. 13/113,504, filed May 23, 2011, 2011/0220890, Sep. 15, 2011, U.S. Pat. No. 8,440,546, May 14, 2013.

U.S. Appl. No. 13/120,486, filed Aug. 4, 2011, 2011/0277813, Nov. 17, 2011.

U.S. Appl. No. 13/228,041, filed Sep. 8, 2011, 2011/0316120, Dec. 29, 2011.

U.S. Appl. No. 13/270,954, filed Oct. 11, 2011, 2012/0083099, Apr. 5, 2012, U.S. Pat. No. 8,394,706, Mar. 12, 2013.

U.S. Appl. No. 13/349,336, filed Jan. 12, 2012, 2012/0261551, Oct. 18, 2012.

U.S. Appl. No. 13/441,618, filed Apr. 6, 2012, 2013/0100618, Apr. 25, 2013.

U.S. Appl. No. 13/441,598, filed Apr. 6, 2012, 2012/0327608, Dec. 27, 2012.

(56) References Cited

OTHER PUBLICATIONS

U.S. Appl. No. 13/472,165, filed May 15, 2012, 2012/0320581, Dec. 20, 2012.
U.S. Appl. No. 13/486,726, filed Jun. 1, 2012, 2013/0072775, Mar. 21, 2013.
U.S. Appl. No. 13/492,636, filed Jun. 8, 2012, 2013/0041235, Feb. 14, 2013.
U.S. Appl. No. 13/549,291, filed Jul. 13, 2012, 2013/0036928, Feb. 14, 2013.
U.S. Appl. No. 13/596,343, filed Aug. 28, 2012, 2012/0321785, Dec. 20, 2012, U.S. Pat. No. 8,367,035, Feb. 5, 2013.
U.S. Appl. No. 13/624,096, filed Sep. 21, 2012, 2013/0140649, Jun. 6, 2013.
U.S. Appl. No. 13/801,868, filed Mar. 13, 2013, 2013/0320503, Dec. 5, 2013.
U.S. Appl. No. 13/835,284, filed Mar. 15, 2013.
U.S. Appl. No. 13/853,770, filed Mar. 29, 2013.
Digikey (publication date unknown) "Datasheet for BAT 62-02LS E6327," http://www.digikey.com/product-detail/en/BAT%2062-02LS%20E6327/BAT%2062-02LS%20E6327CT-ND/2410146.
Ferg et al. (1994) "Spinel Anodes for Lithium-Ion Batteries," *J. Electrochem. Soc.* 141:L147-L150.
Gaikwad et al. (Jul. 3, 2012) "Highly Stretchable Alkaline Batteries Based on an Embedded Conductive Fabric," *Adv. Mater.* 24, 5071-5076.
Garnier et al. (1994) "All-Polymer Field-Effect Transistor Realized by Printing Techniques," *Science* 265:1684-1686.
Gowda et al. (published online Dec. 6, 2010) "Conformal Coating of Thin Polymer Electrolyte Layer on Nanostructured Electrode Materials for Three-Dimensional Battery Applications," *Nano Lett.* 11:101-106.
Hu et al. (2009) "Highly conductive paper for energy-storage devices," *Proc. Natl. Acad. Sci. U. S. A.* 106:21490-21494.
Hu et al. (2010) "Stretchable, Porous, and Conductive Energy Textiles," *Nano Lett.* 10:708-714.
Hu et al. (2010) "Thin, Flexible Secondary Li-Ion Paper Batteries," *ACS Nano.* 4:5843-5848.
Huck et al. (2000) "Ordering of Spontaneously Formed Buckles on Planar Surfaces," *Langmuir* 16:3497-3501.
Jones et al. (Jul./Aug. 2004) "Stretchable Wavy Metal Interconnects," *J. Vac. Sci. Technol. A* 22(4):1723-1725.
Kaltenbrunner et al. (2010) "Arrays of Ultracompliant Electrochemical Dry Gel Cells for Stretchable Electronics," Adv. Mater. 22, 2065-2067 (2010).
Khang et al. (2006) "A stretchable form of single-crystal silicon for high-performance electronics on rubber substrates," *Science.* 311, 208-212.
Kim et al. (Aug. 12, 2011) "Epidermal Electronics," *Science.* 333:838-843.
Kim et al. (Mar. 6, 2011) "Materials for multifunctional balloon catheters with capabilities in cardiac electrophysiological mapping and ablation therapy," *Nature Mater.* 10:316-323.
Ko et al. (2008) "A hemispherical electronic eye camera based on compressible silicon optoelectronics," *Nature.* 454:748-753.
Krieger (Aug. 8, 2012) "Extreme mechanics: Buckling down," *Nature.* 488:146-147.
Lacour et al. (2005) "Stretchable Interconnects for Elastic Electronic Surfaces," Proc. IEEE 93:1459-1467.
Lacour et al. (Apr. 14, 2003) "Stretchable Gold Conductors on Elastomeric Substrates," *Appl. Phys. Lett.* 82(15):2404.
Lacour et al. (Dec. 2004) "An Elastically Stretchable TFT Circuit," *IEEE Electron Dev. Lett.* 25(12):792-794.
Lee et al. (Feb. 22, 2011) "Stretchable GaAs Photovoltaics with Designs That Enable High Areal Coverage," *Adv. Mater.* 23:986-991.
Lee et al. (published online Mar. 29, 2012) "Stretchable Semiconductor Technologies with High Areal Coverages and Strain-Limiting Behavior: Demonstration in High-Efficiency Dual-Junction GaInP/GaAs Photovoltaics," *Small.* 8:1851-1856.

Mandlik et al. (Aug. 2006) "Fully Elastic Interconnects on Nanopatterned Elastomeric Substrates," *IEEE Electron Dev. Lett.* 27(8):650-652.
Mannsfeld et al. (Sep. 12, 2010) "Highly sensitive flexible pressure sensors with microstructured rubber dielectric layers," *Nature Mater.* 9:859-864.
Nishide et al. (2008) "Toward flexible batteries," *Science.* 319:737-738.
Ouyang et al. (2000) "Conversion of some siloxane polymers to silicon oxide by UV/ozone photochemical processes," *Chem. Mater.* 12:1591-1596.
Owen (1997) "Rechargeable lithium batteries," *Chem. Soc. Rev.* 26:259-267.
Pelrine et al. (2000) "High-speed electrically actuated elastomers with strain greater than 100%," *Science.* 287:836-839.
Pushparaj et al. (2007) "Flexible energy storage devices based on nanocomposite paper," *Proc. Natl. Acad. Sci. U. S. A.* 104:13574-13577.
Scrosati (2007) "Nanomaterials—Paper powers battery breakthrough," *Nature Nanotechnol.* 2:598-599.
Scrosati et al. (2010) "Lithium batteries: Status, prospects and future," *J. Power Sources.* 195:2419-2430.
Sekitani et al. (2008) "A rubberlike stretchable active matrix using elastic conductors," *Science.* 321:1468-1472.
Sekitani et al. (Mar. 2012) "Stretchable organic integrated circuits for large-area electronic skin surfaces," MRS Bull. 37:236-245.
Someya et al. (2004) "A large-area, flexible pressure sensor matrix with organic field-effect transistors for artificial skin application," *Proc. Natl. Acad. Sci. U. S. A.* 101:9966-9970.
Sun et al. (2006) "Controlled buckling of semiconductor nanoribbons for stretchable electronics," *Nature Nanotechnol.* 1:201-207.
Suo (Mar. 2012) "Mechanics of stretchable electronics and soft machines," MRS Bull. 37:218-225.
Takei et al. (2010) "Nanowire active-matrix circuitry for low-voltage macroscale artificial skin," *Nature Mater.* 9:821-826.
Tarascon et al. (2001) "Issues and challenges facing rechargeable lithium batteries," *Nature.* 414:359-367.
Thanawala et al. (2000) "Surface modification of silicone elastomer using perfluorinated ether," *Langmuir.* 16:1256-1260.
Wagner et al. (2004) "Electronic skin: architecture and components," *Physica E Low Dimens. Syst. Nanostruct.* 25:326-334.
Yoon et al. (2008) "Ultrathin silicon solar microcells for semitransparent, mechanically flexible and microconcentrator module designs," Nature Mater. 7:907-915.
Yoshima et al. (Jun. 15, 2012) "Fabrication of micro lithium-ion battery with 3D anode and 3D cathode by using polymer wall," *J. Power Sources.* 208:404-408.
Yu et al. (2009) "Stretchable supercapacitors based on buckled single-walled carbon nanotube macrofilms," *Adv. Mater.* 21:4793-4797.
Ahn et al. (2009) "Omnidirectional Printing of Flexible, Stretchable, and Spanning Silver Microelectrodes," Science. 323:1590-1593.
Axisa et al. (2007) "Biomedical Stretchable Sytems using MID Based Stretchable Electronics Technology," In; The Conference Proceedings of the 29th Annual International Conference of the IEEE Engineering in Medicine and Biology Society, 2007. EMBS 2007. pp. 5687-5690.
Bluestar Silicones (Nov. 2012) "Silbion® RT GEL 4717 A & B," Bluestar Silicones Technical Data Sheet No. SIL 12 326 3.
Bowden et al. (May 14, 1998) "Spontaneous Formation of Ordered Structures in Thin Films of Metals Supported on an Elastomeric Polymer," Nature. 393:146-149.
Brosteaux et al. (2007) "Design and fabrication of elastic interconnections for stretchable electronic circuits," IEEE Electron Device Lett. 28:552-554.
Carlson et al. (Aug. 31, 2012) "Transfer printing techniques for materials assembly and micro/nanodevice fabrication," Adv. Mater. 24:5284-5318.
Chasiotis et al. (2002) "A new microtensile tester for the study of MEMS materials with the aid of atomic force microscopy," Experimental Mechanics. 42:51-57.

(56) References Cited

OTHER PUBLICATIONS

Chasiotis et al. (2007) "Strain rate effects on the mechanical behavior of nanocrystalline Au films," Thin Solid Films. 515:3183-3189.
Chen et al. (1993) "Control of Strength and Toughness of Ceramic-Metal Laminates Using Interface Design," Journal of Materials Research. 8:2362-2369.
Chow et al. (Jun. 2013) "Implantable RF medical devices: The benefits of high-speed communication and much greater communication distances in biomedical applications," IEEE Microw. Mag. 14:64-73.
Cohen (1995) "Fractal Antennas: Part 1," Communications Quarterly: The Journal of Communications Technology. pp. 7-22.
Connor et al. (1998) "Broadband ac conductivity of conductor-polymer composites," Physical Review B. 57:2286-2294.
Cotton et al. (2009) "A Multifunctional Capacitive Sensor for Stretchable Electronic Skins," IEEE Sensors Journal. 9:2008-2009.
Duan et al. (Dec. 16, 2013) "Non-wrinkled, highly stretchable piezoelectric devices by electrohydrodynamic direct-writing," Nanoscale. 6:3289-3295.
Duan et al. (Oct. 1, 2013) "Transfer printing and patterning of stretchable electrospun film," Thin Solid Films. 544:152-156.
Espinosa et al. (2004) "Plasticity size effects in free-standing submicron polycrystalline FCC films subjected to pure tension," Journal of the Mechanics and Physics of Solids. 52:667-689.
Fairbanks et al. (2011) "Fractal electronic devices: simulation and implementation," Nanotechnology. 22(36):365304.
Fan et al. (Feb. 7, 2014) "Fractal Design Concepts for Stretchable Electronics," Nat Commun. 5:3266.
Gao et al. (2005) "Mechanics of hierarchical adhesion structures of geckos," Mechanics of Materials. 37:275-285.
Gianvittorio et al. (2002) "Y. Fractal antennas: A novel antenna miniaturization technique, and applications," IEEE Antennas and Propagation Magazine. 44:20-36.
Goldberger et al. (1987) "Fractals in Physiology and Medicine," Yale Journal of Biology and Medicine. 60:421-435.
Golestanirad et al. (Jul. 12, 2013) "Analysis of fractal electrodes for efficient neural stimulation," Frontiers in Neuroengineering. 6:3.
Gonzalez et al. (2008) "Design and performance of metal conductors for stretchable electronic circuits," Circuit World. 35:22-29.
Gonzalez et al. (2008) "Design of metal interconnects for stretchable electronic circuits," Microelectronics Reliability. 48:825-832.
Gonzalez et al. (Jun. 2011) "Design and implementation of flexible and stretchable systems," Microelectron. Reliab. 51:1069-1076.
Graudejus et al. (Dec. 8, 2011) Encapsulating Elastically Stretchable Neural Interfaces: Yield, Resolution, and Recording/Stimulation of Neural Activity, Advanced Functional Materials. 22:640-651.
Gray et al. (2004) "High-Conductivity Elastomeric Electronics," Adv. Mater. 16:393-397.
Hajji et al. (1999) "Synthesis, structure, and morphology of polymer-silica hybrid nanocomposites based on hydroxyethyl methacrylate," Journal of Polymer Science Part B—Polymer Physics. 37:3172-3187.
Hao et al. (Mar. 8, 2013) "A Transforming Metal Nanocomposite with Large Elastic Strain, Low Modulus, and High Strength," Science. 339:1191-1194.
Harris et al. (2011) "Elastically Stretchable Insulation and Bilevel Metallization and Its Application in a Stretchable RLC Circuit," J. Eletron. Mater. 40:1335-1344.
Hsu et al. (2009) "In situ observations on deformation behavior and stretching-induced failure of fine pitch stretchable interconnect," J. Mater. Res. 24:3573-3582.
Hsu et al. (2010) "The effect of pitch on deformation behavior and the stretching-induced failure of a polymer-encapsulated stretchable circuit," J. Micromech. Microeng. 20:075036.
Hsu et al. (Aug. 2011) "Polyimide-Enhanced Stretchable Interconnects: Design, Fabrication, and Characterization," IEEE Trans. Electron. Dev. 58:2680-2688.
Huang et al. (Jul. 9, 2012) "Controllable self-organization of colloid microarrays based on finite length effects of electrospun ribbons," Soft Matter. 8:8302-8311.
International Search Report with Written Opinion corresponding to International Patent Application No. PCT/US2014/014932, dated May 14, 2014.
Jeong et al. (Sep. 25, 2013) "Materials and Optimized Designs for Human-Machine Interfaces via Epidermal Electronics," Adv. Mater. 25(47):6839-6846.
Jiang et al. (2007) "Finite deformation mechanics in buckled thin films on compliant supports," Proc. Natl. Acad. Sci. USA. 104:15607-15612.
Jiang et al. (2008) "Finite width effect of thin-films buckling on compliant substrate: Experimental and theoretical studies," Journal of the Mechanics and Physics of Solids 56:2585-2598.
Kaltenbrunner et al. (Jul. 24, 2013) "An ultra-lightweight design for imperceptible plastic electronics," Nature. 499:458-463.
Keplinger et al. (Aug. 30, 2013) "Stretchable, Transparent, Ionic Conductors," Science 341:984-987.
Kim et al. (2008) "Materials and noncoplanar mesh designs for integrated circuits with linear elastic responses to extreme mechanical deformations," Proc. Natl. Acad. Sci. USA. 105:18675-18680.
Kim et al. (2008) "Stretchable and Foldable Silicon Integrated Circuits," Science 320:507-511.
Kim et al. (2009) "Optimized Structural Designs for Stretchable Silicon Integrated Circuits," Small. 5:2841-2847.
Kim et al. (2010) "Stretchable, Curvilinear Electronics Based on Inorganic Materials," Adv. Mater. 22:2108-2124.
Kim et al. (2010) "Waterproof AlInGaP optoelectronics on stretchable substrates with applications in biomedicine and robotics," Nature Materials. 9:929-937.
Kim et al. (Aug. 14, 2012) "Thin, Flexible Sensors and Actuators as 'Instrumented' Surgical Sutures for Targeted Wound Monitoring and Therapy," Small 8:3263-3268.
Kim et al. (Aug. 2012) "Flexible and Stretchable Electronics for Biointegrated Devices," Annual Review of Biomedical Engineering. 14:113-128.
Kim et al. (Jul. 17, 2013) "Stretchable nanoparticle conductors with self-organized conductive pathways," Nature. 500:59-63.
Kim et al. (Jun. 29, 2012) "Materials and Designs for Wirelessly Powered Implantable Light-Emitting Systems," Small 8:2812-2818.
Kim et al. (May 17, 2013) "Midfield Wireless Powering of Subwavelength Autonomous Devices," Phys. Rev. Lett. 110:203905.
Kim et al. (Nov. 12, 2012) "Electronic sensor and actuator webs for large-area complex geometry cardiac mapping and therapy," Proc. Natl. Acad. Sci. USA. 109:19910-19915.
Kubo et al. (2010) "Stretchable Microfluidic Radiofrequency Antennas," Adv. Mater. 22:2749-2752.
Lacour et al. (2006) "Stiff subcircuit islands of diamondlike carbon for stretchable electronics," J. Appl. Phys. 100:014913.
Lee et al. (2011) "Flexible Inorganic Nanostructure Light-Emitting Diodes Fabricated on Graphene Films," Advanced Materials. 23:4614-4619.
Lee et al. (Aug. 15, 2013) "A Sub-nW Multi-stage Temperature Compensated Timer for Ultra-Low-Power Sensor Nodes," IEEE J. Solid-State Circuits. 48:2511-2521.
Lee et al. (Dec. 12, 2012) "A Modular 1 mm3 Die-Stacked Sensing Platform With Low Power I2 C Inter-Die Communication and Multi-Modal Energy Harvesting," IEEE J. Solid-State Circuits. 48:229-243.
Li et al. (2005) "Compliant thin film patterns of stiff materials as platforms for stretchable electronics," Journal of Materials Research. 20:3274-3277.
Li et al. (Apr. 2013) "A generalized mechanical model for suture interfaces of arbitrary geometry," Journal of the Mechanics and Physics of Solids. 61:1144-1167.
Li et al. (Mar. 1, 2012) "Bioinspired, mechanical, deterministic fractal model for hierarchical suture joints," Physical Review E. 85(3):031901.
Lipomi et al. (Feb. 25, 2011) "Stretchable Organic Solar Cells," Advanced Materials. 23:1771-1775.

(56) References Cited

OTHER PUBLICATIONS

Lipomi et al. (Oct. 23, 2011) "Skin-like pressure and strain sensors based on transparent elastic films of carbon nanotubes," Nature Nanotech. 6:788-792.
Lu et al. (2007) "Metal films on polymer substrates stretched beyond 50%," Applied Physics Letters. 91(3): 221909.
Lu et al. (Jul. 12, 2012) "Highly Sensitive Skin-Mountable Strain Gauges Based Entirely on Elastomers," Advanced Functional Materials. 22:4044-4050.
Mannoor et al. (Mar. 27, 2012) "Graphene-based wireless bacteria detection on tooth enamel," Nat. Commun. 3:763.
Masters (2004) "Fractal analysis of the vascular tree in the human retina," Annual Review of Biomedical Engineering. 6:427-452.
Medina et al. (1989) "Comparison of electrode site preparation techniques," Heart Lung. 18:456-460.
Meitl et al. (2006) "Transfer printing by kinetic control of adhesion to an elastomeric stamp," Nat. Mater. 5:33-38.
Nelson et al. (2011) "Epitaxial growth of three-dimensionally architectured optoelectronic devices," Nature Materials 10:676-681.
Office Action corresponding to Chinese Patent Application No. 2014800184126, dated Jul. 27, 2017—English translation provided.
Office Action corresponding to Chinese Patent Application No. 2014800184785, dated Sep. 4, 2017—with English translation.
Palleau et al. (Jan. 18, 2013) "Self-Healing Stretchable Wires for Reconfigurable Circuit Wiring and 3D Microfluidics," Adv. Mater. 25:1589-1592.
Puente et al. (1998) "Small but long Koch fractal monopole," Electronics Letters. 34:9-10.
Ramuz et al. (May 29, 2012) "Transparent, Optical, Pressure-Sensitive Artificial Skin for Large-Area Stretchable Electronics," Advanced Materials 24:3223-3227.
Robinson et al. (Jul. 1, 2011) "Microstructured Silicone Substrate for Printable and Stretchable Metallic Films," Langmuir. 27:4279-4284.
Rogers et al. (2010) "Materials and Mechanics for Stretchable Electronics," Science. 327:1603-1607.
Rogers et al. (Aug. 31, 2011) "Synthesis, assembly and applications of semiconductor nanomembranes," Nature 477:45-53.
Romeo et al. (Apr. 2, 2013) "Elastomeric substrates with embedded stiff platforms for stretchable electronics," Appl. Phys. Lett. 102:131904.
Saeidpourazar et al. (Jul. 5, 2012) "Laser-Driven Micro Transfer Placement of Prefabricated Microstructures," J. Microelectromech. Syst. 21:1049-1058.
Sato et al. (1998) "Tensile testing of silicon film having different crystallographic orientations carried out on a silicon chip," Sensors and Actuators A—Physical. 70:148-152.
Schwartz et al. (May 14, 2013) "Flexible polymer transistors with high pressure sensitivity for application in electronic skin and health monitoring," Nature Communications 4:1859.
Search Report corresponding to European Patent Application No. 14748754.0, dated Apr. 6, 2017.
Sekitani et al. (2009) "Stretchable active-matrix organic light-emitting diode display using printable elastic conductors," Nature Materials. 8:494-499.
Song et al. (2008) "Buckling of a stiff thin film on a compliant substrate in large deformation," International Journal of Solids and Structures. 45:3107-3121.
Song et al. (2009) "Mechanics of noncoplanar mesh design for stretchable electronic circuits," Journal of Applied Physics. 105:123516.
Song et al. (May 2, 2013) "Digital cameras with designs inspired by the arthropod eye," Nature. 497:95-99.
Su et al. (2012) "Postbuckling analysis and its application to stretchable electronics," J. Mech. Phys. Solids. 60:487-508.
Sun et al. (Aug. 6, 2012) "A Trust-Based Framework for Fault-Tolerant Data Aggregation in Wireless Multimedia Sensor Networks," IEEE Trans. Dependable Secur. Comput. 9:785-797.
Supplementary Partial European Search Report corresponding to European Patent Application No. 14749472.8, dated Aug. 1, 2016, 6 pages.
Taylor (2011) "Vision of beauty," Physics World. 24:22-27.

Thomas et al. (Nov. 16, 2012) "A Battery-Free Multichannel Digital Neural/EMG Telemetry System for Flying Insects," IEEE Trans. Biomed. Circuit Syst. 6:424-436.
Tian et al. (Aug. 26, 2012) "Macroporous nanowire nanoelectronic scaffolds for synthetic tissues," Nat. Mater. 11:986-994.
Van der Sluis et al. (Dec. 22, 2010) "Stretching-induced interconnect delamination in stretchable electronic circuits," J. Phys. D—Appl. Phys. 44:034008.
Vandeparre et al. (Apr. 30, 2013) "Localization of Folds and Cracks in Thin Metal Films Coated on Flexible Elastomer Foams," Adv. Mater. 25:3117-3121.
Vanfleteren et al. (Mar. 14, 2012) "Printed circuit board technology inspired stretchable circuits," MRS Bull. 37:254-260.
Verlinden (2006) "Silver solar cells: A new thin-crystalline silicon photovoltaic technology," Solar Energy Materials and Solar Cells. 90:3422-3430.
Viventi et al. (2010) "A Conformal, Bio-Interfaced Class of Silicon Electronics for Mapping Cardiac Electrophysiology," Science Translational Medicine. 2:24ra22.
Vogt et al. (Oct. 2013) "Design and Characterization of a Soft Multi-Axis Force Sensor Using Embedded Microfluidic Channels," IEEE Sensors J. 13, 4056-4064 (2013).
Wagner et al. (Mar. 2012) "Materials for stretchable electronics," MRS Bull. 37:207-217.
Wang et al. (Jul. 21, 2013) "User-interactive electronic skin for instantaneous pressure visualization," Nature Mater. 12:899-904.
Webb et al. (Sep. 15, 2013) "Ultrathin conformal devices for precise and continuous thermal characterization of human skin," Nat. Mater. 12:938-944.
White et al. (Jul. 28, 2013) "Ultrathin, highly flexible and stretchable PLEDs," Nature Photon. 7:811-816.
Wu et al. (Apr. 25, 2013) "Taxel-Addressable Matrix of Vertical-Nanowire Piezotronic Transistors for Active and Adaptive Tactile Imaging," Science. 340:952-957.
Wu et al. (May 19, 2013) "A transparent electrode based on a metal nanotrough network," Nat. Nanotechnol. 8:421-425.
Xu et al. (Feb. 26, 2013) "Stretchable batteries with self-similar serpentine interconnects and integrated wireless recharging systems," Nature Communications. 4:1543.
Yang et al. (Jul. 5, 2013) "Gauge Factor and Stretchability of Silicon-on-Polymer Strain Gauges," Sensors. 13:8577-8594.
Yao et al. (2006) "Mechanics of robust and releasable adhesion in biology: Bottom-up designed hierarchical structures of gecko," Journal of the Mechanics and Physics of Solids. 54:1120-1146.
Yao et al. (2007) "Multi-scale cohesive laws in hierarchical materials," International Journal of Solids and Structures. 44:8177-8193.
Yeo et al. (Feb. 26, 2013) "Multifunctional Epidermal Electronics Printed Directly Onto the Skin," Advanced Materials. 25:2773-2778.
Ying et al. (Aug. 10, 2012) "Silicon nanomembranes for fingertip electronics," Nanotechnology. 23:344004.
Yu et al. (2009) "Monitoring Hippocampus Electrical Activity In Vitro on an Elastically Deformable Microelectrode Array," Journal of Neurotrauma. 26:1135-1145.
Zhang et al. (Dec. 16, 2011) "Strain-Controlled Switching of Hierarchically Wrinkled Surfaces between Superhydrophobicity and Superhydrophilicity," Langmuir. 28:2753-2760.
Zhang et al. (Dec. 2013) "Mechanics of ultra-stretchable self-similar serpentine interconnects," Acta Materialia. 61:7816-7827.
Zhang et al. (Feb. 1997) "On the wear debris of polyetheretherketone: Fractal dimensions in relation to wear mechanisms," Tribology International 30:87-102.
Zhang et al. (Jun. 27, 2013) "Buckling in serpentine microstructures and applications in elastomer-supported ultra-stretchable electronics with high areal coverage," Soft Matter. 9:8062-8070.
Zhang et al. (Nov. 26, 2013) "Experimental and Theoretical Studies of Serpentine Microstructures Bonded to Prestrained Elastomers for Stretchable Electronics," Advanced Functional Materials. 24(14):2028-2037.
Zhang et al. (Sep. 1, 2010) "On optimal hierarchy of load-bearing biological materials," Proceedings of the Royal Society B—Biological Sciences. 278:519-525.

(56) References Cited

OTHER PUBLICATIONS

Japanese Patent Application No. JP 2015-557036, Office Action dated Feb. 6, 2018, 4 pp.
Japanese Patent Application No. JP 2015-557038, Office Action dated Dec. 19, 2017, 5 pp.
Non-Final Rejection in U.S. Appl. No. 15/477,865 dated Jan. 24, 2018, 17 pp.
Sterken et al. (Aug. 30-Sep. 3, 2011) "Ultra-thin chip package (UTCP) and stretchable circuit technologies for wearable ECG system," In; The Conference Proceedings of the Annual International Conference of the IEEE Engineering in Medicine and Biology Society, EMBC, 2011. pp. 6886-6889.
Office Action corresponding to Japanese Patent Application No. 2015-557038, dispatched Dec. 19, 2017—provided with English translation.

\* cited by examiner

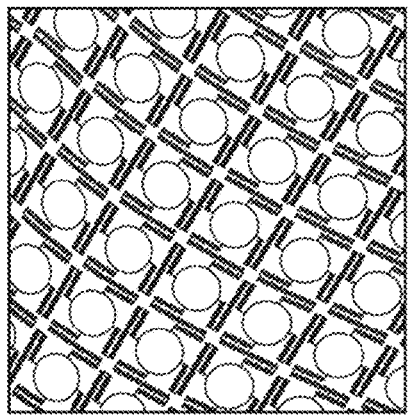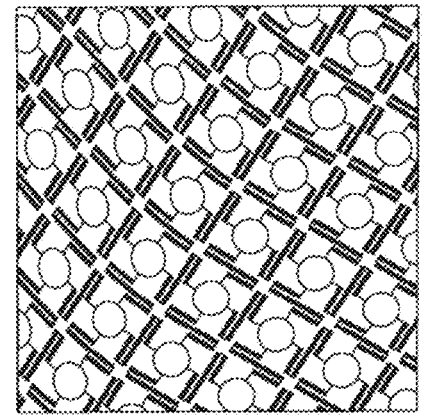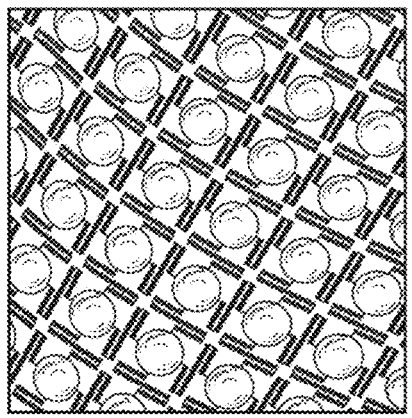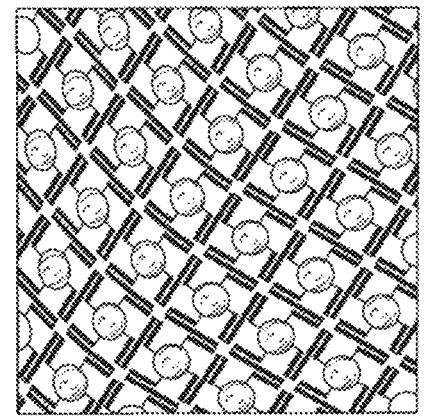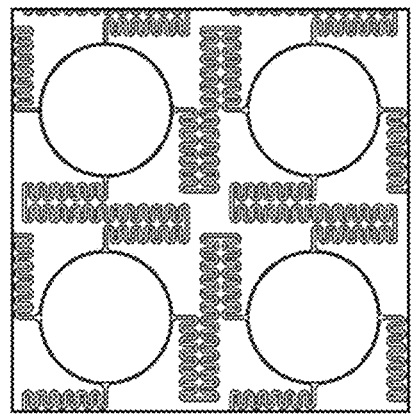
FIG. 1D
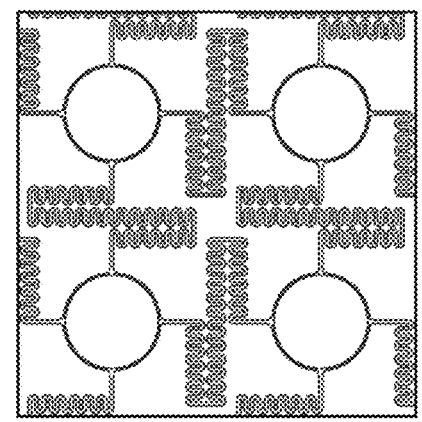
FIG. 1E

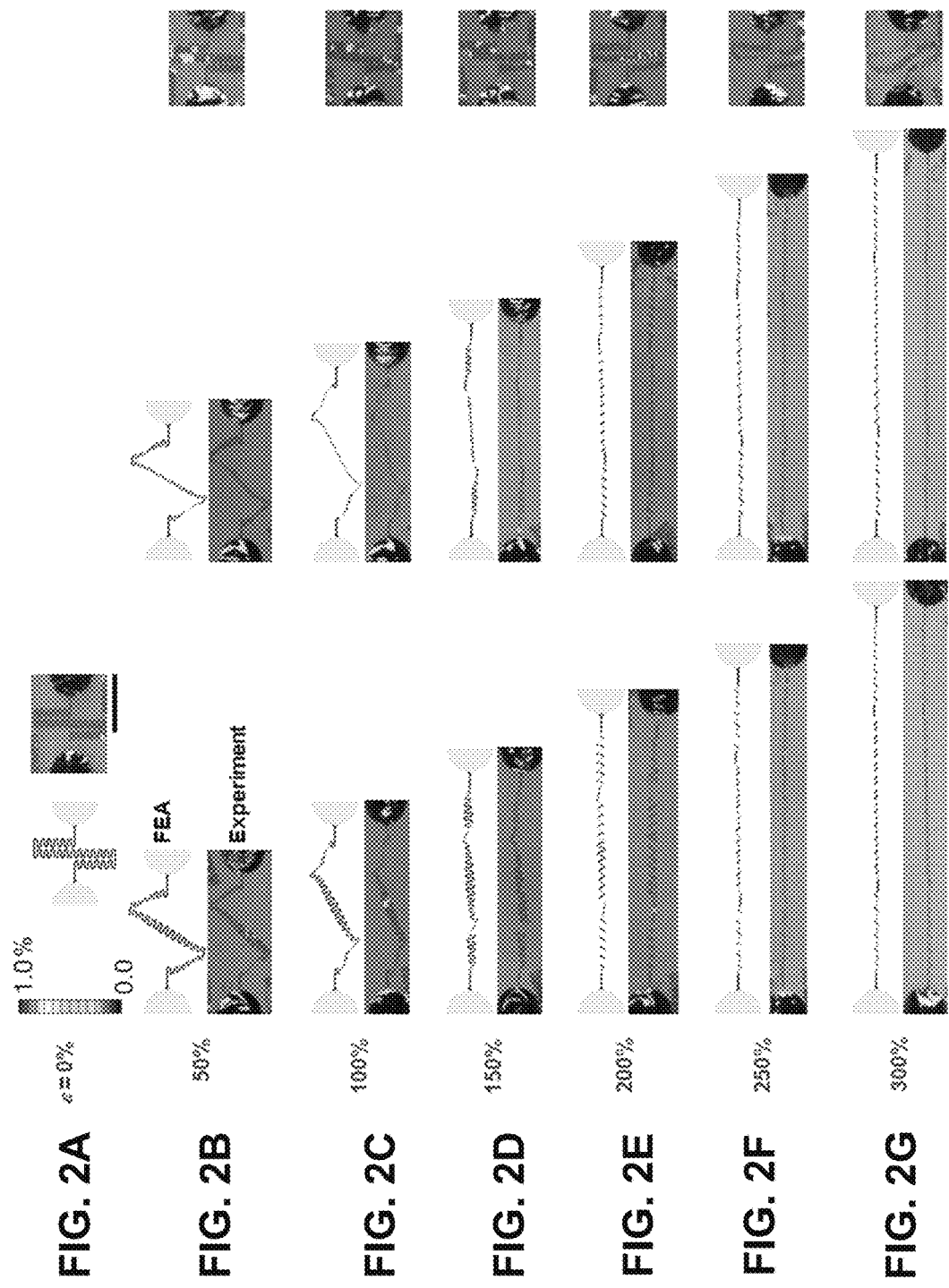

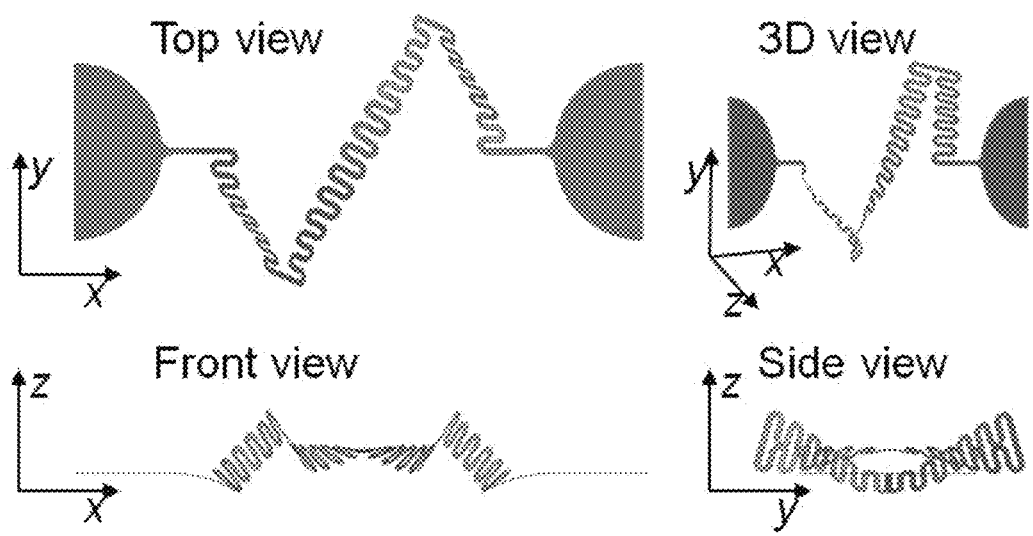
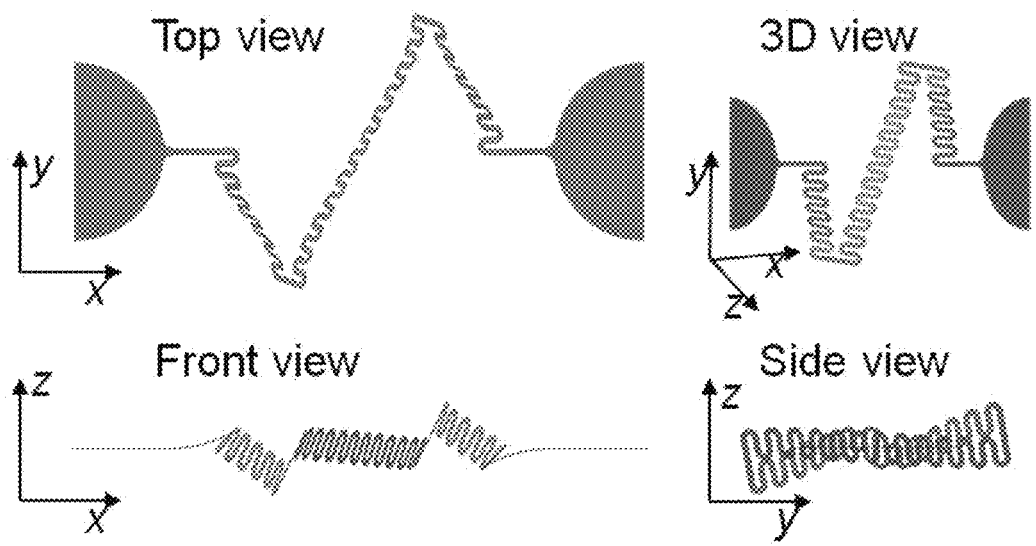
FIG. 8

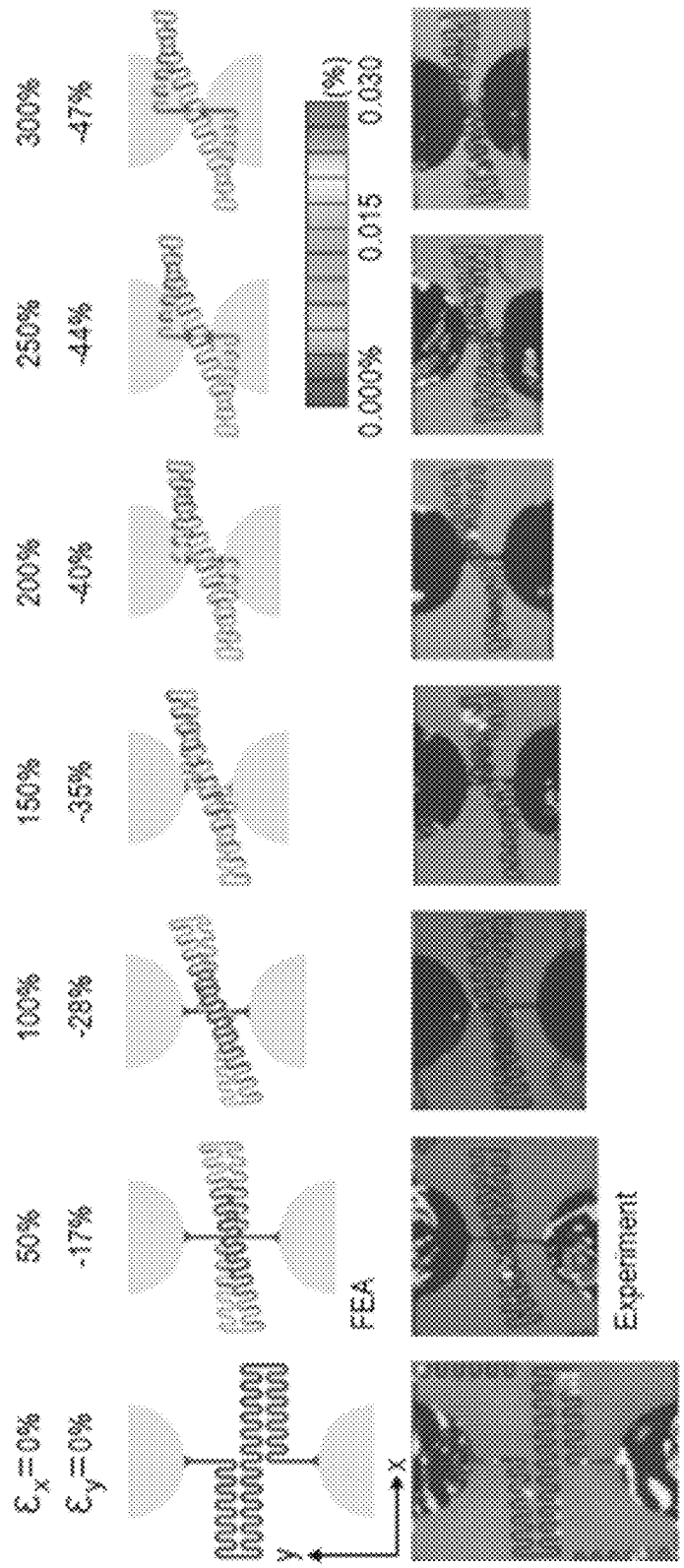

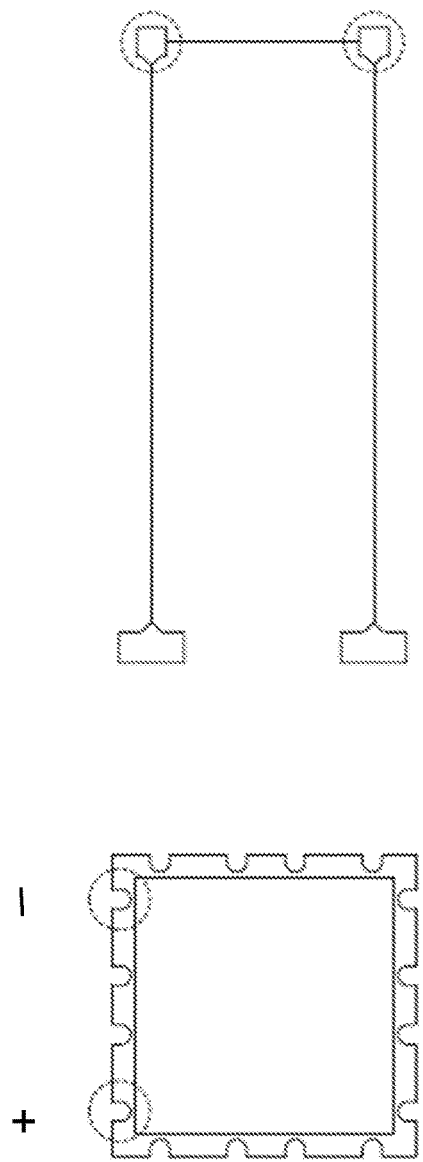
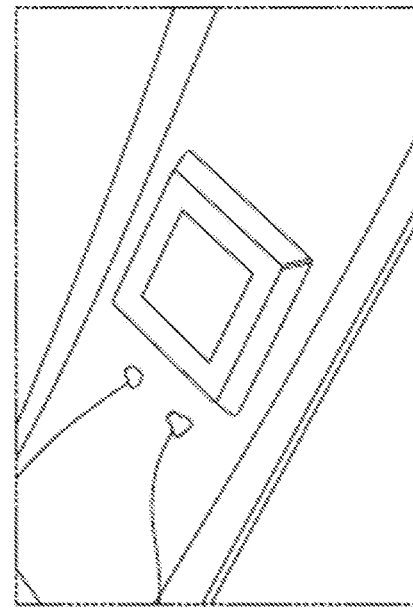
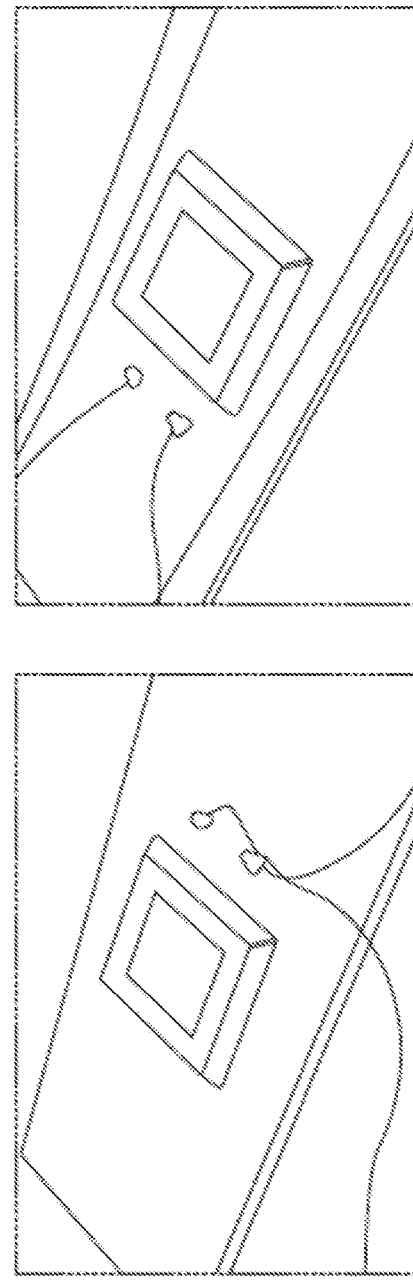
FIG. 28A
FIG. 28B
FIG. 28C
FIG. 28D

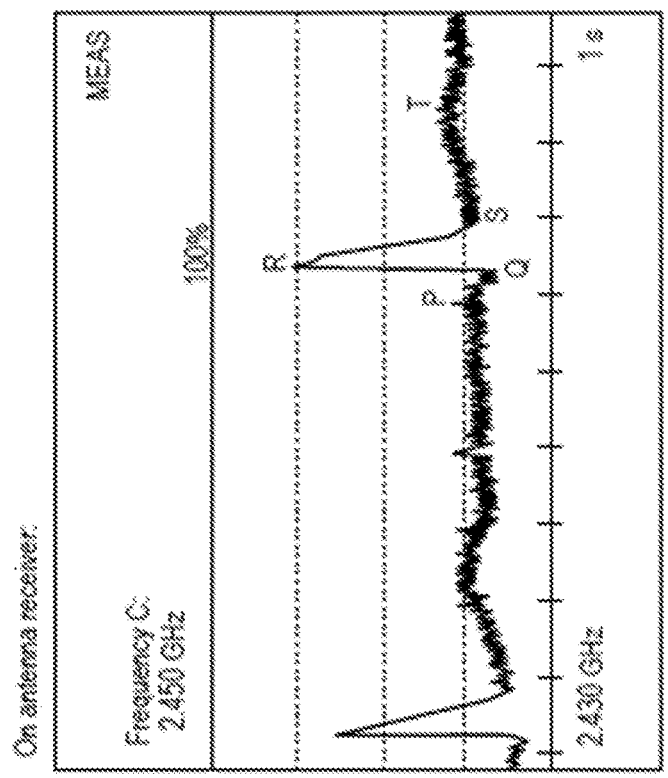
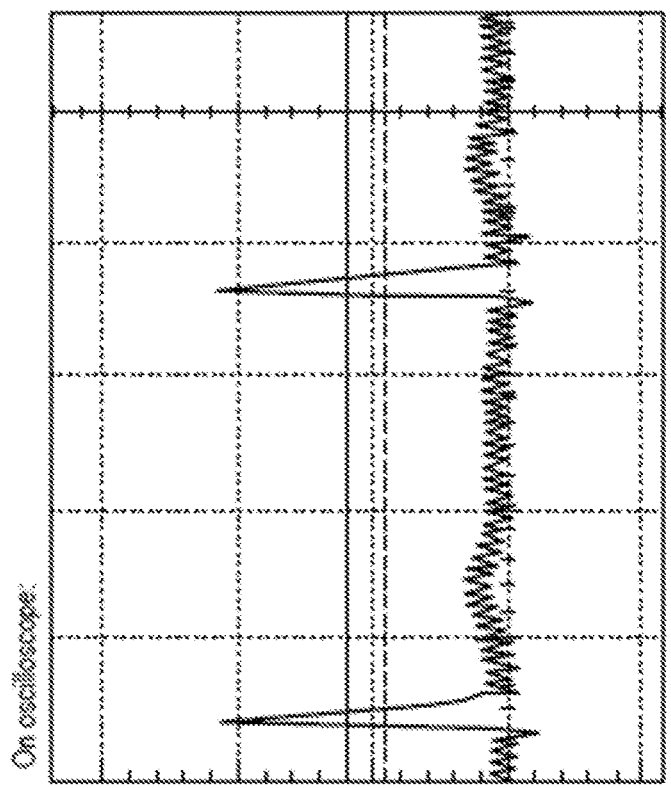
FIG. 31B
FIG. 31A

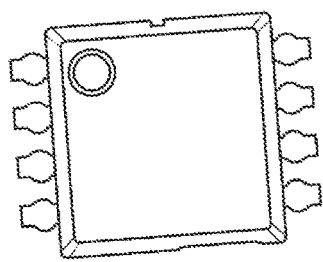
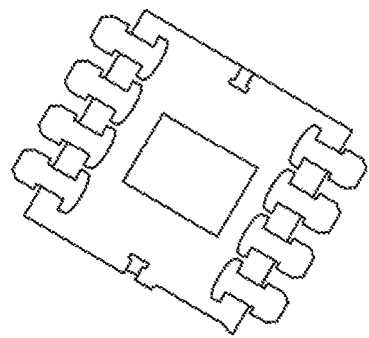
FIG. 42A          FIG. 42B
FIG. 43

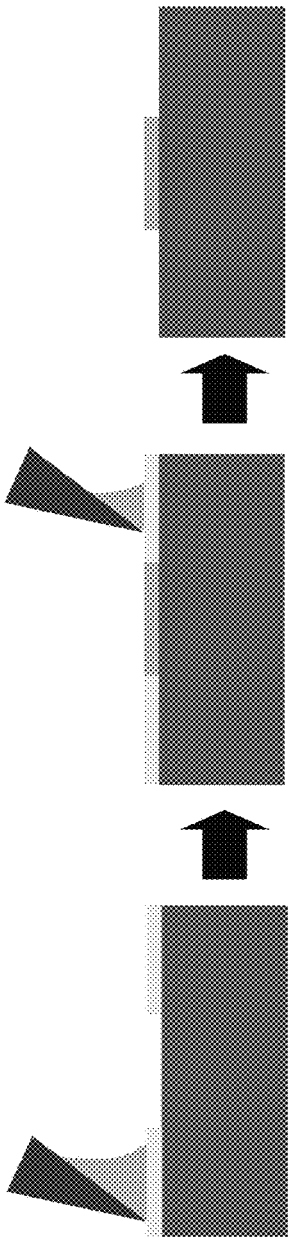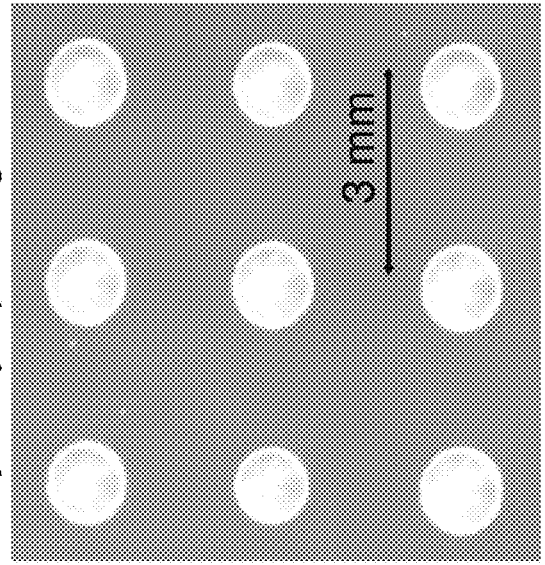
FIG. 53

Layout design considerations (5)
1. Self-similar vs conventional serpentine
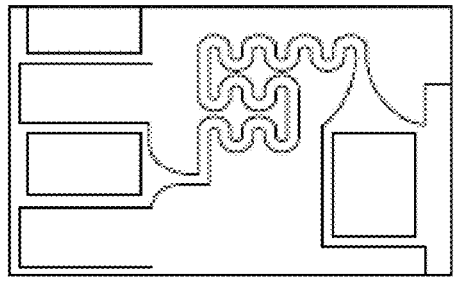 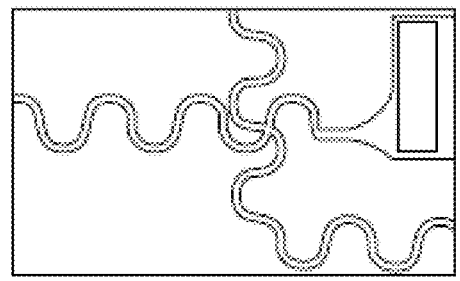
2. Replaced all of the sharp corners with rounded corners.
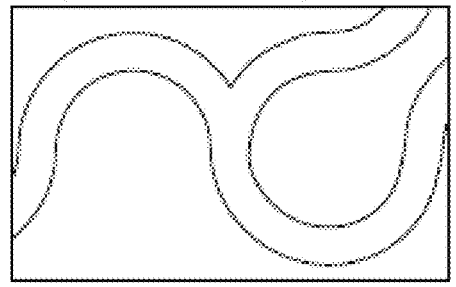 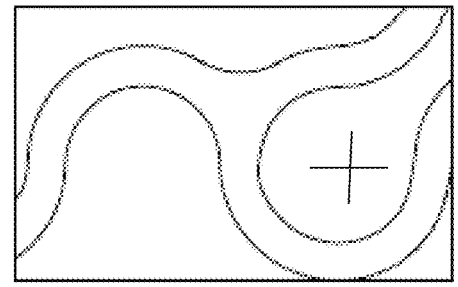
3. Selective bonding of the serpentine wires to avoid tangling.
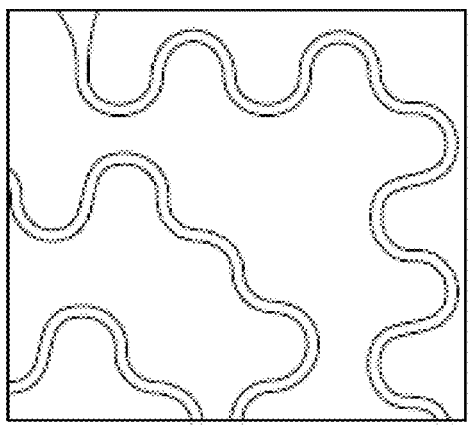
FIG. 57

Pedestals and bonded interconnects

Interconnects selectively bonded on pedestals:

Pedestals (~100 μm high):

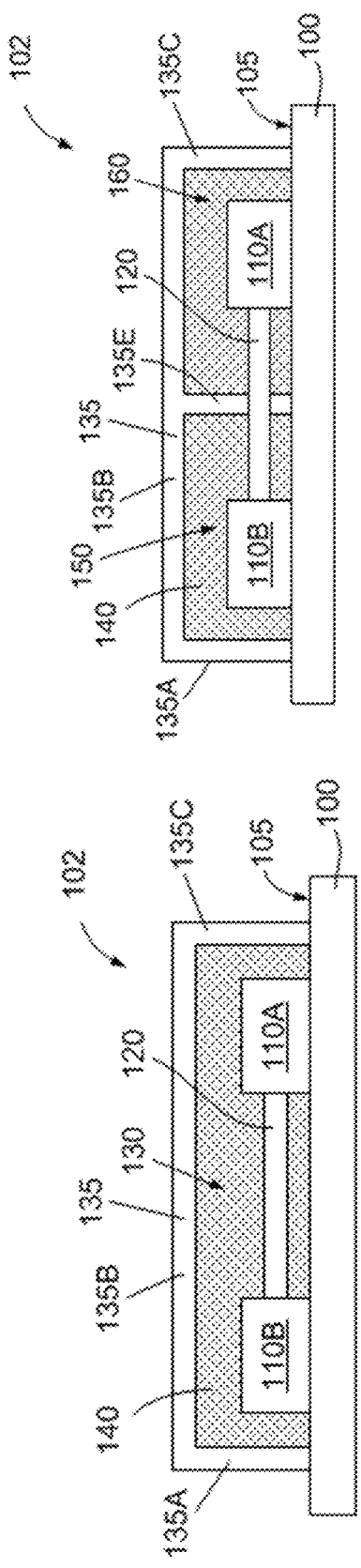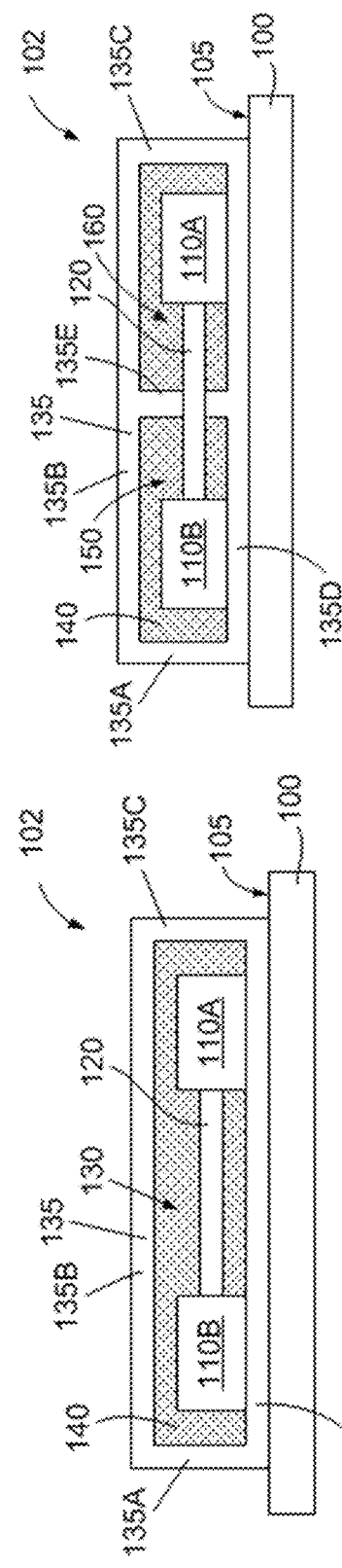

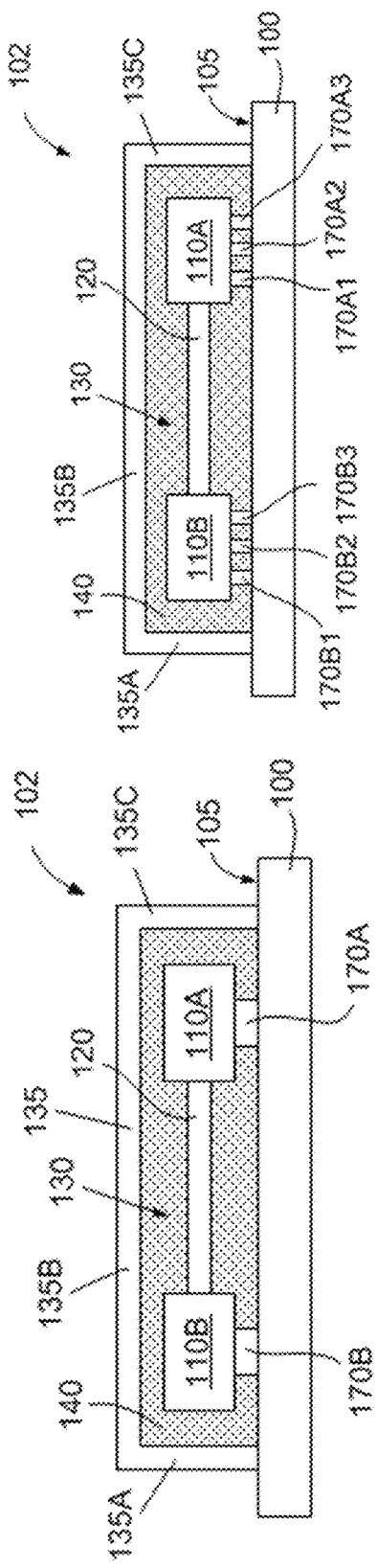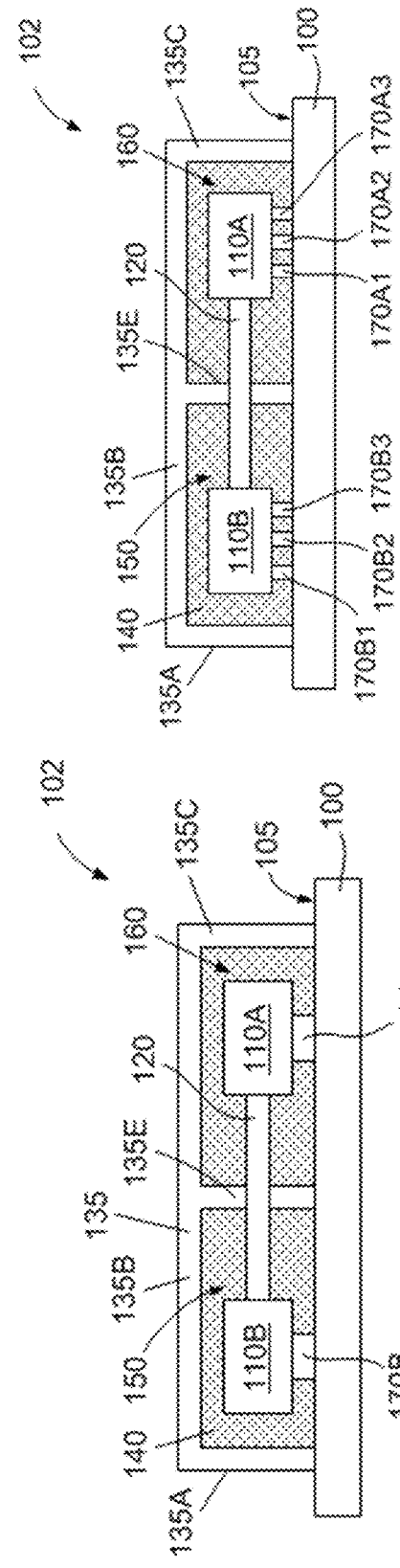
FIG. 70E
FIG. 70F
FIG. 70G
FIG. 70H

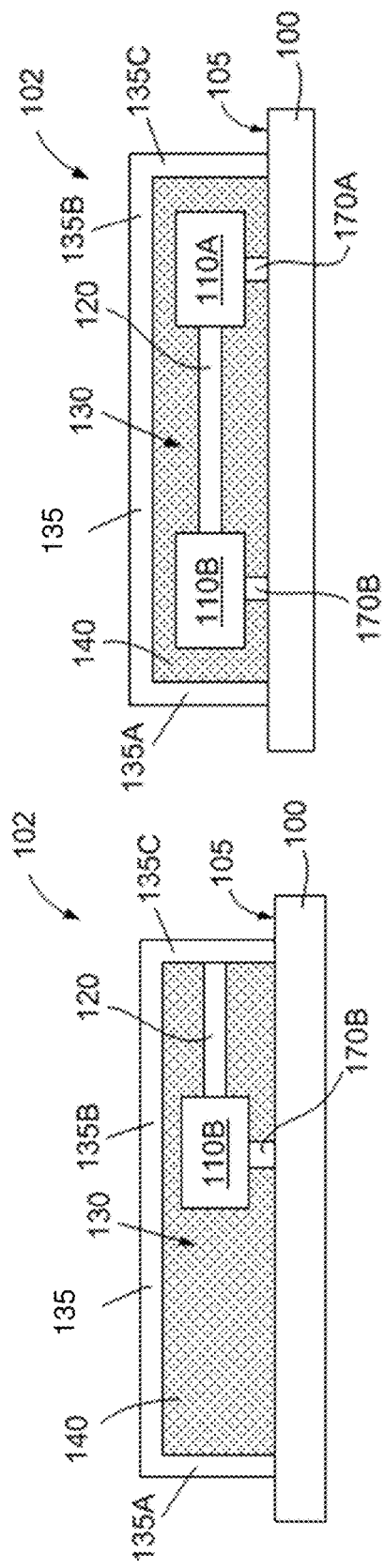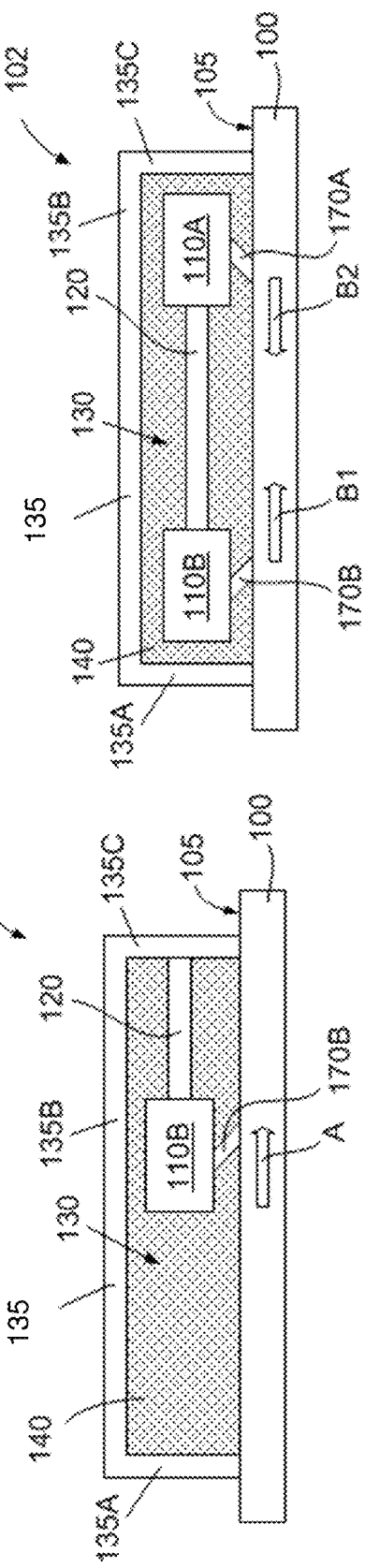

STRETCHABLE ELECTRONIC SYSTEMS WITH FLUID CONTAINMENT

CROSS-REFERENCE TO RELATED APPLICATIONS

This application claims the benefit of priority from U.S. Provisional Patent Application No. 61/761,412, filed Feb. 6, 2013, which is hereby incorporated by reference in its entirety.

STATEMENT REGARDING FEDERALLY SPONSORED RESEARCH OR DEVELOPMENT

This invention was made at least in part with U.S. government support under OISE-1043143 and ECCS-0824129 awarded by the National Science Foundation and under DEFG02-91 ER45439, DEFG02-07ER46471 and DEFG02-07ER46453 awarded by the Department of Energy. The U.S. government has certain rights in the invention.

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors for flexible plastic electronic devices. Progress in the field of flexible electronics, however, is not only driven by the development of new solution processable materials but also by new device component geometries, efficient device and device component processing methods and high resolution patterning techniques applicable to flexible electronic systems. It is expected that such materials, device configurations and fabrication methods will play an essential role in the rapidly emerging new class of flexible integrated electronic devices, systems and circuits.

Interest in the field of flexible electronics arises out of several important advantages provided by this technology. For example, the inherent flexibility of substrate materials allows them to be integrated into many shapes providing for a large number of useful device configurations not possible with brittle conventional silicon based electronic devices. In addition, the combination of solution processable component materials and flexible substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well-developed methods of making conventional silicon based electronic devices are incompatible with most flexible materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Further, although many amorphous silicon, organic or hybrid organic-inorganic semiconductors are compatible with incorporation into flexible substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Flexible electronic circuitry is an active area of research in a number of fields including flexible displays, electro-active surfaces of arbitrary shapes such as electronic textiles and electronic skin. These circuits often are unable to sufficiently conform to their surroundings because of an inability of the conducting components to stretch in response to conformation changes. Accordingly, those flexible circuits are prone to damage and electronic degradation and can be unreliable under rigorous and/or repeated conformation change. Flexible circuits require stretchable and bendable interconnects that remain intact while cycling through stretching and relaxation.

Conductors that are capable of both bending and elasticity are generally made by embedding metal particles in an elastomer such as silicone. Those conductive rubbers are both mechanically elastic and electrically conductive. The drawbacks of a conductive rubber include high electrical resistivity and significant resistance changes under stretching, thereby resulting in overall poor interconnect performance and reliability.

Gray et al. discuss constructing elastomeric electronics using microfabricated tortuous wires encased in a silicone elastomer capable of linear strains up to 54% while maintaining conductivity. In that study, the wires are formed as a helical spring-shape. In contrast to straight-line wires that fractured at low strains (e.g., 2.4%), tortuous wires remained conductive at significantly higher strains (e.g., 27.2%). Such a wire geometry relies on the ability of wires to elongate by bending rather than stretching. That system suffers limitations in the ability to controllably and precisely pattern in different shapes and in additional planes, thereby limiting the ability to tailor systems to different strain and bending regimes.

Studies suggest that elastically stretchable metal interconnects experience an increase in resistance with mechanical strain. (Mandlik et al. 2006). Mandlik et al. attempt to minimize this resistance change by depositing metal film on pyramidal nanopatterned surfaces. That study, however, relies on the relief feature to generate microcracks that impart stretchability to thin metal lines. The microcracks facilitate metal elastic deformation by out of plane twisting and deformation. Those metal cracks, however, are not compatible with thick metal films, and instead are compatible with a rather narrow range of thin metal films (e.g., on the order of less than 30 nm) that are deposited on top of patterned elastomers.

One manner of imparting stretchability to metal interconnects is by prestraining (e.g., 15%-25%) the substrate during conductor (e.g., metal) application, followed by spontaneous relief of the prestrain, thereby inducing a waviness to the metal conductor interconnects. (see, e.g., Lacour et al. (2003); (2005); (2004), Jones et al. (2004); Huck et al. (2000); Bowden et al. (1998)). Lacour et al. (2003) report by initially compressing gold stripes to generate spontaneously wrinkled gold stripes, electrical continuity is maintained under strains of up to 22% (compared to fracture strains of gold films on elastic substrates of a few percent). That study, however, used comparatively thin layers of metal films (e.g., about 105 nm) and is relatively limited in that the system could potentially make electrical conductors that could be stretched by about 10%.

U.S. Pat. Nos. 7,557,367, 7,521,292, and 8,217,381 and US Patent Publication Nos. 2010/0002402, 2012/0157804, and 2011/0230747 describe flexible and/or stretchable electronic systems accessed by microfabrication pathways including printing-based techniques. The stretchable systems of these references include devices having distributed electronic device components interconnected via deformable electronic interconnects, optionally capable of elastic responses to large strain deformation. The systems of these references include electronic devices for applications including tissue mounted biomedical devices, solar energy and large area macroelectronic systems.

From the forgoing, it is apparent there is a need for electronic devices such as interconnects and other electronic components having improved stretchability, electrical properties and related processes for rapid and reliable manufacture of stretchable interconnects in a variety of different configurations. Progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in folded, stretched and/or contracted conformations.

SUMMARY OF THE INVENTION

The present invention provides electronic systems, including device arrays, comprising functional device(s) and/or device component(s) at least partially enclosed via one or more fluid containment chambers, such that the device(s) and/or device component(s) are at least partially, and optionally entirely, immersed in a containment fluid. Useful containment fluids for use in fluid containment chambers of electronic devices of the invention include lubricants, electrolytes and/or electronically resistive fluids. In some embodiments, for example, electronic systems of the invention comprise one or more electronic devices and/or device components provided in a free-standing and/or tethered configuration that decouples, or otherwise mechanically isolates, forces originating upon deformation, stretching or compression of a supporting substrate from the free standing or tethered device or device component, for example, so as to decrease the strain on the one or more electronic devices and/or device components caused by deformation, stretching or compression of the supporting substrate by a factor of 4 to 1000 times, and optionally greater than 10 times, relative to a comparable device having an equivalent device or device component provided in a configuration where it is directly bonded to the supporting substrate.

In an embodiment, for example, the invention provides systems combining elastomeric materials, fluid packaging and devices or device components having a free standing or tethered geometry enabling useful mechanical, electronic and/or optical properties, for example, when provided in compressed, elongated, stretched and/or deformed configurations. Devices of the invention are useful for a wide range of applications including power generation, communications, sensing, photovoltaics, displays, generation of electromagnetic radiation, medical devices, conformable electronics, large area electronics, wearable electronics, electronic paper, and the like.

In an aspect, for example, the invention provides an electronic system comprising: (i) a substrate; (ii) an electronic device or device component supported by the substrate; wherein the electronic device or device component is free standing or tethered to the substrate; and (iii) a fluid containment chamber at least partially enclosing the electronic device or device component; wherein the fluid containment chamber is at least partially filled with a containment fluid. In an embodiment, for example, the free standing or tethered configuration of the electronic device or device component decouples motion and/or deformation of the substrate from the electronic device or device component. In an embodiment, for example, the free standing or tethered configuration of the electronic device or device component decouples forces generated by elongation, compression or deformation of the substrate from the electronic device or device component.

An array of electronically interconnected devices is also described, where the device component layout on the substrate may be ordered, registered, random or arbitrary. A plurality of devices or device components may be enclosed within a single fluid containment chamber and/or one or more devices or device components may be segregated into a compartmentalized or nested fluid containment chamber. For example, a device or device component in a compartmentalized or nested fluid containment chamber may be isolated from bulk devices or device components to perform a solitary function, e.g. to communicate with exterior devices and/or to communicate or otherwise interface with an external environment. A geometry of a device component layout of certain aspects of the invention allows different components to communicate or interface with one another and/or allows device components to interface with an external environment, e.g. a tissue interface.

In an embodiment, the device of the invention is characterized by an integrated electronic device and/or electronic circuit comprising a plurality of integrated device components, wherein the integrated electronic device and/or electronic circuit is provided as a free standing or tethered structure enclosed within a single fluid containment chamber. Devices of this aspect may communicate with other devices (e.g. in a device array) or with an external environment via a range of systems including wired communication and/or power systems, optical communication systems, radio frequency systems, and/or electrical interconnects which connect the device or circuit provided within the fluid containment chamber to devices or device components external to the fluid containment chamber. In an embodiment, for example, a single freestanding or tethered integrated circuit or chip is provided in a single fluid containment chamber.

In an embodiment, an electronic device or device component is provided on a receiving surface of a substrate or on an intermediate structure provided between the substrate and the electronic device or device component. As will be understood a wide range of intermediate structures may be used to support devices and device components of the invention including functional device component structures (e.g. electrodes, electrical insulators, dielectric structures, semiconductor structures, etc.) and structural device component structures (e.g., thin film structures, relief features, particles, pedestals, membranes, etc.).

In an embodiment, a fluid containment chamber comprises one or more enclosing structures positioned to at least partially surround an exterior portion of an electronic device or device component, optionally entirely enclosing the device or device component. The one or more enclosing structures of the fluid containment chamber may be operationally coupled to a supporting surface or an intermediate structure provided between the supporting surface and the one or more enclosing structures, for example via lamination, chemical bonding and/or use of adhesives. In an embodiment, the one or more enclosing structures of the fluid containment chamber are not in physical contact with the electronic device or device component, and optionally for some embodiments all of the enclosing structures of the fluid containment chamber are not in physical contact with the electronic device or device component. For example, the enclosing structures may comprise one or more chamber walls or barrier structures each positioned at least 1000 microns from a side of the electronic device or device component, optionally for some embodiments at least 100 microns from a side of the electronic device or device component and optionally for some embodiments at least 10 microns from a side of the electronic device or device component. In an embodiment, for example, a barrier structure or chamber wall is provided that constrains movement of the device or device component, for example, by physically impeding or otherwise blocking movement of the device or component. In an embodiment, for example, a barrier structure or chamber wall is provided that constrains movement of the device or device component in a direction parallel to a surface of the substrate, e.g., a supporting surface of the substrate directly or indirectly supporting the device or device component, to less than or equal to 1000 microns, optionally for some embodiments less than or equal to 100 microns and optionally for some embodiments less than or equal to 10 microns. In an embodiment, for example, a barrier structure or chamber wall is provided that constrains movement of the device or device component in a direction orthogonal to a surface of the substrate, e.g., a supporting surface of the substrate directly or indirectly supporting the device or device component, to less than or equal to 1000 microns, optionally for some embodiments less than or equal to 100 microns and optionally for some embodiments less than or equal to 10 microns. In an embodiment, for example, one or more of the enclosing structures of the fluid containment chamber are in physical contact with the device or device component. In an embodiment, for example, one or more of the enclosing structures of the fluid containment chamber are not in physical contact with the device or device component, for example, when provided in an undeformed state.

In an embodiment, the fluid containment chamber further comprises one or more recessed features provided in the substrate to accommodate the device or device component, for example, partially surrounding the electronic device or device component, where the one or more enclosing structures are provided to at least partially enclose the recessed features. For example, the recessed features of the fluid containment chamber may comprise one or more chamber walls or barrier structures each positioned at least 1000 microns from a side of the electronic device or device component, optionally for some embodiments at least 100 microns from a side of the electronic device or device component and optionally for some embodiments at least 10 microns from a side of the electronic device or device component. Typically, at least a portion of the enclosing structures of the fluid containment chamber is physically or chemically bonded (e.g., laminated, glued etc.) to the substrate or an intermediate structure provided between the substrate and the enclosing structure. For example, a flip chip bonder may be used to bond commercial off the shelf (COTS) chips and/or bare dies with anisotropic conductive film or solder bumper at the chip/metal interconnect interface. In some embodiments, COTS chips or bare die have a modulus from 10 GPa to 100 GPa, and a tensile rigidity from 0.01 GPa·mm$^2$ to 1000 GPa·mm$^2$.

In an embodiment, a barrier structure limits or otherwise restricts movement of a free standing or tethered device or device component, for example limiting movement in a direction parallel and/or orthogonal to a supporting surface or receiving surface of a substrate. Exemplary barrier structures include but are not limited to corrals, relief features, embossed features, indentations or depressions, inner chamber walls of the containment chamber, the containment chamber itself, bumpers and the like. In an embodiment, barrier structures are positioned at least 1000 microns from a side of the electronic device or device component, optionally for some embodiments at least 100 microns from a side of the electronic device or device component and optionally for some embodiments at least 10 microns from a side of the electronic device or device component. In an embodiment, barrier structures are positioned between 10 microns and 100 millimeters from a side of an electronic device or device component, or optionally between 100 microns and 5 millimeters from a side of an electronic device or device component, or optionally between 100 microns and 1 millimeter from a side of an electronic device or device component. In some embodiments, barrier structures have a height, h, that is less than (e.g., 90% or less, optionally 60% or less) the full height of the fluid containment chamber, such that a gap exists between the barrier structure and the top wall of the fluid containment chamber. Alternatively, the invention includes barrier structures that extend the entire height of a fluid containment chamber. The height of a barrier structure is, however, at least sufficient to prevent a free standing device or device component from moving or otherwise extending over the barrier structure through a gap between the barrier structure and a top region of the fluid containment chamber.

In an embodiment, for example, the containment fluid mitigates forces of friction acting on the electronic device or device component, for example by functioning as a lubricant, for example to decrease the force of friction between moving surfaces of the device or device component. In some embodiments, for example, the containment fluid decreases frictions so as to prevent degradation or failure of the device of device component, for example, by decreasing friction generated by rubbing or other physical interactions of surfaces of the device or device components. In an embodiment, for example, the containment fluid functions as a lubricant to decrease friction generated by physical interaction of an electrical interconnect with itself and/or other electrical interconnects or other components of a device. In an embodiment, the containment fluid decreases the extent of friction between one or more devices or device components by more than a factor of 2, optionally for some embodiments by more than a factor of 10 and optionally for some embodiments by more than a factor of 100, relative to a configuration not having the containment fluid present.

In an embodiment, the electronic device or device component is a free standing or tethered fully formed chip or integrated circuit or a compound thereof. By utilizing the tethering, selective bonding and/or floating of the fluid containment strategy described herein, mechanical loads of the chips/integrated circuit to the elastomeric substrate are minimized. In an embodiment, the electronic device or device component is a single crystalline semiconductor structure or electronic device, such as a single crystalline inorganic semiconductor structure or electronic device including high purity inorganic single crystalline materials and/or doped inorganic single crystalline materials. In an embodiment, the electronic device or device component is a single crystalline semiconductor structure or device component, which may be operationally connected to at least one additional device component or structure selected from the group consisting of a conducting structure, a dielectric structure, an electrode, a cathode, an anode, and an additional semiconductor structure. In an embodiment, for example, the device or device component comprises single crystalline silicon, germanium, III-V semiconductor (e.g., GaAs) or diamond. In an embodiment, for example, the device or device component comprises a piezoelectric material, such as a piezoelectric semiconductor material.

A single crystalline semiconductor electronic device or device component may, for example, comprise one or more electronic devices selected from the group consisting of a transistor, an electrochemical cell, a fuel cell, an integrated circuit, a solar cell, a laser, a light emitting diode, a nano-electromechanical device, a microelectromechanical device, a photodiode, a P-N junction, a sensor, a memory device, an integrated circuit, a complementary logic circuit and arrays or combinations of these.

In an embodiment, the electronic device or device component has a thickness selected from the range of 10 nanometers to about 1000 microns, a width selected from the range of 100 nanometers to about 10 millimeter and a length selected from the range of 500 nanometers to about 10 millimeter. In an embodiment, the electronic device or device component has a thickness selected from the range of 10 nanometers to about 100 microns, a width selected from the range of 100 nanometers to about 1 millimeter and a length selected from the range of 1 micron to about 1 millimeter. In an embodiment, the electronic device or device component has a thickness selected from the range of 500 nanometers to about 1000 microns, a width selected from the range of 1 micron to about 1 millimeter and a length selected from the range of 1 micron to about 1 millimeter.

In an embodiment, and electronic system may further comprise one or more additional electronic devices or device components at least partially enclosed by a fluid containment chamber or at least partially enclosed by one or more additional fluid containment chambers. The invention includes devices comprising an array of electronic devices or device components, optionally electrically interconnected with each other, provided in the same or a plurality of fluid containment chambers. In an embodiment, for example, a device of the invention includes 5 or more devices or device components provided in a fluid containment chamber, optionally 20 or more devices or device components provided in a fluid containment chamber, and optionally 100 or more devices or device components provided in a fluid containment chamber.

In an embodiment, the electronic device or device component is an electrical interconnect, such as a stretchable electrical interconnect. For example, one or more stretchable electrical interconnects may be in electrical contact with an electronic device or device component, and at least a portion of the one or more stretchable electrical interconnects may be at least partially embedded in an enclosing structure of a fluid containment chamber.

In an embodiment, an enclosing structure of a fluid containment chamber, such as a chamber wall or barrier structure, has a Young's modulus selected from the range of 1 kPa to 1 GPa, or selected from the range of 1 kPa to 100 MPa, or selected from the range of 100 kPa to 1 MPa, or selected from the range of 250 kPa to 750 kPa. In an embodiment, for example, an enclosing structure of a fluid containment chamber, such as a chamber wall or barrier structure, has a Young's modulus that is less than or equal to 10 MPa, optionally less than or equal to 1 MPa, and, optionally less than or equal to 500 kPa, optionally less than or equal to 200 kPa. In an embodiment, an enclosing structure of a fluid containment chamber, such as a chamber wall or barrier structure, has a flexural rigidity selected from the range of $10^{-13}$ N·m to $10^5$ N·m, or selected from the range of $10^{-10}$ N·m to $10^3$ N·m, or selected from the range of $10^{-5}$ N·m to 10 N·m. In an embodiment, an enclosing structure of a fluid containment chamber has a permeability selected from the range of 1 fg·mm/m²·day to 1 g·mm/m²·day, or selected from the range of 1 ng·mm/m²·day to 0.5 g·mm/m²·day, or selected from the range of 1 mg·mm/m²·day to 0.1 g·mm/m²·day. In an embodiment, an enclosing structure of a fluid containment chamber has a coefficient of thermal expansion selected from the range of $10^{-7\circ}$ C.$^{-1}$ to $10^{-2\circ}$ C.$^{-1}$, or selected from the range of $10^{-5\circ}$ C.$^{-1}$ to $10^{-1\circ}$ C.$^{-1}$, or selected from the range of $10^{-3\circ}$ C.$^{-1}$ to $10^{\circ}$ C.$^{-1}$.

In an embodiment, the fluid containment chamber comprises a material that is not permeable to the containment fluid. For example, a wide range of polymers are useful for fluid containment chambers of the invention. For example, the fluid containment chamber may comprise a soft material capable of being physically stretched, such as an elastomer. A wide range of polymers are useful for fluid containment chambers of the invention. In an embodiment, for example, the fluid containment chamber comprises a material selected form the group consisting of polydimethylsiloxane (PDMS), ECOFLEX® silicone rubber, a silicone, a rubber, and a polymer.

In an embodiment, the fluid containment chamber has a height selected from the range of 10 μm to 10 cm, or selected from the range of 100 μm to 5 cm, or selected from the range of 1 mm to 0.5 cm, or selected from the range of 5 mm to 50 mm. In an embodiment, for example, the fluid containment chamber has a height that is greater than or equal to 10 μm, and optionally for some embodiments greater than or equal to 100 μm, and optionally for some embodiments greater than or equal to 1000 μm. In an embodiment, the fluid containment chamber has lateral dimensions (e.g., length and width) selected from the range of 10 μm to 10 m, or selected from the range of 100 μm to 1 m, or selected from the range of 1 mm to 0.1 m, or selected from the range of 50 mm to 50 cm. In an embodiment, for example, the fluid containment chamber has a lateral dimensions that are greater than or equal to 10 μm, and optionally for some embodiments greater than or equal to 100 μm, and optionally for some embodiments greater than or equal to 1000 μm. In an embodiment, the fluid containment chamber has a volume selected from the range of 1000 μm³ to 10 m³, or selected from the range of 1 μm³ to 1 m³, or selected from the range of 100 mm³ to 100 cm³, or selected from the range of 10 mm³ to 1 cm³. In an embodiment, for example, the fluid containment chamber has a volume that is greater than or equal to 1000 μm³, and optionally for some embodiments greater than or equal to 1 µm³ µm, and optionally for some embodiments greater than or equal to 100 mm³.

In an embodiment, the fluid containment chamber is formed of two thin sheets of elastomer sealed along an outer border to form a pouch. The fluid container may have a form factor or geometry selected from a 3D square, a 3D rectangle, a sphere, a prism, or an arbitrary form, depending on the layout of the electronic device or device component contained in the chamber.

In an embodiment, at least 50% of the volume of the fluid containment chamber is occupied by a containment fluid, and optionally at least 90% of the volume of the fluid containment chamber is occupied by a containment fluid, and optionally at least 98% of the volume of the fluid containment chamber is occupied by a containment fluid. In an embodiment, the containment fluid occupies a percentage of the fluid containment chamber selected from the range of 1% to 99.9%, or selected from the range of 1% to 99%, or selected from the range of 25% to 90%, or selected from the range of 50% to 90%, or selected from the range of 50% to 75%. In an embodiment, at least 0.1% of the volume of the fluid containment chamber is occupied by an electronic device or device component. In an embodiment, the electronic device or device component occupies a percentage of the fluid containment chamber selected from the range of 1% to 99%, or selected from the range of 2% to 50%, or selected from the range of 5% to 30%, or selected from the range of 5% to 15%. The containment fluid may, for example, be in physical contact with the electronic device or device component, for example, in physical contact with one or all external surfaces of the device or device component.

In an embodiment, the electronic device or device component is entirely immersed in the containment fluid. Suitable containment fluids include but are not limited to functional fluids, such as liquids, colloids, gels, gases, lubricants, electrolytes, thermally functional fluids, fluids having a low viscosity, chemically inert fluids, fluids having a low ionic resistance, and fluids having a high ionic resistance (e.g., electrically insulating fluids). For example, suitable lubricants include oils (natural or synthetic) and uncured silicone elastomer precursors, such as a polydimethylsiloxane precursor. For example, suitable lubricants include silicones, halocarbons or fluorocarbons. Suitable electrolytes include non-aqueous lithium ion battery electrolytes, such as lithium salts, e.g. $LiPF_6$, $LiBF_4$ or $LiClO_4$ in an organic solvent, such as ethylene carbonate, dimethyl carbonate, and diethyl carbonate. Suitable thermally functional fluids include heat transfer fluids, such as fluids having a finite heat transfer coefficient, in order to dissipate the heat generated from the electronic device components. In an embodiment, the containment fluid is a material selected from the group consisting of a prepolymer, a solvent, a nonaqueous electrolyte, a silicone, a natural oil, a synthetic oil, a polyolefin and a fluorocarbon. In an embodiment, one or more colloids may be added to the containment fluid to adjust the fluid's viscosity, optical properties, and/or electrical properties. In an embodiment, for example, the containment fluid is a thermally stable fluid.

In an embodiment, a containment fluid has a vapor pressure less than or equal to 760 Torr at 298 K. In an embodiment, a containment fluid has a viscosity selected from 0.1 cP to 10000 cP at 298 K, or selected from 10 cP to 500 cP at 298 K. In an embodiment, a containment fluid has an ionic resistance selected from $10^7$ ohm·cm to infinity, or selected from $10^{10}$ ohm·cm to $10^{70}$ ohm·cm. In an embodiment, a containment fluid has an electronic resistance selected from $10^7$ ohm·cm to infinity, or selected from $10^{10}$ ohm·cm to $10^{70}$ ohm·cm. In an embodiment, a containment fluid has a vapor pressure selected from 100 Pa to 1 MPa, or selected from 500 Pa to 1 kPa. In an embodiment, a containment fluid has a vapor pressure selected from $10^{-7\circ}$ C.$^{-1}$ to $10^{-1\circ}$ C.$^{-1}$, or selected from $10^{-5\circ}$ C.$^{-1}$ to $10^{-3\circ}$ C.$^{-1}$. In an embodiment, a containment fluid has a surface tension or wetting property, depending on the materials used for constructing the liquid chamber, such that the fluid should has a contact angle below 90°, e.g., selected from 1 dyne/cm to 70 dynes/cm. In an embodiment, a containment fluid has a high ionic conductivity, for example, so as to function as an electrolyte in an electrochemical system, such as an ionic conductivity greater than or equal to 0.001 S cm$^{-1}$, optionally greater than or equal to 0.01 S cm$^{-1}$, optionally greater than or equal to 0.005 S cm–1.

In an embodiment, the electronic device or device component is a free standing structure supported by or in physical contact with the substrate. As used herein, free standing refers to a configuration wherein the device or device component is supported by, but not bonded to, a surface of the substrate or an intermediate substrate between the substrate and the device or device component. In an embodiment, for example, a free standing device or device component is capable of movement relative to a substrate surface, such as movement in a direction parallel and/or orthogonal to a substrate surface, such as a supporting or receiving surface of the substrate. A free standing structure may, however, undergo and/or participate in one or more associative interactions with the substrate or an intermediate structure provided between the substrate and the free standing structure, for example wherein the associative interaction is a dipole-dipole interaction or a Van der Waals interaction.

In an embodiment, an electronic device or device component, such as a semiconductor device component, electrode and/or electrical interconnect, is a tethered structure supported by one or more tethering structures, such as relief features of a substrate or one or more relief features supported by the substrate. In an embodiment, for example, a tethered device or device component is capable of movement relative to a substrate surface, such as movement in a direction parallel and/or orthogonal to a substrate surface, such as a supporting or receiving surface of the substrate. In an embodiment, for example, a tethering structure, such as one or more relief features, is bonded to the substrate or an intermediate structure provided between the tethering structure and the substrate. In an embodiment, for example, a tethering structure, such as one or more relief features, is bonded to a portion, but not all, of a surface of the device or device component, such as 30% or less than the area of a bottom surface of the device or device component, optionally 10% or less than the area of a bottom surface of the device or device component, optionally 5% or less than the area of a bottom surface of the device or device component and optionally 1% or less than the area of a bottom surface of the device or device component. In an embodiment, for example, a tethering structure, such as one or more relief features, is bonded to a portion, but not all, of a surface of the device or device component, such as between 1% and 30% of the area of a bottom surface of the device or device component, optionally between 1% and 10% of the area of a bottom surface of the device or device component and optionally between 1% and 5% of the area of a bottom surface of the device or device component. Such embodiments having selective bonding between the tethering structure, such as one or more relief features, and some but not all of a surface of device or device component is particularly useful for achieving at least partial mechanical decoupling of the device or device component from motion and/or deformation of the substrate. The tethered geometry of some embodiments is useful for mechanically isolating the device component from the substrate, for example, providing mechanical isolation from movement and/or deformation of the substrate. In some embodiments, the tethered geometry of some embodiments is useful for holding the position of the device component, such as a semiconductor device component, electrode and/or electrical interconnect. In some embodiments, the tethered geometry is useful for preventing tangling of the device component, such as tangling of a semiconductor device component, electrode and/or electrical interconnect, for example, during or after stretching and release cycles.

In an embodiment, for example, an electronic device or device component is a tethered structure supported by array of 5 to 1000 relief features, and optionally for some examples an array of 5 to 100 relief features, and optionally for some examples an array of 5 to 20 relief features. In an embodiment, for example, an electronic device or device component is a tethered structure supported by at least 5 relief features, optionally for some embodiments supported by at least 10 relief features and optionally for some embodiments supported by at least 100 relief features. A wide range of tethering structures are useful in the present invention including one or more columns, pedestals, pillars, platforms, fingers, and the like. Tethering structures of the invention may have a wide range of cross sectional shapes, such as circular, triangular, elliptical, rectangular, trapezoidal and any combination of these. In an embodiment, for example, a tethering structure of the invention extends a length along a direction orthogonal or substantially orthogonal (e.g. within 20 degrees of absolute orthogonal orientation) relative to the substrate surface.

For example, the one or more relief features may comprise a pedestal, or the one or more relief features may comprise an array of at least 10 pedestals, optionally for some embodiments an array of at least 20 pedestals, optionally for some embodiments an array of at least 100 pedestals, and optionally for some embodiments an array of at least 1000 pedestals. In an embodiment, the tethered structure is bonded to the one or more relief features comprising the tethering structure. In an embodiment, relief features of the tethering structure comprise an elastomer, PDMS, ECO-FLEX® silicone rubber, or a silicone. In an embodiment, for example, the tether comprises a materials different than that of the device or device component.

In an embodiment, for example, each of the one or more relief structures of the tethering structure independently extends a length selected over the range of 100 nm to 1 mm and independently has one or more cross sectional physical dimensions selected over the range of 100 nm to 10 mm, and optionally for some embodiments a length selected over the range of 100 nm to 1000 microns and independently has one or more cross sectional physical dimensions selected over the range of 100 nm to 1000 microns, and optionally for some embodiments a length selected over the range of 1 micron to 1000 microns and independently has one or more cross sectional physical dimensions selected over the range of 1 micron to 1000 microns, and optionally for some embodiments a length selected over the range of 10 micron to 1000 microns and independently has one or more cross sectional physical dimensions selected over the range of 10 micron to 1000 microns.

In an embodiment, a substrate is a flexible substrate or a stretchable substrate, such as a polymer substrate. For example, a wide range of polymers are useful for substrates of the present invention. For example, the substrate may comprise one or more materials selected from the group consisting of an elastomer, PDMS, ecoflex®, and a silicone. Typically, the substrate has a Young's modulus selected from the range of 1 kPa to 100 MPa, or selected from the range of 100 kPa to 1 MPa, or selected from the range of 250 kPa to 750 kPa. In some embodiments, the substrate has a thickness selected from the range of 100 microns to 100 mm, or selected from the range of 100 microns to 50 mm, or selected from the range of 1 mm to 10 mm. In some embodiments, the substrate has a thickness less than or equal to 1000 mm, optionally less than or equal to 10 mm and optionally less than or equal to 1 mm.

In an embodiment, an electronic system comprises one or more electrical interconnects in electrical contact with an electronic device or device component. For example, the one or more electrical interconnects may establish electrical contact between the electronic device or device component and one or more additional electronic devices or device components. The electronic device or device component, the one or more additional electronic devices or device components and the one or more electrical interconnects may be provided in an island bridge geometry, where the electronic devices or device components comprise the islands and where the electrical interconnects comprise the bridges. The electronic device or device component, the one or more additional electronic devices or device components and the one or more electrical interconnects may be provided in a rigid island bridge geometry, where the electronic devices or device components comprise rigid islands and where the electrical interconnects comprise the flexible and/or stretchable bridges.

In an embodiment, an electronic system comprises an array of device components comprising rigid device islands, wherein the one or more electrical interconnects electrically connect adjacent rigid device islands. For example, at least one of the electrical interconnects may electrically connect a device component comprising a first rigid device island with a second device component comprising a second rigid device island. In an embodiment, an electronic system comprises a plurality of device components, where each of the rigid device islands corresponds to a device component. Generally, the physical dimension and geometry of the islands correspond to those of the electronic device or device component.

In an embodiment, one or more electrical interconnects may be a stretchable electrical interconnect configured to provide elasticity, bendability, or both to the electronic system. For example, at least a portion of the one or more stretchable electrical interconnects may have a bent, buckled, folded, curved or serpentine geometry. Further, at least a portion of the one or more stretchable electrical interconnects may have a geometry that is in plane, out of plane, or both in plane and out of plane, relative to a plane defined by a support surface of the substrate, which may curved or substantially flat. In an embodiment, at least a portion of the one or more electrical interconnects has an in plane serpentine geometry.

In an embodiment, an as-fabricated multilayer (polyimide (1.2 µm)/Cu(500 nm)/Au(100 nm)/polyimide(1.2 µm)/(Cu (600 nm)/polyimide (1.2 µm)/Al(600 nm)/polyimide(1.2 µm)) interconnect has an in-plane (or non-coplanar) serpentine geometry, or arc-shaped pop-up layout, with a lateral width of 50 µm-100 µm. The Young's moduli of these materials are polyimide 2.5 GPa, Cu 120 GPa, Au 78 GPa, and Al 70 GPa.

In some embodiments, the free standing and/or tether device geometries of the present invention provide an efficient means of achieving mechanical isolation of the electronic device, or components thereof, from the substrate. This aspect of the invention is beneficial, for example, for reducing the extent of strain on an electronic device component caused by movement or deformation of the substrate. In an embodiment, a free standing or tethered electronic device or device component, such as semiconductor device, chip, etc., is mechanically isolated from the substrate. For comparison, the strain level of a device without mechanical isolation is 4 to 1000 times larger than the strain level of a device that is free standing or tethered according to the present invention.

In an embodiment of a tethered configuration, a plurality of tethers (e.g., a pillar array) are used to support an electronic device, device component or interconnect. The number of tethers will vary depending on the number of devices or device components and the sophistication of the circuit layout. The function of the tethers is to substantially maintain the position of an electronic device or device component or interconnect to prevent physical or electrical interaction (e.g., tangling) during stretching and releasing. In an embodiment, a tether may be cylindrical, conical, rectangular, square, or irregularly shaped. Typically, the lateral dimensions of a tether range from 0.5 mm to 1 mm in diameter when used to support an electronic device or device component having lateral dimensions ranging from 1 mm to 10 mm.

Thus, the rigid islands are bonded to tethers on a small portion of their overall area in a selective bonding configuration. In an embodiment, a tether has a height of about 100 μm, a Young's modulus of about 1 kPa to 1 GPa and a flexural rigidity of about $10^{-13}$ N·m to $10^5$ N·m.

In an embodiment, tethers and the substrate are mounted in an etched Si wafer as a single, unitary piece and standard procedures are used to laminate multilayered metal serpentine interconnects onto the tether's surface by UV ozone activation and $SiO_2$ bonding.

In an embodiment, tethers are used to prevent drifting of the rigid device islands and stretchable interconnects are used to prevent entangling of the interconnects during repetitive stretching and releasing processes.

In an embodiment, devices or device components, such as COTS chips as received and after mechanical decapsulation, bare dies and in-house fabricated thin film sensors/devices, are embedded in enclosing structures of a fluid containment chamber. In another embodiment, interconnects are embedded in enclosing structures (e.g. walls) of a fluid containment chamber.

In an embodiment, interconnects are single or multilayered with vias, and conducting metal traces may be insulated, for example, by dielectric polymers, such as polyimide or parylene C or SU8.

In an embodiment, at least a portion of the one or more stretchable electrical interconnects comprises a plurality of electrically conductive structures each independently having a primary unit cell shape comprising a plurality of spatially offset and opposing segments, wherein the conductive structures are connected in a sequence characterized by a secondary shape comprising at least one pair of spatially offset and opposing regions formed from the sequence of electrically conductive structures, where the sequence of conductive structures is capable of undergoing deformation thereby providing stretchability of the stretchable electronic device. In an embodiment, at least a portion of the one or more electrical interconnects comprising the sequence of electrically conductive structures provides an overall self-similar geometry for the stretchable electrical interconnect. For example, the sequence of conductive structures may comprise a monolithic structure and/or the sequence of conductive structures may comprise a wire.

In an embodiment, the secondary shape is similar to the primary unit cell shape but has a different scale. For example, the secondary shape may be similar to the primary unit cell shape but at least 10 times larger than the primary unit cell shape, or at least 25 times larger than the primary unit cell shape, or at least 50 times larger than the primary unit cell shape.

In an embodiment, the sequence of electrically conductive structures is further characterized by a tertiary shape comprising at least one pair of spatially offset and opposing regions formed from a repeating series of the electrically conductive structures comprising the secondary shape.

In an embodiment, the spatially offset and opposing segments of the primary unit cell shape comprise convex and concave regions. For example, the unit cell shape may be a serpentine shape.

In an embodiment an electronic system comprises a transistor, an electrochemical cell, a fuel cell, an integrated circuit, a solar cell, a laser, a light emitting diode, a nano-electromechanical device, a microelectromechanical device, a photodiode, a P-N junction, a sensor, a memory device, a complementary logic circuit or an array of any of these.

In an aspect, an electrochemical cell comprises: a substrate; a positive electrode forming part of a first electronic device component supported by the substrate; wherein the first electronic device component is free standing or tethered to the substrate; a negative electrode forming part of a second electronic device component supported by the substrate; wherein the second electronic device component is free standing or tethered to the substrate; and a fluid containment chamber at least partially enclosing the positive electrode, the negative electrode or both the positive electrode and the negative electrode; wherein the fluid containment chamber is at least partially filled with an electrolyte fluid allowing for ionic transport between the positive electrode and the negative electrode. In the embodiment, an electrochemical cell further comprises one or more stretchable electrical interconnects in electrical contact with the positive electrode, the negative electrode or both the positive electrode and the negative electrode. For example, each of the one or more stretchable electrical interconnects may independently have a self-similar serpentine geometry. An array comprising a plurality of electronically interconnected electrochemical cells is also described.

In an aspect, a method of making an electronic system comprises: providing a substrate; providing an electronic device or device component that is free standing or tethered to the substrate in a fluid containment chamber on the substrate such that the fluid containment chamber at least partially encloses the electronic device or device component; and at least partially filling the fluid containment chamber with a containment fluid.

In an aspect, a method of using an electronic system comprises providing an electronic system comprising: a substrate; an electronic device or device component supported by the substrate; wherein the electronic device or device component is free standing or tethered to the substrate; and a fluid containment chamber at least partially enclosing the electronic device or device component; wherein the fluid containment chamber is at least partially filled with a containment fluid; and applying an electric current to the electronic system.

Stretchable and flexible electronics having the configuration described herein may be used for a variety of device applications. The use of free floating interconnects in a fluid allows the interconnects to freely buckle and deform, which greatly increases the stretchability and flexibility of electronic devices in various fields of use. For example, a free floating interconnect may be used in a lithium ion battery having an array of active material islands connected by wavy interconnects. The islands may be firmly bonded on the substrate, while the wavy interconnects can freely buckle and deform. Stretchable interconnects may also be used in optical systems, such as light emitting diode and photo diode arrays formed as rigid island arrays. Rigid island sensor arrays be also be used to monitor temperature, hydration, pressure, strain and/or biological parameters. For example, by design specific functional circuits, electrophysiological parameters of humans and/or animals can be measured, such as skin temperature, electrocardiograms, electromyograms, electroencephalograms, electrooculograms.

The invention also provides methods of making and using electronic systems including stretchable and/or deformable electronic devices and device arrays. These methods are explicitly intended to be commensurate in scope with the entirety of the description and may be practiced with all devices and embodiments disclosed herein.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

The invention is further set forth, exemplified and described by the following examples and claims.

BRIEF DESCRIPTION OF THE DRAWINGS

FIG. 2A, 2B, 2C, 2D, 2E, 2F, 2G. Experimental and computational studies of buckling physics in interconnects with self-similar serpentine layouts. Optical images and corresponding finite element analysis (FEA) of symmetric (left column) and anti-symmetric (middle column) deformation modes, for various levels of applied tensile strain ($\epsilon$). The color in the FEA results represents the maximum principal strains of the metal layer. The scale bar is 2 mm. The right column shows the interconnect structures after releasing the applied strain.

FIG. 8. Deformed configurations (FEA results) of the self-similar electrode for symmetric (a) and anti-symmetric (b) buckling modes under an applied strain of 50%, from different viewing angles (i.e., top, front, side, and three-dimensional (3D) views).

FIG. 12A, 12B, 12C, 12D, 12E, 12F, 12G. Finite element analyses of the buckling profiles of a vertically aligned self-similar interconnect under compression, and its comparison with optical images from experiment. The color contours in the FEA results represent the distribution of maximum principal strain in the metal layer.

V for coin cell geometries with exactly the same slurries and the capacitance matched cathode and anode geometries.

Figure 17:
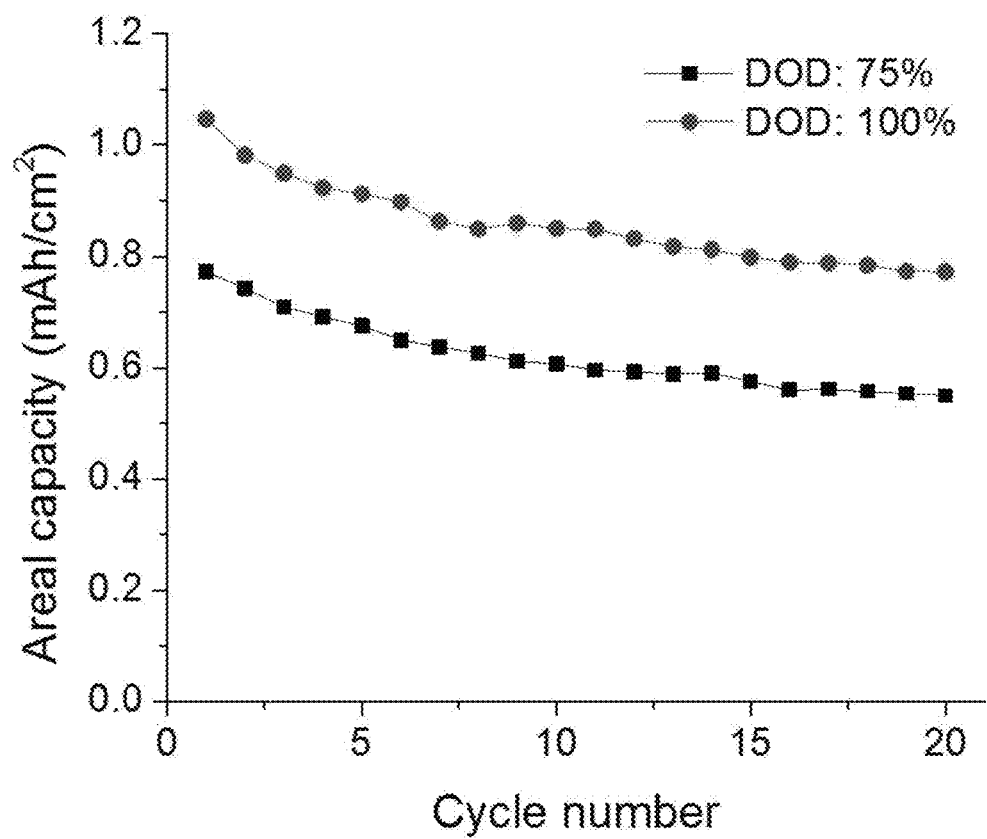

FIG. 17. Capacity retention curves with depth of discharge of 100% (red curve, cut-off voltage of 1.60-2.50 V) and ~75% (black curve, cut-off voltage of 2.25-2.50 V).

Figure 18:
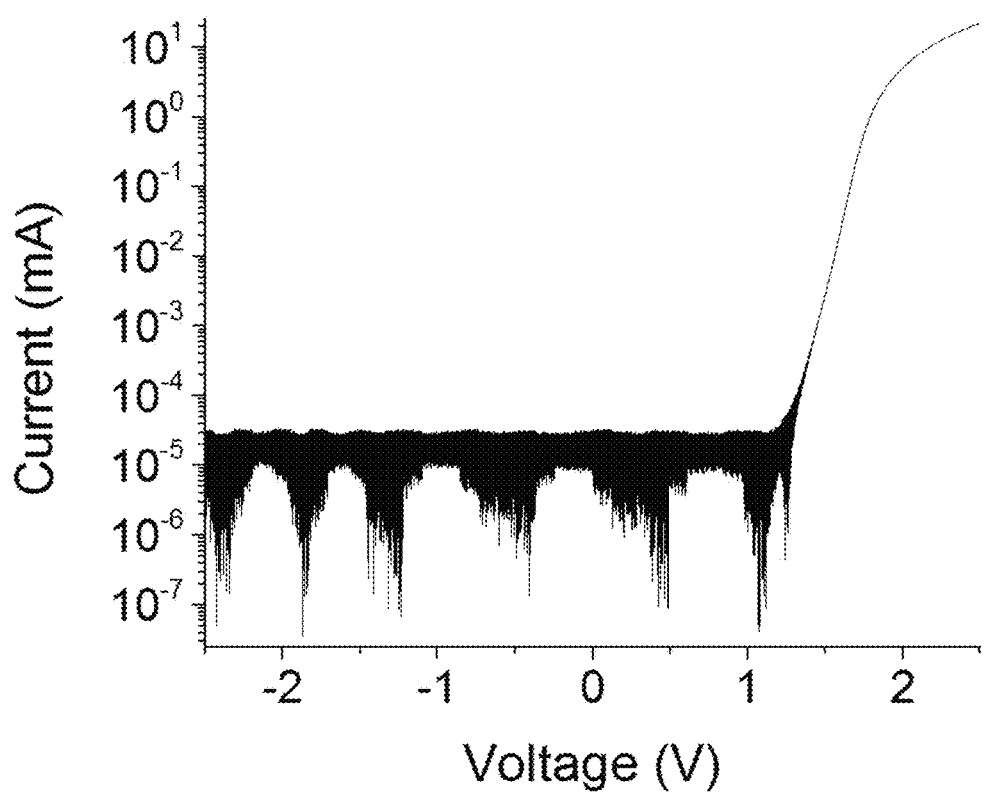

FIG. 18. I-V curve of the commercial red light emitting diode, showing its turn on voltage at around 1.7 V.

Figure 19:
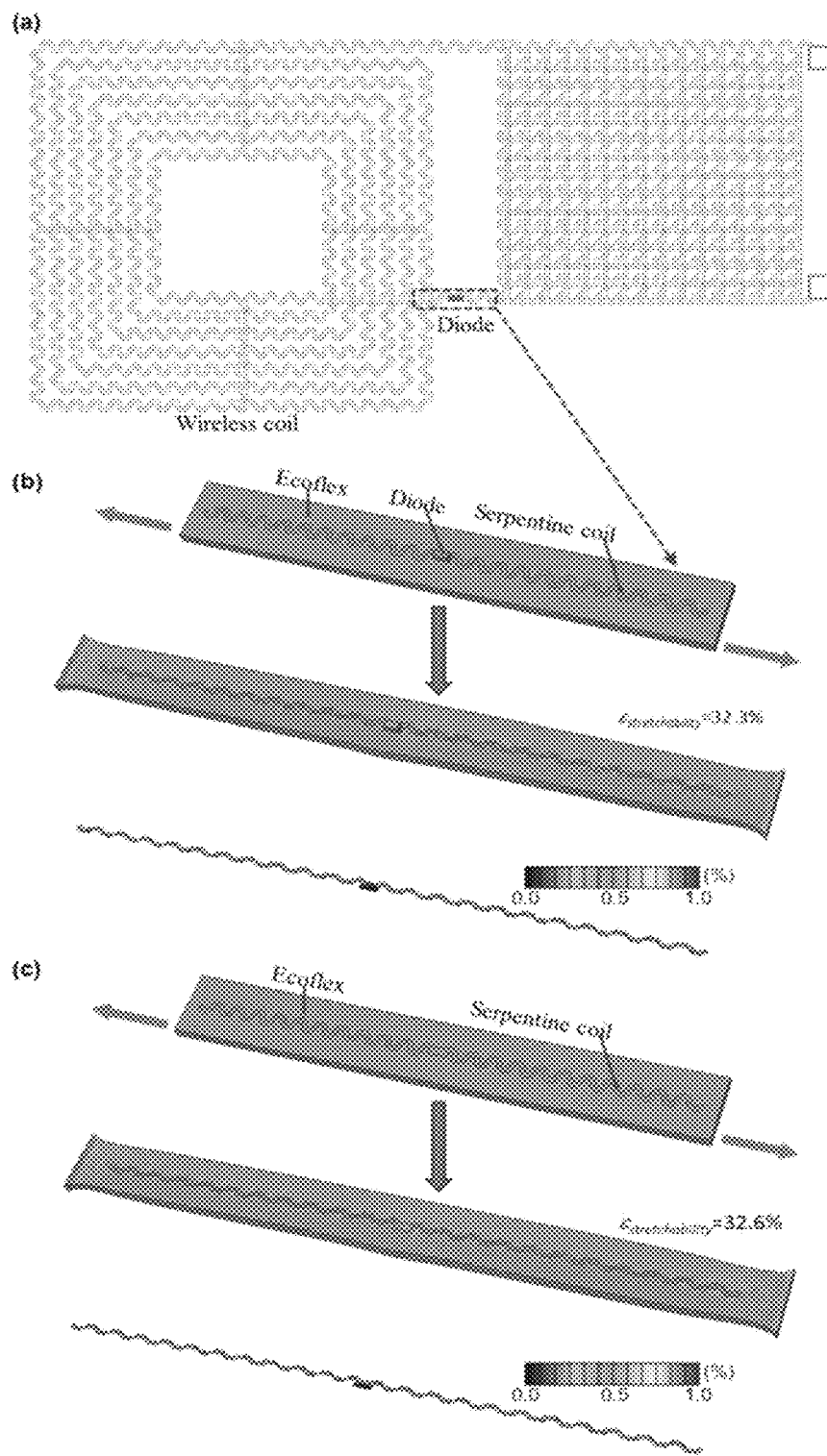

FIG. 19. (a) Schematic illustration of the layout of a wireless recharging system; (b) Calculated deformation and distribution of maximum principal strain under an applied strain of 32.3%, for a representative component of the wireless coil, with both the discrete diode and serpentine interconnect; (c) Calculated deformation and distribution of maximum principal strain under an applied strain of 32.6%, for a representative component of the wireless coil, with only the serpentine interconnect.

Figure 20:
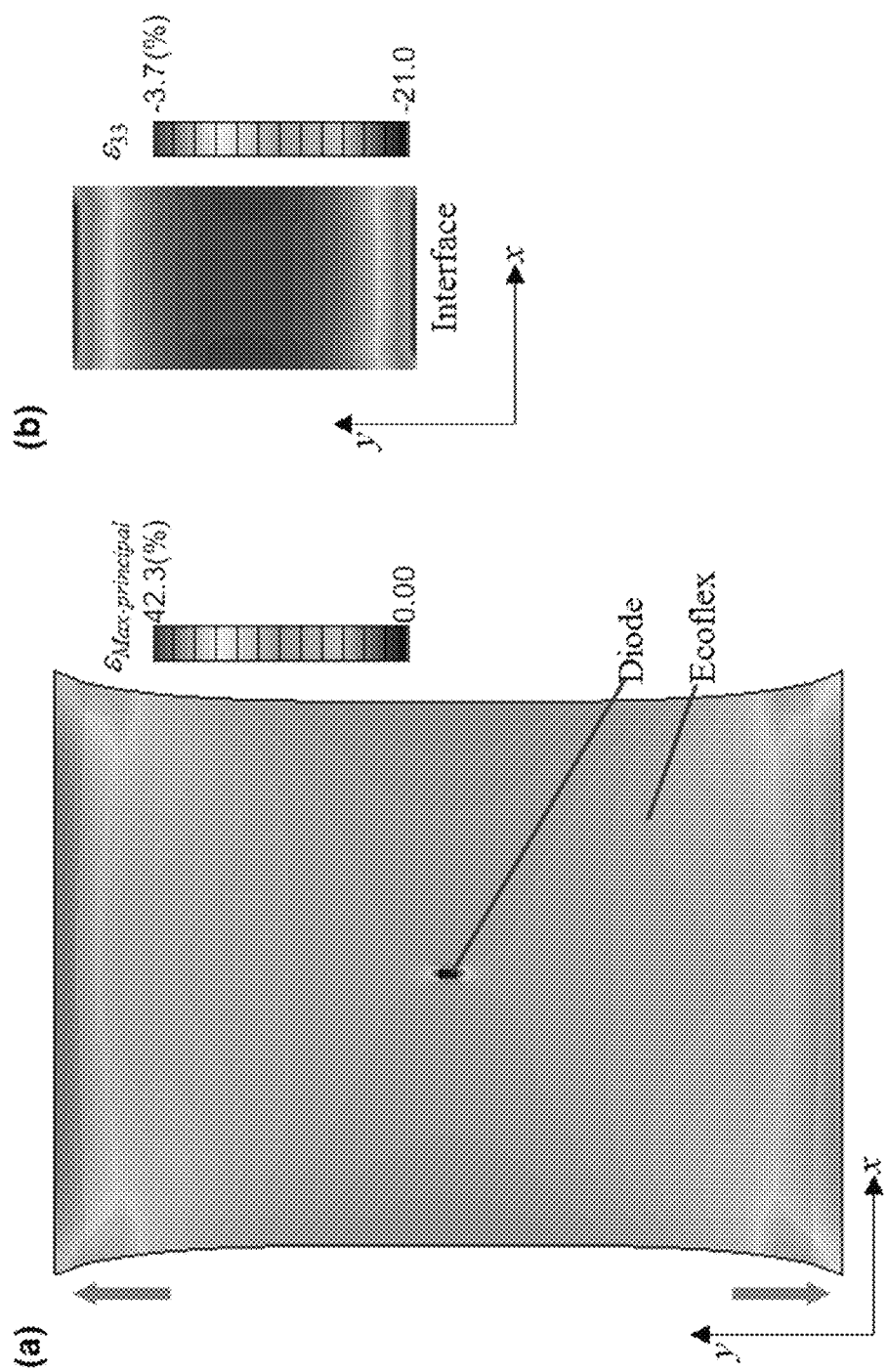

FIG. 20. Calculated distribution of (a) maximum principal strain in the whole structure, and (b) substrate normal strain ($\varepsilon_{33}$) at the diode/substrate interface, when the system is stretched by 30% along the vertical direction.

Figure 21:
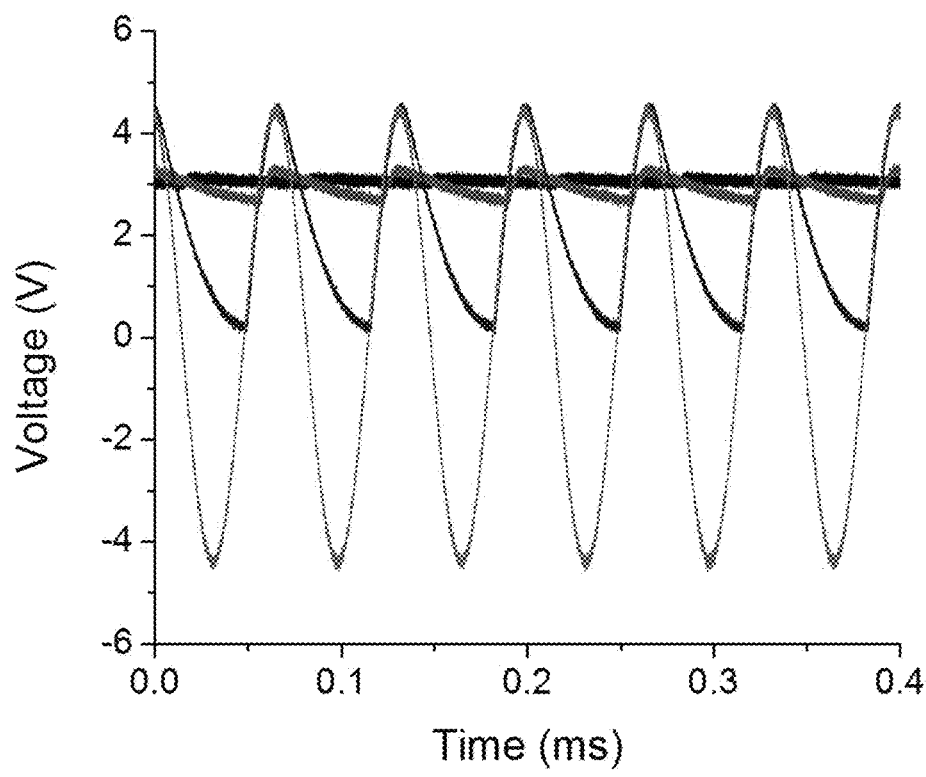

FIG. 21. The input and output electrical characteristics of the wireless charging systems. The Schottky diode rectifies the alternating voltage input from the functional generator (pink curve), to yield a rectified output (blue curve), which oscillates nominally from 0 V to 4.6 V. The parallel 1.7 nF capacitor integrates this oscillation to give a current source with a behavior closer to direct current (red curve). Increasing the capacitance (e.g. 17 nF) further smooths the current (black curve).

Figure 22:
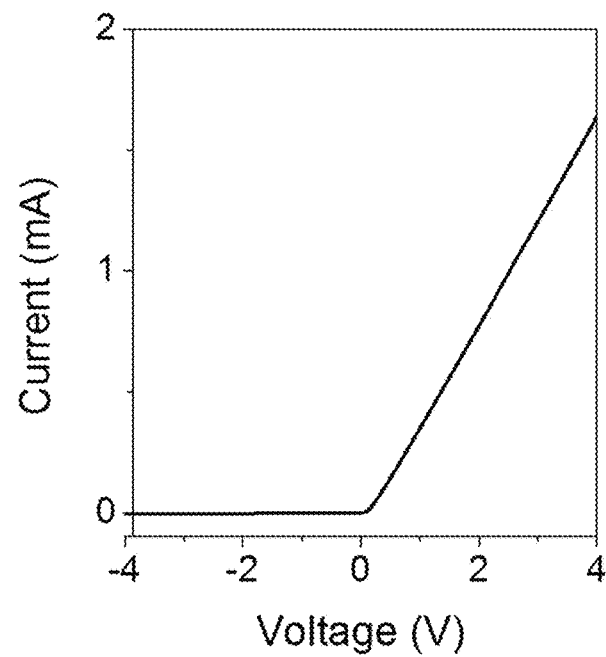

FIG. 22. I-V curve of the wireless coil with the rectifying chip, showing its series resistance of about 2.3 KΩ.

Figure 23A:
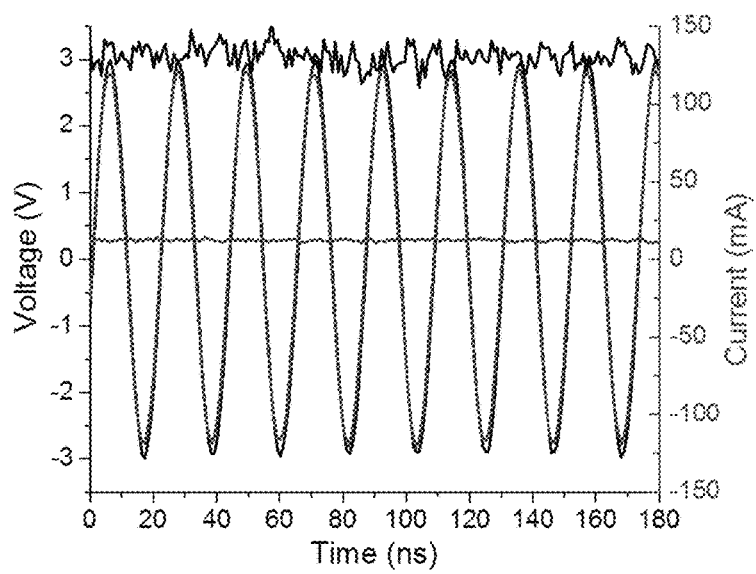
Figure 23B:
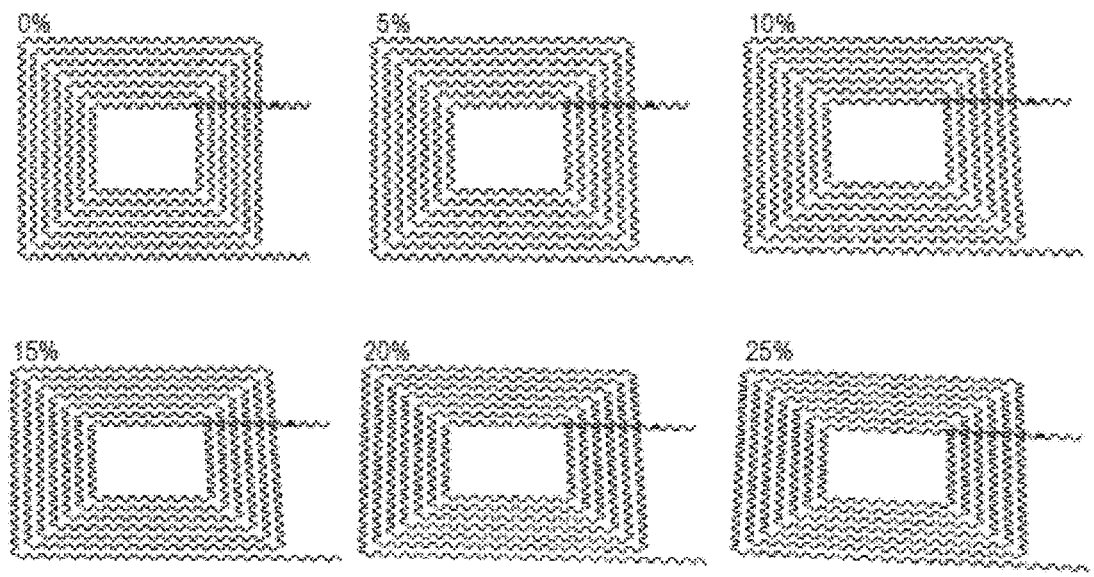

FIG. 23. (a) Input and output voltages (black) and currents (red) of the wireless coil 18 μm thick copper foil. (b) Optical micrographs of a 7 μm thick Cu coil at different levels of applied uniaxial strain. The scale bars are all 1 cm. (c) Finite element analysis of stretching of a segment of a serpentine coil with a thickness of 7 μm.

Figure 24A:
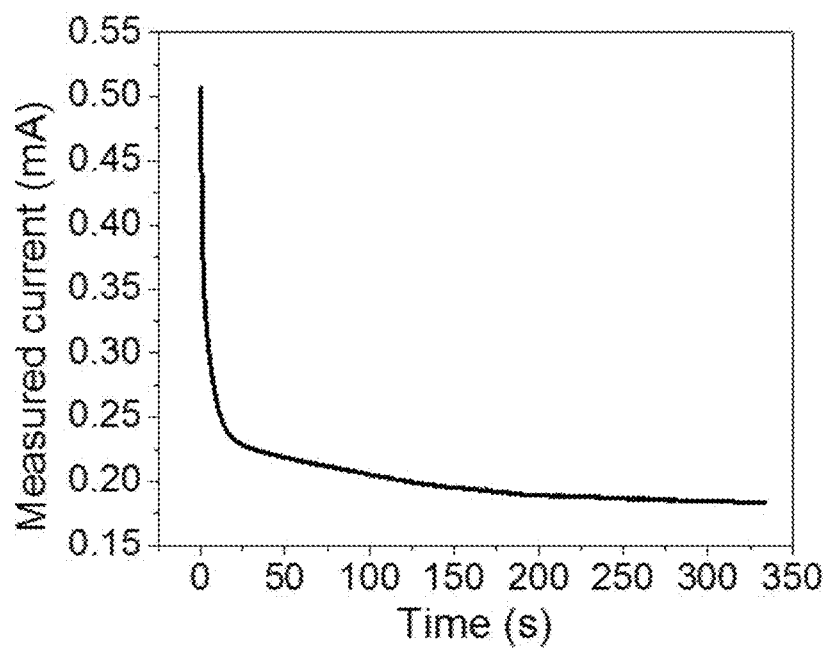
Figure 24B:
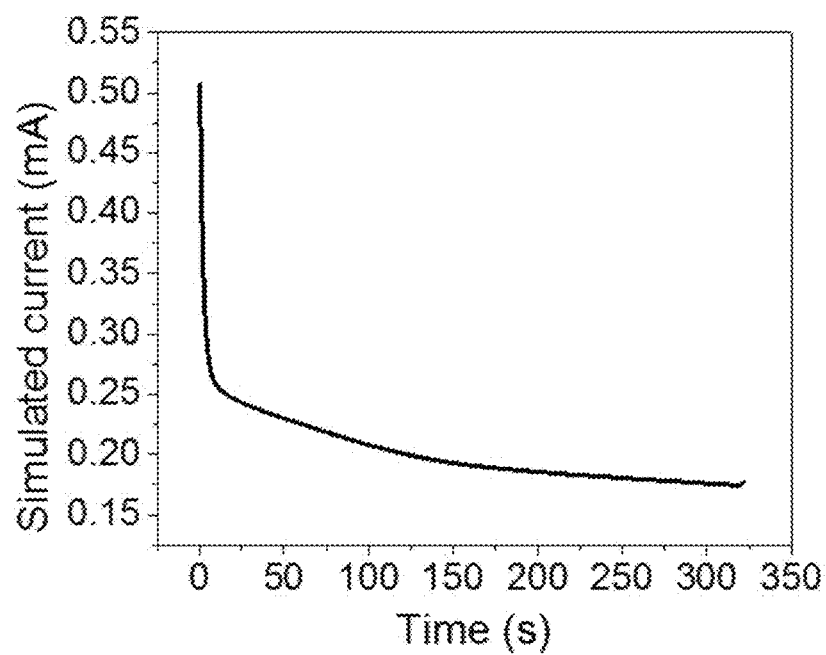

FIG. 24. Comparison between the (a) measured current change and the (b) simulated result in the wireless coil charging circuit.

Figure 25:
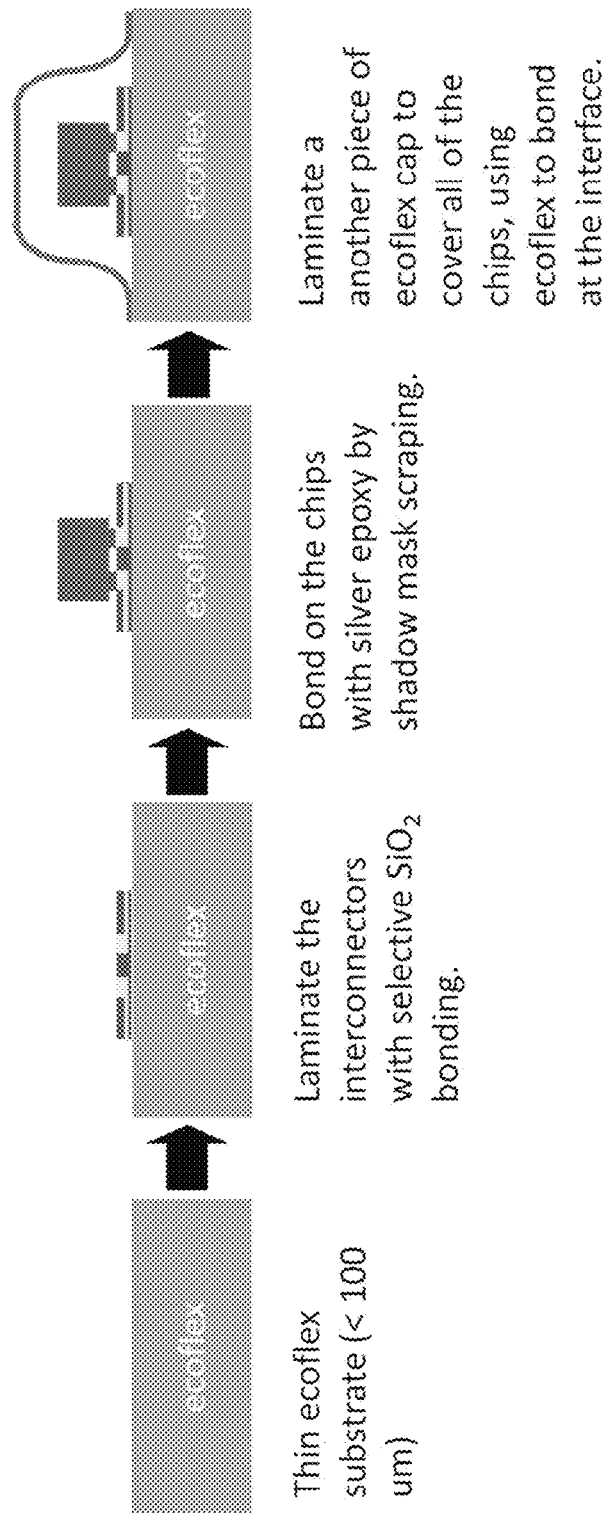

FIG. 25. Exemplary overall fabrication flow chart for making some electronic systems, according to an embodiment of the present invention.

Figure 26:
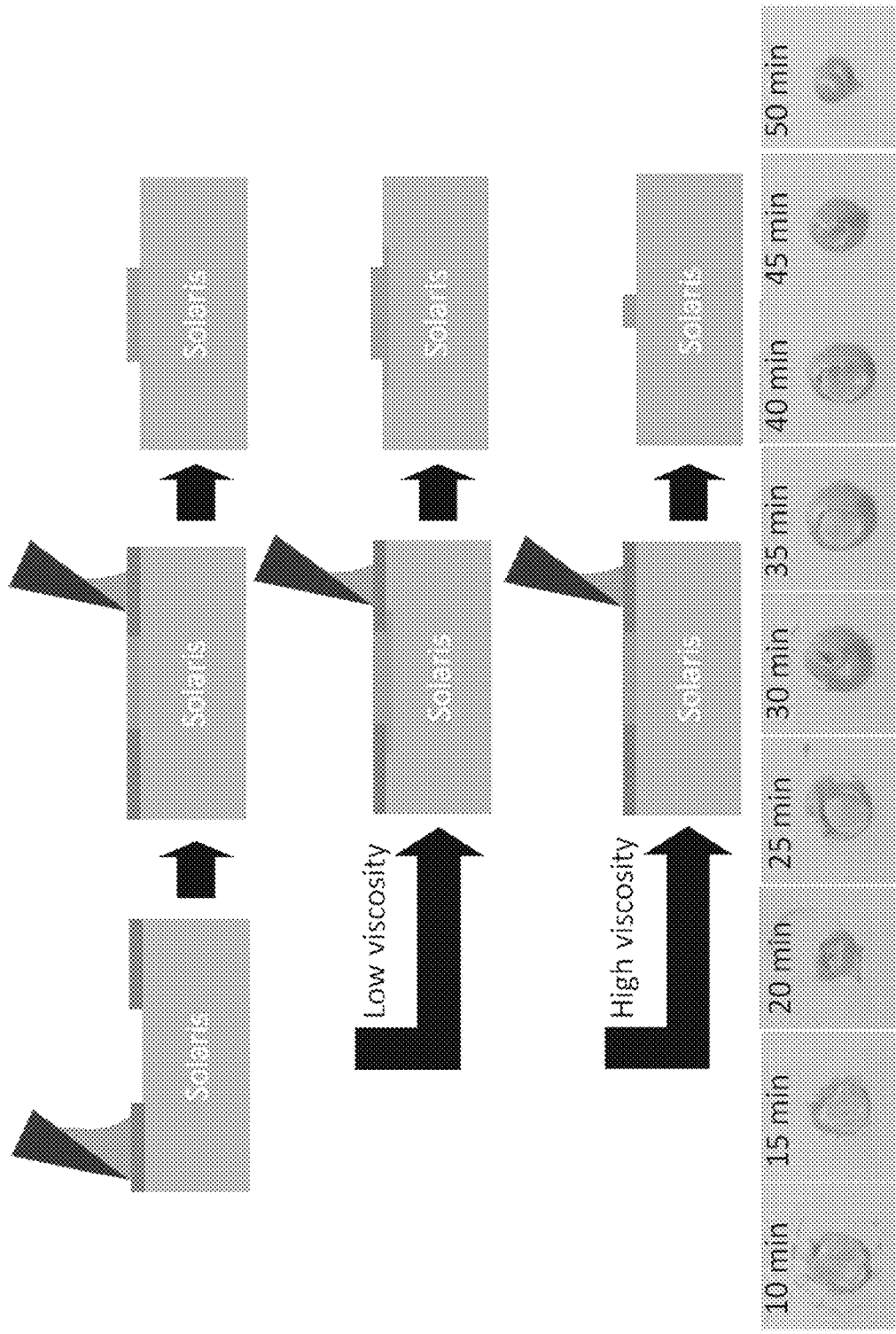

FIG. 26. Illustration of silver epoxy scraping.

Figure 27:
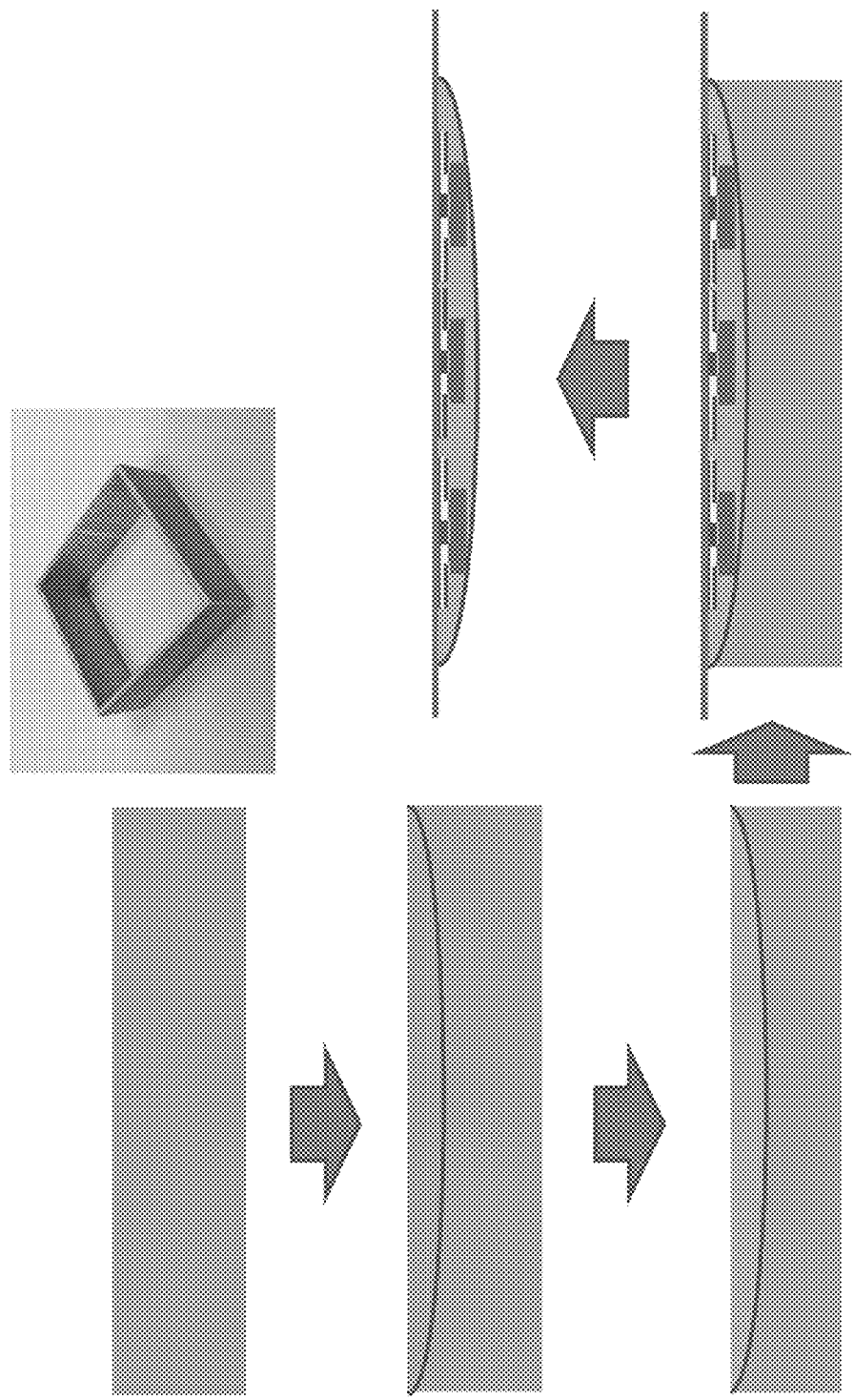

FIG. 27. Illustration of liquid chamber fabrication, according to an embodiment of the present invention.

FIGS. 28A-28D. Illustration of a single battery according to an embodiment of the present invention.

Figure 29B:
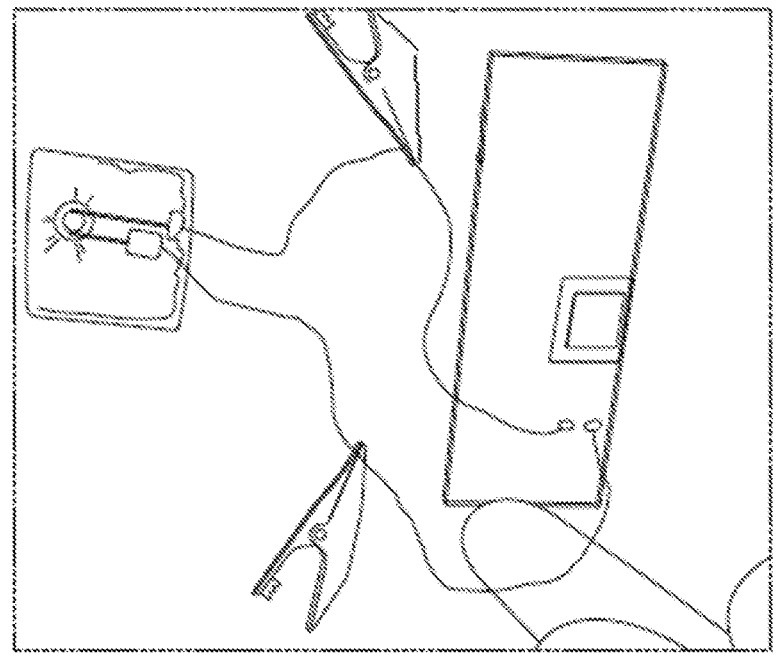
Figure 29A:
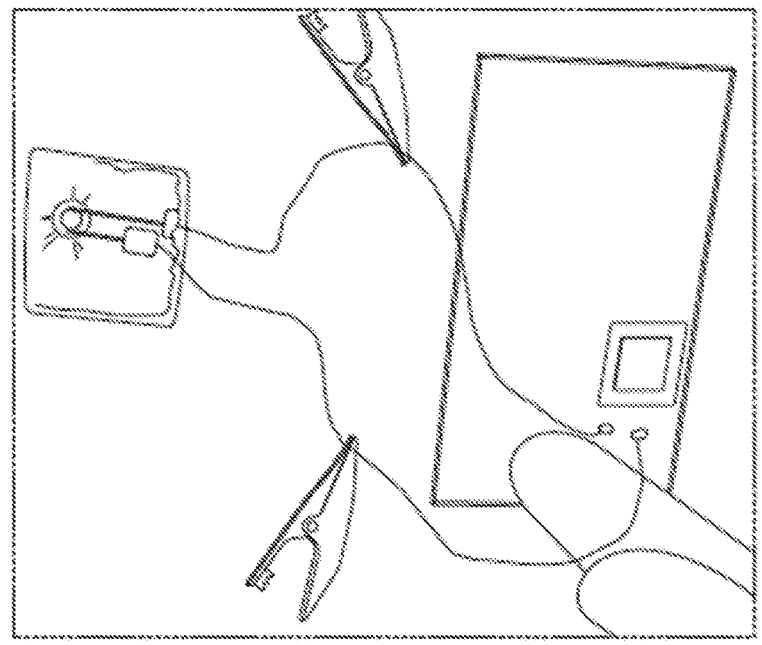

FIGS. 29A-29B. Battery chip in liquid chamber to power up a blue LED (FIG. 29A) before stretching and (FIG. 29B) undergoing approximately 100% stretching. Stretchability limiting factor: bonded serpentines in the chamber wall.

Figure 30:
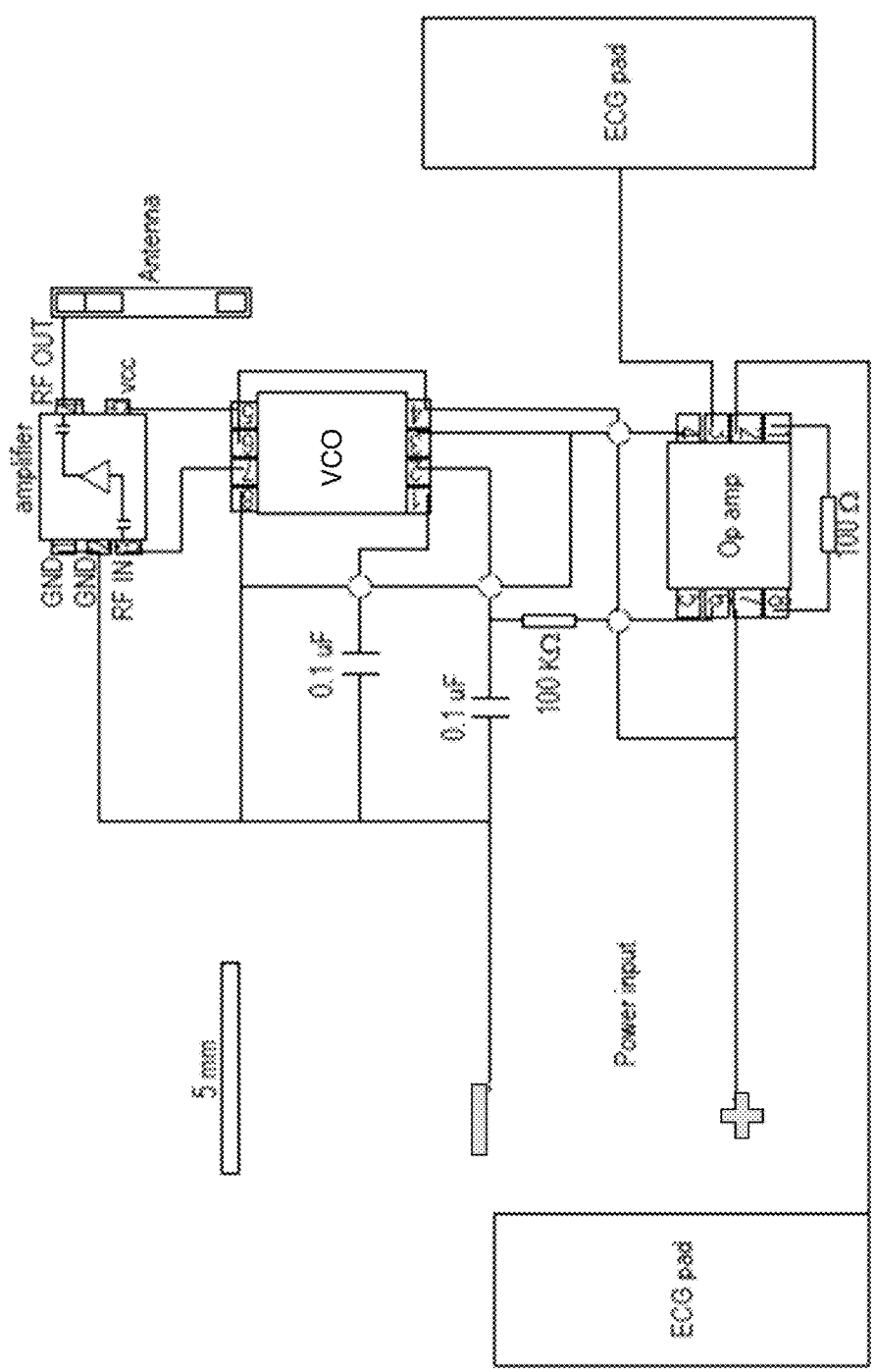

FIG. 30. ECG circuit with wireless power and telecommunication.

FIGS. 31A-31B. (FIG. 31A) Exemplary ECG data on oscilloscope and (FIG. B) on antenna receiver.

Figure 32:
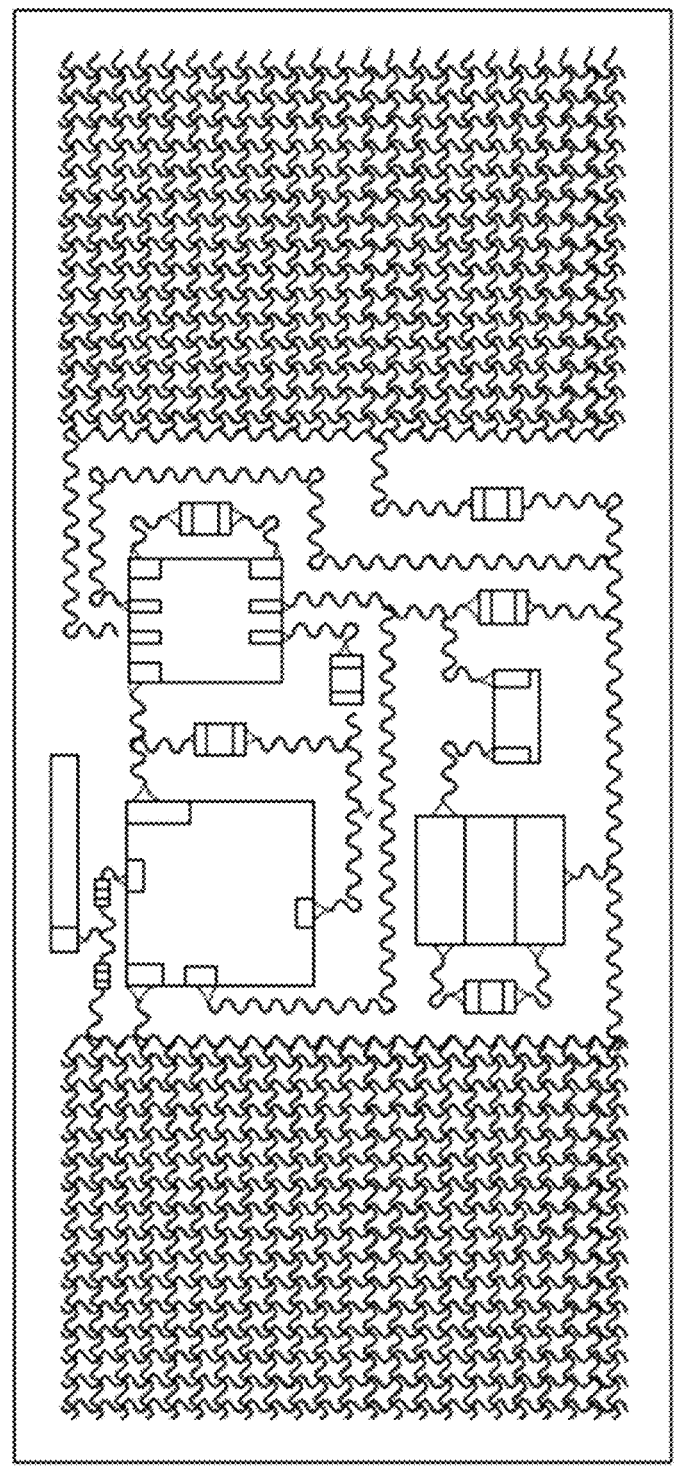

FIG. 32. Illustration of a circuit with selective bonding.

Figure 33:
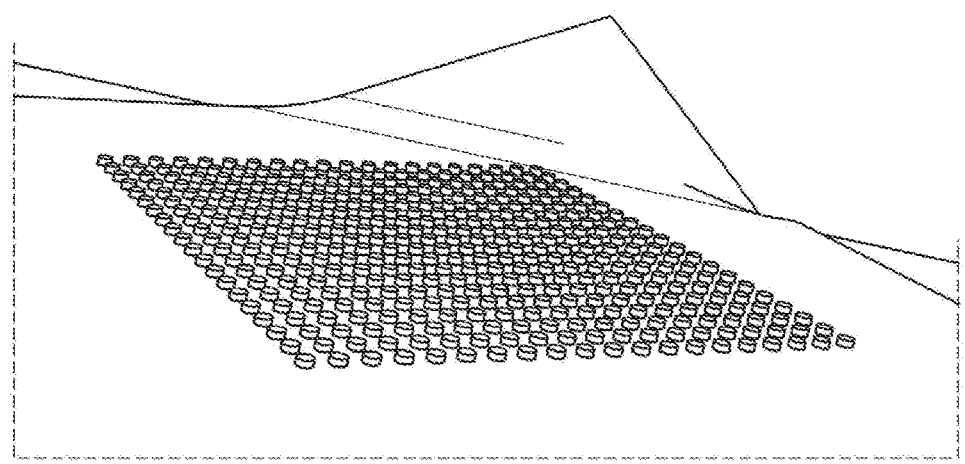

FIG. 33. An array of ECOFLEX® silicone rubber pedestals under the chip to facilitate the interconnect to glide in teh liquid chamber.

Figure 34A:
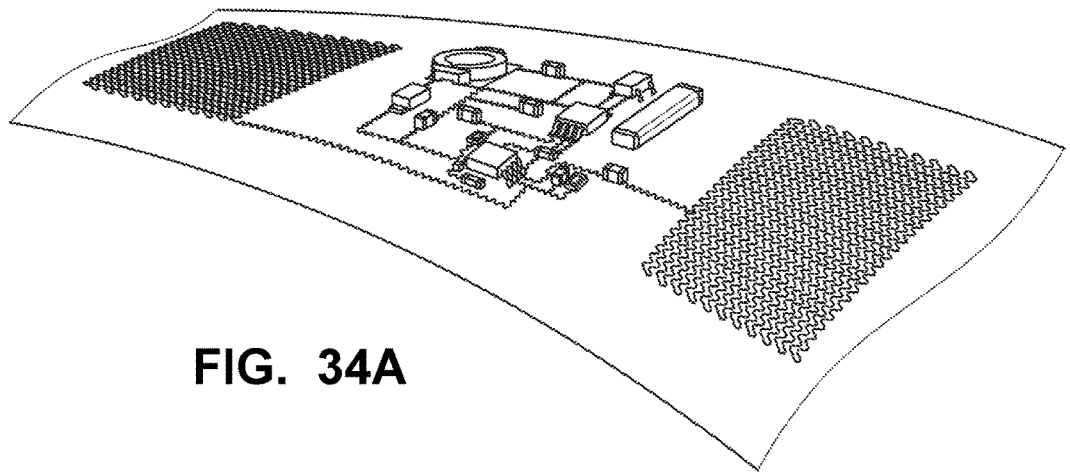
Figure 34B:
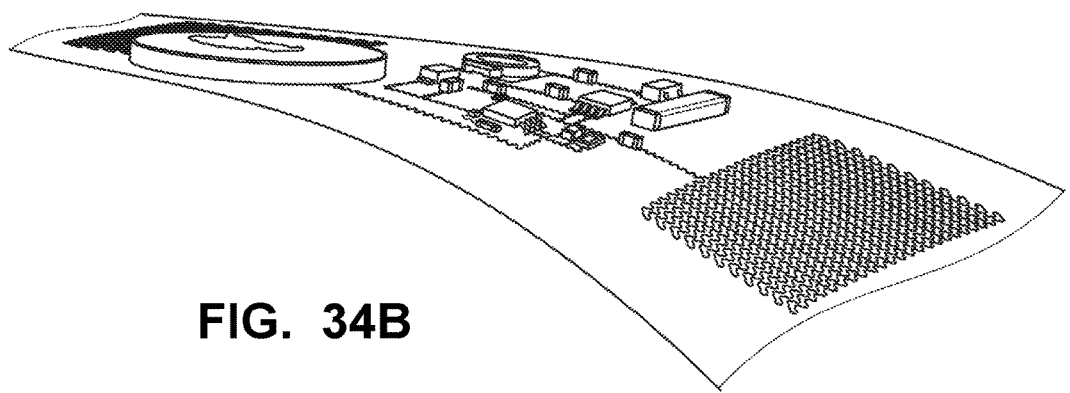

FIGS. 34A-34B. Illustration of thin chips (<1 mm).

Figure 35A:
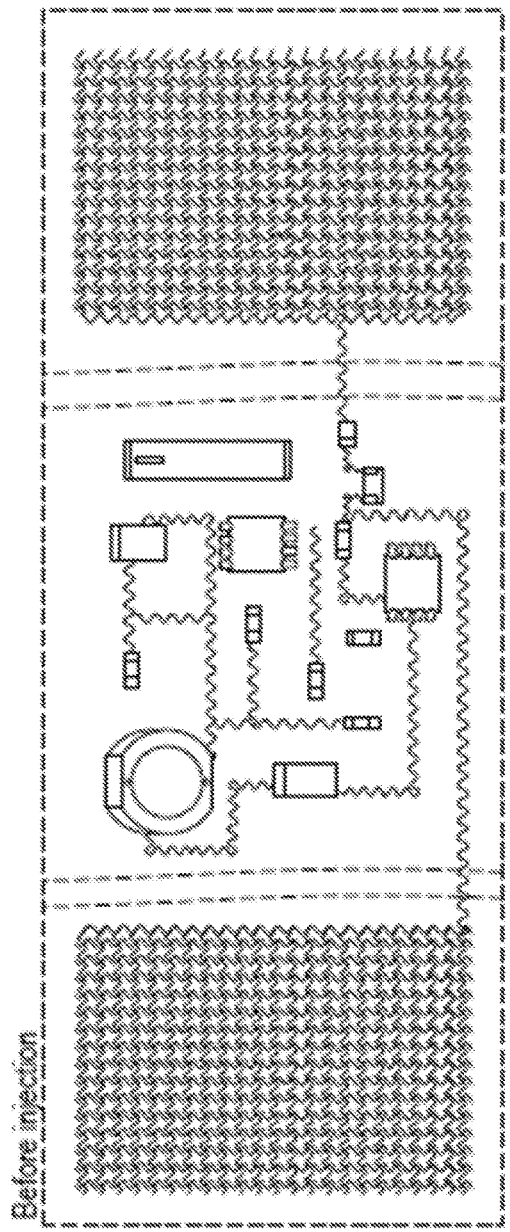
Figure 35B:
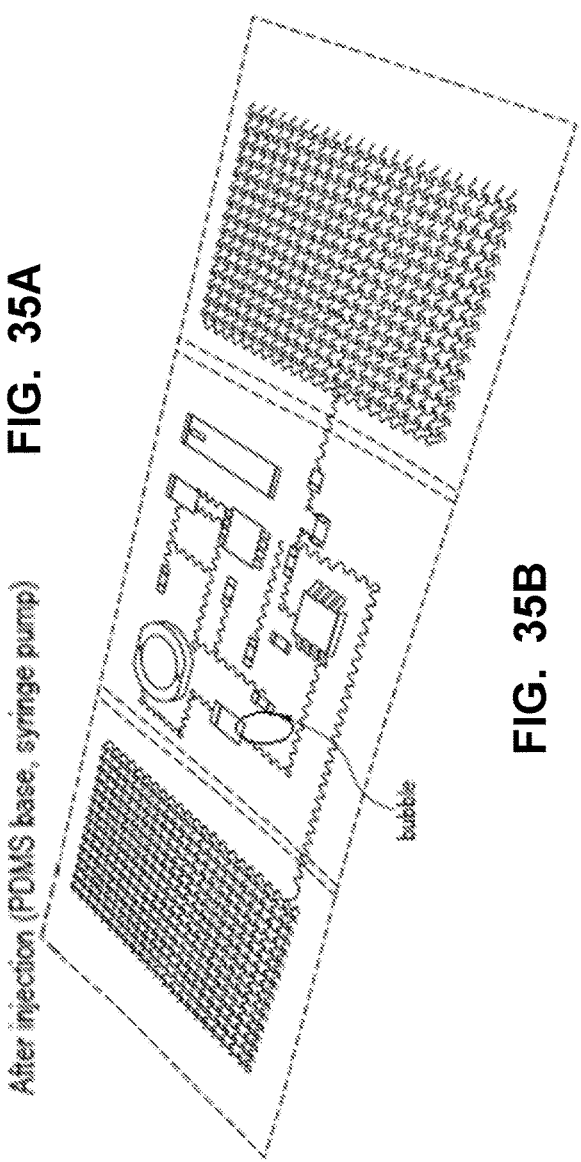

FIGS. 35A-35B. A circuit having a liquid chamber, according to an embodiment of the present invention, (FIG. 35A) before injection and (FIG. 35B) after injection.

Figure 36A:
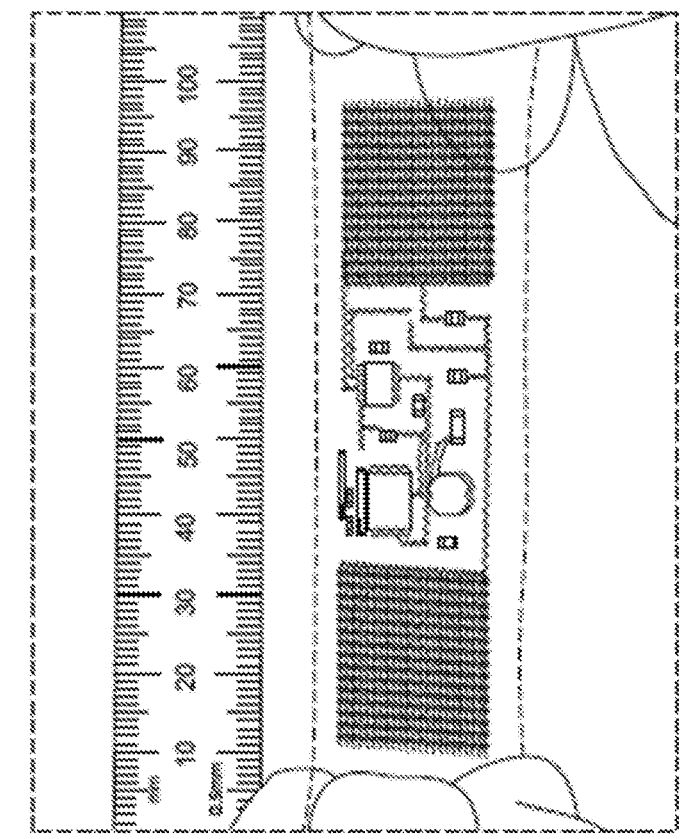
Figure 36B:
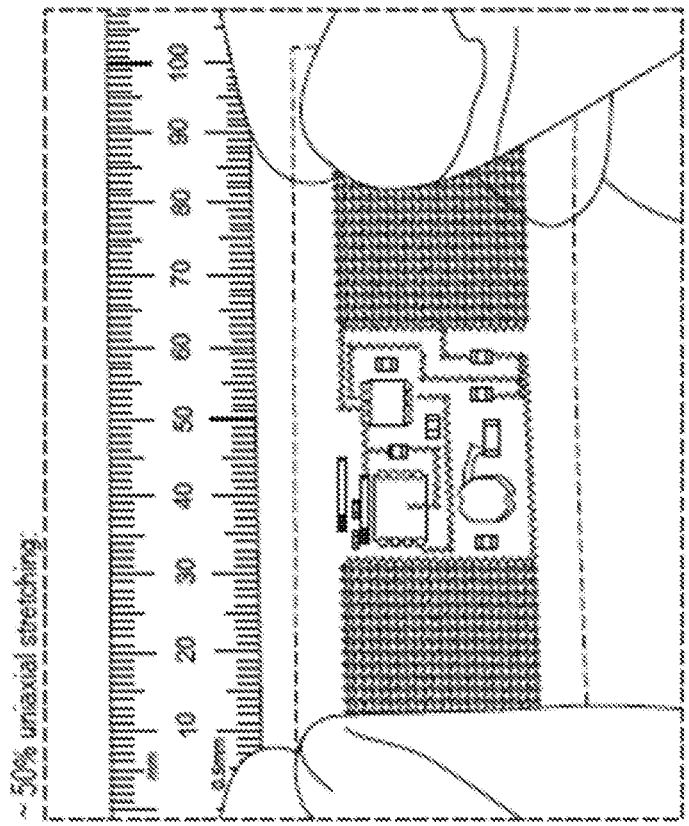

FIGS. 36A-36B. Images demonstrating stretching of an electronic system.

Figure 37B:
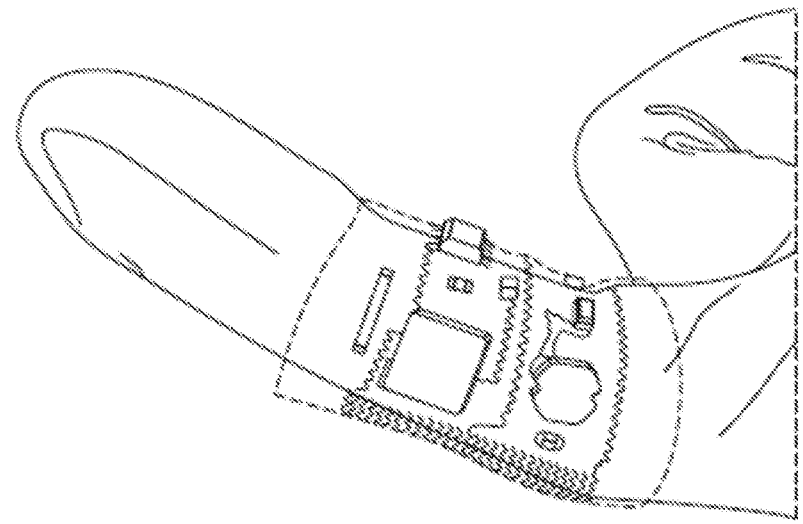
Figure 37A:
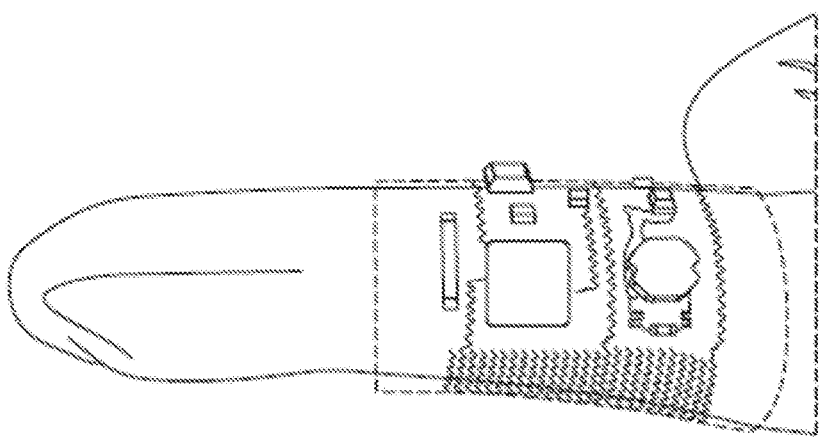

FIGS. 37A-37B. Images demonstrating flexing of an electronic system.

Figure 38:
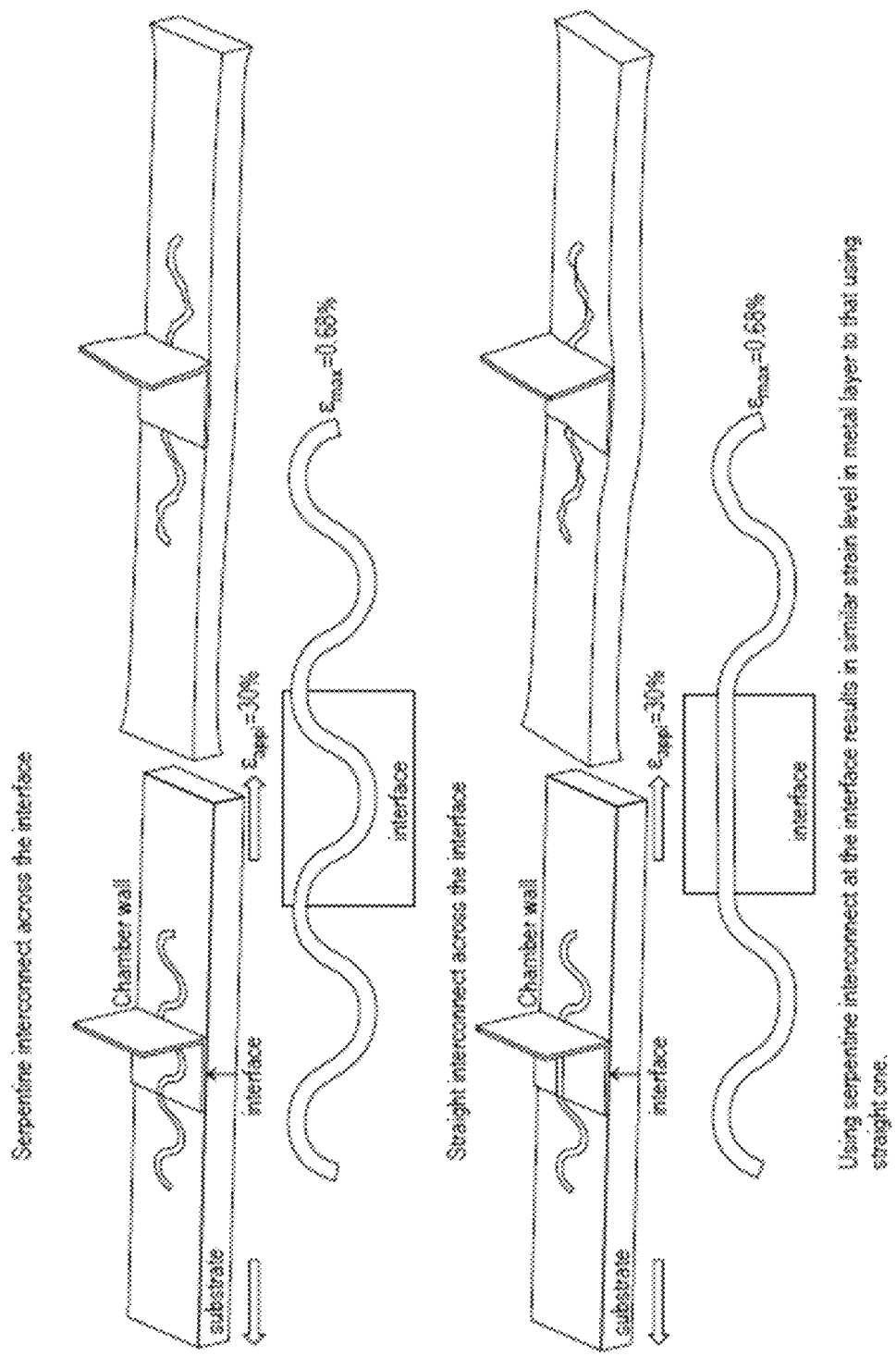

FIG. 38. Schematic diagrams illustrating interconnects at an interface.

Figure 39:
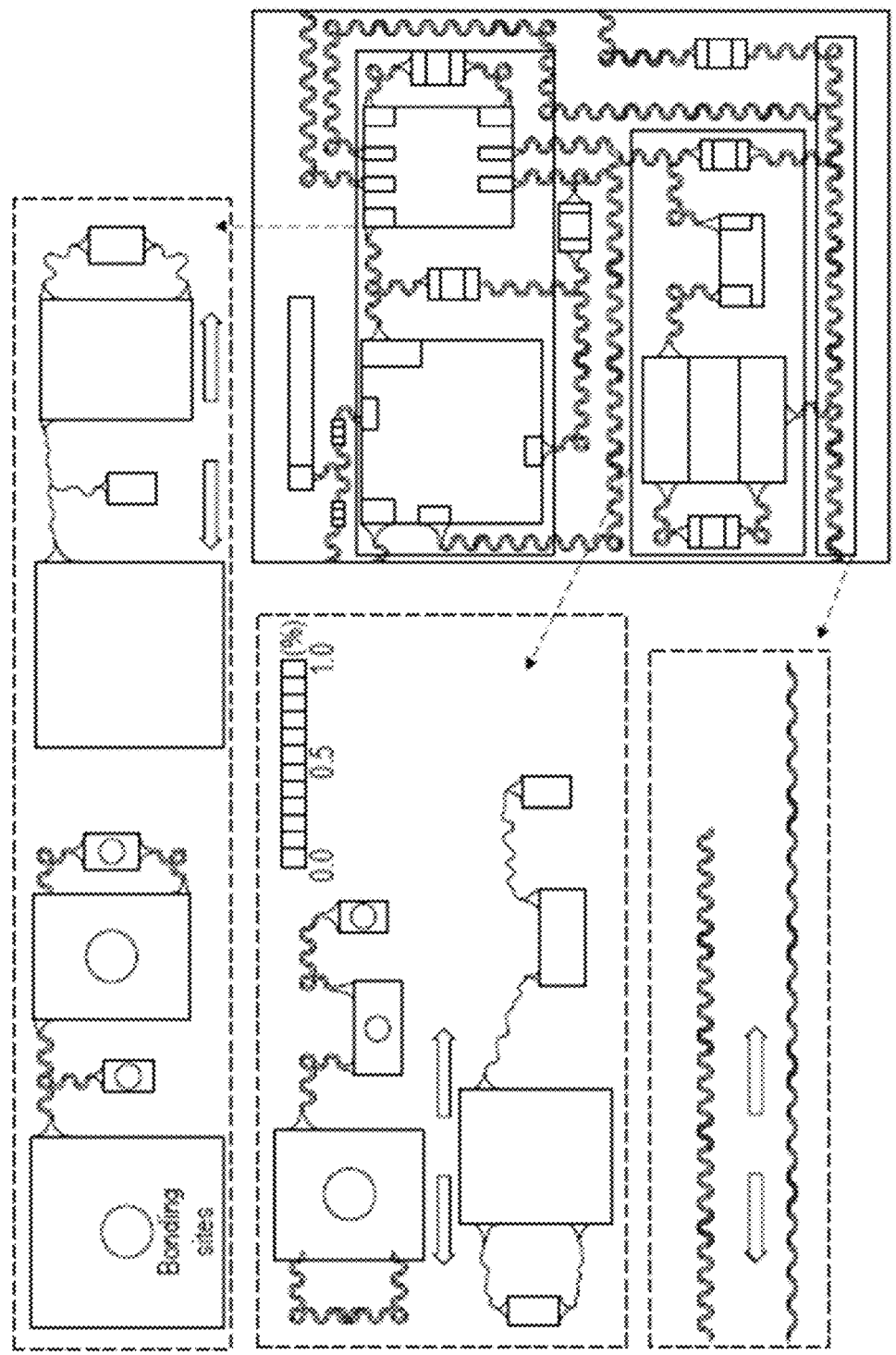

FIG. 39. Schematic diagrams illustrating system level mechanics-horizontal.

Figure 40:
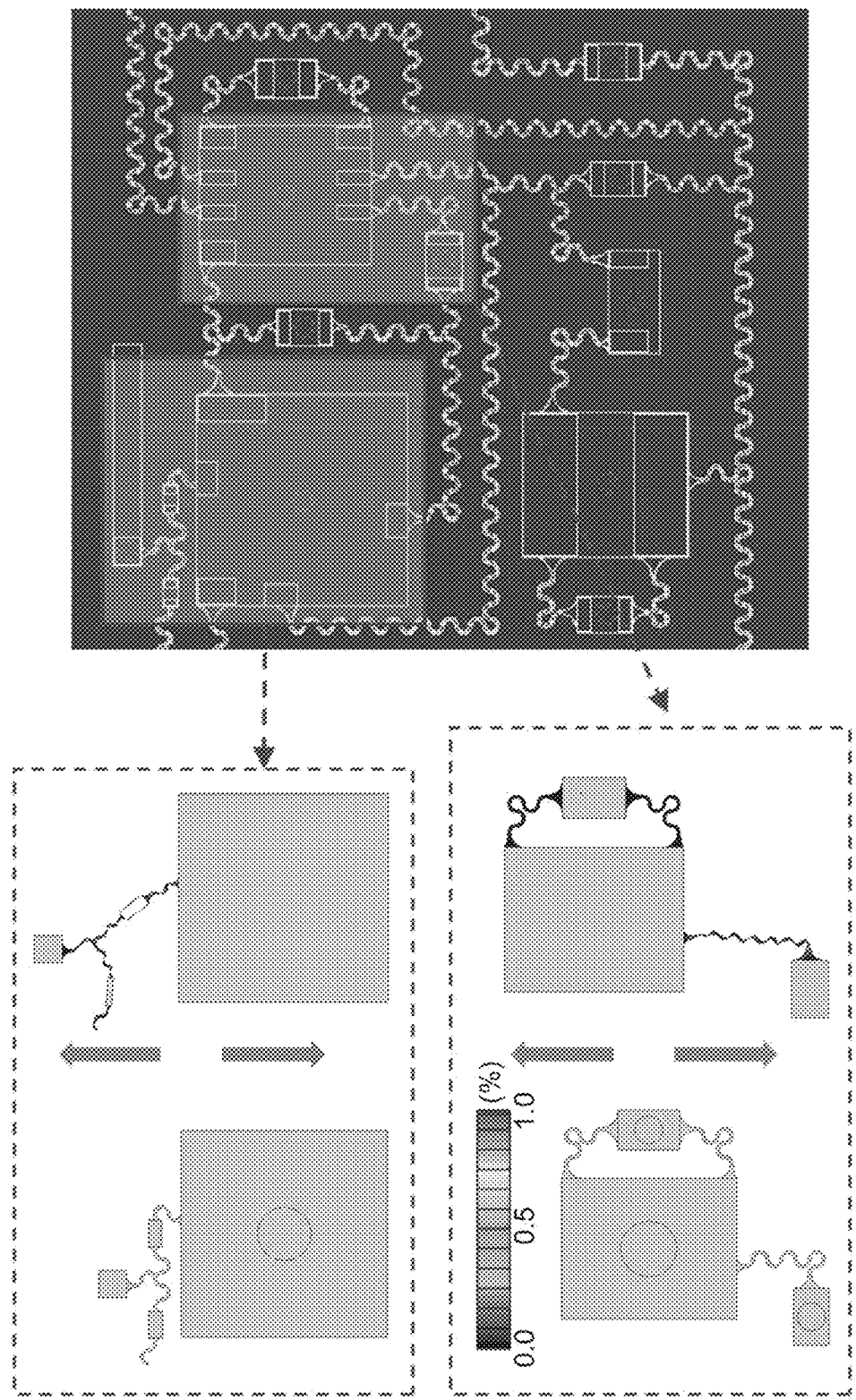

FIG. 40. Schematic diagrams illustrating system level mechanics-vertical.

Figure 41:
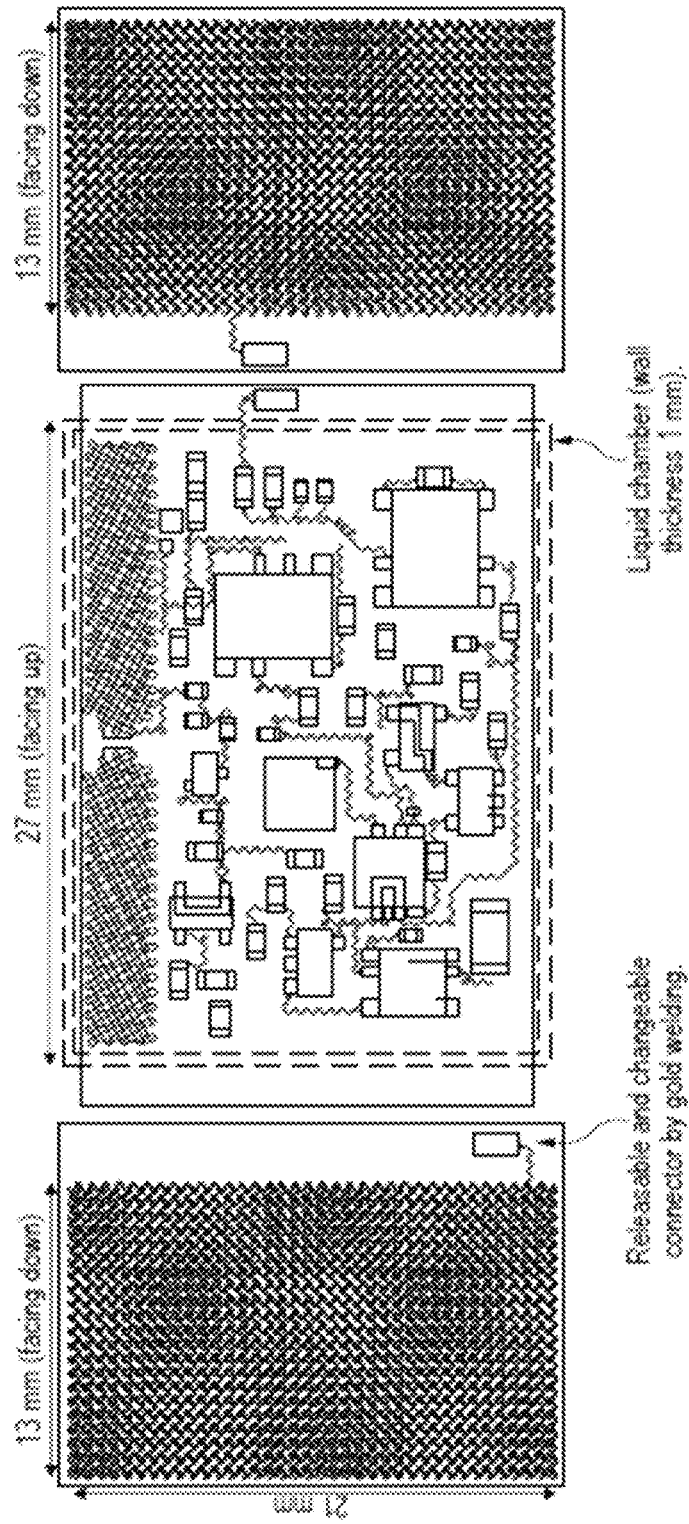

FIG. 41. An advanced multifunctional circuit with liquid chamber.

FIGS. 42A-42B. Mechanically polished commercial off the shelf (COTS) chips using tripod and with reduced thickness.

FIG. 43. Side view of mechanically polished commercial off the shelf (COTS) chips.

Figure 44:
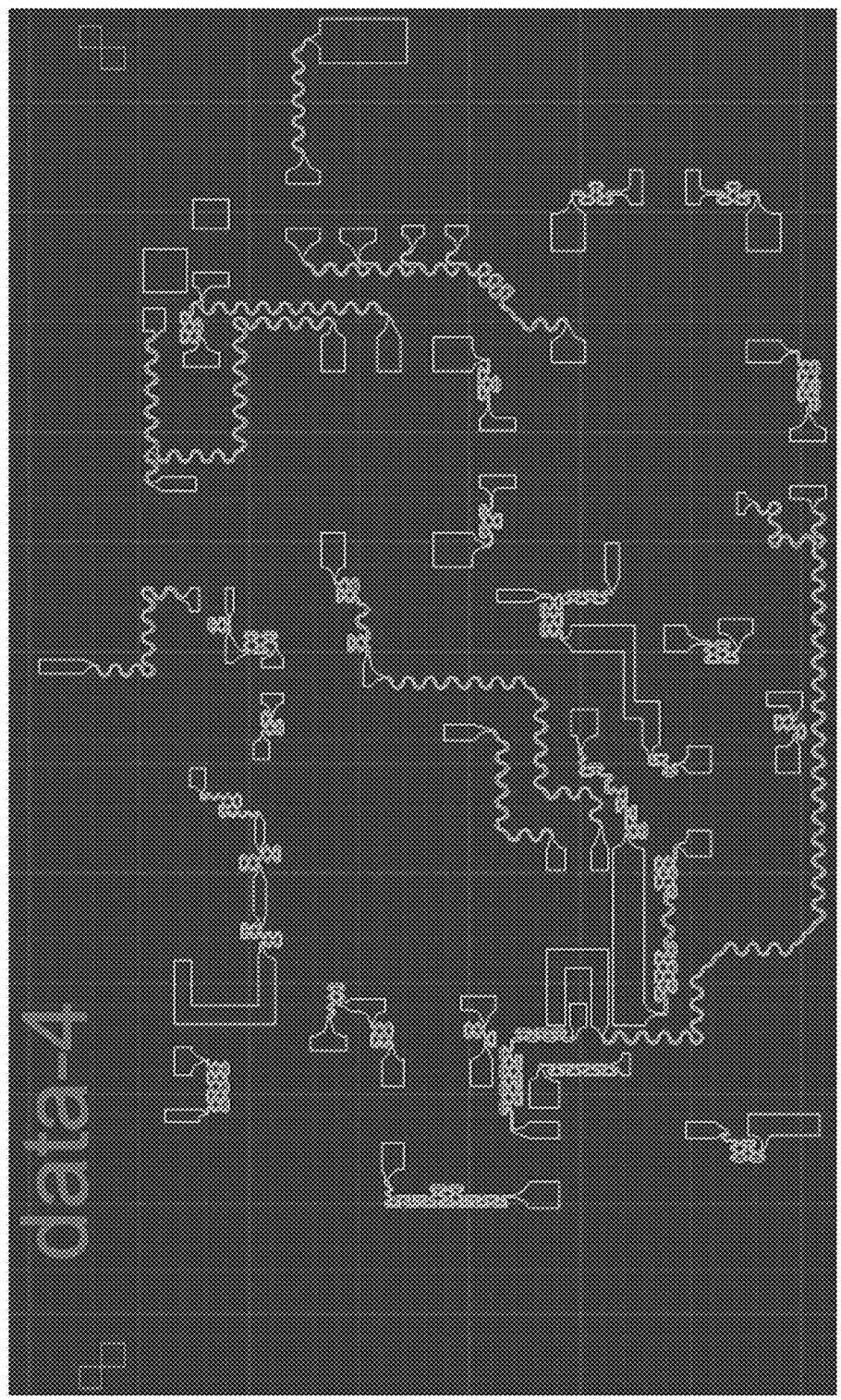

FIG. 44. Illustration of a multilayer—$1^{st}$.

Figure 45:
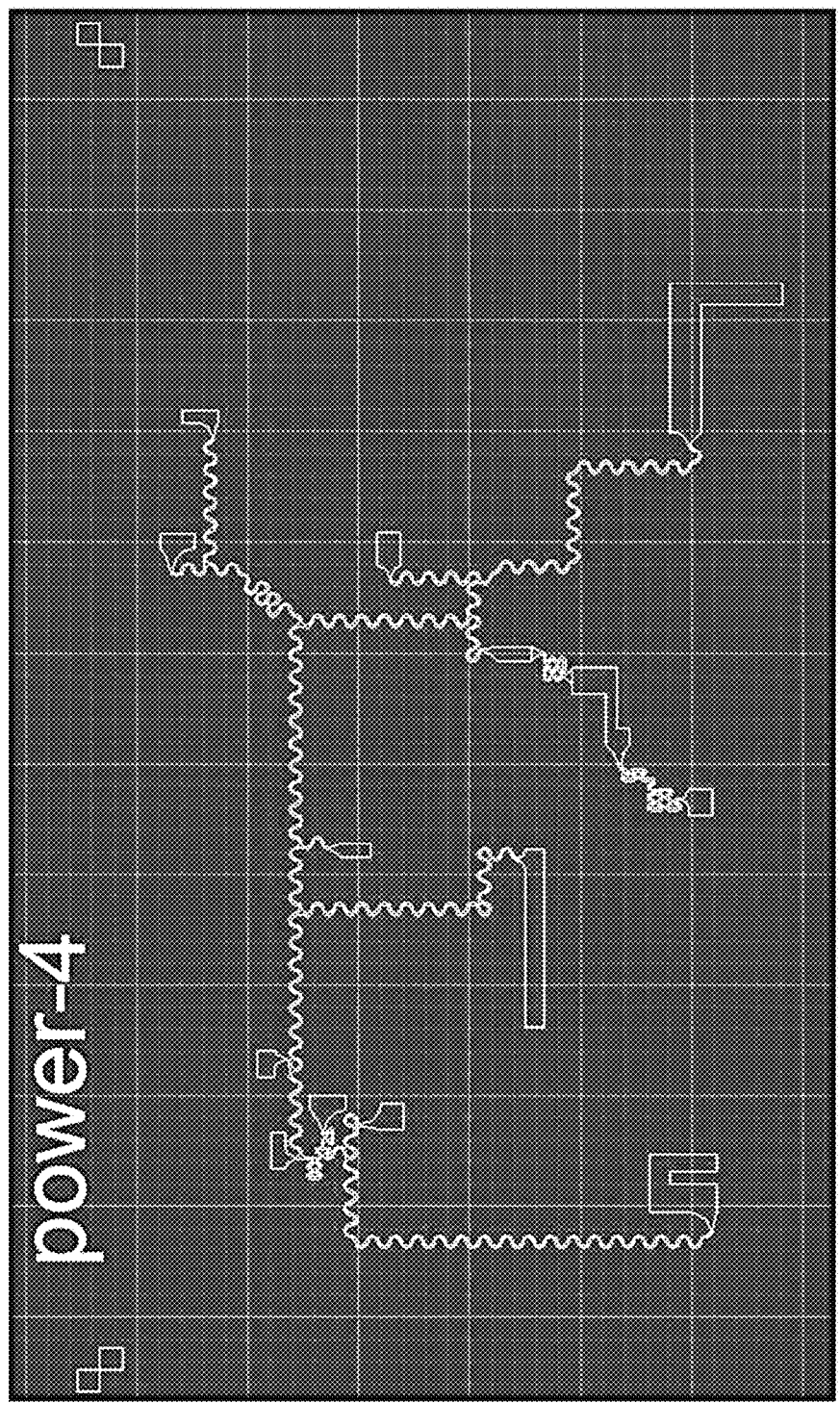

FIG. 45. Illustration of a multilayer—$2^{nd}$.

Figure 46:
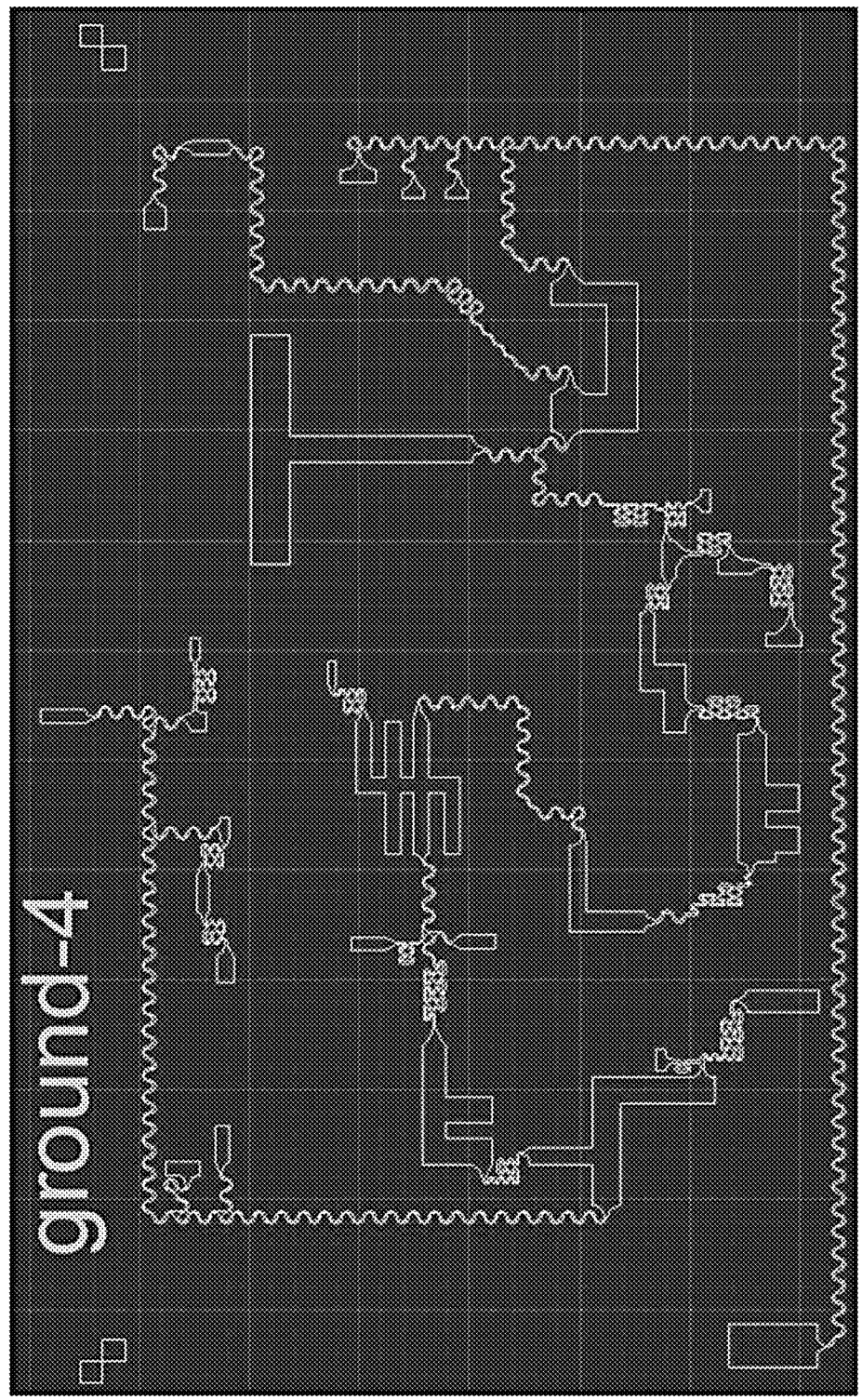

FIG. 46. Illustration of a Multilayer—$3^{rd}$.

Figure 47:
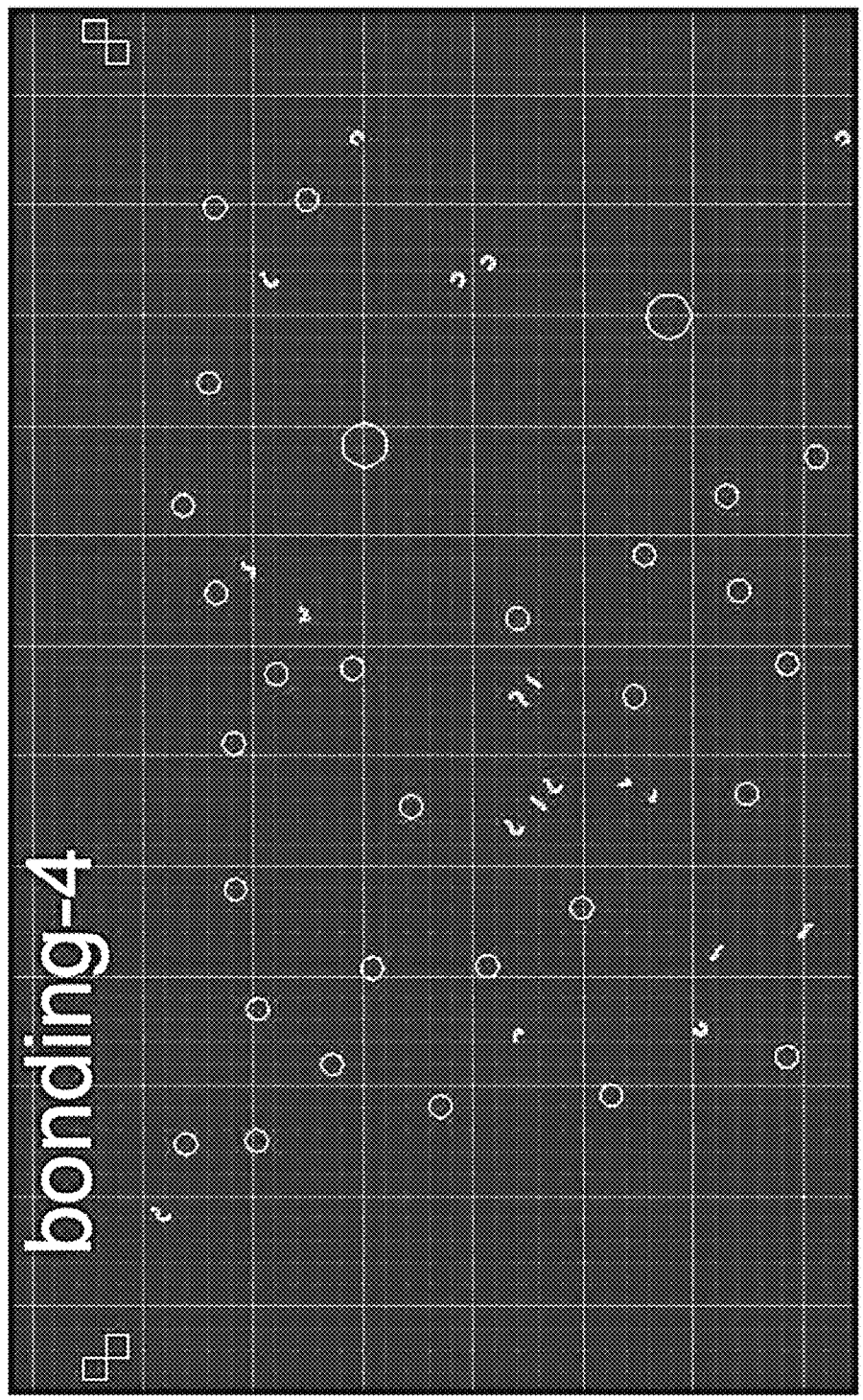

FIG. 47. Illustration of the location of precise selective bonding (1).

Figure 48B:
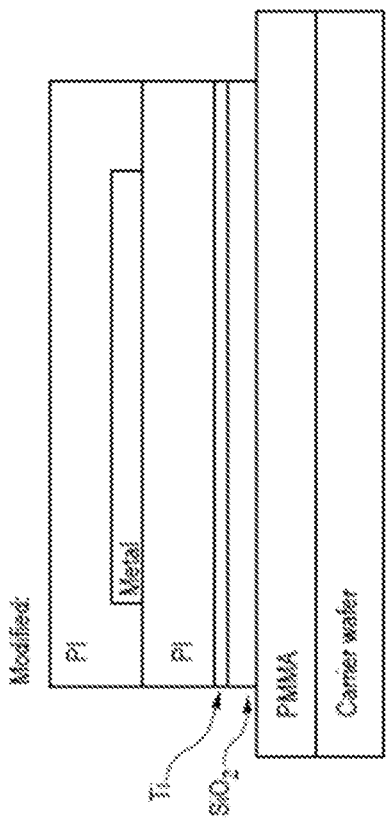
Figure 48A:
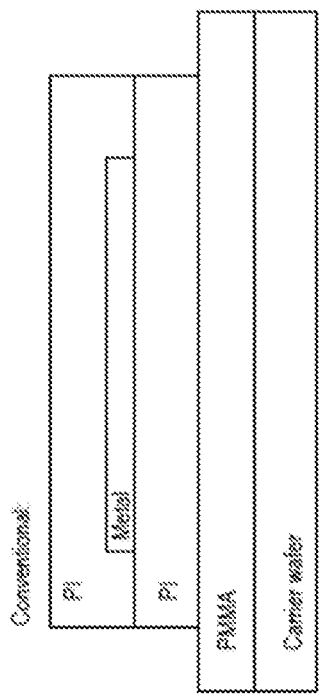

FIG. 48. Illustration of fabrication process of precise selective bonding (2). FIG. 48A shows the conventional process and FIG. 48B shows the modified process.

Figure 49B:
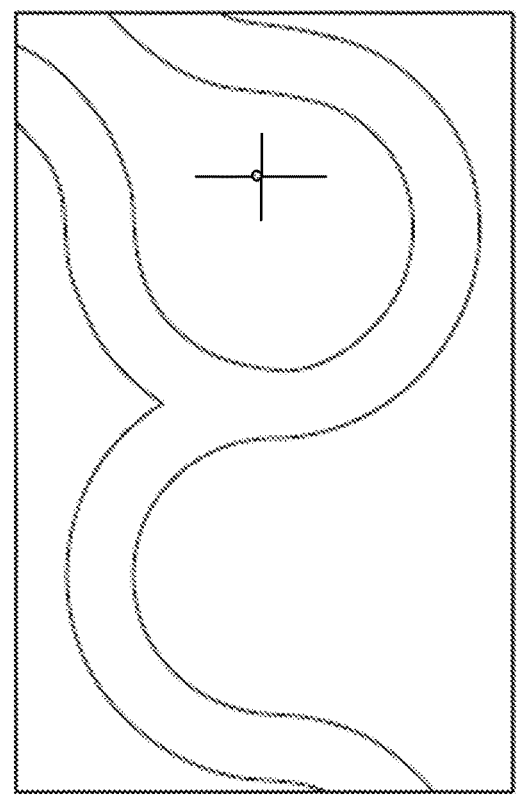
Figure 49A:
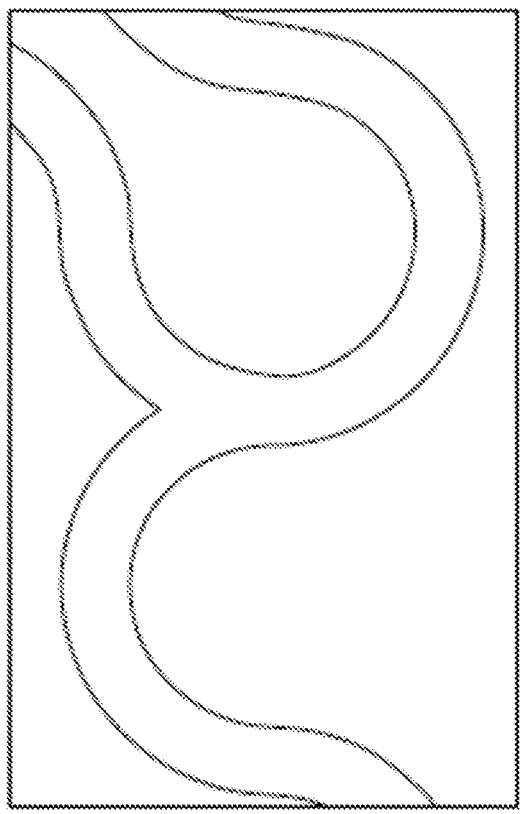

FIGS. 49A-49B. Illustration of reduced sharp corners.

Figure 50:
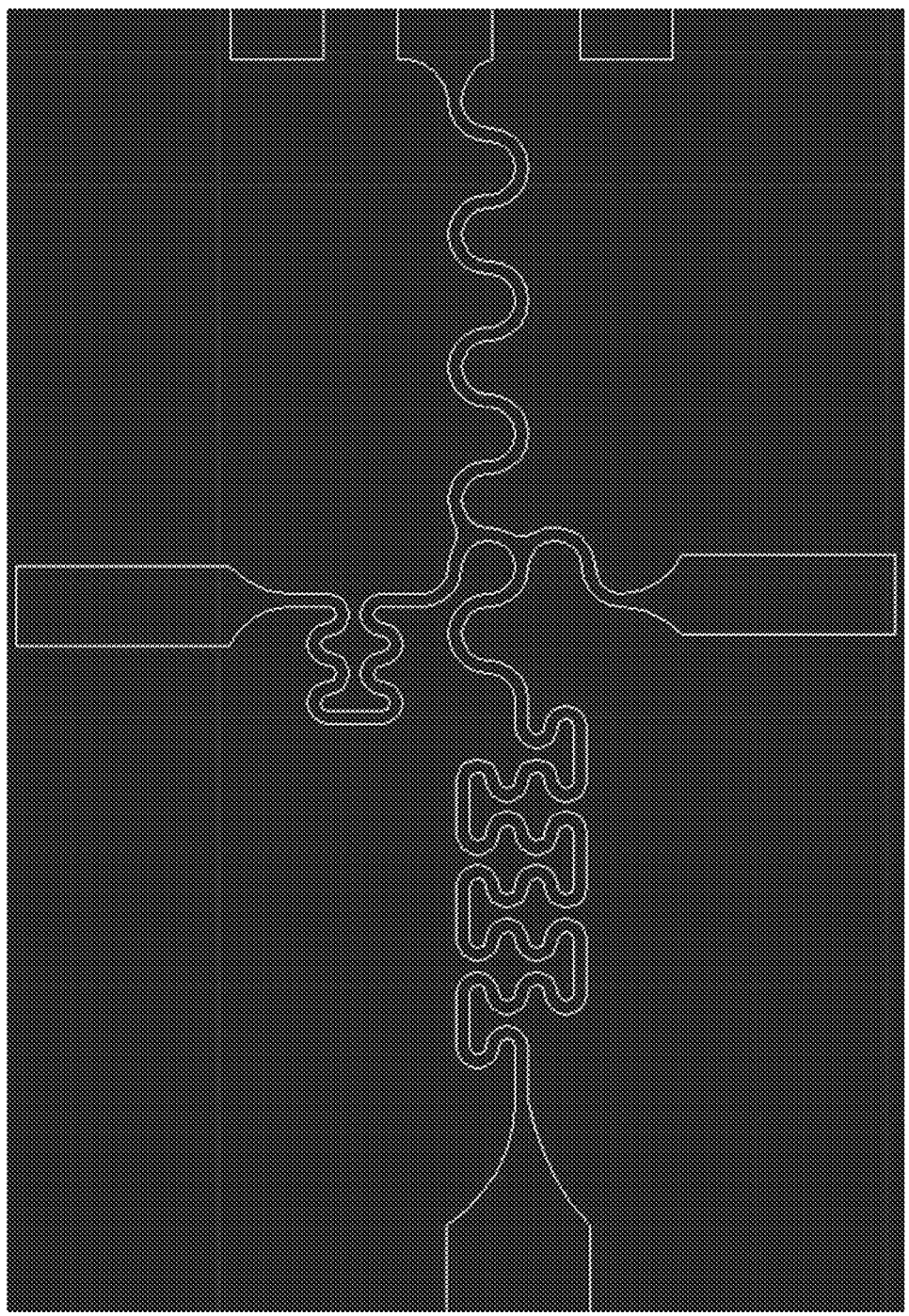

FIG. 50. Illustration of self-similar interconnects.

Figure 51:
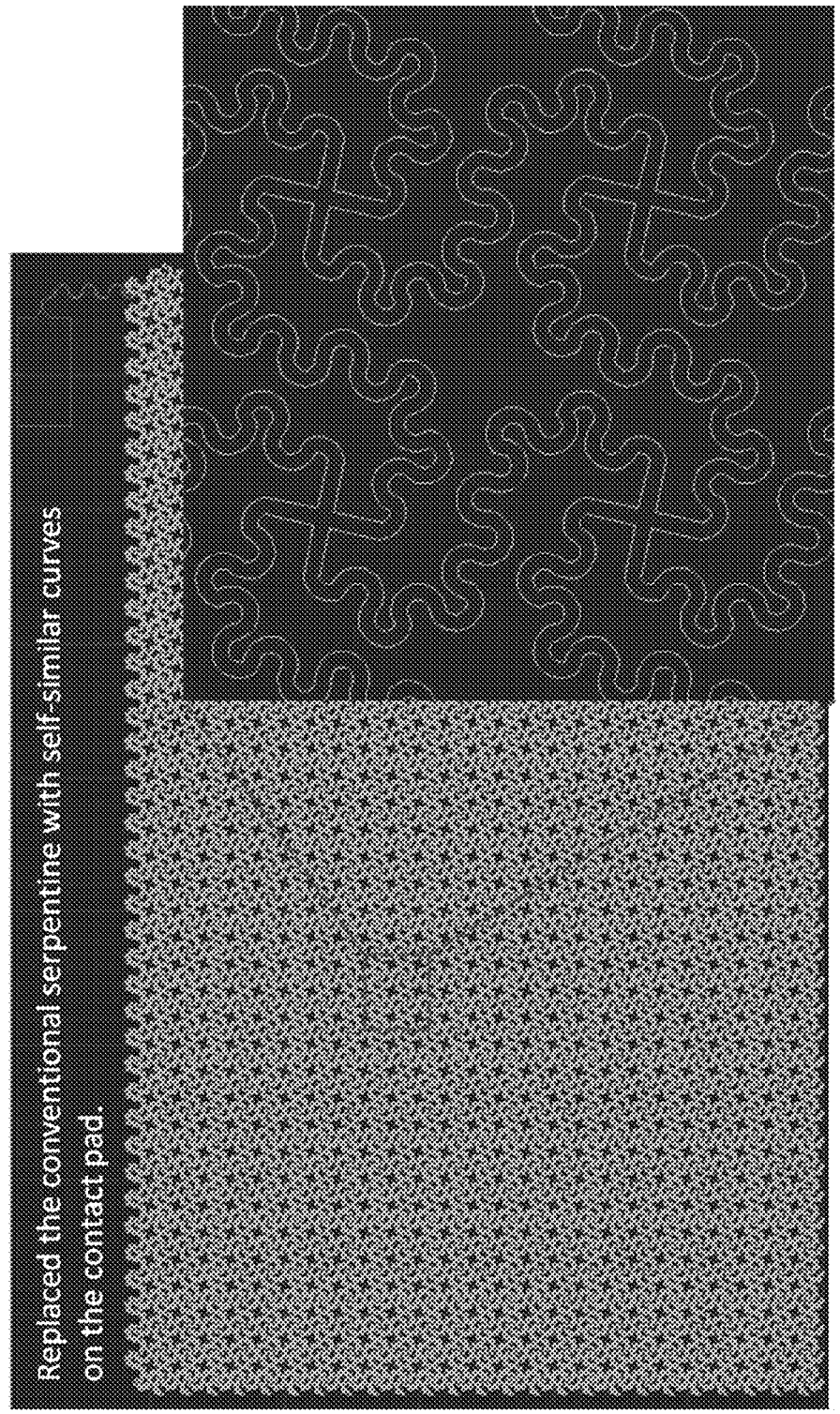

FIG. 51. Illustration of self-similar contact pads.

Figure 52:
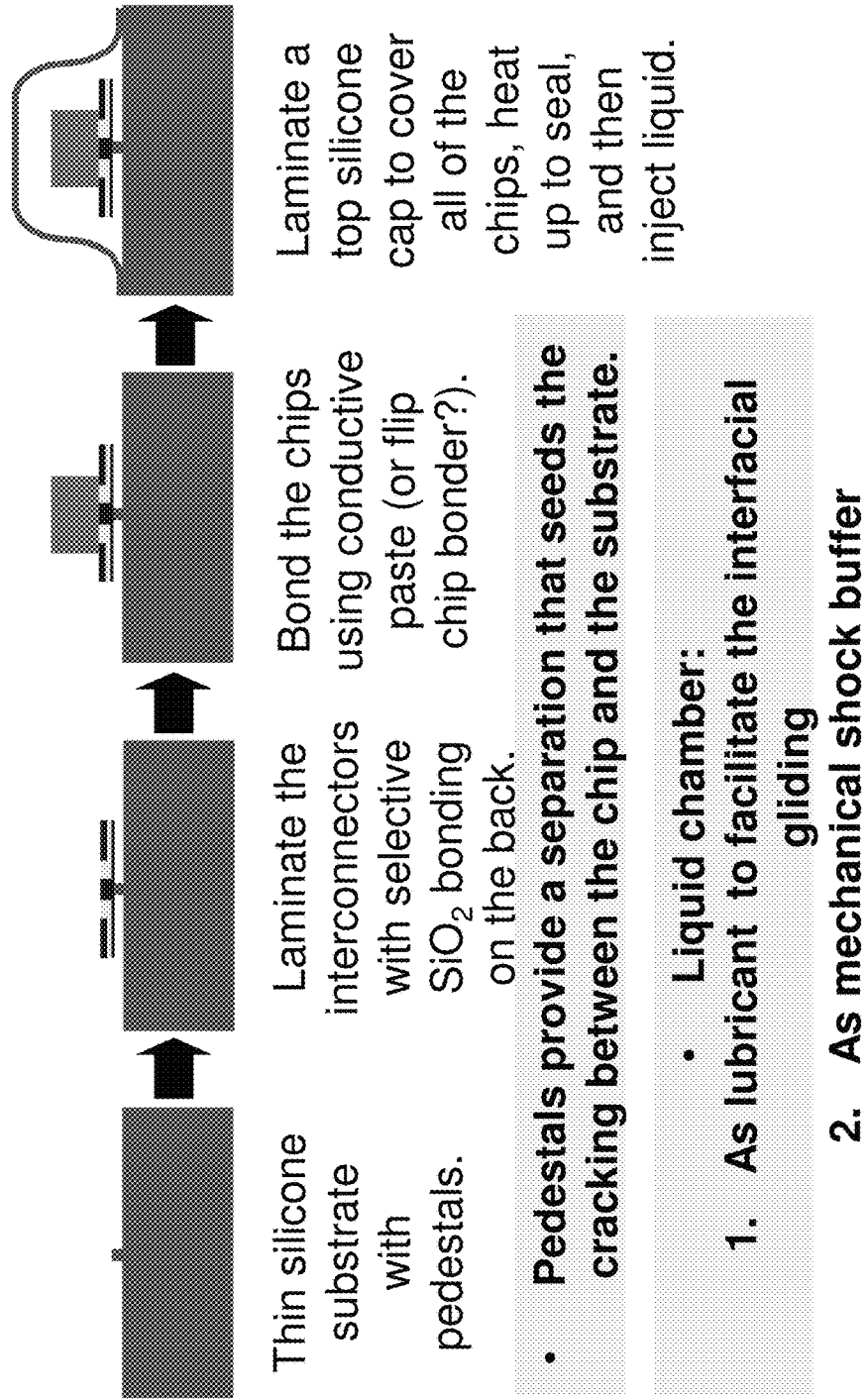

FIG. 52. Exemplary basic fabrication scheme.

FIG. 53. Exemplary basic fabrication scheme.

Figure 54:
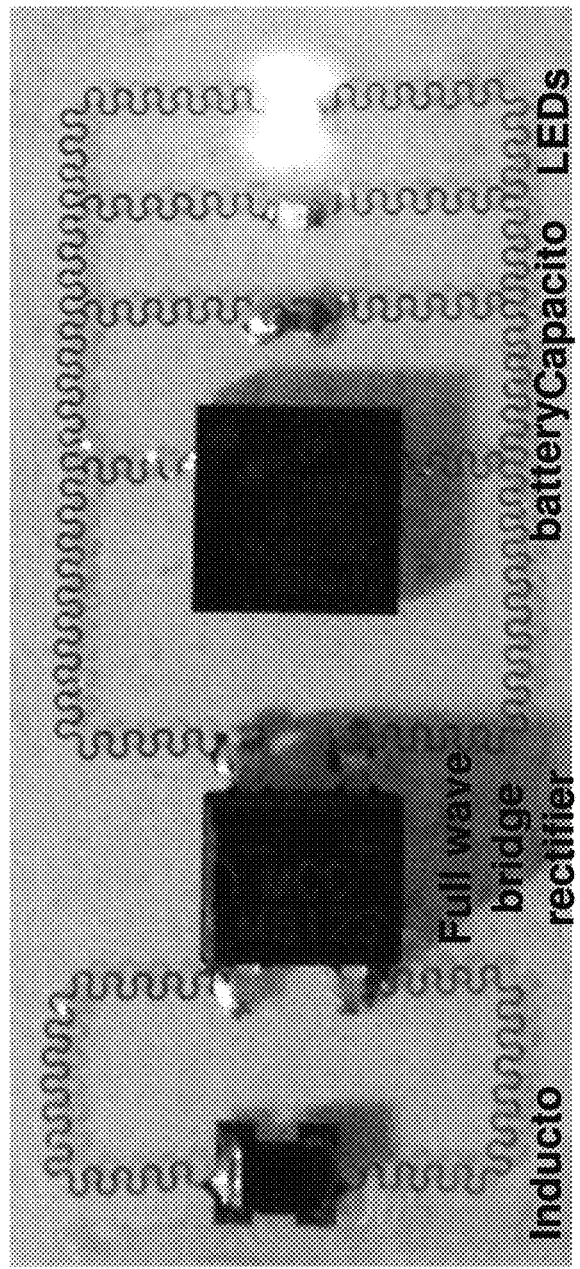

FIG. 54. An example of a wireless power circuit.

Figure 55A:
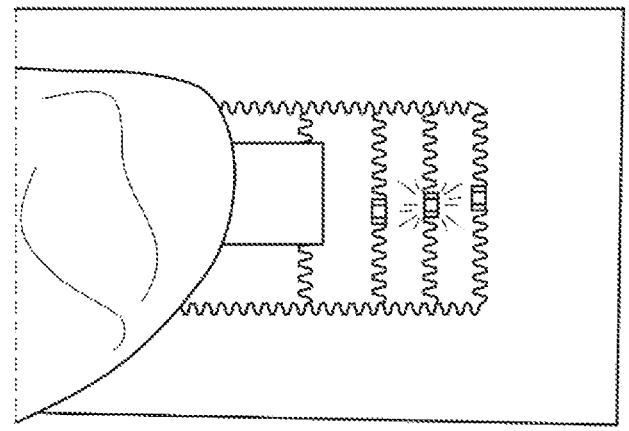
Figure 55B:
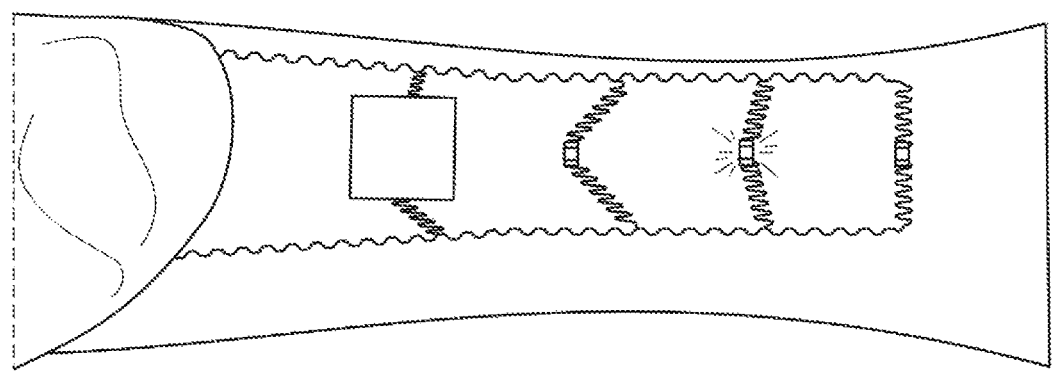

FIGS. 55A-55B. Demonstration of wireless circuit stretching with approximately 100% strechability and fully bonded wires.

Figure 56:
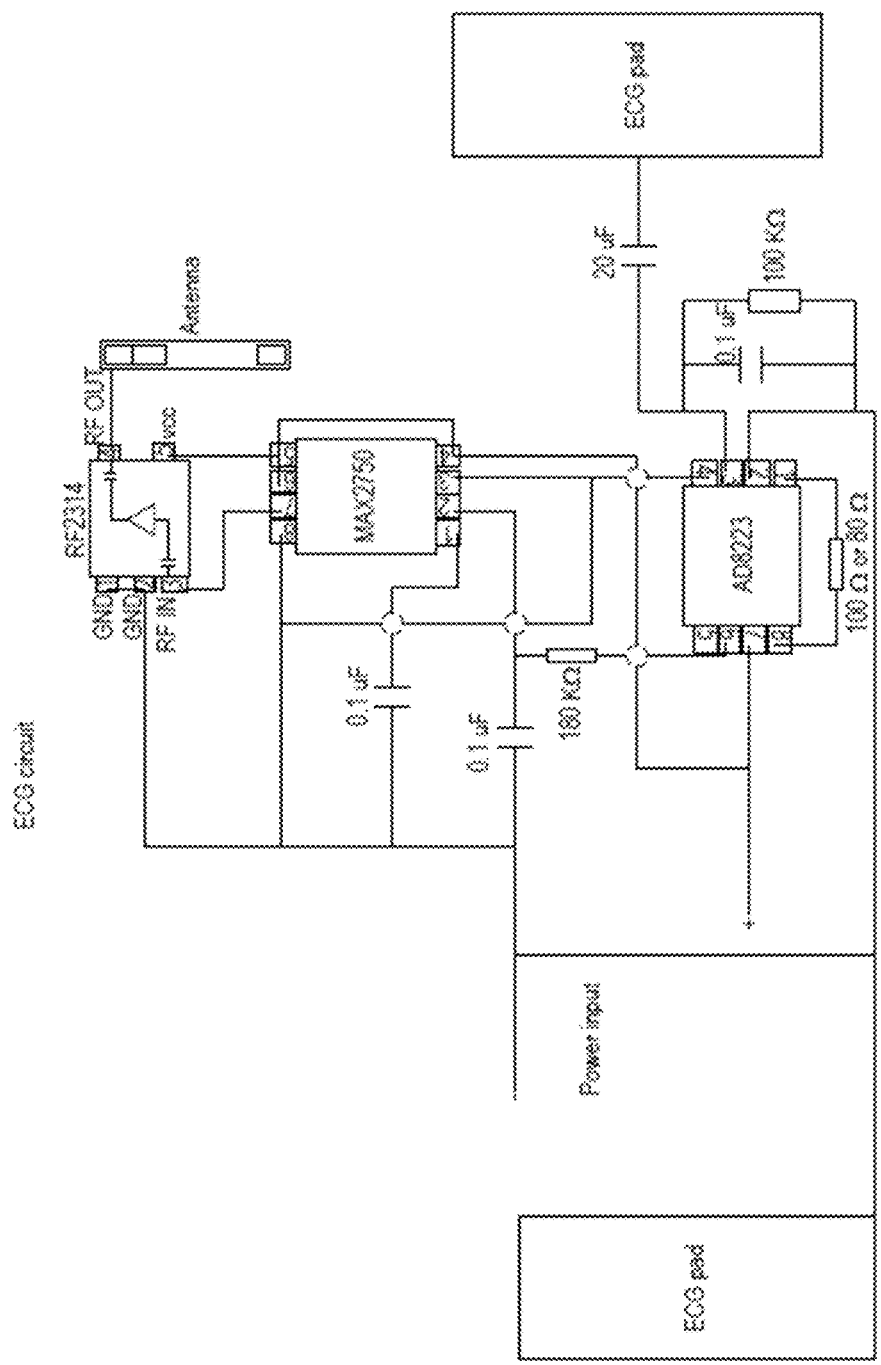

FIG. 56. Exemplary ECG circuit.

FIG. 57. (1)-(3) Illustration of exemplary layout design considerations.

Figure 58:
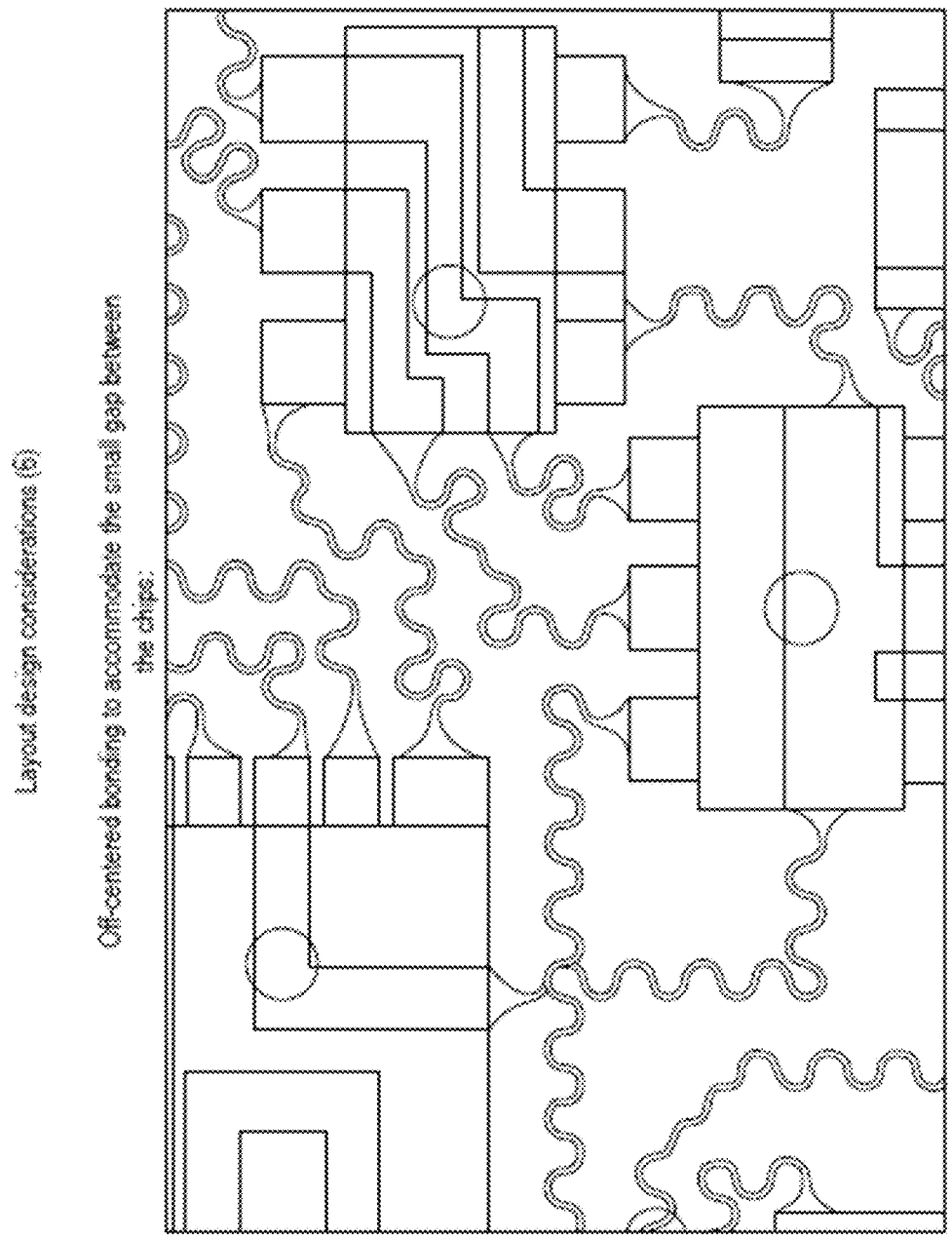

FIG. 58. Illustration of exemplary layout design considerations.

Figure 59:
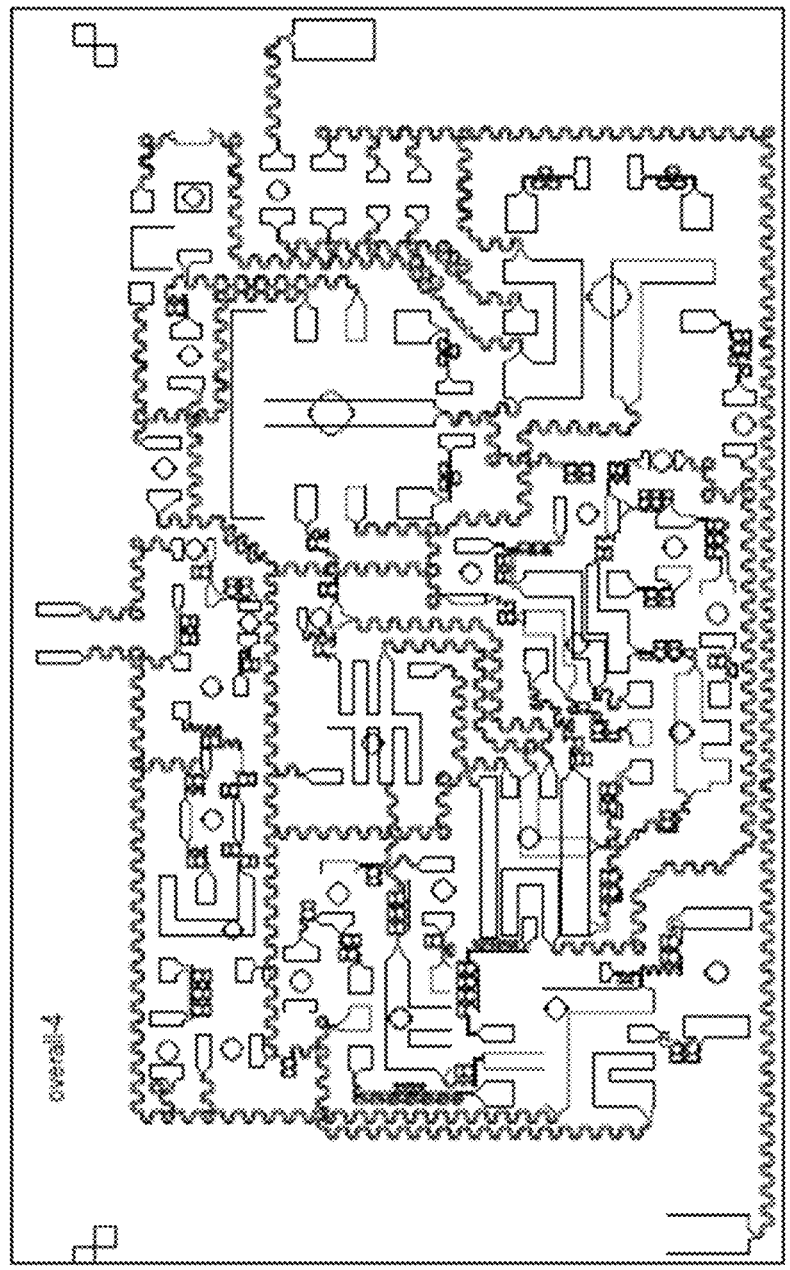

FIG. 59. Illustration of exemplary layout design considerations.

Figure 60A:
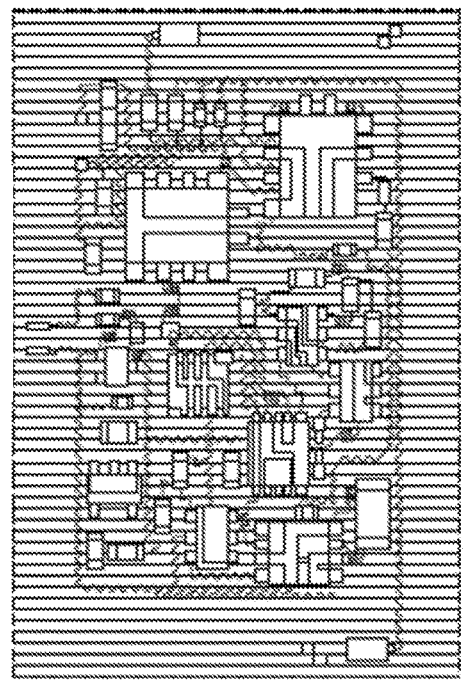
Figure 60C:
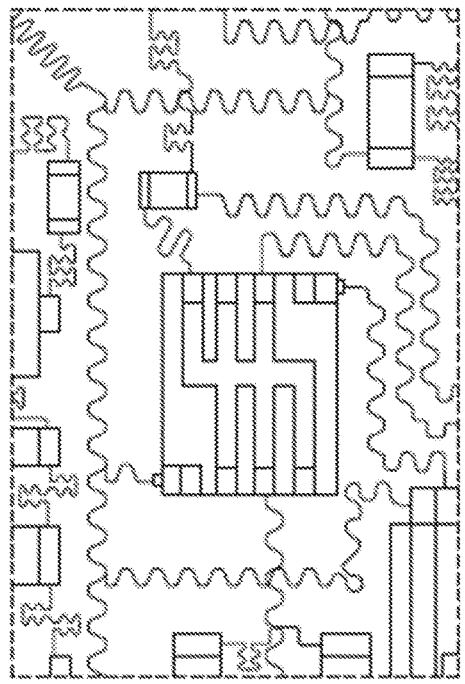
Figure 60B:
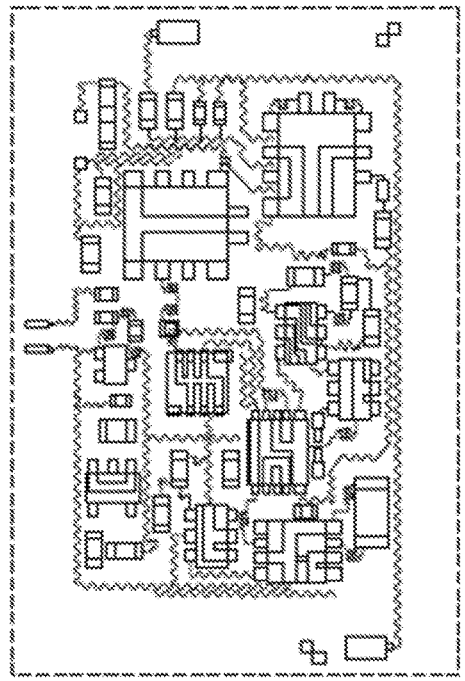

FIGS. 60A-60C. Illustration of exemplary fabricated interconnects.

Figures 61A, 61B:
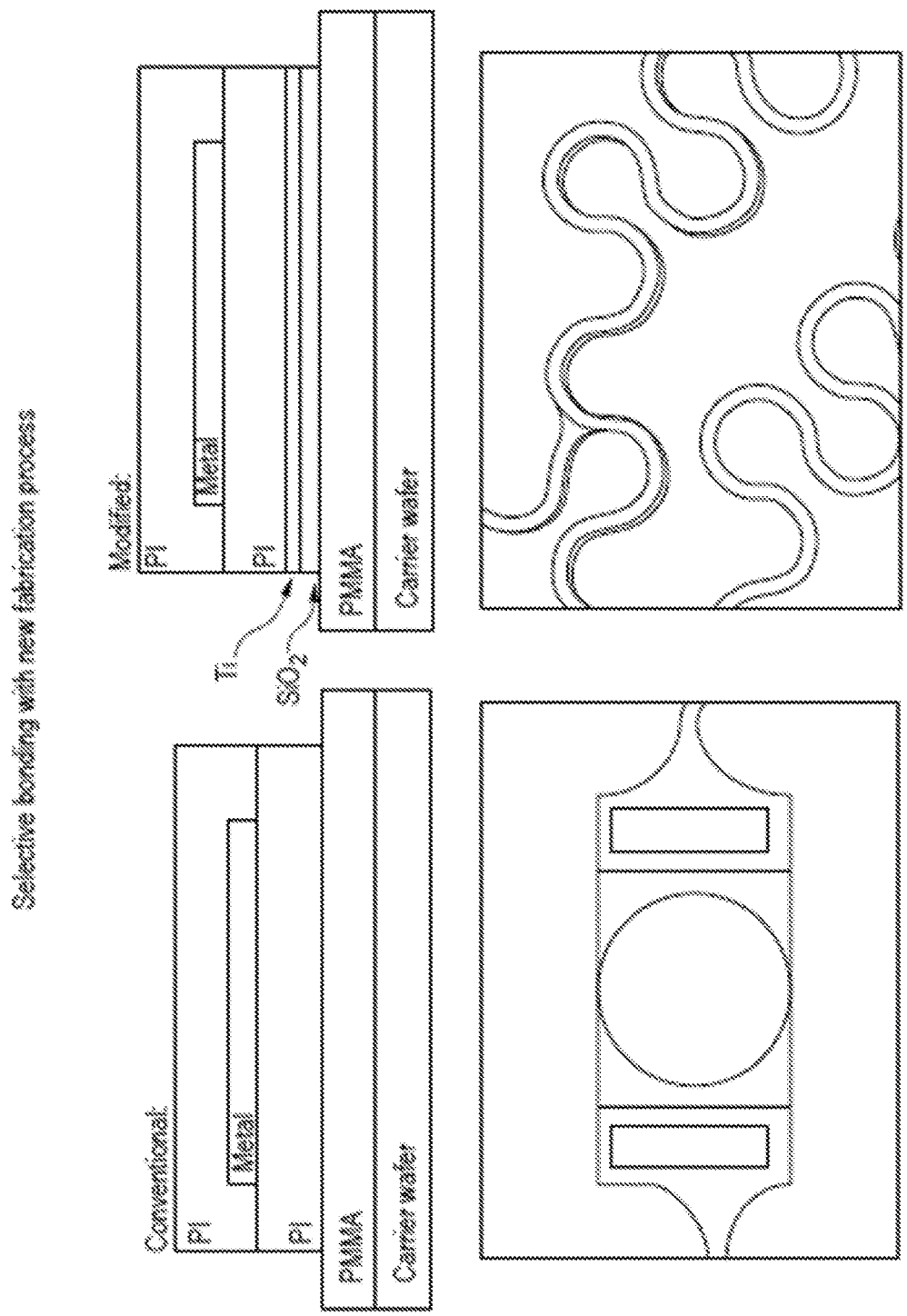

FIGS. 61A-61B. Illustration of selective bonding using a fabrication process. FIG. 61A shows conventional process and FIG. 61B shows modified process.

Figure 62B:
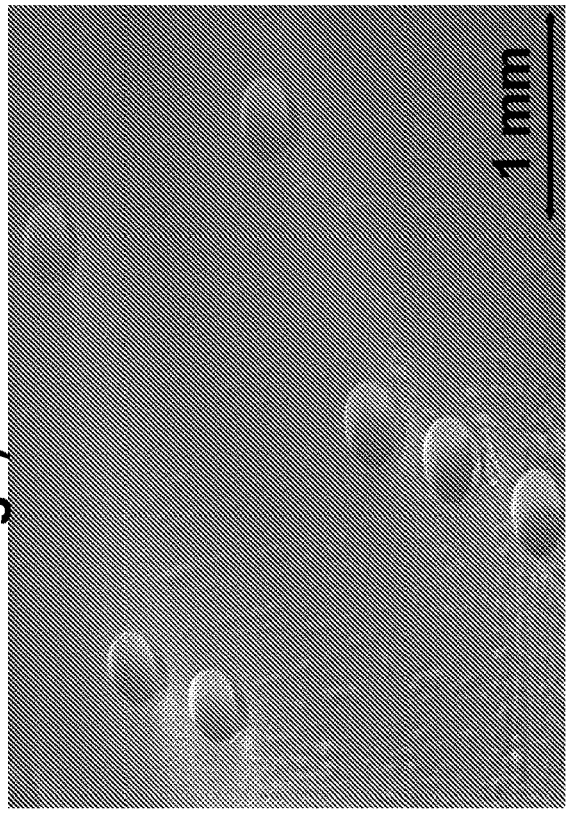
Figure 62A:
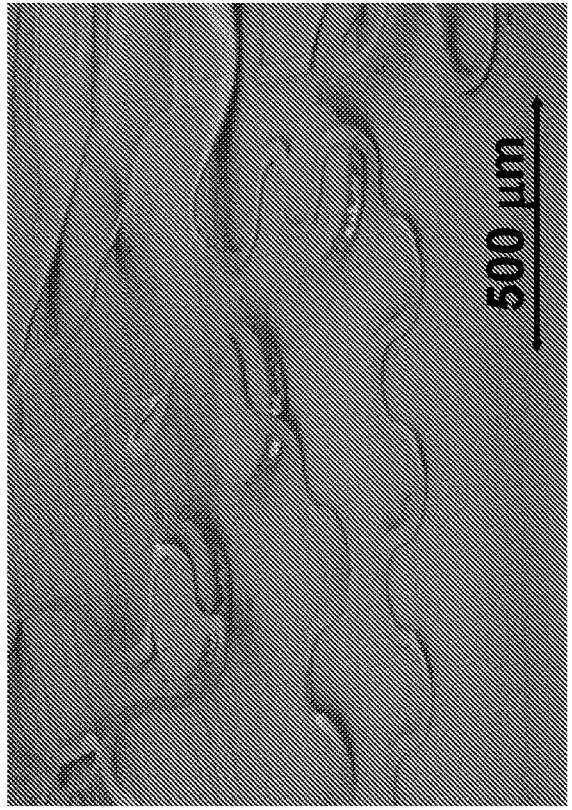

FIGS. 62A-62B. Illustration of device tethered components comprising stretchable electrical interconnects bonded to pedestals.

Figure 63A:
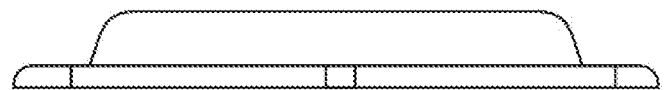
Figure 63B:
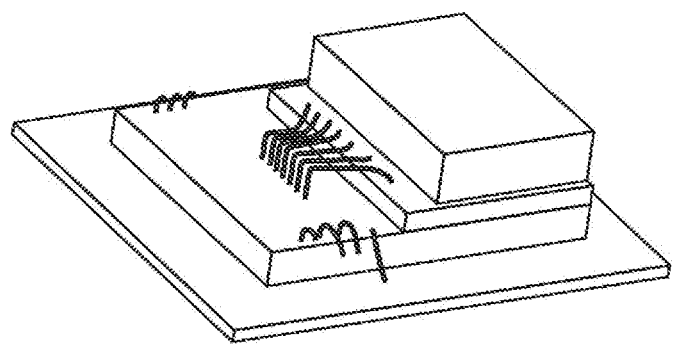

FIGS. 63A-63B. Illustration of chip depackaging. FIG. 63A shows halfly depackaged chip by mechanical polishing and FIG. 63B shows fully depackaged chip by acid etching.

Figure 64A:
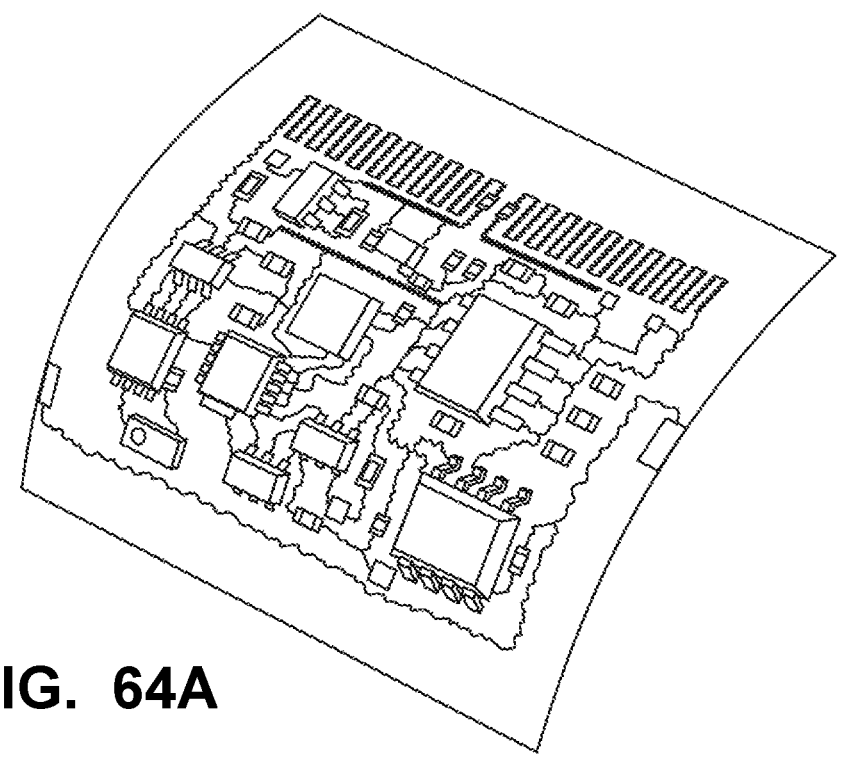
Figure 64B:
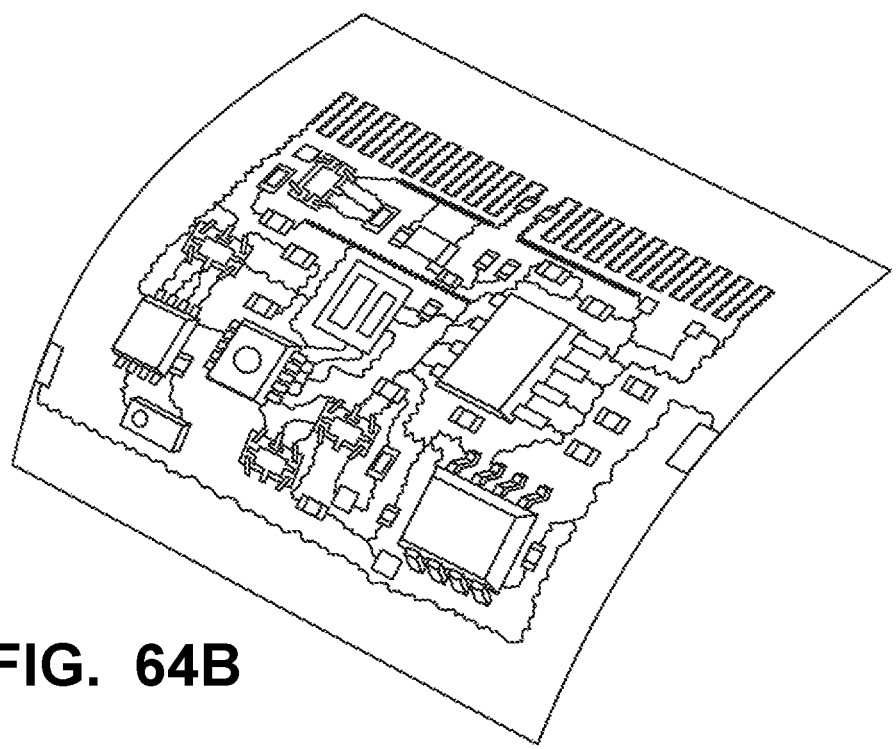
Figure 65A:
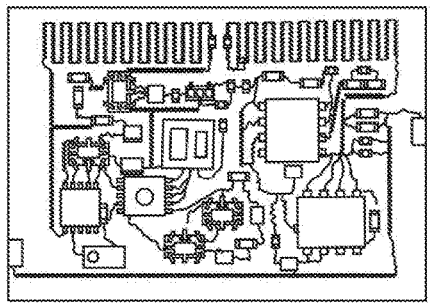
Figure 65B:
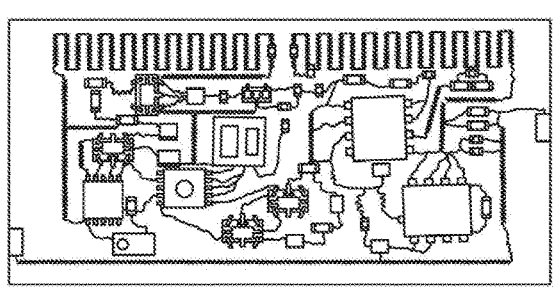
Figure 65C:
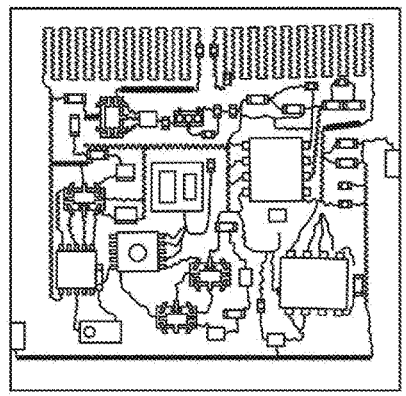
Figure 65D:
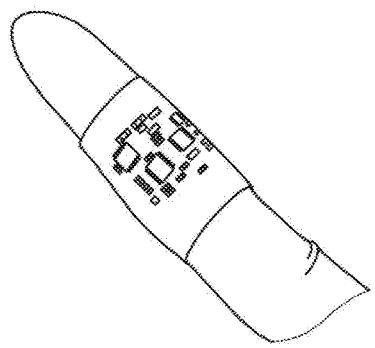

FIGS. 64A-64B. Illustration of a fabricated device. FIG 64A shows the device made of COTS chips (overall thickness ~3 mm) and FIG. 64B shows the device made of depackaged chips (overall thickness ~0.6 mm).

FIGS. 65A-65D. Illustration of stretching and flexing of an electronic device having a smalle bonding area (about 1 mm$^2$) and antisotropic stain distribution: as made (FIG. 64A), horizontal 30% (FIG. 64B), vertical 30% (FIG. 64C) and flexing (radius about 2 cm) (FIG. 64D).

Figure 66:
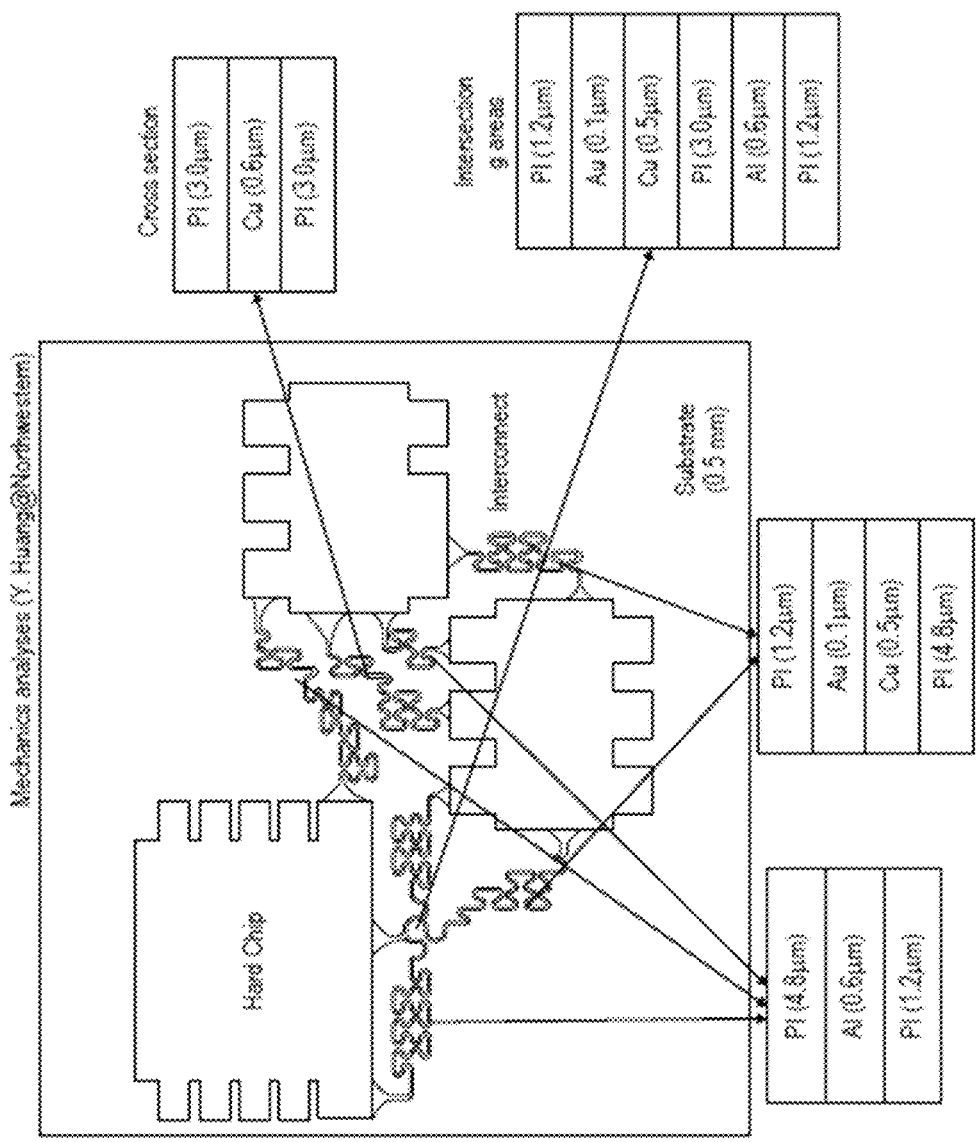

FIG. 66. Exemplary mechanical analyses.

Figure 67:
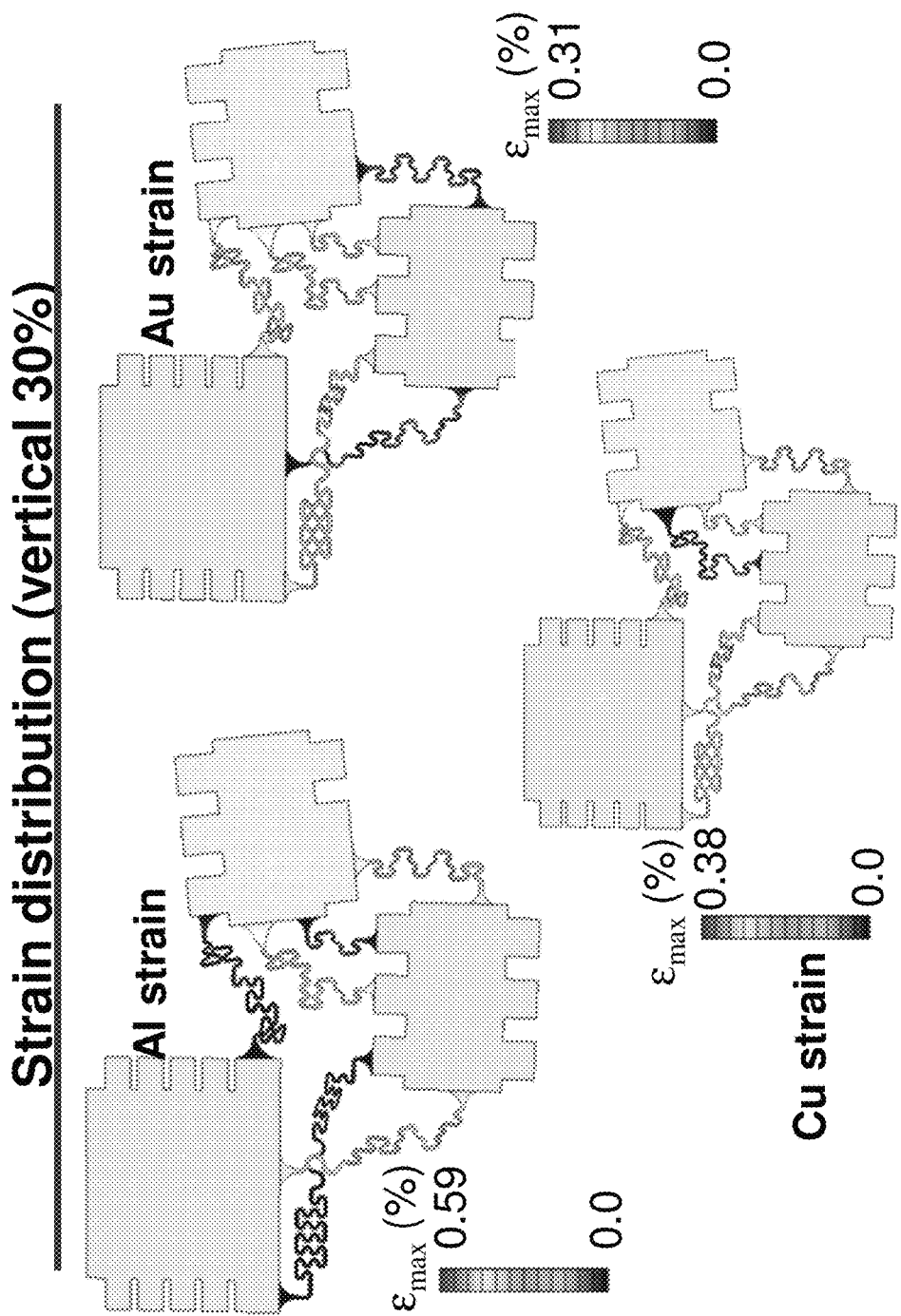

FIG. 67. Illustration of strain distribution.

Figure 68:
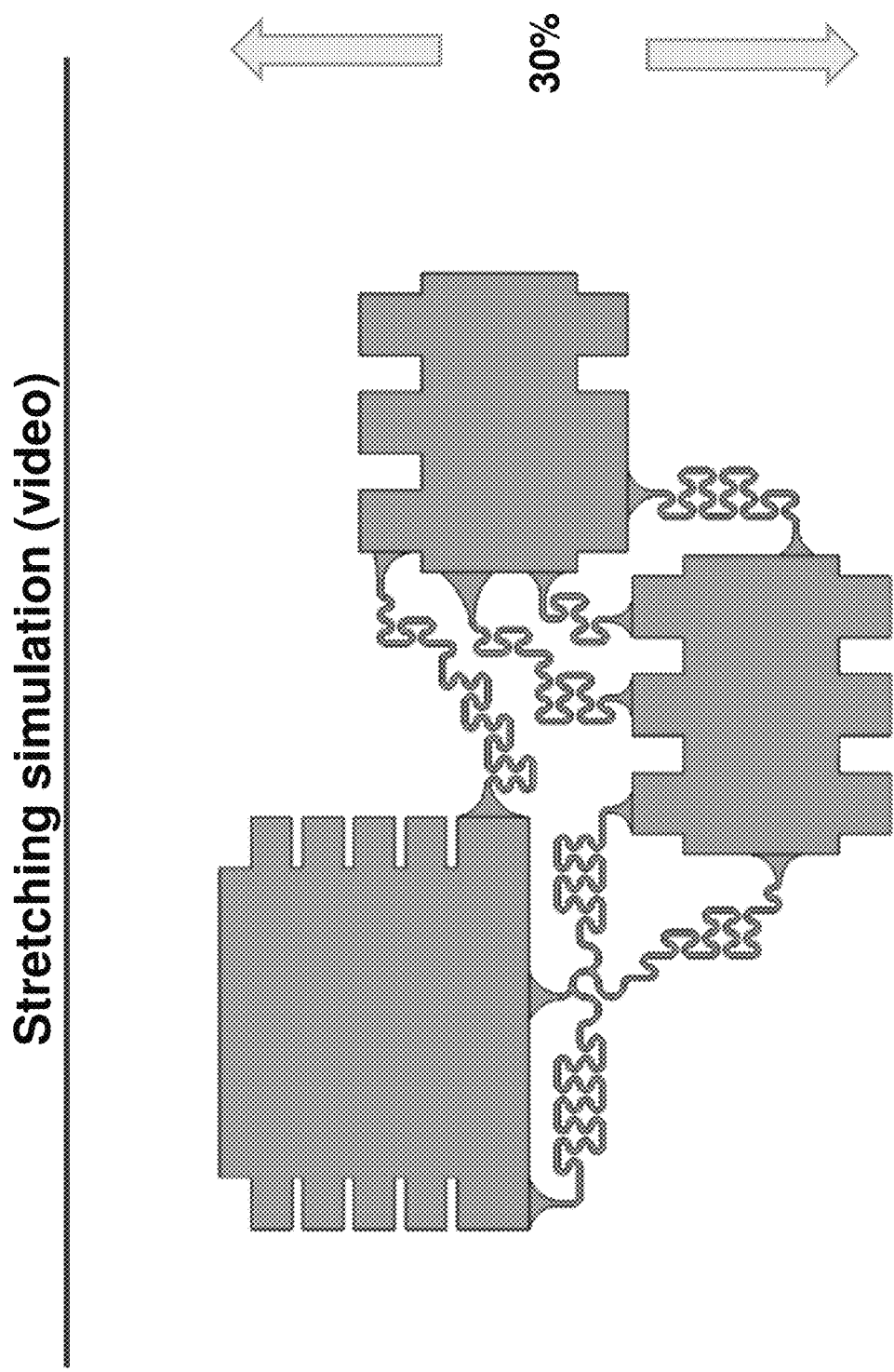

FIG. 68. Schematic illustration of stretching simulations.

Figure 69:
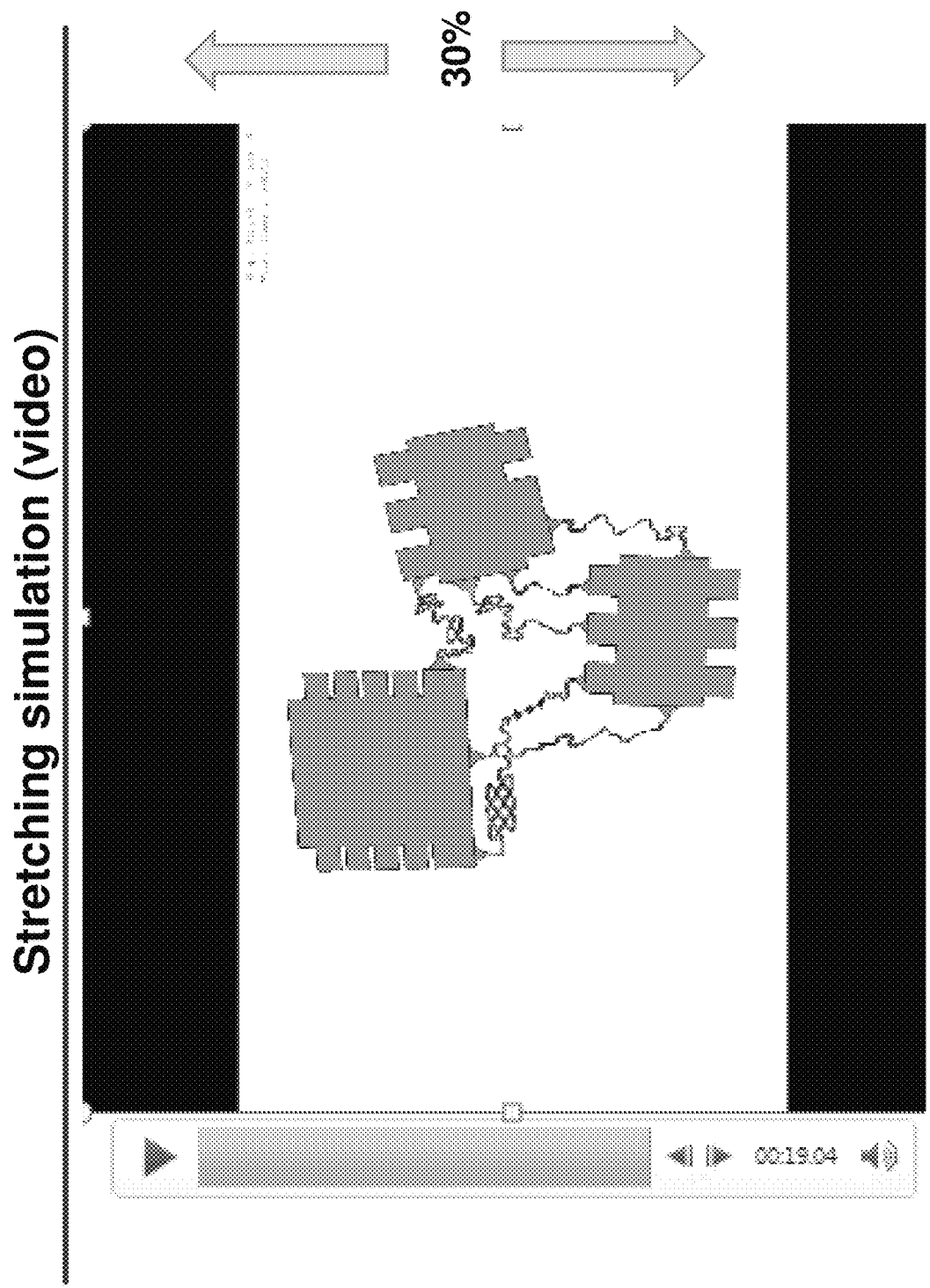

FIG. 69. Schematic illustration of stretching simulations.

Figure 70K:
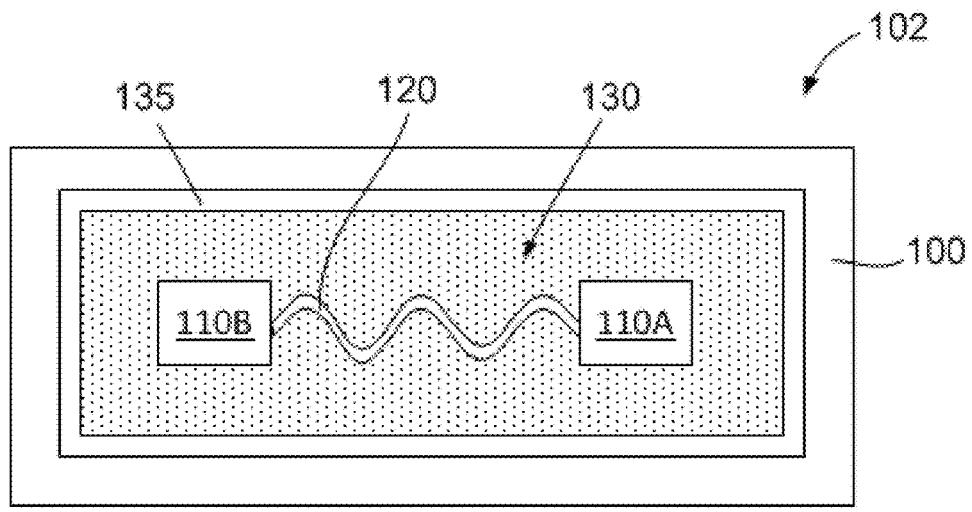
Figure 70L:
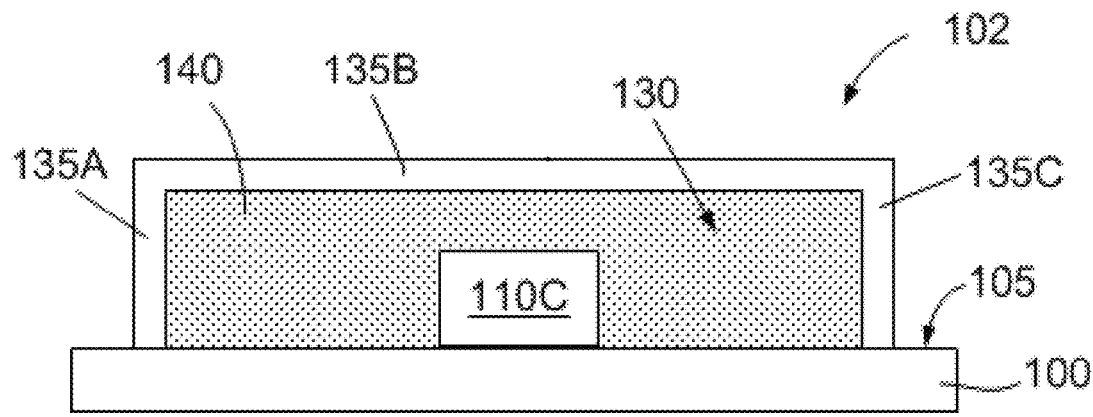
Figure 70M:
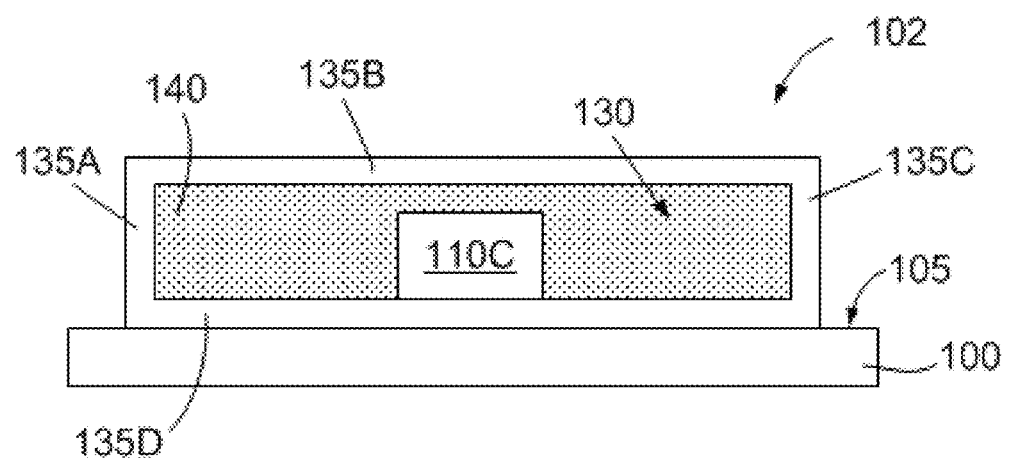
Figure 70N:
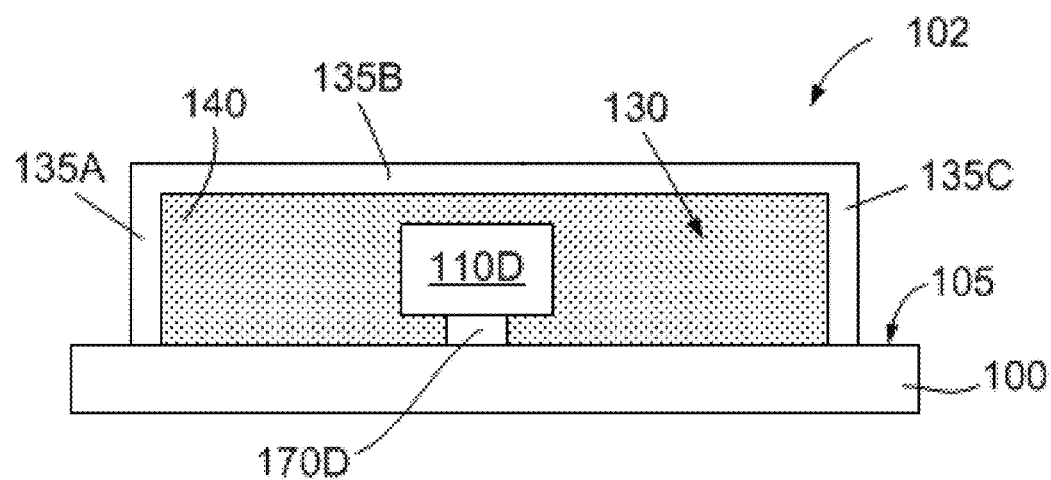
Figure 70O:
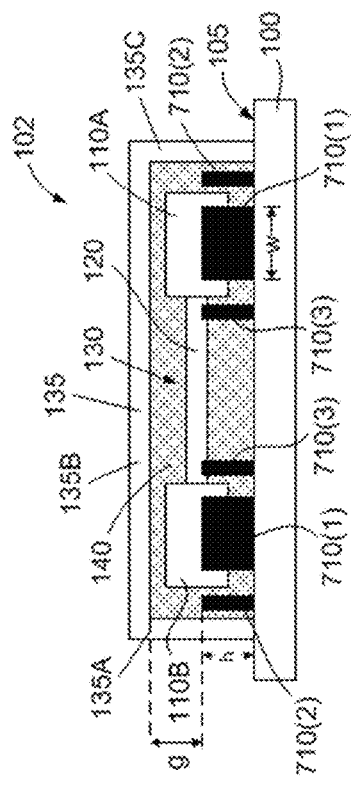
Figure 70P:
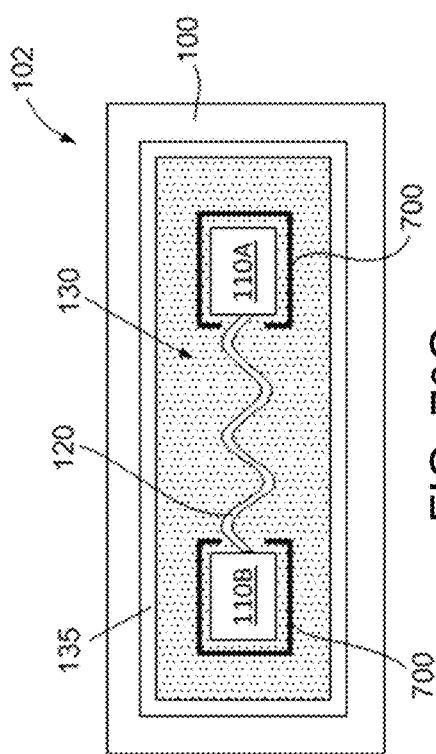
Figure 70Q:
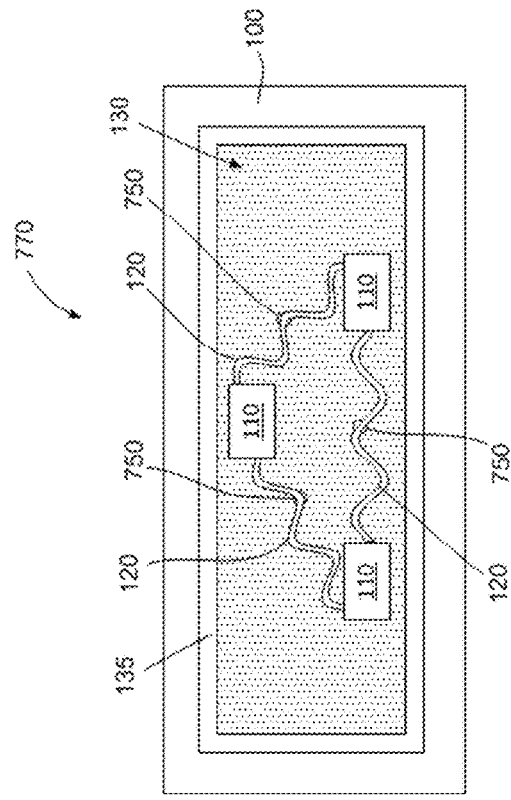

FIGS. 70A-70Q. Schematic illustrations of multiple embodiments of electronic devices and/or device components within fluid containment chambers, according to multiple embodiments of the present invention.

Figure 71:
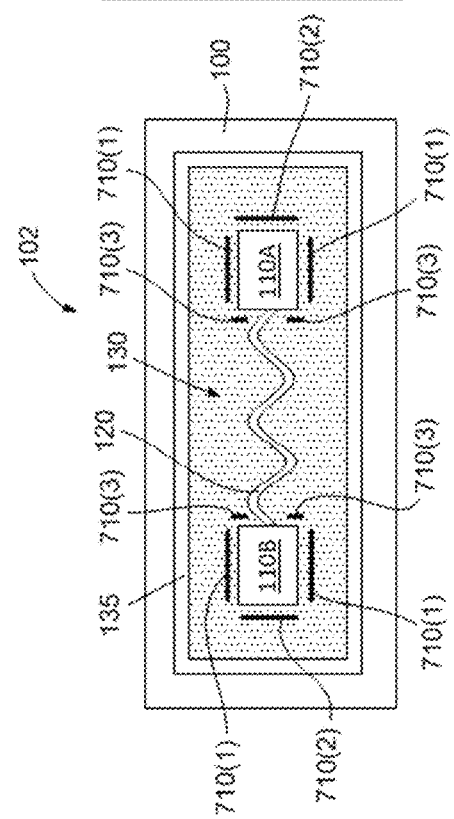

FIG. 71. Schematic illustration of an embodiment of an electronic device having device components that are selectively bonded (directly or indirectly) to a substrate, according to an embodiment of the present invention.

DETAILED DESCRIPTION OF THE INVENTION

In general, the terms and phrases used herein have their art-recognized meaning, which can be found by reference to standard texts, journal references and contexts known to those skilled in the art. The following definitions are provided to clarify their specific use in the context of the invention.

"Functional layer" refers to a layer that imparts some functionality to the device. For example, the functional layer may contain semiconductor components. Alternatively, the functional layer may comprise multiple layers, such as multiple semiconductor layers separated by support layers. The functional layer may comprise a plurality of patterned elements, such as interconnects running between or below electrodes or islands. The functional layer may be homogeneous or may have one or more properties or materials that are inhomogeneous. "Inhomogeneous property" refers to a physical parameter that can spatially vary, thereby effecting the position of the neutral mechanical plane within a multilayer device.

"Structural layer" refers to a layer that imparts structural functionality, for example by supporting and/or encapsulating and/or partitioning device components.

"Semiconductor" refers to any material that is an insulator at a very low temperature, but which has an appreciable electrical conductivity at a temperature of about 300 Kelvin. In the present description, use of the term semiconductor is intended to be consistent with use of this term in the art of microelectronics and electronic devices. Useful semiconductors include those comprising elemental semiconductors, such as silicon, germanium and diamond, and compound semiconductors, such as group IV compound semiconductors such as SiC and SiGe, group III-V semiconductors such as AlSb, AlAs, AlN, AlP, BN, BP, BAs, GaSb, GaAs, GaN, GaP, InSb, InAs, InN, and InP, group III-V ternary semiconductors such as $Al_xGa_{1-x}As$, group II-VI semiconductors such as CsSe, CdS, CdTe, ZnO, ZnSe, ZnS, and ZnTe, group I-VII semiconductors such as CuCl, group IV-VI semiconductors such as PbS, PbTe, and SnS, layer semiconductors such as $PbI_2$, $MoS_2$, and GaSe, and oxide semiconductors such as CuO and $Cu_2O$. The term semiconductor includes intrinsic semiconductors and extrinsic semiconductors that are doped with one or more selected materials, including semiconductors having p-type doping materials and n-type doping materials, to provide beneficial electronic properties useful for a given application or device. The term semiconductor includes composite materials comprising a mixture of semiconductors and/or dopants. Specific semiconductor materials useful for some embodiments include, but are not limited to, Si, Ge, Se, diamond, fullerenes, SiC, SiGe, SiO, $SiO_2$, SiN, AlSb, AlAs, AlIn, AlN, AlP, AlS, BN, BP, BAs, $As_2S_3$, GaSb, GaAs, GaN, GaP, GaSe, InSb, InAs, InN, InP, CsSe, CdS, CdSe, CdTe, $Cd_3P_2$, $Cd_3As_2$, $Cd_3Sb_2$, ZnO, ZnSe, ZnS, ZnTe, $Zn_3P_2$, $Zn_3As_2$, $Zn_3Sb_2$, $ZnSiP_2$, CuCl, PbS, PbSe, PbTe, FeO, $FeS_2$, NiO, EuO, EuS, PtSi, TlBr, $CrBr_3$, SnS, SnTe, $PbI_2$, $MoS_2$, GaSe, CuO, $Cu_2O$, HgS, HgSe, HgTe, $HgI_2$, MgS, MgSe, MgTe, CaS, CaSe, SrS, SrTe, BaS, BaSe, BaTe, $SnO_2$, TiO, $TiO_2$, $Bi_2S_3$, $Bi_2O_3$, $Bi_2Te_3$, $BiI_3$, $UO_2$, $UO_3$, $AgGaS_2$, PbMnTe, $BaTiO_3$, $SrTiO_3$, $LiNbO_3$, $La_2CuO_4$, $La_{0.7}Ca_{0.3}MnO_3$, CdZnTe, CdMnTe, $CuInSe_2$, copper indium gallium selenide (CIGS), HgCdTe, HgZnTe, HgZnSe, PbSnTe, $Tl_2SnTe_5$, $Tl_2GeTe_5$, AlGaAs, AlGaN, AlGaP, AlInAs, AlInSb, AlInN, AlInAsP, AlGaAsN, GaAsP, GaAsN, GaMnAs, GaAsSbN, GaInAs, GaInP, AlGaAsSb, AlGaAsP, AlGaInP, GaInAsP, InGaAs, InGaP, InGaN, InAsSb, InGaSb, InMnAs, InGaAsP, InGaAsN, InAlAsN, GaInNAsSb, GaInAsSbP, and any combination of these. Porous silicon semiconductor materials are useful for aspects described herein. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

A "semiconductor component" broadly refers to any semiconductor material, composition or structure, and expressly includes high quality single crystalline and polycrystalline semiconductors, semiconductor materials fabricated via high temperature processing, doped semiconductor materials, inorganic semiconductors, and composite semiconductor materials.

A "component" is used broadly to refer to an individual part of a device. An "interconnect" is one example of a component, and refers to an electrically conducting structure capable of establishing an electrical connection with another component or between components. In particular, an interconnect may establish electrical contact between components that are separate. Depending on the desired device specifications, operation, and application, an interconnect is made from a suitable material. Suitable conductive materials include semiconductors.

Other components include, but are not limited to, thin film transistors (TFTs), transistors, electrodes, integrated circuits, circuit elements, control elements, microprocessors, transducers, islands, bridges and combinations thereof. Components may be connected to one or more contact pads as known in the art, such as by metal evaporation, wire bonding, and application of solids or conductive pastes, for example.

"Neutral mechanical plane" (NMP) refers to an imaginary plane existing in the lateral, b, and longitudinal, l, directions of a device. The NMP is less susceptible to bending stress than other planes of the device that lie at more extreme positions along the vertical, h, axis of the device and/or within more bendable layers of the device. Thus, the position of the NMP is determined by both the thickness of the device and the materials forming the layer(s) of the device.

"Coincident" refers to the relative position of two or more objects, planes or surfaces, for example a surface such as a neutral mechanical plane that is positioned within or is adjacent to a layer, such as a functional layer, substrate layer, or other layer. In an embodiment, a neutral mechanical plane is positioned to correspond to the most strain-sensitive layer or material within the layer.

"Proximate" refers to the relative position of two or more objects, planes or surfaces, for example a neutral mechanical plane that closely follows the position of a layer, such as a functional layer, substrate layer, or other layer while still providing desired conformability without an adverse impact on the strain-sensitive material physical properties. "Strain-sensitive" refers to a material that fractures or is otherwise impaired in response to a relatively low level of strain. In general, a layer having a high strain sensitivity, and consequently being prone to being the first layer to fracture, is located in the functional layer, such as a functional layer containing a relatively brittle semiconductor or other strain-sensitive device element. A neutral mechanical plane that is proximate to a layer need not be constrained within that layer, but may be positioned proximate or sufficiently near to provide a functional benefit of reducing the strain on the strain-sensitive device element.

"Unitary" refers to an object formed as a single piece or undivided whole.

The terms "direct and indirect" describe the actions or physical positions of one component relative to another component, or one device relative to another device. For example, a component that "directly" acts upon or touches another component does so without intervention from an intermediary. Contrarily, a component that "indirectly" acts upon or touches another component does so through an intermediary (e.g., a third component).

"Electronic device" generally refers to a device incorporating a plurality of components, and includes large area electronics, printed wire boards, integrated circuits, component arrays, electrophysiological and/or biological and/or chemical sensors, and physical sensors (e.g., temperature, acceleration, etc.).

"Sensing" refers to detecting the presence, absence, amount, magnitude or intensity of a physical and/or chemical property. Useful electronic device components for sensing include, but are not limited to electrode elements, chemical or biological sensor elements, pH sensors, accelerometers, temperature sensors and capacitive sensors.

"Island" refers to a relatively rigid component of an electronic device comprising a plurality of semiconductor components. "Bridge" refers to structures interconnecting two or more islands or one island to another component. The invention includes electronic devices having bridge structures comprising electrical interconnects, such as stretchable electrical interconnects provided between and in electrical contact with semiconductor device components.

"Encapsulate" refers to the orientation of one structure such that it is at least partially, and in some cases completely, surrounded by one or more other structures. "Partially encapsulated" refers to the orientation of one structure such that it is partially surrounded by one or more other structures, for example, wherein 30%, or optionally 50% or optionally 90%, of the external surfaces of the structure is surrounded by one or more structures. "Completely encapsulated" refers to the orientation of one structure such that it is completely surrounded by one or more other structures.

"Contiguous" refers to materials or layers that are touching or connected throughout in an unbroken sequence. In one embodiment, a contiguous layer of a device has not been manipulated to remove a substantial portion (e.g., 10% or more) of the originally provided material or layer.

"Active circuit" and "active circuitry" refer to one or more components configured for performing a specific function. Useful active circuits include, but are not limited to, amplifier circuits, multiplexing circuits, current limiting circuits, integrated circuits, impedance matching circuits, wireless power harvesting circuits, wireless data transmission circuits, transistors and transistor arrays.

"Substrate" refers to a material, layer or other structure having a surface, such as a receiving surface or supporting surface, that is capable of supporting one or more components or electronic devices. A component that is "bonded" to the substrate refers to a component that is in physical contact with the substrate and unable to substantially move relative to the substrate surface to which it is bonded. Unbonded components or portions of a component, in contrast, are capable of substantial movement relative to the substrate. In an embodiment, the invention includes electronic devices having one or more free standing semiconductor device components supported by a substrate, optionally in physical contact with the substrate or in physical contact with one or more intermediate structures supported by the substrate. In an embodiment, the invention includes electronic devices having one or more tethered semiconductor device components supported by, or optionally bonded to, one or more structures, such as a pedestal or array of pedestals, independently connecting the semiconductor device components to the substrate.

"Free standing" refers to a configuration wherein a device or device component is supported by, but not bonded to, a substrate or intermediate structure provided between the device or device component and the substrate. In an embodiment, for example, a substrate is able to move relative to a free standing device or component supported by the substrate. In an embodiment, for example, a free standing device or component is able to move relative to a substrate supporting the free standing device or component. In some embodiments, for example, a free standing configuration of a device or device component decouples movement and/or deformation of the substrate from the device or device component. In some embodiments, for example, a free standing configuration of a device or device component decouples forces generated by elongation, compression or deformation of the substrate from the device or device component. In some embodiments, a free standing device or component is characterized by undergoing an associative interaction with a substrate surface or intermediate structure provided thereon, such as a Van der Waals interaction, dipole-dipole interaction or other non-covalent associative interaction. In an embodiment, a free standing device or component is not covalently bonded to the supporting surface of a substrate.

"Tethered" refers to a configuration wherein a device or component is connected to a substrate via one or more tethering structures, such as a pedestal or array of pedestals. In an embodiment, for example, a substrate is able to move relative to a tethered device or component supported by the substrate. In an embodiment, for example, a tethered device or component is able to move relative to a substrate supporting the tethered device or component. In some embodiments, for example, a tethered configuration of a device or device component decouples movement and/or deformation of the substrate from the device or device component. In some embodiments, for example, a tethered configuration of a device or device component decouples forces generated by elongation, compression or deformation of the substrate from the device or device component. In some embodiments, less than 20%, optionally less than 5%, and optionally less than 1%, of the area of a bottom surface of a device or component is covalently bonded to the tethering structure connected to the substrate.

"Nanostructured surface" and "microstructured surface" refer to device surfaces having nanometer-sized and micrometer-sized relief features, respectively. The relief features extend a length, x, from a substantially contiguous plane of the device surface. Quantitative descriptors of a structured surface include surface roughness parameters, such as $R_{max}$, $R_a$, and normalized roughness ($R_a/R_{max}$), all of which may be measured by atomic force microscopy (AFM). $R_{max}$ is the maximum height between a highest peak to a lowest valley. $R_a$ is the center-line-mean roughness, which is the average of an absolute value of a deviation from a center line of a roughness curve to the roughness curve. The surface of a substrate or layer is "substantially smooth", for the purposes of this disclosure, if the surface has an $R_a$ value of 100 nm or less. If the surface has an $R_a$ value greater than 100 nm, the surface is considered to be a "structured surface" for purposes of this disclosure.

"Dielectric" refers to a non-conducting or insulating material. In an embodiment, an inorganic dielectric comprises a dielectric material substantially free of carbon. Specific examples of inorganic dielectric materials include, but are not limited to, silicon nitride, silicon dioxide and non-conjugated polymers.

"Polymer" refers to a macromolecule composed of repeating structural units connected by covalent chemical bonds or the polymerization product of one or more monomers, often characterized by a high molecular weight. The term polymer includes homopolymers, or polymers consisting essentially of a single repeating monomer subunit. The term polymer also includes copolymers, or polymers consisting essentially of two or more monomer subunits, such as random, block, alternating, segmented, grafted, tapered and other copolymers. Useful polymers include organic polymers or inorganic polymers that may be in amorphous, semi-amorphous, crystalline or partially crystalline states. Crosslinked polymers having linked monomer chains are particularly useful for some applications. Polymers useable in the methods, devices and components include, but are not limited to, plastics, elastomers, thermoplastic elastomers, elastoplastics, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate), polymethylpentene, polyphenylene oxides and polyphenylene sulfides, polyphthalamide, polypropylene, polyurethanes, styrenic resins, sulfone-based resins, vinyl-based resins, rubber (including natural rubber, styrene-butadiene, polybutadiene, neoprene, ethylene-propylene, butyl, nitrile, silicones), acrylic, nylon, polycarbonate, polyester, polyethylene, polypropylene, polystyrene, polyvinyl chloride, polyolefin or any combinations of these.

"Elastomeric stamp" and "elastomeric transfer device" are used interchangeably and refer to an elastomeric material having a surface that can receive as well as transfer a material. Exemplary elastomeric transfer devices include stamps, molds and masks. The transfer device affects and/or facilitates material transfer from a donor material to a receiver material.

"Elastomer" refers to a polymeric material which can be stretched or deformed and returned to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers include, but are not limited to, thermoplastic elastomers, styrenic materials, olefinic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly (phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones. In an embodiment, a polymer is an elastomer.

"Conformable" refers to a device, material or substrate which has a bending stiffness that is sufficiently low to allow the device, material or substrate to adopt any desired contour profile, for example a contour profile allowing for conformal contact with a surface having a pattern of relief features.

"Conformal contact" refers to contact established between a device and a receiving surface. In one aspect, conformal contact involves a macroscopic adaptation of one or more surfaces (e.g., contact surfaces) of a device to the overall shape of a surface. In another aspect, conformal contact involves a microscopic adaptation of one or more surfaces (e.g., contact surfaces) of a device to a surface resulting in an intimate contact substantially free of voids. In an embodiment, conformal contact involves adaptation of a contact surface(s) of the device to a receiving surface(s) such that intimate contact is achieved, for example, wherein less than 20% of the surface area of a contact surface of the device does not physically contact the receiving surface, or optionally less than 10% of a contact surface of the device does not physically contact the receiving surface, or optionally less than 5% of a contact surface of the device does not physically contact the receiving surface.

"Young's modulus" is a mechanical property of a material, device or layer which refers to the ratio of stress to strain for a given substance. Young's modulus may be provided by the expression:

$$E = \frac{(\text{stress})}{(\text{strain})} = \left(\frac{L_0}{\Delta L}\right)\left(\frac{F}{A}\right), \quad (I)$$

where E is Young's modulus, $L_0$ is the equilibrium length, $\Delta L$ is the length change under the applied stress, F is the force applied, and A is the area over which the force is applied. Young's modulus may also be expressed in terms of Lame constants via the equation:

$$E = \frac{\mu(3\lambda + 2\mu)}{\lambda + \mu}, \quad (II)$$

where $\lambda$ and $\mu$ are Lame constants. High Young's modulus (or "high modulus") and low Young's modulus (or "low modulus") are relative descriptors of the magnitude of Young's modulus in a given material, layer or device. In some embodiments, a high Young's modulus is larger than a low Young's modulus, preferably about 10 times larger for some applications, more preferably about 100 times larger for other applications, and even more preferably about 1000 times larger for yet other applications. In an embodiment, a low modulus layer has a Young's modulus less than 100 MPa, optionally less than 10 MPa, and optionally a Young's modulus selected from the range of 0.1 MPa to 50 MPa. In an embodiment, a high modulus layer has a Young's modulus greater than 100 MPa, optionally greater than 10 GPa, and optionally a Young's modulus selected from the range of 1 GPa to 100 GPa.

"Inhomogeneous Young's modulus" refers to a material having a Young's modulus that spatially varies (e.g., changes with surface location). A material having an inhomogeneous Young's modulus may optionally be described in terms of a "bulk" or "average" Young's modulus for the entire material.

"Low modulus" refers to materials having a Young's modulus less than or equal to 10 MPa, less than or equal to 5 MPa or less than or equal to 1 MPa.

"Bending stiffness" is a mechanical property of a material, device or layer describing the resistance of the material, device or layer to an applied bending moment. Generally, bending stiffness is defined as the product of the modulus and area moment of inertia of the material, device or layer. A material having an inhomogeneous bending stiffness may optionally be described in terms of a "bulk" or "average" bending stiffness for the entire layer of material.

EXAMPLE 1

Stretchable Batteries with Self-Similar Serpentine Interconnects and Integrated Wireless Recharging Systems An important trend in electronics involves the development of materials, mechanical designs and manufacturing strategies that enable the use of unconventional substrates, such as polymer films, metal foils, paper sheets or rubber slabs. The last possibility is particularly challenging because the systems must accommodate not only bending but also stretching, sometimes to high levels of strain (>100%). Although several approaches are available for the electronics, a persistent difficulty is in energy storage devices and power supplies that have similar mechanical properties, to allow their co-integration with the electronics. In this Example, we provide a set of materials and design concepts for a rechargeable lithium ion battery technology that exploits thin, low modulus, silicone elastomers as substrates, with a segmented design of the active materials, and unusual 'self-similar' interconnect structures. The result enables reversible levels of stretchability up to 300%, while maintaining capacity densities of ~1.1 mAh/cm$^2$. Stretchable wireless power transmission systems provide means to charge these types of batteries, without direct physical contact.

Development of classes of electronic and optoelectronic technologies that offer elastic responses to large strain (>>1%) deformations has accelerated in recent years[1-6]. Combinations of materials, device layouts, mechanics designs and manufacturing approaches are now beginning to emerge for realistic applications in areas ranging from wearable photovoltaics[7] to 'epidermal' health/wellness monitors[8], to sensitive robotic skins[9-11], to soft surgical tools[12] and electronic 'eyeball' imaging devices[13]. In many cases, stretchability represents a key, enabling characteristic. For many of these and other uses, a critical need lies in energy storage devices with similar physical properties, to allow for direct and natural integration with the electronics[14]. Many important storage devices have been developed with flexible characteristics, including supercapacitors[15-17] and batteries[17,18]. Here, sufficiently thin geometrical forms lead to flexibility, by virtue of bending induced strains (typically to values of ~1% or less) that decrease linearly with thickness, for a given bend radius. Stretchability, on the other hand, represents a more challenging type of mechanics, in which the systems must accommodate large strain deformation (>>1%), typically of arbitrary form, including not only bending, but also twisting, stretching, compressing and others, and thickness is typically not a critical factor. Stretchable supercapacitors using buckled thin films of CNTs[19] or CNT-soaked fibrous textiles[20], and stretchable non-rechargeable zinc carbon batteries based on conductive fabrics[21,22] represent two examples. Although these technologies each have attractive features, none offers multiple capabilities in recharging with high storage capacity, stretching to large levels of deformation (>100%), or establishing wireless electrical interfaces to external power supplies. The materials and integration schemes provided in this example achieve these characteristics in a type of lithium ion battery that exploits segmented layouts and deformable electrical interconnects in specialized, 'self-similar' geometries. The resulting devices offer biaxial stretchability up to strains of 300%, with capacity densities of ~1.1 mAh/cm$^2$, and little loss in capacity for up to 20 cycles of recharging. The designs also allow integration of stretchable, inductive coils to enable charging through external supplies without the need for physical connections. This set of attributes satisfies requirements for many applications that are being contemplated for stretchable electronics.

Results

Battery Design.

Figure 1A:
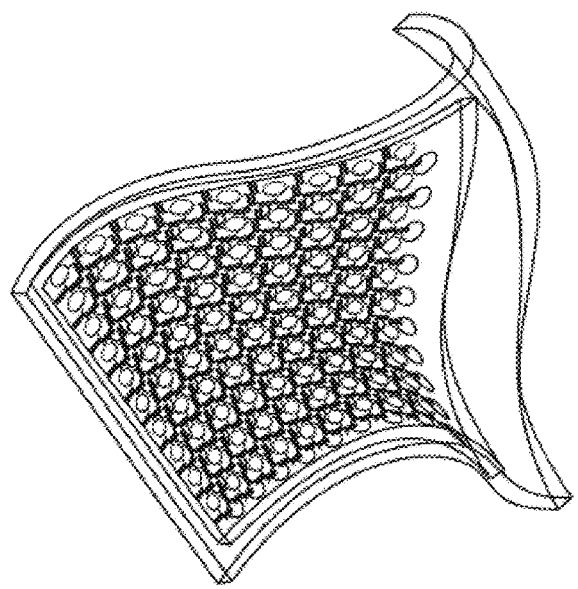
FIG. 1. Aspects in battery layout and design. (a) Schematic illustration of a completed device, in a state of stretching and bending. (b) Exploded view layout of the various layers in the battery structure. (c) Illustration of 'self-similar' serpentine geometries used for the interconnects (black: $1^{st}$ level serpentine; yellow: $2^{nd}$ level serpentine). (d) Optical images of the Al electrode pads and self-similar interconnects on Si wafer (left panel; top down view; ~4 unit cells), after transfer printing on a sheet of silicone (middle panel; top down view, in a bent geometry), and with moulded slurries of $LiCoO_2$ (right panel; top down view, in a bent geometry). (e) Optical images of the Cu electrode pads and self-similar interconnects on Si wafer (left panel; top down view; ~4 unit cells), after transfer printing on a sheet of silicone (middle panel; top down view, in a bent geometry), and with moulded slurries of $Li_4Ti_5O_{12}$ (right panel; top down view, in a bent geometry). Scale bars in d and e are 2 mm.
Figure 5:
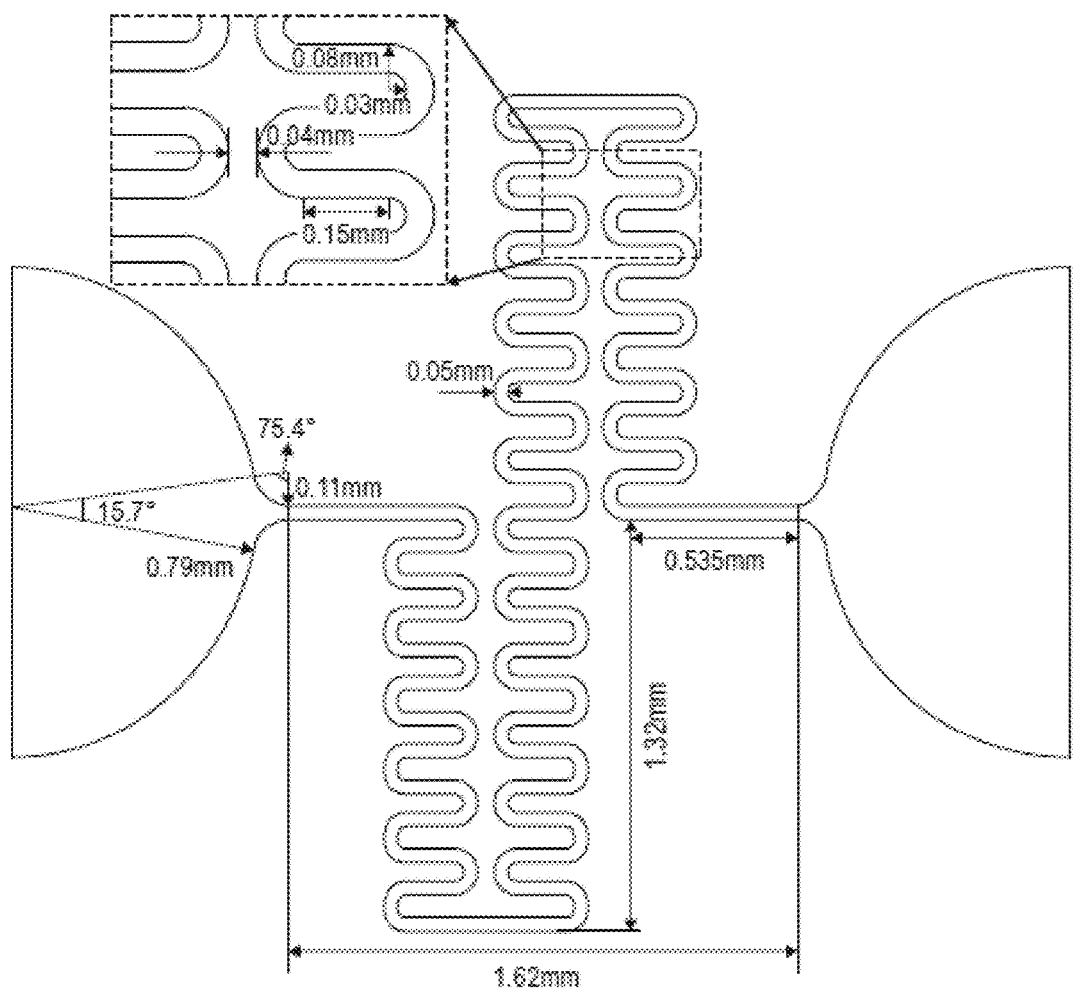
FIG. 5. Illustration of the dimensions for the self-similar interconnect (copper layer).
Figure 6:
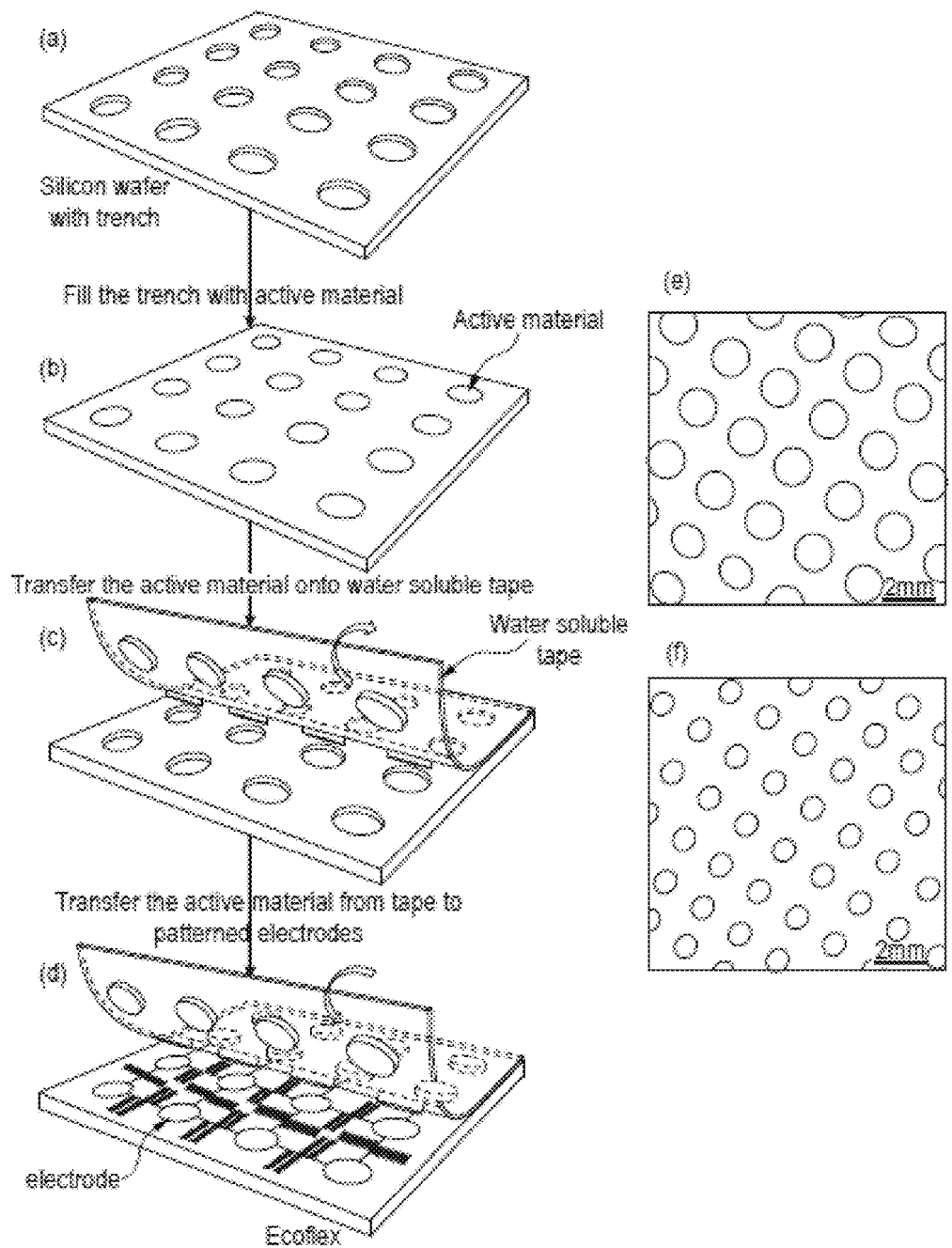
FIG. 6. (a)-(d) Schematic illustration of the fabrication process, and images of the moulded (e) cathode and (f) anode slurry on water soluble tape.
Figure 7:
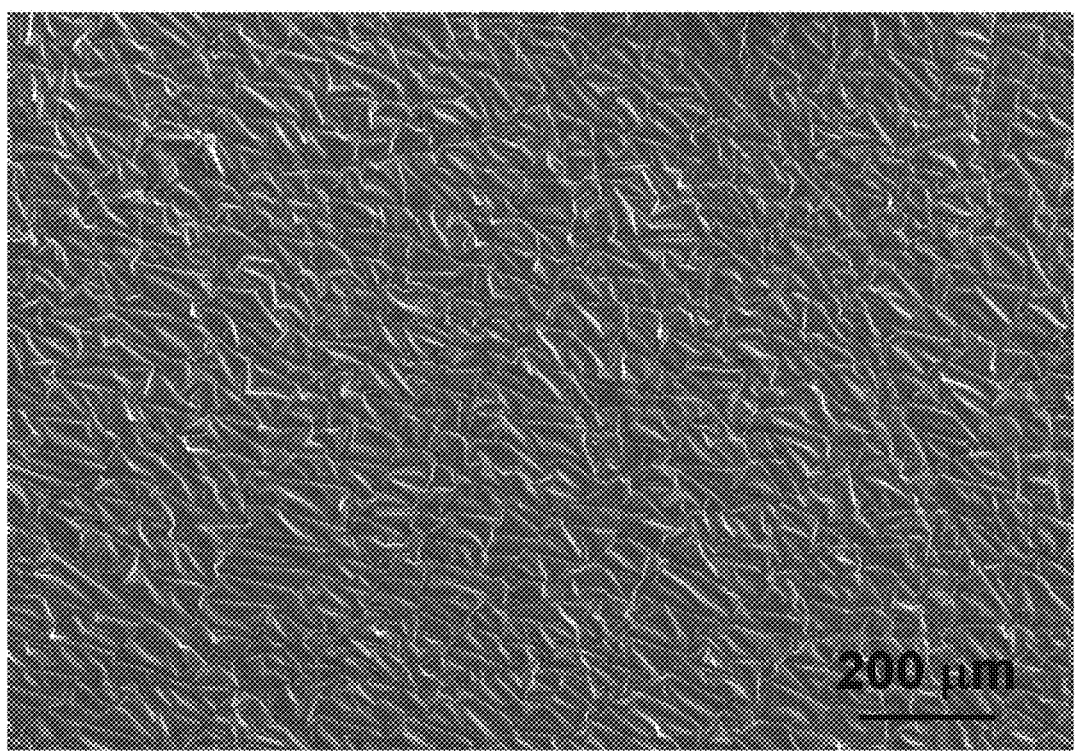
FIG. 7. SEM image of a buckled Al foil (600 nm)/PI (1200 nm) bilayer on the surface of a sheet of ECOFLEX® silicone rubber after releasing a prestrain of ~30%. This bilayer structure resembles the types of laminated Al/polymer packaging materials that are used in pouch cells, to block the permeation of water, air and solvent.

The devices of this example exploit pouch cells in which arrays of small-scale storage components are connected by conducting frameworks with extraordinary stretchable characteristics. A schematic illustration of the system, an exploded view of the multilayer construction of a unit cell, and a representation of the 'self-similar' interconnect geometries appear in FIG. 1a,b,c, and FIG. 5 in Supplementary Information (SI). The current collectors consist of photolithographically patterned circular disks of aluminum (600 nm) and copper (600 nm). Layers of polyimide (PI; 1.2 µm) encapsulate interconnecting traces between these disks in a way that places the metals close to the neutral mechanical plane (FIGS. 1d and 1e, left panel). Thin (0.25 mm), low modulus (60 kPa) sheets of silicone elastomer form top and bottom substrates that support these structures (FIGS. 1d and 1e, middle panel) and other components of the batteries. The overall construct consists of a square array of 100 electrode disks, electrically connected in parallel. Molded pads of slurries based on $LiCoO_2$ and $Li_4Ti_5O_{12}$ serve as active materials at the cathode and anode[23,24], respectively (FIGS. 1d and 1e, right panel, and FIG. 6). The two sheets laminate together in a way that involves spatial offsets between the active materials to avoid electrical shortage between them and to eliminate the need for a separator. A spacer, made of the same silicone elastomer and applied around the periphery of the system, prevents direct contact of the top and bottom sheets. A gel electrolyte injected into the gap provides media for ionic transport. Thin encapsulating layers of an acryloxy perfluoropolyether elastomer bonded to the outer surfaces help to prevent moisture from diffusing into the battery and solvents in the gel from leaking out[25]. Long term operation requires more sophisticated packages consisting, for example, of buckled bilayer sheets of aluminum/polyimide that bond to the outer surfaces of the battery (FIG. 7). The materials and fabrication details appear in the Methods section.

The devices must accommodate two competing design goals: (1) achieving high areal capacity, which requires large coverage of the active regions, and (2) affording high mechanical stretchability, which requires large distances between these regions. Strategic features of relief on the elastomer substrates provide a partial solution to this challenge, as demonstrated recently in photovoltaic modules[26,27]. A disadvantage is that levels of stretchability beyond ~30% can be difficult to achieve without sacrificing coverage. Here, we take a different, but complementary, approach in which the focus is on deformable interconnects with advanced designs. In particular, we introduce layouts that use 'self-similar' structures of wires in serpentine configurations to offer, simultaneously, high system-level stretchability, and low interconnect resistances. A conventional serpentine consists of circular arcs connected by straight lines. 'Self-similar' designs follow from iteratively applying this basic geometry, beginning with a unit cell as illustrated schematically in the red box of FIG. 1c. Here, reducing the scale of the cell, and then connecting multiple copies of it in a fashion that reproduces the layout of the original cell geometry corresponds to one iteration. The yellow line in FIG. 1c represents a 2nd order serpentine geometry, created in this fashion. Although higher orders can be designed and implemented easily, the 2nd order construct satisfies requirements for the applications considered here, as described in the detailed experimental and theoretical study below.

Mechanical Characteristics of the 'Self-Similar' Interconnects. Three-dimensional (3D) finite element analysis (FEA) (SI text) and experimental measurements illustrate the essential mechanics. Test samples fabricated for this purpose consist of free-standing, multilayer traces, with materials and multilayer stack designs (PI (1.2 μm)/Cu (0.6 μm)/PI (1.2 μm)) that match those used in the batteries, between circular pads that bond to posts molded onto underlying elastomer substrates. The self-similar geometry leads to hierarchical buckling physics that ensure ultra-low strains in the materials, even under extreme stretching[3,28]. For the entire range of tensile strains examined, from 0% to 300%, the configurations predicted by FEA agree remarkably well with optical images collected during the experiments, as shown in FIG. 2. Both symmetric and anti-symmetric buckling modes exist (see FIG. 8 for detailed illustrations of the two modes). The trace consists of three columns of serpentine wires connected by two horizontal straight lines. We refer to the construct that corresponds to the 'short' wavelength serpentine within each column as the 1st level; the 2nd level corresponds to the large-scale serpentine shape, with 'long' wavelength. For the symmetric buckling mode (FIG. 8(a)), the left and right columns undergo mainly an overall bending deformation along the vertical direction, resulting in the collective upward motion of the entire middle column of serpentine wires. In this sense, the out-of-plane displacement is symmetric with respect to the center line (x=0) in the "Front view" of FIG. 8(a). For the anti-symmetric buckling mode (FIG. 8(b)), the serpentines in the left and right columns mainly undergo an overall twisting deformation along the vertical direction. Here, the two ends of the middle serpentine move in opposite directions (i.e. one moves up, and the other moves down). In this case, the out-of-plane displacement is anti-symmetric with respect to the center line (x=0) in the "Front view" of FIG. 8(b). The critical buckling strains obtained by FEA for the symmetric (0.078%) and anti-symmetric (0.087%) modes are much lower than those (>0.172%) for all other buckling modes. This result is consistent with experimental observation of only these two modes. In both cases, the physics associated with stretching involves a mechanism of "ordered unraveling", which begins at the 2nd level, at a well-defined, critical buckling strain, ~0.08% for the example investigated here. Next, the 2nd level gradually "unravels" via bending and twisting as the applied strain increases from 0.08% to ~150%, during which there is essentially no further deformation in the 1st level. The motions in the 1st level start when the 2nd level is almost fully extended, corresponding to an applied strain of ~150% in this case. As the "unraveling" of the 1st level serpentine approaches its end, the strain in the materials begins to increase rapidly, thereby defining the practical limit in stretchability.

Figure 9:
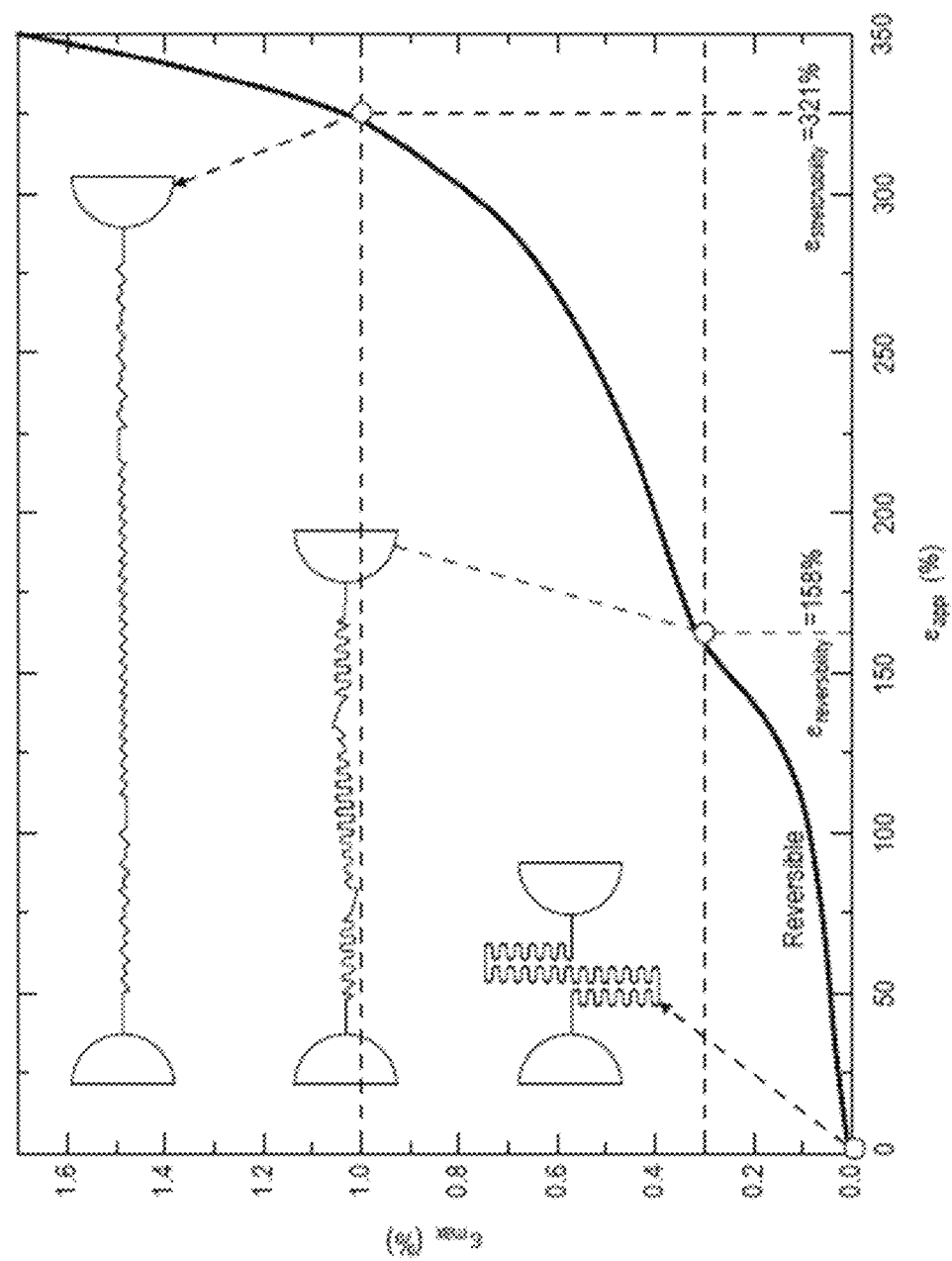
FIG. 9. The maximum value ($\epsilon_{max}$) of the maximum principal strain in the metal layer of the self-similar interconnect as a function of the applied strain ($\epsilon_{appl}$), together with the evolution of the deformations.

For applied strains below this limit, the deformation mechanisms of ordered unraveling processes ensure low levels of strain in the materials (FIG. 9). For a representative failure strain of 1% for copper, FEA predicts a stretchability of 321%, which is in good agreement with the experimental observations (300%<$\varepsilon_{stretchability}$<350%). (Simulations suggest that the copper reaches its failure point before the PI.) For reversible behavior (i.e., the interconnects return to their initial configuration after release), the maximum material strain must be less than the yield strain. For a representative yield strain of 0.3% for copper, FEA suggests reversibility for applied strains up to ~168%. This value is lower than experimental observations, where reversibility occurs even for strains of between 200% and 250% (FIG. 2). The likely explanation for this discrepancy is that yield occurs first in only small portions of the interconnect (e.g., one element in the FEA). In this case, the effects on reversibility might not be easily observed in experiments.

Figure 10:
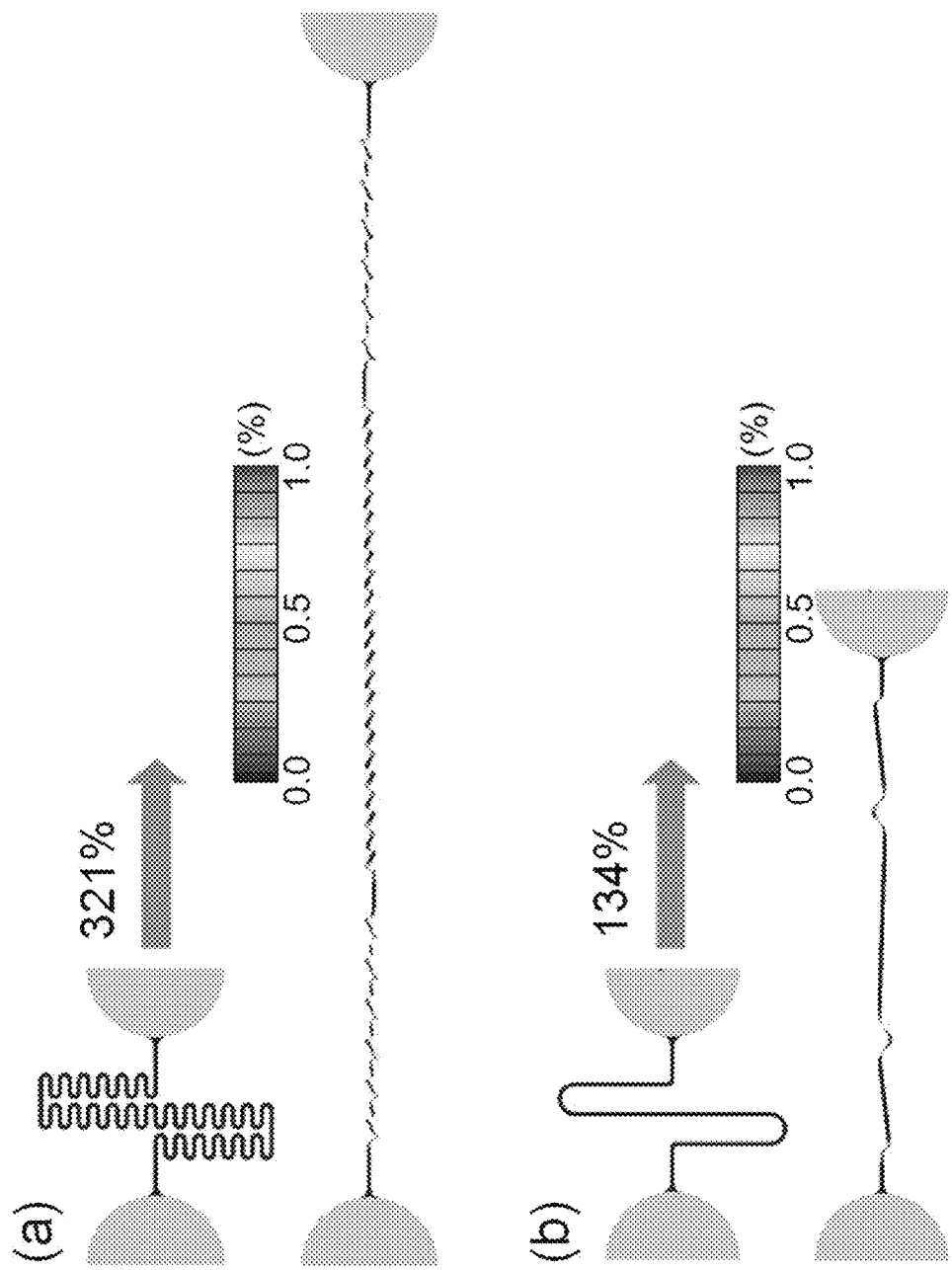
FIG. 10. The distribution of maximum principal strain in the metal layer when its maximum value reaches 1%: (a) the 2-order self-similar interconnect; and (b) the 1-order interconnect. The two structures have the same overall dimensions, and cross-sections.
Figure 11:
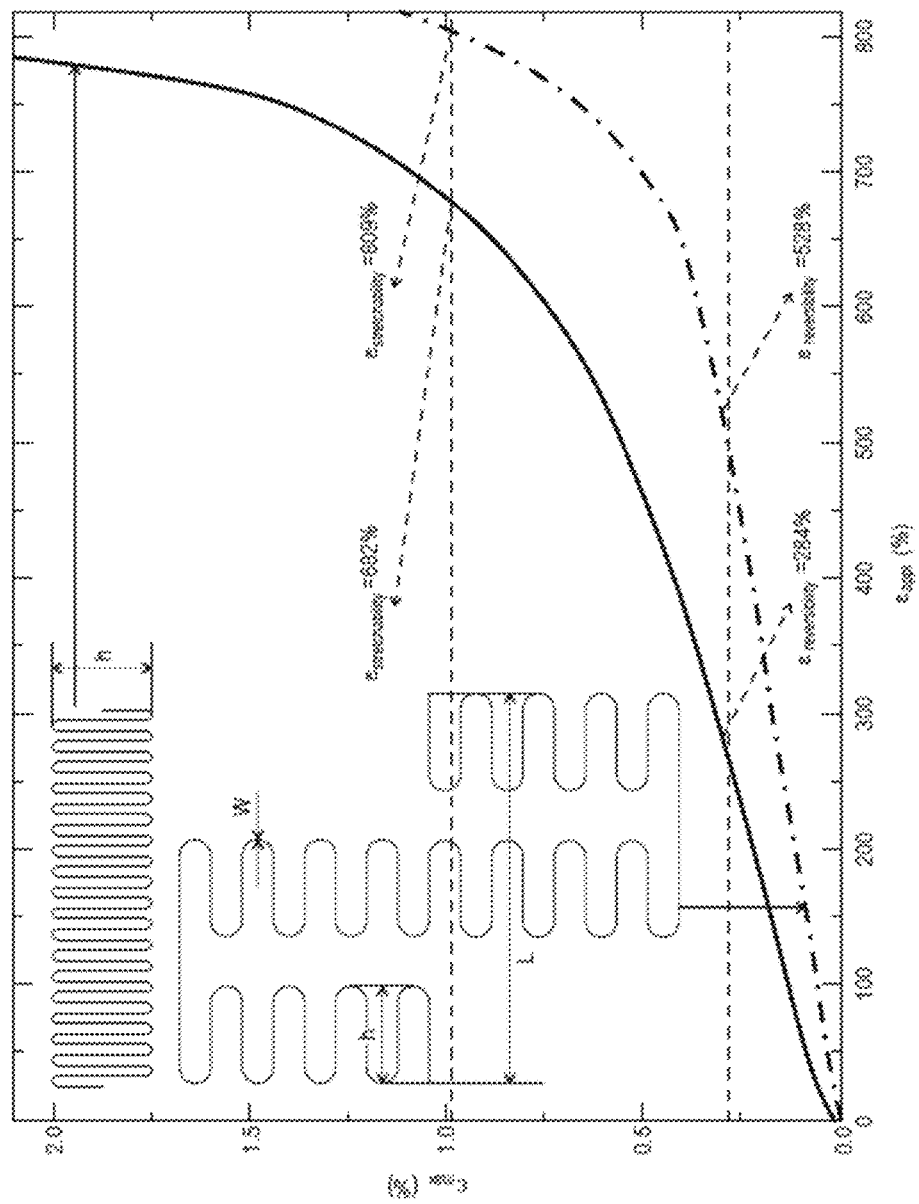
FIG. 11. The maximum value ($\epsilon_{max}$) of the maximum principal strain in the metal layer of the interconnect as a function of the applied strain ($\epsilon_{appl}$), for the self-similar and simple serpentine designs. The two interconnects have the same total length ($l_{total}$), span (L), amplitude (h), width (w), and thickness (t).

These levels of stretchability (>300%) and reversibility (>200%) significantly exceed those of previous reports in stretchable batteries and/or battery electrodes; they are also greater than those of any other reports of stretchable interconnects that use lithographically defined patterns of conventional metals. The importance of the self-similar designs can be assessed through comparisons of stretchability to otherwise similar, but conventional serpentine structures: the former exhibits a stretching range of 321%, while the latter is 134%, determined by FEA (FIG. 10). Furthermore, even for the same total length ($l_{total}$), span (L), amplitude (h), and cross section (width w and thickness t), the self-similar design again outperforms the conventional serpentine, both in stretchability (809% vs 682%) and reversibility (528% vs 284%) (FIG. 11). We note that in all cases of uniaxial stretching, the Poisson effect leads to compression in the orthogonal direction. The buckling profiles in these regions have behaviors that are consistent with FEA (FIGS. 12A-12G).

Figure 13A:
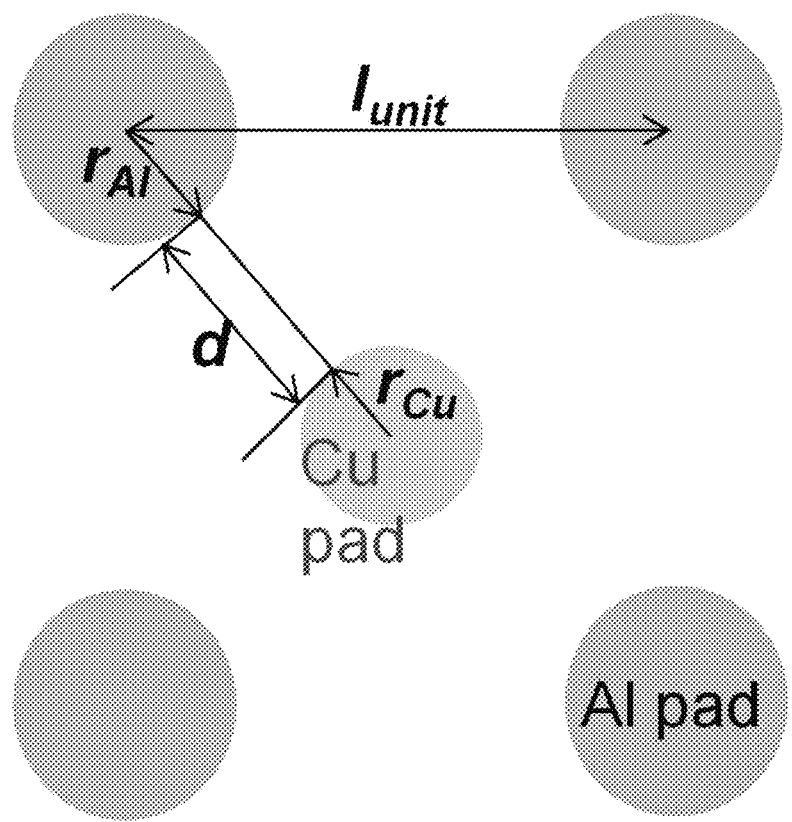
FIG. 13. The layout of Al and Cu pads (a), and the dependences of fill factor on the size of a representative unit cell and the radius of the Al pad (b). The offset distance (d) is set to be 0.5 mm in the model to avoid possible short circuits as the battery is stretched.
Figure 13B:
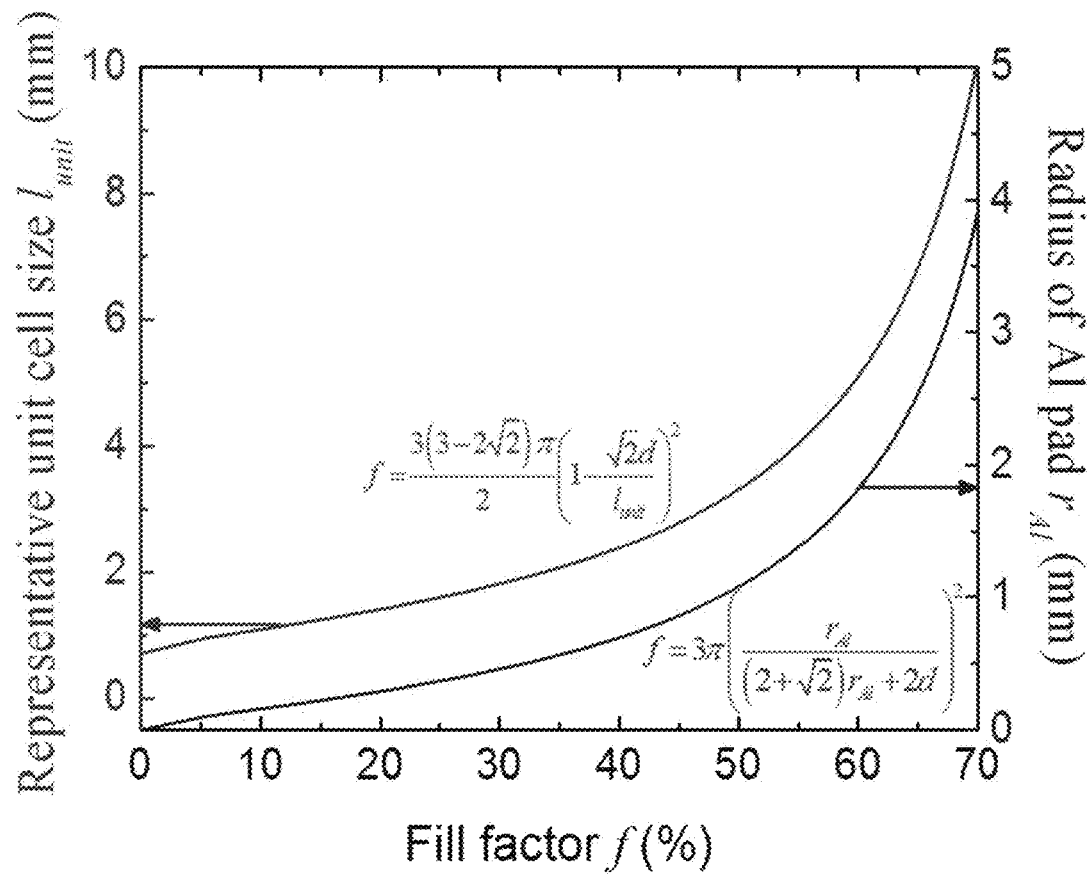

Electrochemical and mechanical behavior of the battery. After choosing a set of dimensions that offers excellent system level stretchability, with good areal capacity density, and modest interconnect resistance, we observed the best electrical performance for layouts in which the diameters of the disks for the cathode and anode are 2.20 mm and 1.58 mm, respectively, and the offset distances are 0.51 mm. This configuration corresponds to an areal coverage of 33% for the cathode, 17% for the anode, and 50% for the entire battery (in the undeformed configuration) (FIG. 13). The interconnects have thicknesses of 600 nm and widths of 50 μm. For these parameters, the resistance between adjacent disks is 24Ω, and that between the connection lead and the most distant disk is 45Ω. The leads for external connection are thin and narrow to avoid strain at the interface, and facilitate connection to flexible (but not stretchable) cables that connect to external characterization equipment. The gel electrolyte combines the flow properties of viscous liquids with the cohesive properties of a solid, thereby allowing it to accommodate large strains while maintaining ionic conduction pathways.

Figure 3A:
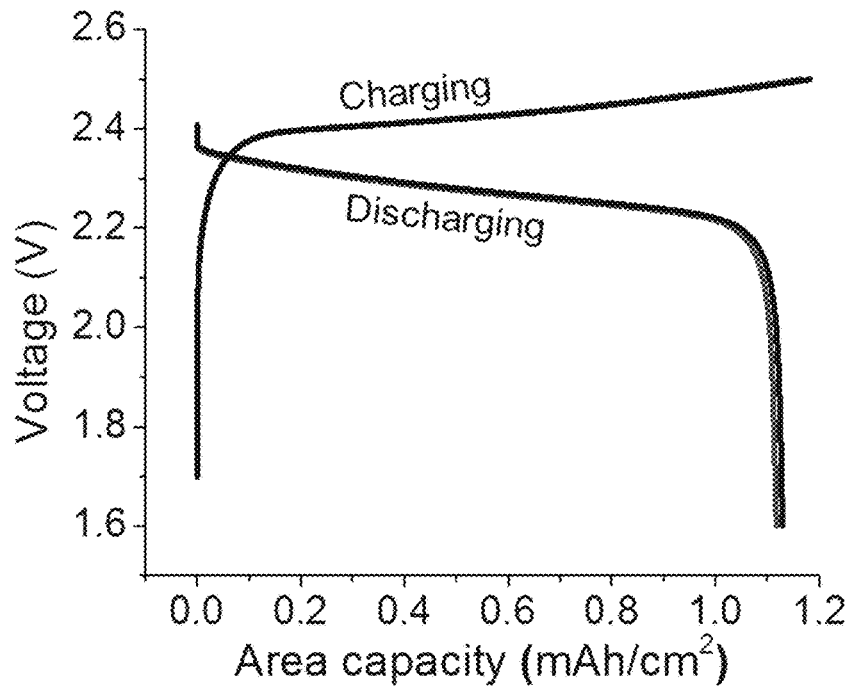
FIG. 3. Electrochemical and mechanical properties of the battery. (a) Galvanostatic charging and discharging of the battery electrodes without (black) and with 300% uniaxial strain (red). (b) Capacity retention (black) and coulombic efficiency (red) over 20 cycles with a cutoff voltage of 2.5-1.6 V. (c) Output power as a function of applied biaxial strain. (d) Operation of a battery connected to a red LED while (e) biaxially stretched to 300%, (f) folded, (g) twisted, and (h) compliant when mounted on the human elbow.
Figure 3B:
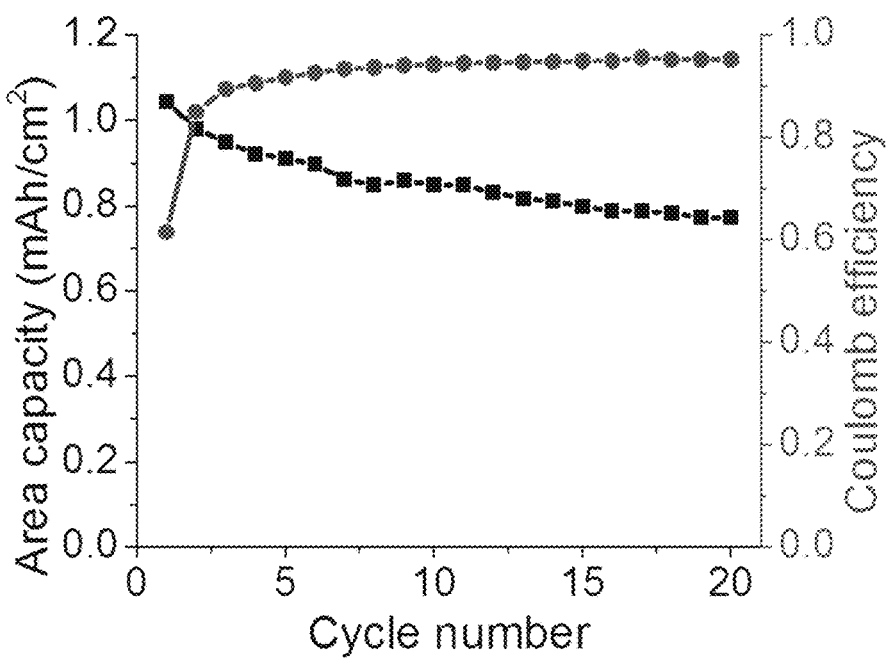
Figure 3C:
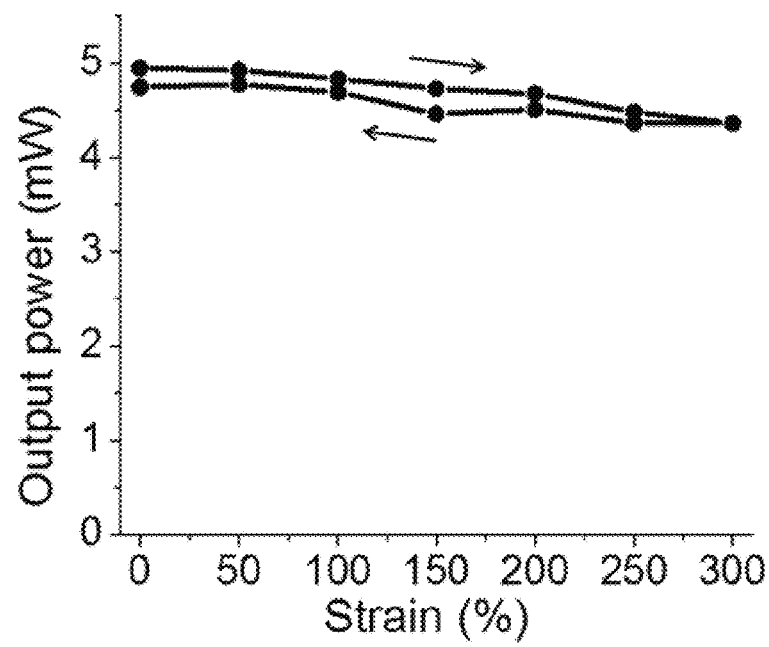
Figure 3D:
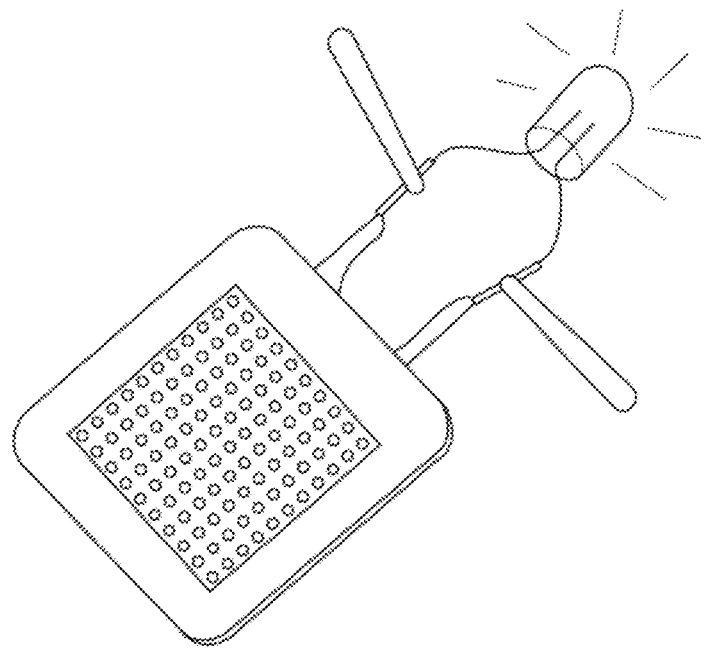
Figure 3E:
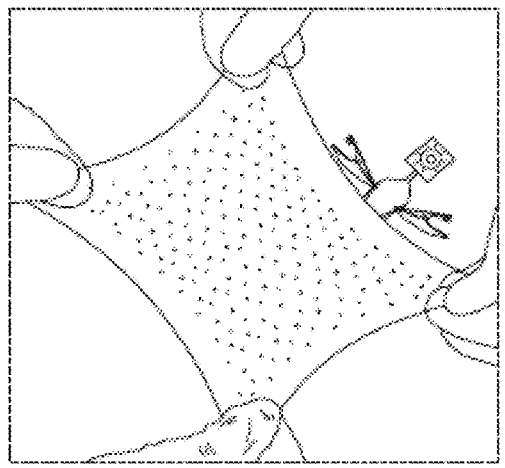
Figure 3F:
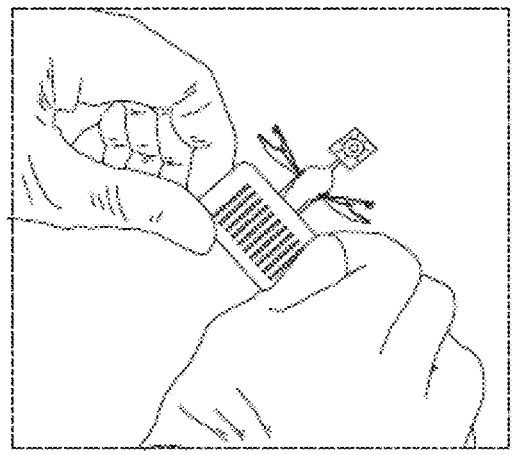
Figure 3G:
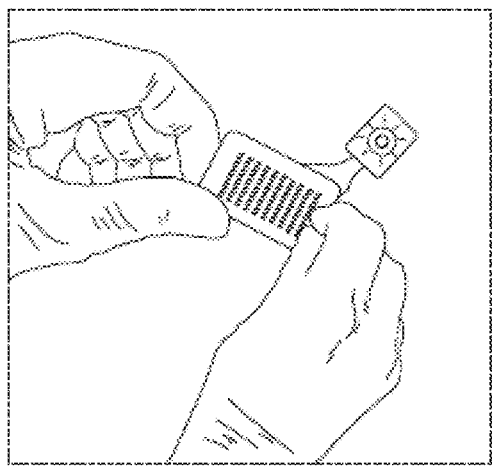
Figure 3H:
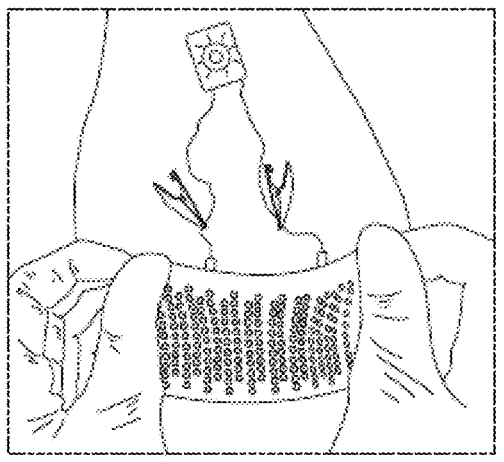
Figure 14:
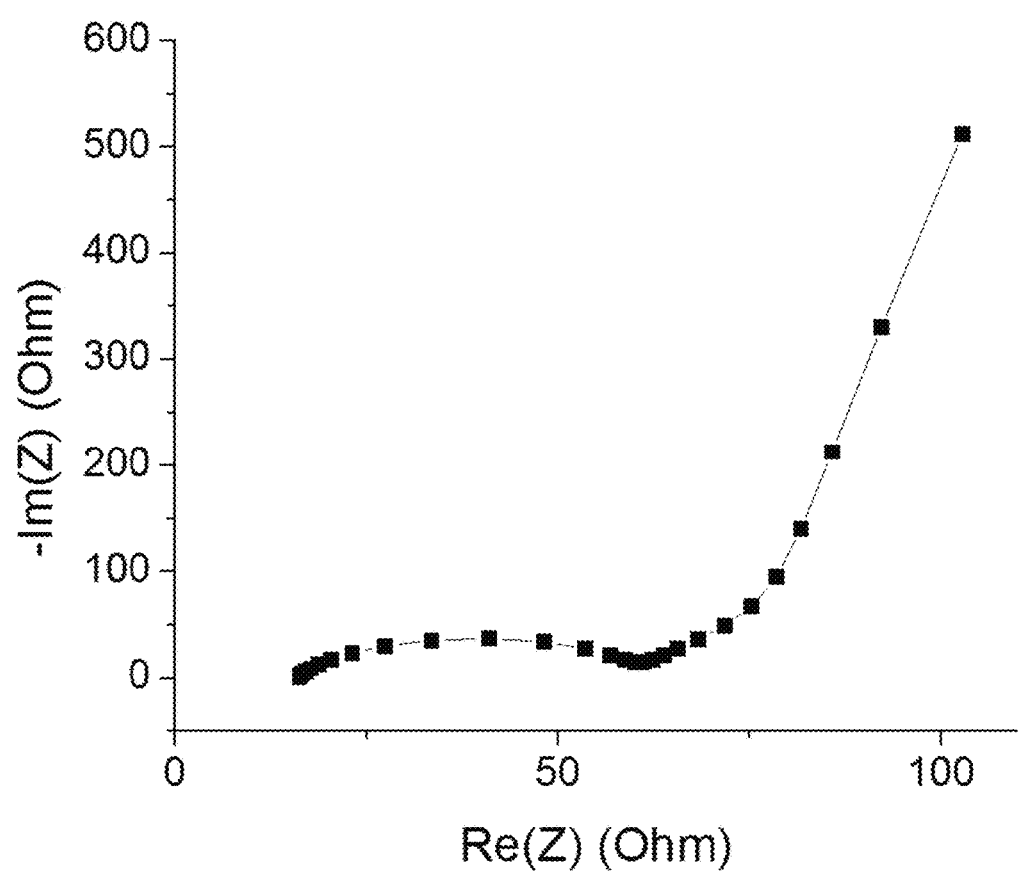
FIG. 14. Nyquist impedance plot for the pouch type stretchable battery from 1 MHz to 10 mHz with an a.c. perturbation amplitude of 10 mV.
Figure 15:
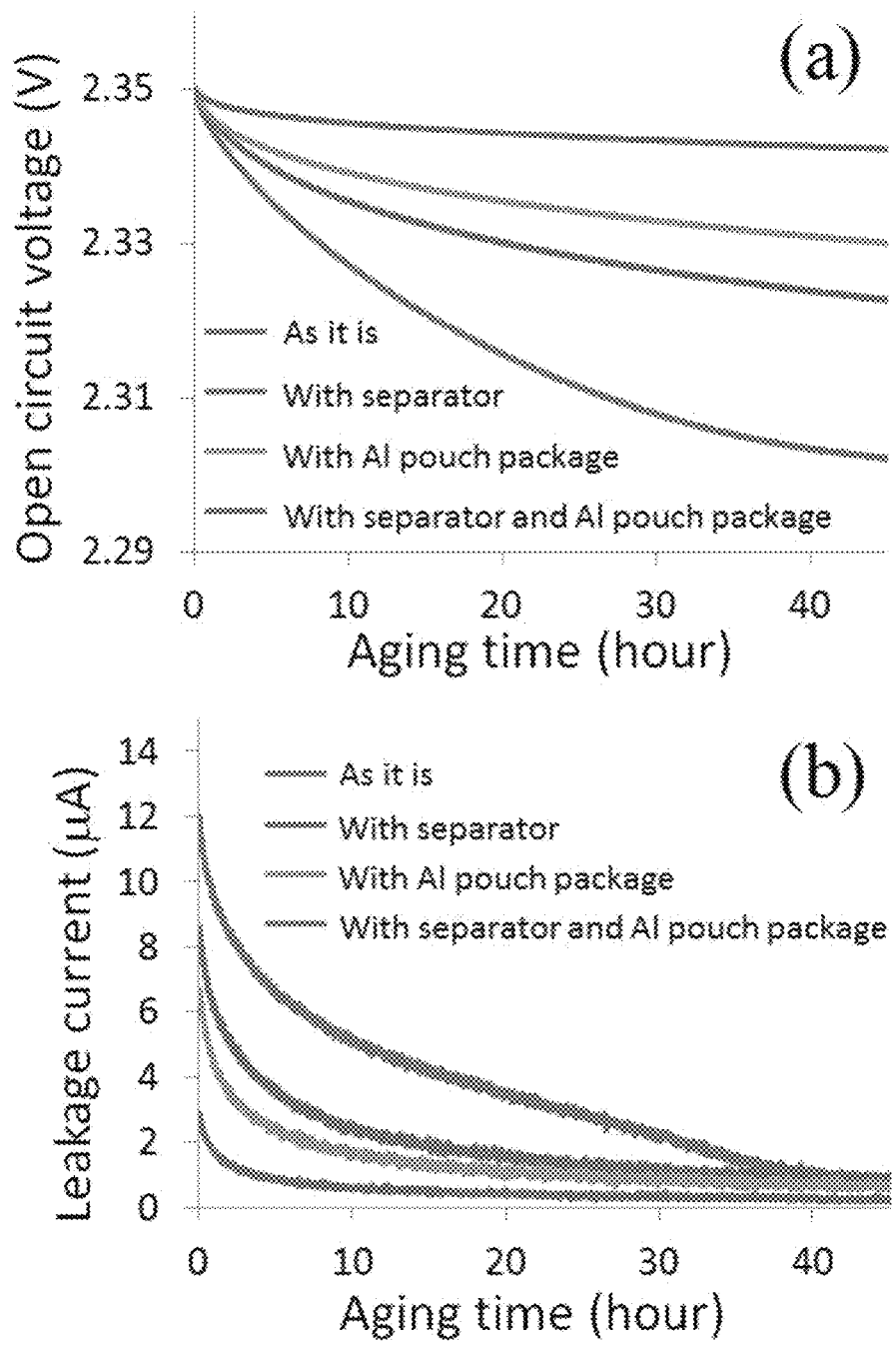
FIG. 15. (a) Open circuit voltage decay curves and (b) leakage current curves for batteries in various configurations, measured at room temperature.
Figure 16:
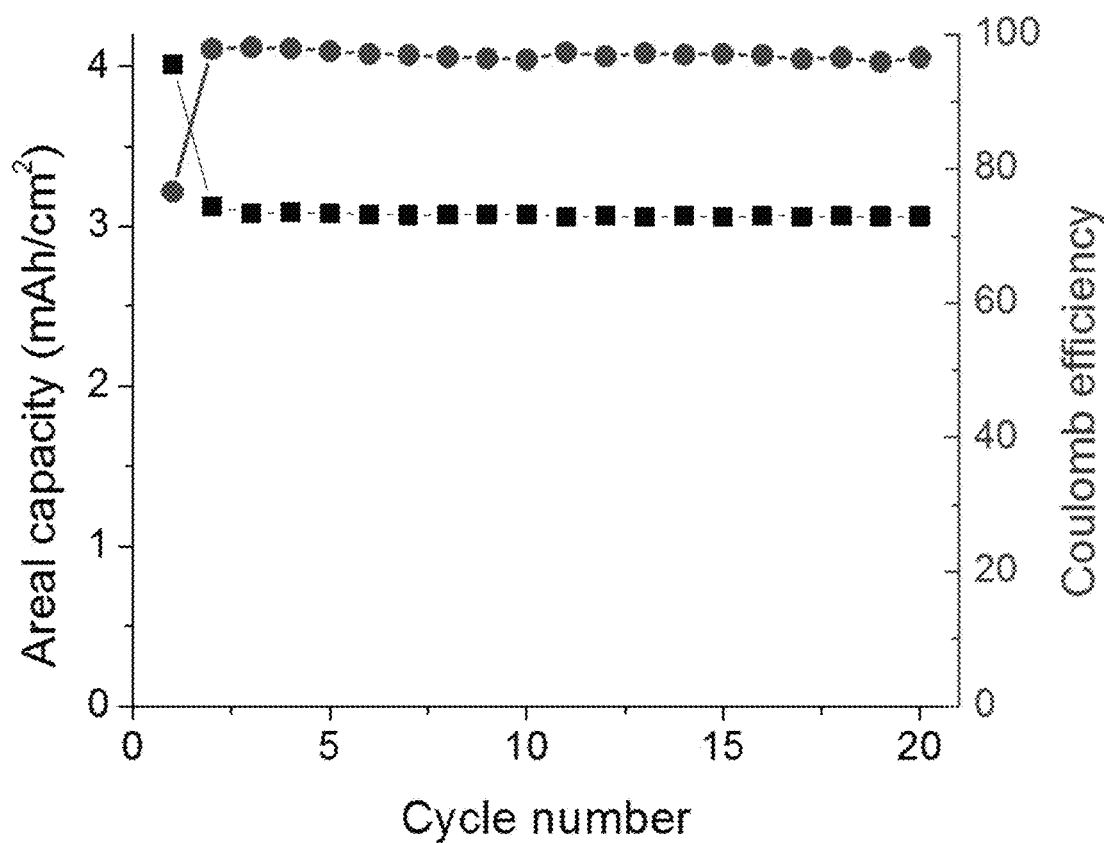
FIG. 16. Capacity retention (black) and coulombic efficiency (red) over 20 cycles with a cutoff voltage of 2.5-1.6

Electrochemical properties of the battery electrodes without and with 300% uniaxial strain appear in FIG. 3a. The results show two well defined plateaus at around 2.35 V corresponding to potentials of $Co^{3+}/^{4+}$ and $Ti^{4+}/^{3+}$ redox couples[29]. The thickness of the $LiCoO_2$ (specific capacity 145 mAh/g) at each unit is ~120 μm, corresponding to a mass of ~95 mg, and thus areal capacity density of 1.1 mAh/cm$^2$ at a charge/discharge rate of C/2. The mass of $Li_4Ti_5O_{12}$ (specific capacity 160 mAh/g) is ~90 mg, which corresponds to 5%-10% more anode capacity than cathode[30]. Slurry disks with thicknesses larger than those described here yield improved areal capacity density, but with reduced rate capability due to the concentration polarization in the disks[31,32]. The output resistance of the battery is ~70 Ω (FIG. 14), and the leakage current is 1-10 μA. The leakage current arises from three main sources: (i) the reverse biased Schottky diode, (ii) internal ohmic self-discharge between the slurry disks at the anode and cathode and (iii) Faradaic effects, including shuttle reactions associated with impurities in the slurry materials, residual oxygen and/or moisture. Experimental results presented in the SI and FIG. 15 show that use of separators and enhanced packaging schemes can reduce the capacity loss from 161 μA·h to 23 μA·h in 44 hours. FIG. 3b shows the coulombic efficiency (red) and cycling performance (black) of the encapsulated battery. The coulombic efficiency rises from ~60% for the first cycle to over 90% after three cycles. The initial loss can be attributed to the formation cycle, during which a solid-electrolyte-interphase forms, and lithium is consumed in side reactions with impurities in the electrolyte. The gradually degrading capacity retention results rather from the cycle fade (FIG. 16) but more likely from the calendar fade due to some combination of reaction with residual water in the packaging materials, moisture penetration, and electrical discontinuity of slurry particles that detach from the disks (which are not hot-pressed), and can be sometimes observed in the electrolyte gel. Varying the depth of discharge from 100% to 75% did not have a significant effect on the degradation characteristics (FIG. 17). Further increasing the baking temperature and optimizing the composition of the slurries, such as increasing the binder ratio, could reduce the latter behaviors. Improved conditions for device assembly could reduce effects of the former. FIG. 3c shows the output power of the battery, when connected to a resistor (2020Ω), during biaxial stretching and releasing. The slight decrease in output power with strain likely results from increased internal resistances that arise from the significantly increased separations between slurry disks with strains at these large levels. The battery provides sufficient power to operate commercial light emitting diodes (LEDs), with turn on voltages of 1.7 V (FIG. 18), as shown in FIG. 3d. The battery could be stretched for up to 300% (FIG. 3e), folded (FIG. 3f), twisted (FIG. 3g), and compliant when mounted on human skin (FIG. 3h) without noticeable dimming of the LED. Furthermore, FEA demonstrates that the effective modulus (66.8 kPa) of the full composite structure of the battery is only slightly higher than the modulus (60.0 kPa) of substrate materials (Ecoflex). As a result, the battery is not only stretchable but also exceptionally soft and compliant. The modulus is, in fact, lower than that of the human epidermis (140-600 kPa)[8], thereby offering the potential for integration onto the skin and biological tissues, without significant mechanical loading.

Stretchable Wireless Charging System for the Battery.

Figure 4A:
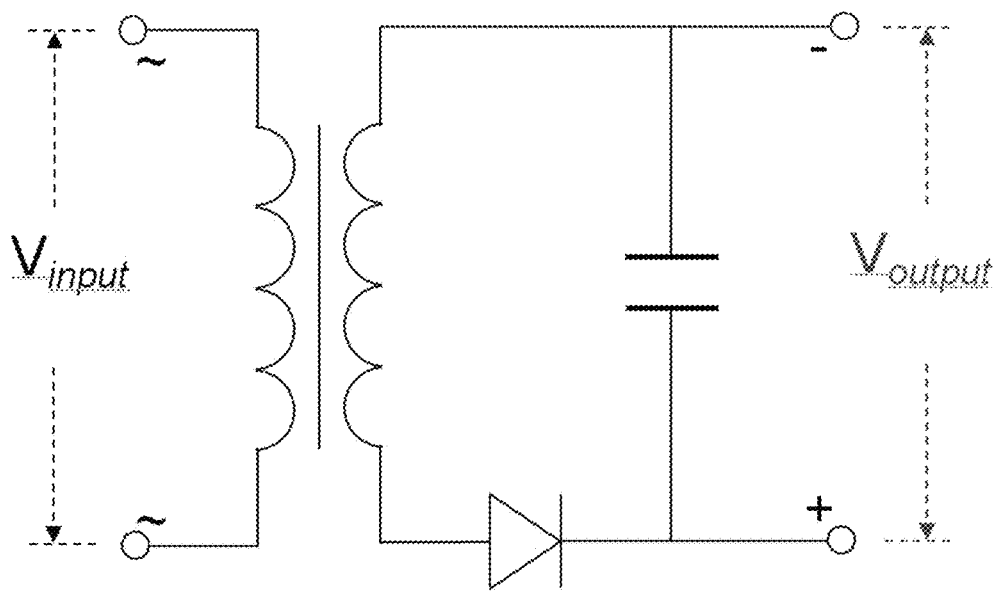
FIG. 4. Stretchable system for wireless charging. (a) Circuit diagram. (b) Image of the integrated system with different components labeled. (c) Characterization of the wireless coil with an alternating voltage input at a frequency of 44.5 MHz (black) and the resulting direct voltage output (red), as indicated in a. (d) Charging voltage (orange) and current (blue) curves as a stretchable battery is charged with 3 V output from the wireless circuit. The scale bar in b is 1 cm.
Figure 4B:
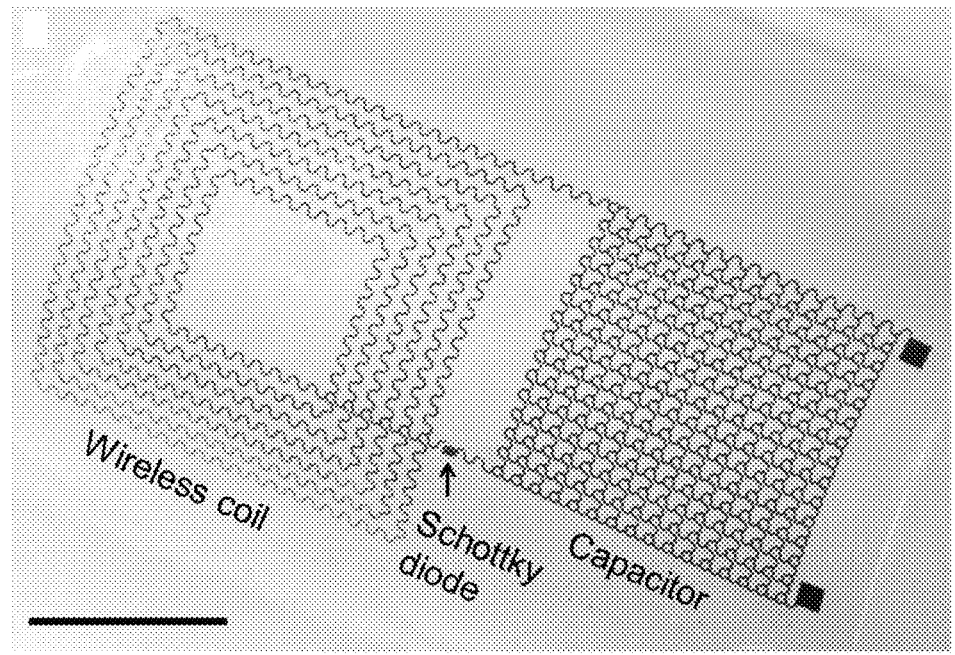

In many practical cases such as embedded devices, the ability to charge the battery without establishing physical connections to external supplies can be valuable. Even in systems where the charging terminals are accessible, such as in skin-mounted devices, there is value in wireless charging, simply because the process of establishing physical contacts can be mechanically destructive to thin, stretchable devices (or to the underlying soft tissue). Approaches that involve physical contact also have the danger of electrical shock to surrounding materials (e.g. the skin itself). The versatility of the materials and designs enable integration of wireless power transmission systems, monolithically with the battery itself. The design and an actual device appear in FIGS. 4a, b, respectively. A secondary coil couples the electromagnetic flux from a primary coil, and a Schottky diode provides rectification. The Schottky diode (packaged in epoxy, with a modulus of ~4.0 GPa) has a modulus of more than 4 orders of magnitude larger than that of the substrate (made of Ecoflex, modulus ~60 kPa), but its size (length 0.62 mm, width 0.32 mm, and height 0.31 mm) is only a few percent (~2%) of the overall size (~30 mm × ~20 mm) of the wireless system. As a result, the influence on the overall stretchability is still negligible, as demonstrated by finite element simulations shown in FIGS. 19 and 20. The capacitor smooths oscillations in the output voltages; its small size and thickness enable natural integration into the overall system. Larger capacitors can smooth the oscillations to an even greater extent (FIG. 21). The coil and rectifier add a series resistance of 2.3 KΩ (FIG. 22), which functions as a parallel resistance with the secondary coil, shunting away current from the battery. The resistance of the serpentine secondary coil is 1.92 kΩ/m; a coil with similar overall geometry but without the serpentine shape is calculated to be 1.22 kΩ/m. Improving the efficiency of the charging system can be achieved by increasing the width and thickness of the wires, but at the expense of reduced stretchability and increased modulus.

Figure 4C:
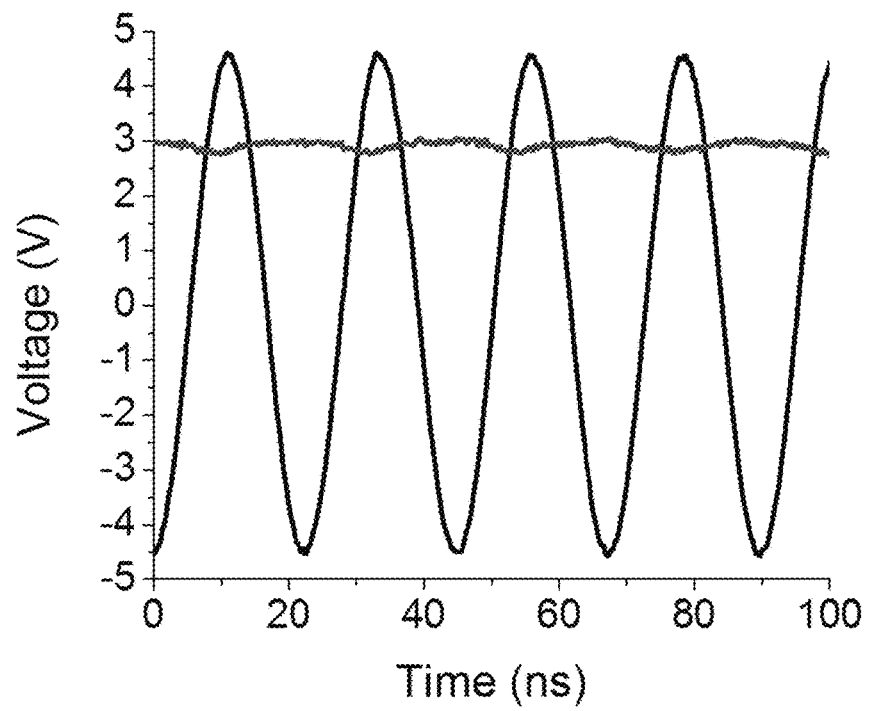
Figure 4D:
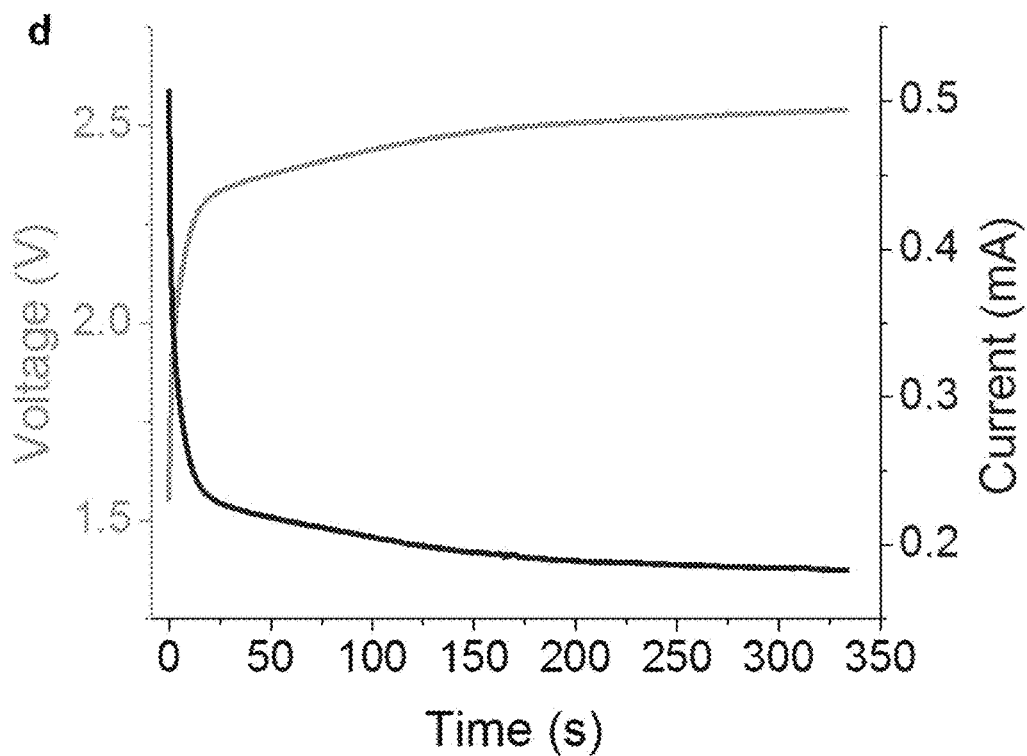

Specific application requirements will define the right tradeoffs. In this case, the output power from the primary coil was 187 mW. With a working distance of 1 mm between the primary and secondary coil, the power received on the secondary coil is 9.2 mW, corresponding to an efficiency of 4.9%. The power coupling efficiency of the wireless charging system depends strongly on the resistance of the serpentine receiver coil. Increasing the thickness to 7 μm and using copper improves the efficiency from 4.9% to 17.2%. At this thickness, the coil retains stretchability to strains of 25%. Data and images appear in the SI. The capacitor has a capacitance of 1.7 nF, in a structure that uses a 1.2 μm thick layer of polyimide as the dielectric, with a layer of thiol molecules on the bottom Au electrodes to enhance adhesion. FIG. 4c shows the input and output of this wireless power transmission device. An input voltage at a frequency of 44.5 MHz matches the self-resonant frequency of the secondary coil, which is dependent on the coil area, number of turns, distance between each turn, and wire resistance. For a peak-to-peak input voltage of 9.1 V (FIG. 4c black curve), the DC output voltage is 3.0 V (FIG. 4c red curve). The charging curves of a small scale battery using the wireless coil appear in FIG. 4d. The battery voltage (FIG. 4d orange curve) rises to 2.5 V in about 6 mins. The charging current in the circuit (FIG. 4d blue curve) decreases from 0.5 mA to below 0.2 mA. We used a partial differential equation to model the charging circuit, and a numerical program to calculate the charging current curve. Simulation of this process agrees well with the experimental data (SI text and FIG. 20).

Discussion

The materials and schemes described in this example provide routes to energy storage devices and wireless charging systems with forms and properties that are attractive for powering stretchable electronic and optoelectronic devices. The slurry materials themselves are deployed in ways (a soft lithographic type casting process) that allow natural integration with unusual materials (low modulus silicone rubber sheets, embossed with surface relief). The stretchable interconnects exploit a 'self-similar' design that offers unique, 'spring within a spring' mechanics. The consequence is a level of stretchability that is more than 4× larger than previous reports, even while, at the same time, enabling coverages of active materials as high as 50%. The combination of these two aspects, together with comprehensive and experimentally validated models of the underlying mechanics, leads to a technology, i.e. a stretchable, rechargeable battery, which offers much different characteristics than anything that has been previously possible. As an additional advance, we introduce integrated stretchable, wireless charging systems that offer physical properties similar to those of the batteries.

The slurry chemistries, separator materials, and stretchable, air-impermeable packaging materials can be selected to provide high device performance. The self-similar serpentine interconnect structure possesses a geometry of space filling curve, and a buckling physics of ordered unraveling. This type of interconnect structure has immediate, and general utility, suitable for any class of stretchable technology that combines hard and soft materials. The topology-level interconnect geometry simultaneously provides for large mechanical stretchability and low electrical resistance. Wireless power transfer efficiency can be improved by reducing the coil input resistance, maximizing the mutual inductance between the primary and secondary coils, and increasing the self-resonant frequency of the coils. Regulation circuits may be incorporated to avoid over-charging the battery.

Methods

Fabrication of electrodes and mechanical testing of self-similar interconnects: Sequential spin casting defined a bilayer of poly(methyl methacrylate) (PMMA 495 A2, 3000 rpm for 30 s, baked on a hotplate at 180° C. for 2 mins) and then a layer of polyimide (PI, from poly(pyromellitic dianhydride-co-4,4'-oxydianiline) amic acid solution; 4000 rpm for 30 s, baked on a hotplate at 150° C. for 4 mins and then in a vacuum oven at 10 mT and 250° C. for 1 h) on a silicon wafer. The cathode and anodes consisted of 600 nm thick layers of Al or Cu, respectively, deposited by electron beam evaporation onto the PI. Photolithography (AZ5214E) and etching (Type A aluminum etchant on hotplate at 50° C. for 2 min; Type CE-100 copper etchant at room temperature for 10 s; Transene Company) defined patterns in these metals. After removing the residual photoresist, spin coating formed an additional layer of PI over the entire structure. Next, photolithography (AZ 4620, 2000 rpm for 30 s, baked at 110° C. for 4 mins) and oxygen plasma etching (300 mT, 20 sccm $O_2$, 200 W for 10 mins) patterned the layers of PI in a geometry matched to the metal traces.

Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) through a shadow mask formed backside coatings aligned to the metal disks[33]. Thin (250 μm) silicone substrates (ECOFLEX® silicone rubber, Smooth-On) were prepared by mixing the two components in a 1:1 weight ratio, spin-casting (300 rpm for 30 s) the resulting material into a petri dish and then partially curing it (30 mins at room temperature). Next, spin-casting (3000 rpm for 30 s) an allyl amide functional perfluorinated ether (DuPont), and then curing it under ultraviolet (UV) light for 30 mins formed a top encapsulation layer. The other side of the ECOFLEX® silicone rubber substrate was surface-activated under UV light for 5 mins. Laminating the electrode structures onto this surface led to strong bonding, upon contact[34]. The water soluble tape was removed by immersing the substrate in tap water for overnight. As a final step, the electrodes were dipped in 1 mM HCl to remove oxides from the surfaces of the metals.

Mechanical testing of the self-similar interconnects was performed with a customized uniaxial stretcher. To ensure that the interconnects were decoupled from the substrate, each disk was mounted on top of a post (250 mm in height) molded into the silicone substrate. Images and video of the deformed interconnects were collected with a digital single-lens reflex camera.

Patterned moulding of slurries and their integration with current collecting electrodes: Photolithography (AZ 4620, 7-8 μm thick) and inductively coupled plasma reactive ion etching (ICP RIE) defined arrays of cylindrical wells on the surface of a silicon wafer. The conditions were chosen to yield sloped sidewalls, which are important for effective transfer of the slurries, as described subsequently. Washing with acetone removed the photoresist. A layer of polytetrafluoroethylene (~200 nm) conformally deposited using the ICP RIE tool served as a coating to prevent adhesion. The slurry materials consisted of lithium cobalt oxide or lithium titanium oxide, acetylene black, and polyvinylidene fluoride, mixed in a weight ratio of 8:1:1 in a solvent of N-methyl-2-pyrrolidone (NMP) for the cathode and anode, respectively. The mixture was stirred for overnight, and then mechanically scraped across the etched surface of the silicon wafer. The cylindrical wells, filled with slurry in this manner, were baked on a hotplate at 90° C. for overnight, and then retrieved onto the surface of a piece of water soluble tape. The baking conditions were selected carefully to enable retrieval of the slurry with high yield. Registering the tape to the metal electrodes ensured that the molded slurry aligned to the metal disks. Immersion in tap water for overnight dissolved the tape. Baking the substrates at 170° C. for overnight in a vacuum oven removed the moisture and improved the strength of bonding between the slurry and the metal.

Assembly and electrochemical testing of the battery:

Anisotropic conductive films, hot pressed onto the metal electrodes, served as points for external electrical connection. Application of Sylgard Prime Coat (Dow Corning, Inc.) to the periphery of the substrates prepared them for bonding. A thin silicone spacer layer (500 μm thick) at the periphery prevented direct contact as the two sheets were laminated together. A lateral spatial offset prevented electrical shorting between the active regions. The edges were sealed with an additional application of ECOFLEX® silicone rubber followed by baking on a hotplate (90° C. for 2 h). The gel electrolyte consisted of a mixture of 100 g lithium perchlorate, 500 ml ethylene carbonate, 500 ml dimethylcarbonate, and 10 g polyethylene oxide (4×106 g/mol), prepared in an argon filled glovebox as a homogenous gel. This material was injected into the battery using a syringe through an edge.

A BioLogic VMP3 electrochemical station with a cutoff voltage of 2.5-1.6 V at room temperature was used to charge and discharge the as-fabricated and stretched battery electrodes, and to evaluate cycling behavior of the full, integrated battery. Areal capacity density was calculated based on the active region. The output power was monitored with the battery connected to a 2020Ω resistor, using an ammeter. Values of current were recorded as a function of strain applied to the battery.

Fabrication and testing of the wireless coil:

A silicon wafer, coated with layers of PMMA and PI using steps described previously, served as a substrate for deposition of Cr (5 nm)/Au (500 nm) by electron beam evaporation. Photolithography (AZ 5214E) and etching (Transene Company) defined patterns in the geometry of the bottom electrode of the capacitor and associated contact lines. Removing the photoresist with acetone, and then immersing the substrate in a 1 mM poly(ethylene glycol) methyl ether thiol solution in isopropanol for 15 mins served to enhance the adhesion and coverage of a second layer of PI spin-cast (4000 rpm 30 s) and cured (on hotplate at 150° C. for 4 mins and then in vacuum oven at 250° C. for 1 h) on the electrodes. This layer of PI served as the dielectric for the capacitor. Photolithography (AZ 4620, 2000 rpm for 30 s, baked at 110° C. for 4 mins) defined a mask for etching vias through the PI layer, as points of connection between the coil and the bottom electrode of the capacitor. After immersion in acetone to remove the photoresist, sputter deposition formed a conformal layer of Cu (600 nm) over the entire surface, including the sidewalls. Photolithography (AZ 5214E) and etching defined the coil and the other top electrode of the capacitor. After removing the resist, a third spin-cast layer of PI formed a coating on the Cu electrodes. An oxygen plasma etching through the three PI layers in a patterned geometry defined the final device layout. Release by immersion in hot acetone partially removed the underlying PMMA, to enable the release of the entire structure onto water soluble tape. Deposition of Ti (5 nm)/$SiO_2$ (50 nm) and lamination onto the UV activated surface of an ECOFLEX® silicone rubber substrate led to strong bonding. After the water soluble tape was removed, a Schottky diode chip (Digikey BAT 62-02LS E6327) was bonded between the coil and the capacitor using silver epoxy. The forward input resistance is ~500 Ω, and the rectification ratio is ~1×104 at a bias voltage of ±1 V[35].

High frequency alternating current signals were generated by a KEITHLEY 3390 50 MHz arbitrary waveform generator. The input and output characterization of the wireless coil were performed using an Agilent infiniium DSO8104A oscilloscope (1 GHz, 4 channels). The wireless charging voltage and current to the battery were monitored using a BioLogic VMP3 electrochemical station.

REFERENCES

1 Pelrine, R., Kornbluh, R., Pei, Q. B. & Joseph, J. High-speed electrically actuated elastomers with strain greater than 100%. Science 287, 836-839 (2000).

2 Wagner, S. et al. Electronic skin: architecture and components. Physica E Low Dimens Syst Nanostruct 25, 326-334 (2004).

3 Khang, D. Y., Jiang, H. Q., Huang, Y. & Rogers, J. A. A stretchable form of single-crystal silicon for high-performance electronics on rubber substrates. Science 311, 208-212 (2006).

4 Sekitani, T. et al. A rubberlike stretchable active matrix using elastic conductors. Science 321, 1468-1472 (2008).

5 Sekitani, T. & Someya, T. Stretchable organic integrated circuits for large-area electronic skin surfaces. Mrs Bulletin 37, 236-245 (2012).

6 Suo, Z. G. Mechanics of stretchable electronics and soft machines. Mrs Bulletin 37, 218-225 (2012).

7 Yoon, J. et al. Ultrathin silicon solar microcells for semitransparent, mechanically flexible and microconcentrator module designs. Nature Mater. 7, 907-915 (2008).

8 Kim, D. H. et al. Epidermal Electronics. Science 333, 838-843 (2011).

9 Mannsfeld, S. C. B. et al. Highly sensitive flexible pressure sensors with microstructured rubber dielectric layers. Nature Mater. 9, 859-864 (2010).

10 Takei, K. et al. Nanowire active-matrix circuitry for low-voltage macroscale artificial skin. Nature Mater. 9, 821-826 (2010).

11 Someya, T. et al. A large-area, flexible pressure sensor matrix with organic field-effect transistors for artificial skin applications. Proc. Natl. Acad. Sci. U.S.A. 101, 9966-9970 (2004).

12 Kim, D. H. et al. Materials for multifunctional balloon catheters with capabilities in cardiac electrophysiological mapping and ablation therapy. Nature Mater. 10, 316-323 (2011).

13 Ko, H. C. et al. A hemispherical electronic eye camera based on compressible silicon optoelectronics. Nature 454, 748-753 (2008).

14 Nishide, H. & Oyaizu, K. Toward flexible batteries. Science 319, 737-738 (2008).

15 Pushparaj, V. L. et al. Flexible energy storage devices based on nanocomposite paper. Proc. Natl. Acad. Sci. U.S.A. 104, 13574-13577 (2007).

16 Scrosati, B. Nanomaterials—Paper powers battery breakthrough. Nature Nanotechnol. 2, 598-599 (2007).

17 Hu, L. B. et al. Highly conductive paper for energy-storage devices. Proc. Natl. Acad. Sci. U.S.A. 106, 21490-21494 (2009).

18 Hu, L., Wu, H., La Mantia, F., Yang, Y. & Cui, Y. Thin, Flexible Secondary Li-Ion Paper Batteries. ACS Nano 4, 5843-5848 (2010).

19 Yu, C. J., Masarapu, C., Rong, J. P., Wei, B. Q. & Jiang, H. Q. Stretchable Supercapacitors Based on Buckled Single-Walled Carbon Nanotube Macrofilms. Adv. Mater. 21, 4793-4797 (2009).

20 Hu, L. B. et al. Stretchable, Porous, and Conductive Energy Textiles. Nano Lett. 10, 708-714 (2010).

21 Kaltenbrunner, M., Kettlgruber, G., Siket, C., Schwodiauer, R. & Bauer, S. Arrays of Ultracompliant Electrochemical Dry Gel Cells for Stretchable Electronics. Adv. Mater. 22, 2065-2067 (2010).

22 Gaikwad, A. M. et al. Highly Stretchable Alkaline Batteries Based on an Embedded Conductive Fabric. Adv. Mater. 24, 5071-5076 (2012).

23 Tarascon, J. M. & Armand, M. Issues and challenges facing rechargeable lithium batteries. Nature 414, 359-367 (2001).

24 Scrosati, B. & Garche, J. Lithium batteries: Status, prospects and future. J. Power Sources 195, 2419-2430 (2010).

25 Thanawala, S. K. & Chaudhury, M. K. Surface modification of silicone elastomer using perfluorinated ether. Langmuir 16, 1256-1260 (2000).

26 Lee, J. et al. Stretchable GaAs Photovoltaics with Designs That Enable High Areal Coverage. Adv. Mater. 23, 986-991 (2011).

27 Lee, J. et al. Stretchable Semiconductor Technologies with High Areal Coverages and Strain-Limiting Behavior:

28 Krieger, K. Extreme mechanics: Buckling down. Nature 488, 146-147 (2012).
29 Yoshima, K., Munakata, H. & Kanamura, K. Fabrication of micro lithium-ion battery with 3D anode and 3D cathode by using polymer wall. J. Power Sources 208, 404-408 (2012).
30 Ferg, E., Gummow, R. J., Dekock, A. & Thackeray, M. M. Spinel Anodes for Lithium-Ion Batteries. J. Electrochem. Soc. 141, L147-L150 (1994).
31 Owen, J. R. Rechargeable lithium batteries. Chem. Soc. Rev. 26, 259-267 (1997).
32 Gowda, S. R. et al. Conformal Coating of Thin Polymer Electrolyte Layer on Nanostructured Electrode Materials for Three-Dimensional Battery Applications. Nano Lett. 11, 101-106 (2011).
33 Sun, Y. G., Choi, W. M., Jiang, H. Q., Huang, Y. G. Y. & Rogers, J. A. Controlled buckling of semiconductor nanoribbons for stretchable electronics. Nature Nanotechnol. 1, 201-207 (2006).
34 Ouyang, M., Yuan, C., Muisener, R. J., Boulares, A. & Koberstein, J. T. Conversion of some siloxane polymers to silicon oxide by UV/ozone photochemical processes. Chem. Mater. 12, 1591-1596 (2000).
35 Datasheet for BAT 62-02LS E6327 on www.digikey.com Supplementary Information Fabrication of a Stretchable Encapsulating Layer, Consisting of a Buckled Sheet of Al/PI on a silicone substrate The first step involved fabrication of a trilayer of PMMA/PI/Al on a silicon substrate, using procedures similar to those employed for the Al battery electrodes. Photolithography with AZ5214E and wet etching the Al defined the lateral dimensions of the PI/Al sheet. Next, oxygen plasma etching (300 mT, 20 sccm $O_2$, 200 W for 5 mins) removed the PI layer in the exposed regions. Immersion in hot acetone partially removed the underlying PMMA layer, thereby allowing the entire structure to be retrieved from the silicon wafer onto the surface of a piece of water soluble tape (3M, Inc.). Electron beam evaporation of Ti (5 nm)/$SiO_2$ (50 nm) formed backside coatings. On a separate substrate, 500 µm thick silicone sheets (ECOFLEX® silicone rubber, Smooth-On) were prepared, then removed and prestrained biaxially to a level of ~30% and then fixed by lamination onto a glass slide. The silicone surface was activated by exposure to UV-induced ozone for 5 mins. Laminating the PI/Al bilayer onto this surface led to strong bonding, upon contact. The water soluble tape was removed by immersing the substrate in tap water for overnight. Peeling the entire assembly away from the glass slide released the prestrain, and led to an expected pattern of buckling. In this configuration, the overall system can be stretched to strains as large as those equal to the prestrain.

Mechanical analyses of "island-bridge" self-similar electrode structures: FEA

Full three-dimensional (3D) FEA is adopted to analyze the postbuckling behaviors of "island-bridge" self-similar electrode structures under stretching and compression. Due to the structural periodicity of the electrode, a representative unit cell was studied, and its detailed geometry is shown in FIG. 5. The circular island of the electrode is mounted on a post (height 250 µm) molded on the surface of a silicone substrate (ECOFLEX® silicone rubber; thickness 500 µm). The metal interconnect (thickness 0.6 µm), is encased, top and bottom, by a thin layer of polyimide (PI, thickness 1.2 µm for each layer). The elastic modulus (E) and Poisson's ratio (v) are $E_{ecoflex}$=0.06 MPa and $v_{ecoflex}$=0.49 for ECOFLEX® silicone rubber; $E_{Cu}$=119 GPa and $v_{Cu}$=0.34 for copper; $E_{Al}$×70 GPa and $v_{Al}$=0.35 for aluminum; and $E_{PI}$× 2.5 GPa and $v_{PI}$=0.34 for PI. Eight-node 3D solid elements and four-node shell elements were used for the ECOFLEX® silicone rubber and self-similar electrode, respectively, and refined meshes were adopted to ensure the accuracy. The evolution of deformed configurations with applied strains are obtained from FEA for both stretching and compression, as shown in FIGS. 2A-G and FIGS. 12A-G, respectively. Good agreement between FEA and experiment results can be found. Here, we take the case of copper as a demonstration of the buckling profiles. The results for the aluminium layer are similar. For the comparison of stretchability and reversibility between self-similar and serpentine interconnects (FIG. 11), the key geometrical parameters are kept the same, including the total length ($I_{total}$×16.77 mm), span (L=1.6 mm), amplitude (h=0.4 mm), width (w=30 µm), and thickness (t=3.0 µm). The aluminum interconnect (thickness 0.6 µm) is encased by two thin layers of polyimide (thickness 1.2 µm for each layer). FIG. 11 demonstrates that over the entire range of stretching from 0% to ~800%, the strain level of the self-similar interconnect is always lower than the serpentine one. The stretchability (809%) and reversibility (528%) of the self-similar design, are higher than those ($\varepsilon_{stretchability}$×682%, $\varepsilon$reversibility×284%) of the simple serpentine design.

Battery Leakage Current Analysis

The leakage current arises from three sources. The first source is current through the reverse biased Schottky diode. This current is ~0.2 µA, and is relatively constant throughout the lifetime of the battery. Schottky diodes with smaller reverse current are available; such devices can reduce this contribution to the leakage.

The second source is the internal ohmic self-discharge current between the slurry disks at the anode and cathode. This contribution arises from finite electronic conductivity of the electrolyte and any parasitic physical contacts between the slurry disks at the cathode and anode. These losses can be dramatically reduced by electrolyte materials with enhanced purity and implementing separators. New experiments reveal the latter effects quantitatively. FIG. 15a and b show the voltage decay and leakage current curves for otherwise similar batteries with and without a commercial separator (Celgard). This component reduces the capacity loss from 161 µA·h to 88 µA·h in 44 hours.

The third source is from current produced by Faradaic effects, including shuttle reactions associated with impurities in the slurry materials, residual oxygen and/or moisture. Improving the air-impermeability of the packaging materials can reduce currents that arise from such reactions. New experiments show that sealing the battery in an Al pouch (which can be configured in a wrinkled configuration to allow stretching) reduces the capacity loss from 161 µA·h to 62 µA·h. Combining the separator and the Al pouch packaging, suppresses the capacity loss to 23 µA·h. FIG. 15 summarizes all of these findings.

Discrete Schottky Diode stretching behavior analysis

From a practical standpoint, we observe no significant constraints on the overall mechanical properties of the integrated system, due to the comparatively small size of the diode. In particular, although the Schottky diode, which is encapsulated in epoxy which has a modulus of ~4.0 GPa, is effectively more than 4 orders of magnitude larger than that of substrate (made of Ecoflex, with a modulus of ~60 kPa), its dimensions (length 0.62 mm, width 0.32 mm, and height 0.31 mm) represent only a few percent (~2%) of the overall size (~30 mm x~20 mm) of the wireless system. Experimentally, we observe that the system is robust to stretching up to ~30% and beyond.

To study these effects quantitatively, we carried out full, three dimensional finite element simulations that examine the influence of the diode on the stretchability of the coil in the integrated system, as in FIG. 19a. Results in FIGS. 19b and 19c, indicate that: (1) The decrease in stretchability is modest, from 32.6% to 32.3%, when the diode is included and (2) The strain in the diode (i.e. the epoxy) is very small (<0.15%, much smaller than the strain needed to induce fracture), even when the overall system is stretched by 32.3%.

The normal interface strain is also important. FIG. 20a shows the distributions of maximum principal strains in a large ECOFLEX® silicone rubber substrate with a diode mounted in its center, for stretching to 30%. FIG. 20b illustrates the distribution of the substrate normal strain at the diode/substrate interface. The normal interface strain in this case is negative, corresponding to compressive strain at the interface. This outcome, which is consistent with theoretical predictions based on energy release rates at an interface crack, minimizes the propensity for delamination.

Coil Resistance Effect on the Wireless Power Transfer Efficiency

The coil resistance/qualify factor is a critical parameter that dictates the efficiency. In additional experiments to illustrate the effects, we replaced the 600 nm thick gold serpentine coils with otherwise similar ones fabricated with copper at increased thicknesses. The results show that coils formed using a 7 μm thick copper film (Dupont) have total resistances of 185Ω, and generate a received power of 30.8 mW with an input power of 179 mW (at a distance of 1 mm, similar to the previously reported results). The corresponding efficiency is 17.2%, which represents more than a factor of three improvement over the original, gold coils (4.9%). Further reducing the coil resistance to 38Ω by using 18 μm thick copper foil (MTI Corp.) improves the received power to 36.2 mW, and the efficiency to 20.2%. See FIG. 23a.

Figure 23C:
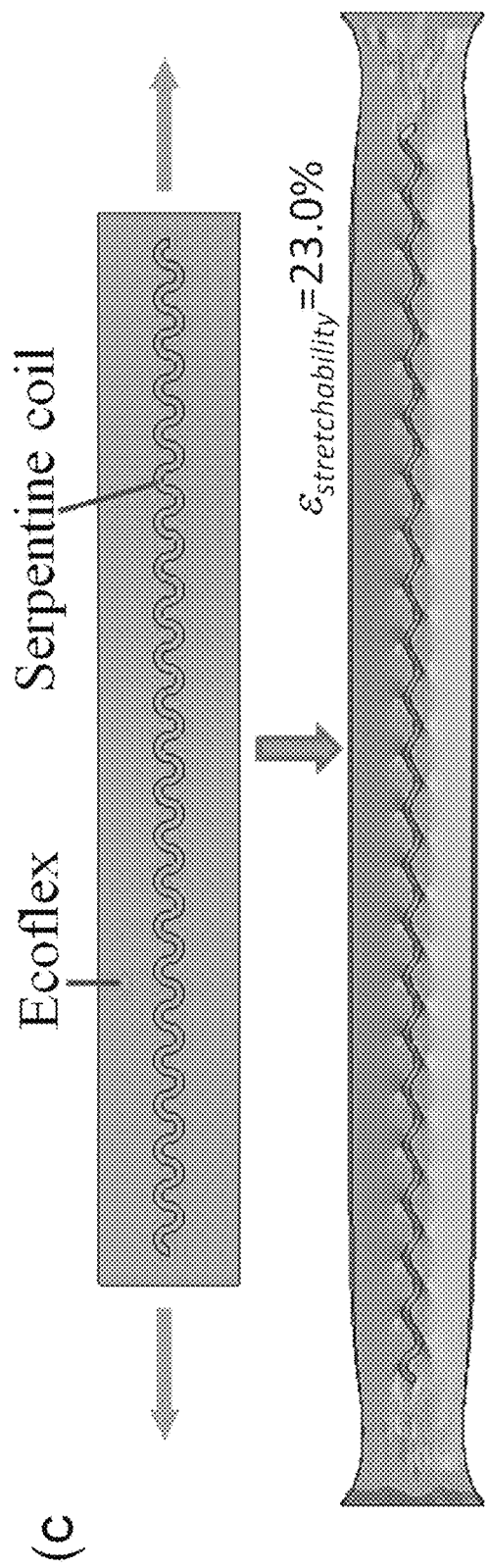

These increases in thickness, and therefore power transfer efficiencies, lead to changes in the essential mechanics associated with stretching. In particular, as the thickness increases, the stretchability decreases. The coil with thickness of 7 μm offers a good balance between efficiency and mechanical deformability, with ability to accommodate strains of ~25%. Images at various levels of strain appear in FIG. 23b, which agree well with the finite element analysis results in terms of both the maximum uniaxial strain and the geometry of the coil serpentines (FIG. 23c).

Modeling of the Charging Current in the Wireless Power Transmission Circuit

The charging circuit can be described using the model below:

$$U_0 = U(t) + L\frac{dI(t)}{dt} + I(t)R \quad (1)$$

Here $U_0$ is the charging source of 3 volts voltage. L and R are the associated inductance and the resistance of the circuit. U(t) is the time dependent readout of the voltmeter and I(t) is the time dependent readout of an ammeter.

A program has been developed to simulate the I-V curve based on the partial differential equation (1). The simulated time dependent current $I_s(t)$ based on U(t) is compared with measured I(t), and the results are shown in FIG. 20.

The program used to simulate the current:

```
#include<iostream.h>
#include<stdio.h>
#include<stdlib.h>
#include<math.h>
#include<time.h>
#define tim 3500
#define start 265
float curre[tim];
float nihe[tim];
float test[tim];
float voll[tim];
FILE *fp;
int main( )
{
    int i,j,k;
    fp=fopen("Cur.txt","r");
    for(i=0;i<tim;i++)
    {
        fscanf(fp,"%f",&curre[i]);
        curre[i]=-curre[i];
        cout<<curre[i]<<endl;
    }
    fclose(fp);
    fp=fopen("Vol.txt","r");
    for(i=0;i<tim;i++)
    {
        fscanf(fp,"%f",&voll[i]);
        cout<<voll[i]<<endl;
    }
    fclose(fp);
    double coef1;
    double coef2;
    coef2=curre[1]/(voll[1]-voll[0]);
    cout<<coef2<<endl;
    test[0]=curre[0];
    test[start]=curre[start];
    double coef1th;
    double maxh=1000000000;
    double coef2th;
    for(coef2=0;coef2<0.04; coef2=coef2+0.0001)
    {
        cout<<coef2<<endl;
        for(coef1=0.94; coef1<=0.96; coef1=coef1+0.0001)
        {
            // cout<<coef1<<endl;
            for(i=start+1;i<tim;i++)
            {
                test[i]=coef1*test[i-1]+(3-(voll[i]+voll[i-1])*0.5)*coef2;
            }
            double poi=0;
            for(i=start;i<tim;i++)
            {
                poi+=(test[i]-curre[i])*(test[i]-curre[i]);
            }
            if(poi<maxh)
            {
                coef1th=coef1;
                coef2th=coef2;
                maxh=poi;
                for(int j=0;j<tim;j++)
                {
                    nihe[j]=test[j];
                }
            }
        }
    }
    cout<<coef1th<<endl;
    cout<<coef2th<<endl;
    cout<<maxh<<endl;
    fp=fopen("nihe.txt","w");
    for(i=0;i<tim;i++)
    {
        fprintf(fp, "%f", -nihe[i]);
        fprintf(fp, "\n");
    }
    fclose(fp);
    fp=fopen("canshu.txt","w");
    fprintf(fp, "%f", coef1th);
```

-continued

```
    fprintf(fp, "\n");
    fprintf(fp, "%f", coef2th);
    fprintf(fp, "\n");
    fclose(fp);
    return(1);
}
```

EXAMPLE 2

Device Geometries and Materials Strategies for Stretchable Electronic Systems

FIGS. 25 and 27 provide example fabrication process flow diagrams for making some electronic systems of the invention. FIG. 25 provides an overall fabrication flow chart. FIG. 26 illustrates silver epoxy scraping for making the electrical contact between the serpentine interconnects and COTS chips. FIG. 27 illustrates liquid chamber fabrication. The cavity or pouch is formed by laminating a thin piece of elastomer sheet on top of the substrate, and sealing at the surrounding periphery is achieved under heat and pressure with the uncured elastomer as glue. Fluid is injected into the as-formed cavity by injection through the cavity side edge with a syringe.

FIGS. 28A-28D illustrate a single battery of the present invention. FIGS. 29A-29B illustrate a battery undergoing ~100% uniaxial stretching.

FIG. 30 provides an ECG circuit with wireless power and telecommunication. FIGS. 31A-31B provides an example of ECG data on wired oscilloscope, and on frequency counter by wireless telecommunication, where the data fidelity is very high, and the QRS complexes can be clearly distinguished.

FIG. 32 illustrates a stretchable format of the circuit in FIG. 30, where the red circles indicate places with selective bonding to the substrate. FIG. 33 shows an array of ECO-FLEX® silicone rubber pedestals mounted into etched Si wafer or patterned thick SU8. FIGS. 34A-34B illustrate the same circuit as FIG. 32 but with a thinner version of COTS chips (<1 mm). FIGS. 35A-35B shows the circuit in FIGS. 34A-34B but with a liquid chamber, where a bubble is intentionally left behind to indicate the presence of fluid. FIGS. 36A-36B provide images demonstrating stretching. FIGS. 37A-37B provide images demonstrating flexing at a radius of around 2 cm.

FIG. 38 provides mechanical simulations illustrating the strain distribution in different geometries of the interconnects under a fully encapsulated case at the liquid chamber interface.

FIG. 39 provides schematic diagrams illustrating system level strain distribution in the interconnects between the stiff islands-horizontal. FIG. 40 provides schematic diagrams illustrating system level strain distribution in the interconnects between the stiff islands-vertical.

FIG. 41 shows the overall layout of a multifunctional circuit with liquid chamber. The basic functions of this circuit include: wireless radiofrequency power harvesting, two-terminal electrophysiological sensors (electrocardiogram, electromyogram, electroencephalogram, and electrooculogram), temperature sensor, acceleration sensor, and wireless data transmission. FIGS. 42A-42B show mechanically polished commercial off the shelf (COTS) chips with the electrical functionality intact and a thickness below 0.5 mm. FIG. 43 provides a side view of mechanically polished commercial off the shelf (COTS) chips with the electrical functionality intact and a thickness below 0.5 mm.

FIG. 44 illustrates a multilayer—$1^{st}$ data transmission lines, FIG. 45 illustrates a multilayer—$2^{nd}$ power delivery lines and FIG. 46 illustrates a multilayer—$3^{rd}$ ground lines. At the cross points of these lines, they are insulated from each other by polymer, such as polyimide, parylene C, or SU8.

FIG. 47 illustrates the locations of precise selective bonding of the islands and the interconnects (1). FIGS. 48A-48B illustrate the fabrication processes to achieve precise selective bonding (2). FIGS. 49A-49B illustrate reduced sharp corners to increase the robustness of the interconnects. FIG. 50 illustrates the hybrid usage of self-similar interconnects and conventional serpentine interconnects (1). FIG. 51 illustrates self-similar interconnects of the contact pads to the skin (2).

FIGS. 52 and 53 illustrate an example of basic fabrication schemes, similar to FIGS. 25 and 26.

FIG. 54 provides an example of a wireless power circuit using a resonant inductive coil. FIGS. 55A-55B demonstrate wireless circuit stretching uniaxially to 100%.

FIG. 56 illustrates an example ECG circuit similar to the circuit in FIG. 30.

FIGS. 57, 58 and 59 illustrate examples of layout, selective bonding location under each rigid island, and interconnect geometry design considerations. FIGS. 60A-60C illustrate examples of fabricated interconnects with three layers of metals for data, power, and ground lines, respectively. These metal layers are separated by polyimide, in this case. The contact pads in the metal layers to the COTS chips are exposed.

FIGS. 61A-61B illustrate selective bonding using an unconventional fabrication process, along with optical microscope images showing the parts with selective bonding. FIGS. 62A-62B illustrate scanning electron microscope images with tethered device components comprising stretchable electrical interconnects bonded to pedestals. As shown, the interconnects are selectively bonded to the substrate at discrete locations, such that 5% or less of the surface area of a device component is in physical contact a tether, or 2% or less of the surface area of a device component is in physical contact with a tether, or 1% or less of the surface area of a device component is in physical contact with a tether. Tethering through selective bonding of interconnects and/or other device components at one or more positions may be used to reduce or prevent entanglement of interconnects, device components and/or devices.

FIGS. 63A-63B illustrates chip depackaging by purely mechanical polishing and acid etching by hot fuming nitric acid.

FIGS. 64A-64B show a fabricated multifunctional device with liquid chamber on a bent cylindrical surface with COTS chips as received and mechanically polished. FIGS. 65A-65D illustrate stretching and flexing of the device in FIGS. 64A-64B. FIG. 66 shows example mechanical analyses of the multilayered interconnects. FIG. 67 shows strain distribution in the multilayered interconnects under vertical uniaxial strain of 30%. FIGS. 68 and 69 schematically illustrate stretching simulation video.

EXAMPLE 3

Electronic Systems Having Fluid Containment

Electronic devices having fluid containment will now be described with reference to the figures, where reference numerals used to describe FIGS. 70A-70Q show the same features in multiple embodiments, multiple items within a figure may not be labeled, and the figures may not be drawn to scale.

FIGS. 70A and 70L show side plan views of systems 102 comprising a substrate 100 with one or more electronic devices or device components 110A, 110B, 110C supported by a surface 105 of the substrate. In the embodiments shown, devices or device components 110A, 110B, 110C are free standing and a fluid containment chamber 135 is formed by a plurality of enclosing structures, such as a top wall 135B and side walls 135A, 135C. The fluid containment chamber 135 at least partially surrounds the devices/components 110A, 110B, 110C within a void space 130 of the chamber that is at least partially filled with a containment fluid 140. In the embodiment of FIG. 70A, the devices/components 110A, 110B are connected to one another by an electrical interconnect 120.

FIGS. 70B and 70M show embodiments similar to those of FIGS. 70A and 70L except that fluid containment chamber 135 is formed in part by a bottom wall 135D in addition to top wall 135B and side walls 135A, 135C. In this embodiment, devices/components 110A, 110B, 110C and containment fluid 140 do not contact substrate 100. Instead, the devices/components 110A, 110B, 110C are free standing on bottom wall 135D.

FIG. 70C shows an embodiment where a fluid containment chamber 135 contains an interior wall 135E that forms multiple void spaces 150, 160. In the embodiment shown, devices/components 110A and 110B are located in separate void spaces 150, 160, but they are in electrical contact through electrical interconnect 120, which is embedded within interior wall 135E. A containment fluid 140 at least partially fills each void space 150, 160.

FIG. 70D shows an embodiment of a system 102 comprising multiple void spaces 150, 160 formed by a fluid containment chamber 135 having a top wall 135B, a bottom wall 135D, side walls 135A, 135C and an interior wall 135E. A containment fluid 140 at least partially fills each void space 150, 160. The devices or device components are located in separate void spaces 150, 160, but are connected to one another by electrical interconnect 120, which is embedded within interior wall 135E. The entire system is supported by a substrate 100.

FIGS. 70E and 70N show embodiments of a system 102 comprising one or more devices or device components 110A, 110B, 110D that are tethered to a substrate 100 by a relief feature 170A, 170B, 170D. For example, in some embodiments, the relief feature 170A, 170B, 170D may be a pedestal. In the embodiment of FIG. 70E, devices/components 110A, 110B are connected to one another by an electrical interconnect 120, which may be a stretchable or serpentine electrical interconnect. Devices/components 110A, 110B, 110D, relief features 170A, 170B, 170D and optionally electrical interconnect 120 are enclosed within a void space 130 of a fluid containment chamber 135 formed by a top wall 135B and side walls 135A, 135C that are laminated to substrate 100. Void space 130 is at least partially filled with a containment fluid 140.

FIG. 70F shows an embodiment where devices or device components 110A, 110B, which are each tethered to a substrate 100 by a relief feature 170A, 170B, are located in separate void spaces 150, 160 of a fluid containment chamber 135 formed by a top wall 135B, side walls 135A, 135C, and an interior wall 135E. The tethered devices/components are connected to one another by an electrical interconnect 120 that passes through interior wall 135E.

FIG. 70O shows an embodiment comprising an array of relief features supporting each device or device component 110A, 110B. For example, device/component 110A is supported by relief features 170A1, 170A2 and 170A3, and device/component 110B is supported by relief features 170B1, 170B2 and 170B3. In this embodiment, containment fluid 140 is able to infiltrate between relief features 170A1-A3 and 170B1-B3.

FIG. 70H shows an embodiment of a system 102 comprising devices or device components 110A, 110B each supported by an array of relief features 170A1-A3 and 170B1-B3, where each device/component 110A, 110B is disposed in an independent void space 150, 160 of a fluid containment chamber 135 formed by a top wall 135B, side walls 135A, 135C and an interior wall 135E. In the embodiment shown, fluid containment chamber 135 is laminated to the surface 105 of substrate 100, but alternate embodiments could include a bottom wall 135D (not shown) of a fluid containment chamber.

Figure 1B:
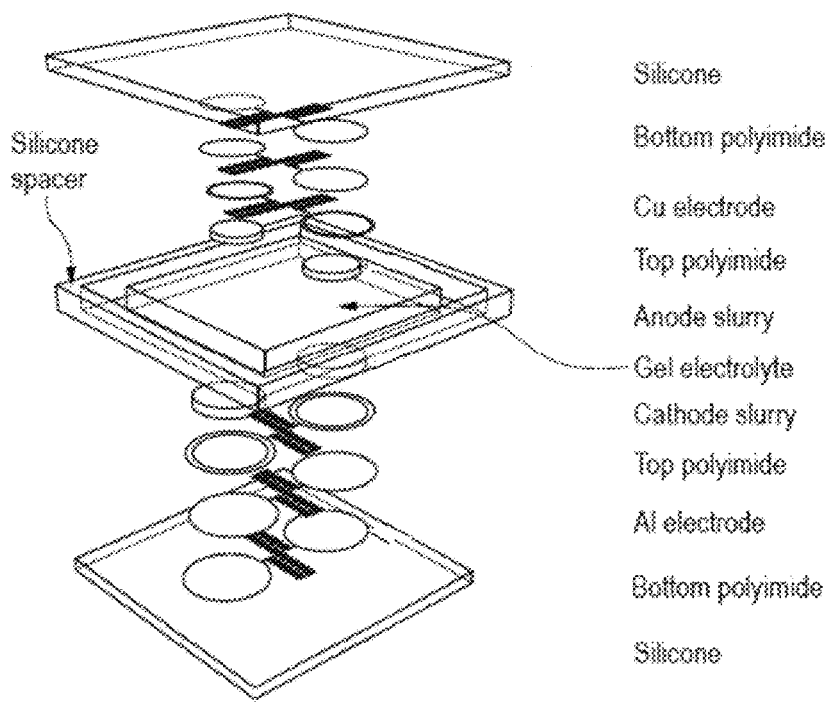
Figure 1C:
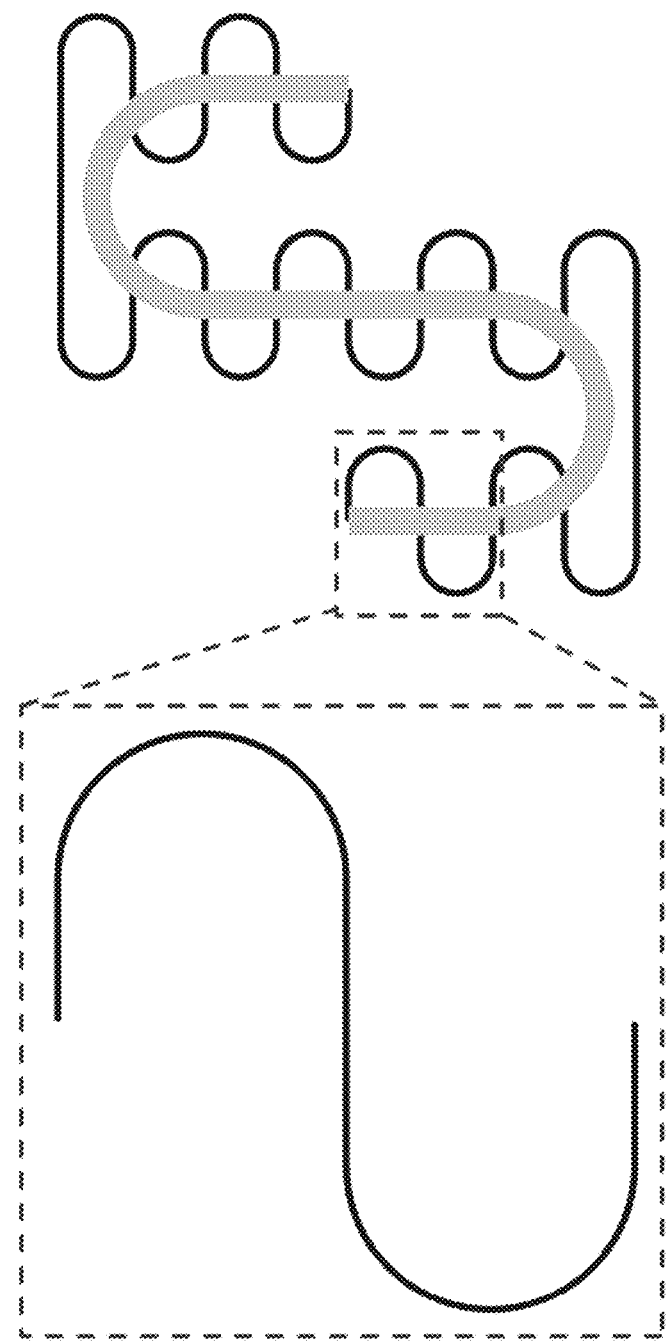

FIGS. 70I1 and 70I2 show the result of stretching substrate 100. FIG. 70I1 shows a system 102 without any external force on the system. FIG. 70I2 shows a force in the direction of arrow A on substrate 100. The applied force pulls the point of relief feature 170B bound to the substrate in the direction of arrow A. The tethered geometry of device/component 110B involving relief feature 170B functions to decouple motion and/or deformation of the substrate from device/component 110B. Containment fluid 140 within void space 130 of fluid containment chamber 135 buffers device/component 110B.

FIGS. 70J1 and 70J2 show the result of contracting a substrate 100 of a system 102. FIG. 70J1 shows system 102 without any external force on the system. FIG. 70J2 shows forces in the directions of arrows B1 and B2 such that substrate 100 is being contracted or squeezed. The applied forces moves the bonding points of relief features 170B and 170A with the substrate in the directions of arrows B1 and B2, respectively. The tethered geometry of devices/components 110B and 110A involving relief features 170B and 170A functions to decouple motion and/or deformation of the substrate from device/components 110B and 110A.

FIG. 70K shows a top plan view of an embodiment of a system 102 comprising a stretchable serpentine electrical interconnect 120 connecting devices or device components 110A, 110B. The system further includes a fluid containment chamber 135 having a void 130 that is at least partially filled with a containment fluid 140. The fluid containment chamber 135 may include a top wall (not shown) and/or a bottom wall (not shown). The entire system is supported by a substrate 100.

FIG. 70O shows a top plan view of an embodiment of an exemplary system 102 comprising a stretchable serpentine electrical interconnect 120 connecting devices or device components 110A, 110B. The system further includes a fluid containment chamber 135 having a void 130 that is at least partially filled with a containment fluid 140. The fluid containment chamber 135 may include a top wall (not shown) and/or a bottom wall (not shown). The entire system is supported by a substrate 100. The embodiment shown in FIG. 70O also includes barrier structures 700, in the form of corrals, which limit movement of a free standing device or device component. Corrals 700 are unitary structures having a height, h, that is less than the full height of fluid containment chamber 135 and having an opening for interconnect 120 to access device or device component 110A, 110B. FIG. 70P shows a similar embodiment, where the barrier structures are formed as a plurality of bumpers including side walls 710(1), back walls 710(2) and front walls 710(3). Each bumper 710(1)-(3) is positioned substantially parallel to an edge of a device or device component, and although each bumper 710(1)-(3) is shorter than the edge of the device or device component it is sufficiently long to constrain movement of the device or device component without preventing movement of containment fluid 140. Two front walls 710(3) form an opening for interconnect 120 to access device or device component 110A, 110B. FIG. 70Q shows a side plan view of the embodiment of FIG. 70P, wherein free standing devices or device components 110A, 110B are laterally constrained by bumpers 710(1)-(3) having widths, w, less than a corresponding edge of device or device component 110A, 110B, and heights, h, at least sufficient to prevent device or device component 110A, 110B from moving vertically and escaping through a gap, g, between a bumper 710(1)-(3) and top wall 135B of fluid containment chamber 135.

FIG. 71 shows a top plan view of an embodiment of an exemplary system 770 comprising stretchable serpentine electrical interconnects 120 connecting devices or device components 110, which may be free floating or tethered and optionally may be constrained within a barrier structure (not shown). The system further includes a fluid containment chamber 135 having a void 130 that is at least partially filled with a containment fluid 140. The fluid containment chamber 135 may include a top wall (not shown) and/or a bottom wall (not shown). The entire system is supported by a substrate 100. To reduce or prevent tangling, interconnects 120 are selectively bonded to the bottom wall or substrate 100 by a bonding pad 750, which may be a pedestal, adhesive bead, or other material for anchoring a device or device component to a bottom wall or substrate 100.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, and methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomer and enantiomer of the compound described individually or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Whenever a range is given in the specification, for example, a range of integers, a temperature range, a time range, a composition range, or concentration range, all intermediate ranges and subranges, as well as all individual values included in the ranges given are intended to be included in the disclosure. As used herein, ranges specifically include the values provided as endpoint values of the range. As used herein, ranges specifically include all the integer values of the range. For example, a range of 1 to 100 specifically includes the end point values of 1 and 100. It will be understood that any subranges or individual values in a range or subrange that are included in the description herein can be excluded from the claims herein.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are claimed, it should be understood that compounds known and available in the art prior to Applicant's invention, including compounds for which an enabling disclosure is provided in the references cited herein, are not intended to be included in the composition of matter claims herein.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. An electronic system comprising:
   i. a substrate,
      wherein said substrate has a Young's modulus selected from the range of 1 kPa to 100 MPa,
      wherein said substrate is a flexible substrate or a stretchable substrate;
   ii. an electronic device or device component supported by said substrate;
      wherein said electronic device or device component is free standing or tethered to said substrate;
   iii. a fluid containment chamber at least partially enclosing said electronic device or device component;
      wherein said fluid containment chamber is an elastomer at least partially filled with a containment fluid and
      wherein at least 50% of the volume of said fluid containment chamber is occupied by said containment fluid,
      wherein said containment fluid has a viscosity greater than or equal to 0.1 cP and less than or equal to 10,000 cP at 298 K after the electronic system is fabricated; and
   iv. one or more stretchable electrical interconnects in electrical contact with said electronic device or device component,
   wherein the electronic device or device component in a free-standing or tethered configuration mechanically isolates forces originating upon deformation, stretching or compression of the flexible or stretchable substrate from the electronic device or device component to decrease a strain exerted on the electronic device or device component by a factor of at least 4 to 1000 times compared to an equivalent device or device component directly bonded to said substrate.

2. The system of claim 1, wherein said containment fluid is in physical contact with said electronic device or device component.

3. The system of claim 1, wherein said electronic device or device component is entirely immersed in said containment fluid.

4. The system of claim 1, wherein said containment fluid is a lubricant.

5. The system of claim 1, wherein said containment fluid is an electrolyte.

6. The system of claim 1, wherein said containment fluid has an ionic conductivity greater than or equal to 0.001 S cm$^{-1}$.

7. The system of claim 1, wherein said containment fluid has a vapor pressure less than or equal to 760 Torr at 298 K.

8. The system of claim 1, wherein said containment fluid is a liquid, colloid, or gel or gas.

9. The system of claim 1, wherein said containment fluid is a material selected from the group consisting of a pre-polymer, a solvent, a nonaqueous electrolyte, a silicone, a natural oil, a synthetic oil, a polyolefin and a fluorocarbon.

10. The system of claim 1, wherein said substrate is a polymer substrate.

11. The system of claim 1, wherein said substrate comprises one or more materials selected from the group consisting of an elastomer, PDMS, silicone rubber, and a silicone.

12. The system of claim 1, wherein said substrate has a thickness selected from the range of 100 microns to 100 mm.

13. The system of claim 1, wherein said fluid containment chamber comprises a material selected from the group consisting of PDMS, silicone rubber, and a silicone.

14. The system of claim 1, wherein said fluid containment chamber has a height selected from the range of 10 µm to 10 cm.

15. The system of claim 1, wherein at least 0.1% of the volume of said fluid containment chamber is occupied by said electronic device or device component.

16. The system of claim 1, wherein said free standing or tethered electronic device or device component at least partially decouples motion or deformation of said substrate from said electronic device or device component.

17. The system of claim 1, wherein said free standing or tethered electronic device or device component at least partially decouples forces generated by elongation, compression or deformation of said substrate from said electronic device or device component.

18. The system of claim 1, wherein said electronic device or device component comprises a single crystalline inorganic semiconductor structure.

19. The system of claim 1, wherein said electronic device or device component comprises a single crystalline inorganic semiconductor structure operationally connected to at least one additional device component or structure selected from the group consisting of a conducting structure, a dielectric structure, an electrode, a cathode, an anode, and an additional semiconductor structure.

20. The system of claim 1, wherein said electronic device or device component has a thickness selected from the range of 10 nanometers to about 100 microns, a width selected from the range of 100 nanometers to about 1 millimeter and a length selected from the range of 1 micron to about 1 millimeter.

21. The system of claim 1, wherein said system further comprises one or more additional electronic devices or device components at least partially enclosed by said fluid containment chamber or at least partially enclosed by one or more additional fluid containment chambers.

22. The system of claim 1, wherein said electronic device or device component is a free standing or tethered fully formed integrated circuit.

23. The system of claim 1, wherein said electronic device or device component comprises a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, a complementary logic circuit or an array of any of these.

24. The system of claim 1, wherein said fluid containment chamber comprises a material that is not permeable to said containment fluid.

25. The system of claim 24, wherein said one or more electrical interconnects establish electrical contact between said electronic device or device component and one or more additional electronic devices or device components.

26. The system of claim 25, wherein said electronic device or device component, said one or more additional electronic devices or device components and said one or more electrical interconnects are provided in an island bridge geometry, wherein said electronic devices or device components comprise said islands and wherein said electrical interconnects comprise said bridges.

27. The system of claim 1, wherein said one or more stretchable electrical interconnects are configured to provide elasticity, bendability, or both of said electronic system.

28. The system of claim 27, wherein at least a portion of said one or more stretchable electrical interconnects has a bent, buckled, folded, curved or serpentine geometry.

29. The system of claim 27, wherein at least a portion of said one or more stretchable electrical interconnects has a geometry that is in plane, out of plane, or both in plane and out of plane, relative to a plane defined by a supporting surface of said substrate.

30. The system of claim 29, wherein said supporting surface is curved.

31. The system of claim 29, wherein said supporting surface is substantially flat.

32. The system of claim 29, wherein at least a portion of said one or more electrical interconnects has an in plane serpentine geometry.

33. The system of claim 27, wherein said at least a portion of said one or more stretchable electrical interconnects comprises a plurality of electrically conductive structures each independently having a primary unit cell shape comprising a plurality of spatially offset and opposing segments, wherein said conductive structures are connected in a sequence characterized by a secondary shape, comprising at least one pair of spatially offset and opposing regions formed from said sequence of electrically conductive structures; wherein said sequence of conductive structures is capable of undergoing deformation thereby providing stretchability of said stretchable electrical interconnects.

34. The system of claim 33, wherein said at least a portion of said one or more electrical interconnects comprising said sequence of electrically conductive structures provides an overall self-similar geometry for said stretchable electrical interconnect.

35. The system of claim 33, wherein said sequence of electrically conductive structures is further characterized by a tertiary shape comprising at least one pair of spatially offset and opposing regions formed from a repeating series of said electrically conductive structures comprising said secondary shape.

36. The system of claim 33, wherein said sequence of conductive structures comprises a monolithic structure.

37. The system of claim 33, wherein said sequence of conductive structures comprises a wire.

38. The system of claim 33, wherein said primary unit cell shape comprises convex and concave regions.

39. The system of claim 33, wherein said unit cell is a serpentine shape.

40. The system of claim 27, wherein at least one of said electrical interconnects electrically connects said device component comprising a first rigid device island with a second device component comprising a second rigid device island.

41. The system of claim 40, further comprising an array of said device components comprising rigid device islands, wherein said one or more electrical interconnects electrically connect adjacent rigid device islands.

42. The system of claim 41, further comprising a plurality of said device components, wherein each of said rigid device islands corresponds to one of said device components.

43. The system of claim 1, wherein said electronic device or device component is a free standing structure supported by or in physical contact with said substrate.

44. The system of claim 43, wherein said free standing structure undergoes an associative interaction with said substrate or an intermediate structure provided between said substrate and said free standing structure;
wherein said associative interaction is a dipole —dipole interaction or a Van der Waals interaction.

45. The system of claim 1, wherein said electronic device or device component comprises a single crystalline semiconductor electronic device.

46. The system of claim 45, wherein said single crystalline semiconductor electronic device or device component comprises one or more electronic devices selected from the group consisting of a transistor, an electrochemical cell, a fuel cell, an integrated circuit, a solar cell, a laser, a light emitting diode, a nanoelectromechanical device, a microelectromechanical device, a photodiode, a P-N junction, a sensor, a memory device, an integrated circuit and a complementary logic circuit.

47. The system of claim 1, wherein said electronic device or device component is a tethered structure supported by one or more relief features of said substrate or one or more relief features supported by said substrate.

48. The system of claim 47, wherein said one or more relief features comprise one or more pedestals.

49. The system of claim 47, wherein said one or more relief features comprise an array of at least 10 pedestals.

50. The system of claim 47, wherein said tethered structure is bonded to said one or more relief features.

51. The system of claim 47, wherein said one or more relief features comprise an elastomer, PDMS, silicone rubber, or a silicone.

52. The system of claim 47, wherein each of said one or more relief structures independently extend a length selected over the range of 100 nm to 1 mm and independently have one or more cross sectional physical dimensions selected over the range of 100 nm to 1 mm.

53. The system of claim 1, wherein said electronic device or device component is provided on a receiving surface of said substrate or on an intermediate structure provided between said substrate and said electronic device or device component.

54. The system of claim 53, wherein said fluid containment chamber comprises one or more enclosing structures positioned to surround an exterior portion of said electronic device or device component.

55. The system of claim 54, wherein said one or more enclosing structures of said fluid containment chamber are operationally coupled to said receiving surface or an intermediate structure provided between said receiving surface and said one or more enclosing structures.

56. The system of claim 54, wherein said one or more enclosing structures of said fluid containment chamber are not in physical contact with said electronic device or device component.

57. The system of claim 54, wherein said enclosing structures comprise one or more chamber walls or barrier structures each positioned at least 10 microns from a side of the electronic device or device component.

58. The system of claim 54, wherein at least a portion of said enclosing structures of said fluid containment chamber is laminated to said substrate or an intermediate structure provided between said substrate and said enclosing structure.

59. The system of claim 54, wherein said enclosing structures of said fluid containment chamber have a Young's modulus selected from the range of 1 kPa to 1 GPa.

60. The system of claim 54, wherein said fluid containment chamber further comprises one or more recessed features provided in said substrate partially surrounding said electronic device or device component, wherein said one or more enclosing structures are provided to enclose said recessed features.

61. The system of claim 60, wherein said recessed features of said fluid containment chamber comprise one or more chamber walls or barrier structures each positioned at least 10 microns from a side of said electronic device or device component.

62. An array of electronically interconnected systems of claim 1.

63. A method of making an electronic system comprising:
providing a substrate,
  wherein said substrate has a Young's modulus selected from the range of kPa to 100 MPa,
  wherein said substrate is a flexible substrate or a stretchable substrate;
providing an electronic device or device component that is free standing or tethered to said substrate in a fluid containment chamber on said substrate such that said fluid containment chamber at least partially encloses said electronic device or device component;
wherein said fluid containment chamber is an elastomer and
wherein at least 50% of the volume of said fluid containment chamber is occupied by a containment fluid;
providing one or more stretchable interconnects in electrical contact with said electronic device or device component, and
at least partially filling said fluid containment chamber with said containment fluid,
wherein said containment fluid has a viscosity greater than or equal to 0.1 cP and less than or equal to 10,000 cP at 298 K after the electronic system is fabricated;
wherein the electronic device or device component in a free-standing or tethered configuration mechanically isolates forces originating upon deformation, stretching or compression of the flexible or stretchable substrate from the electronic device or device component to decrease a strain exerted on the electronic device or device component by a factor of at least 4 to 1000 times compared to an equivalent device or device component directly bonded to said substrate.

* * * * *